United States Patent [19]
Oshima

[11] Patent Number: 5,819,000
[45] Date of Patent: Oct. 6, 1998

[54] MAGNETIC RECORDING AND PLAYBACK APPARATUS

[75] Inventor: Mitsuaki Oshima, Kyoto, Japan

[73] Assignee: Matsushita Electric Industrial Co., Ltd., Osaka, Japan

[21] Appl. No.: 37,108

[22] Filed: Mar. 25, 1993

[30] Foreign Application Priority Data

Mar. 26, 1992 [JP] Japan ..................................... 7-067934
Sep. 25, 1992 [JP] Japan ..................................... 4-256070

[51] Int. Cl.$^6$ ............................... H04N 5/91; H04N 5/38
[52] U.S. Cl. ............................................. 386/46; 348/723
[58] Field of Search ..................................... 358/335, 342, 358/360, 330; 348/723, 724, 21, 24, 729, 17, 22, 608, 636, 725, 737; 386/46

[56] References Cited

U.S. PATENT DOCUMENTS

| | | | |
|---|---|---|---|
| 5,038,219 | 8/1991 | Yamashita et al. | 358/310 |
| 5,164,963 | 11/1992 | Lawrence et al. | 348/723 |
| 5,267,021 | 11/1993 | Ramchandran et al. | 358/12 |
| 5,282,019 | 1/1994 | Basile et al. | 348/723 |
| 5,311,547 | 5/1994 | Wei | 375/18 |
| 5,481,412 | 1/1996 | Bamair et al. | 360/18 |

*Primary Examiner*—Robert Chevalier
*Attorney, Agent, or Firm*—Lowe Hauptman Gopstein & Berner

[57] ABSTRACT

At the transmitter side, carrier waves are modulated according to an input signal for producing relevant signal points in a signal space diagram. The input signal is divided into, two, first and second, data streams. The signal points are divided into signal point groups to which data of the first data stream are assigned. Also, data of the second data stream are assigned to the signal points of each signal point group. A difference in the transmission error rate between first and second data streams is developed by shifting the signal points to other positions in the space diagram. At the receiver side, the first and/or second data streams can be reconstructed from a received signal. In TV broadcast service, a TV signal is divided by a transmitter into, low and high, frequency band components which are designated as a first and a second data stream respectively. Upon receiving the TV signal, a receiver can reproduce only the low frequency band component or both the low and high frequency band components, depending on its capability.

12 Claims, 138 Drawing Sheets

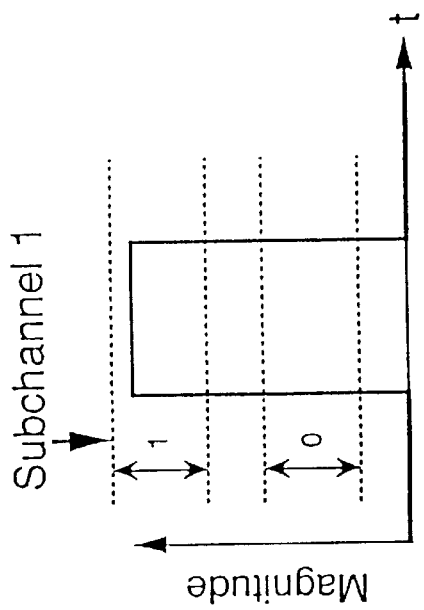
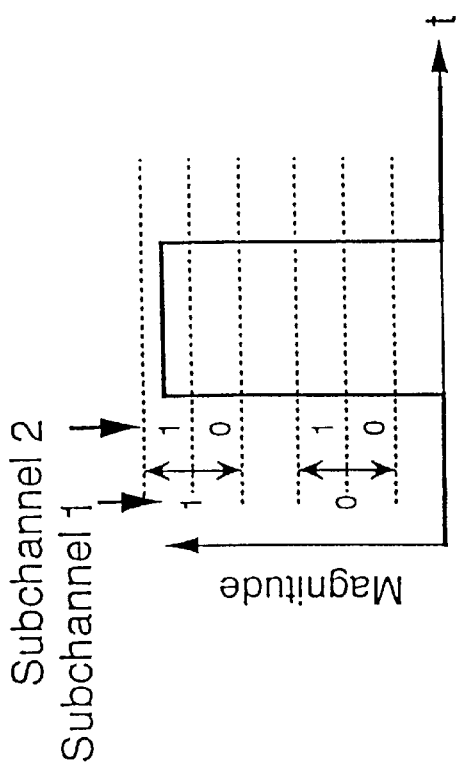
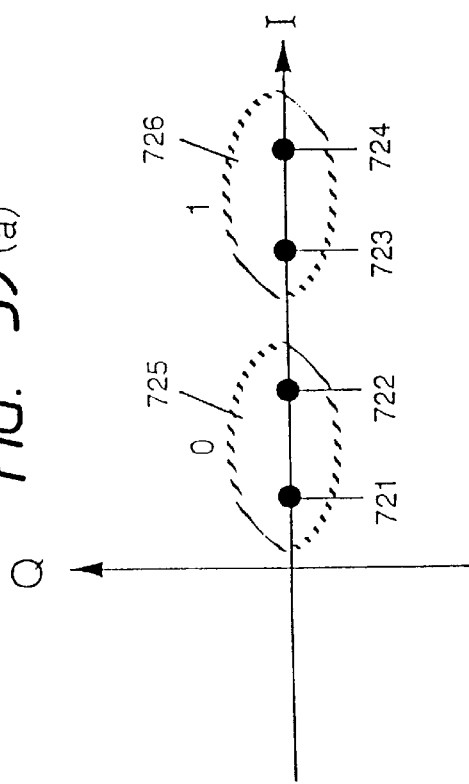
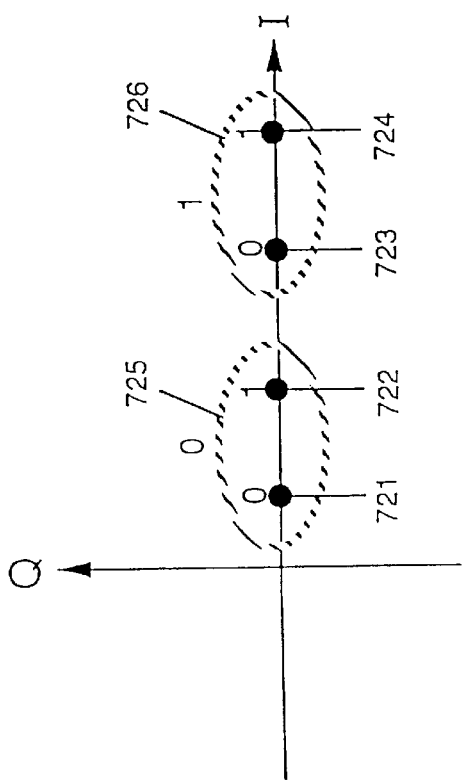

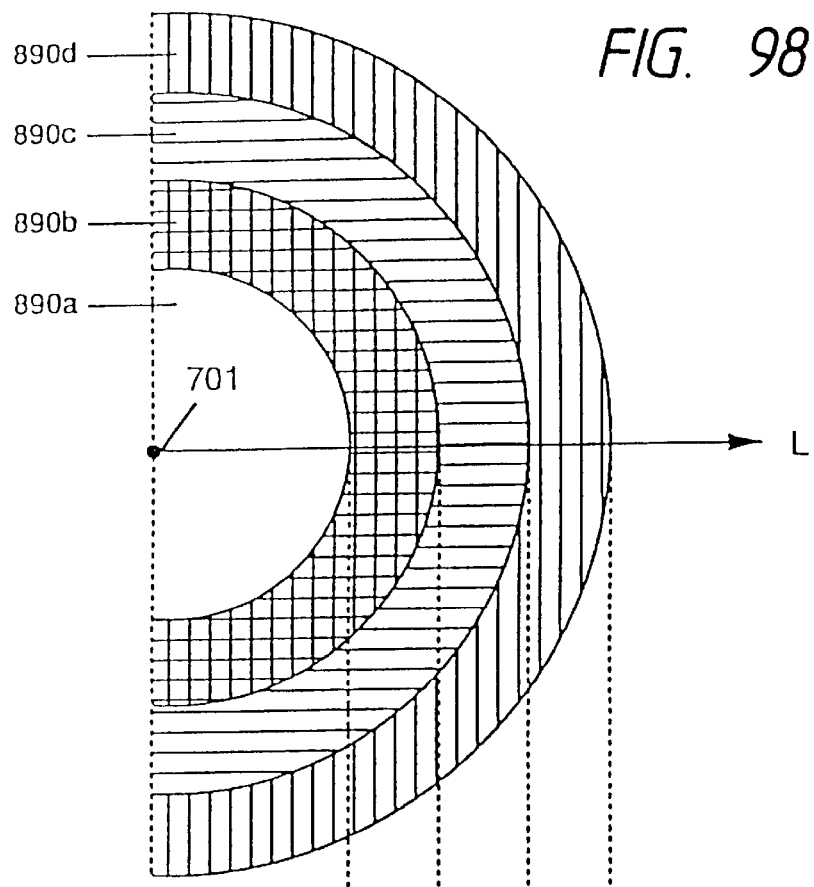
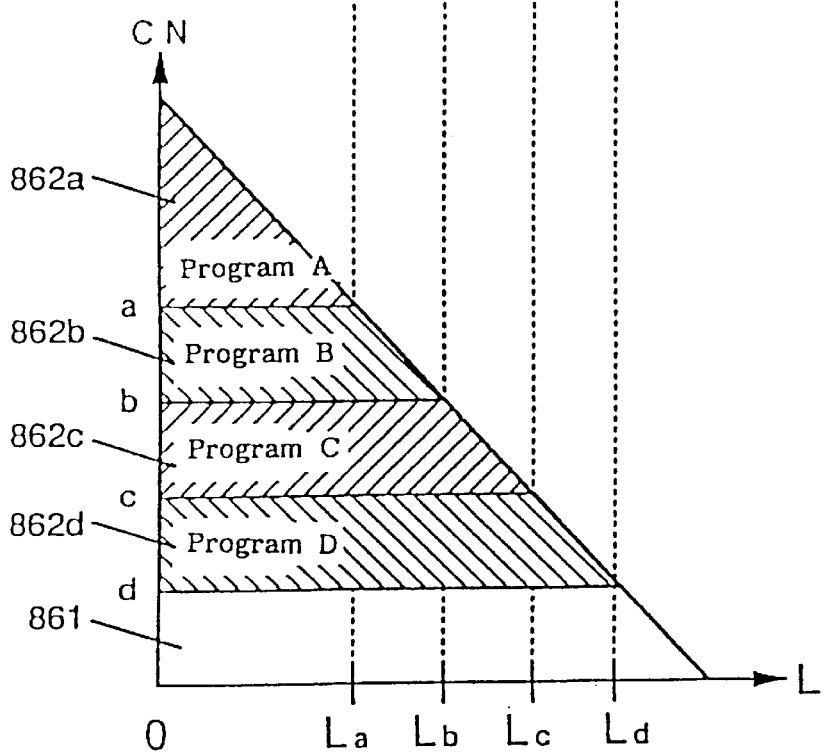
FIG. 98

FIG. 111
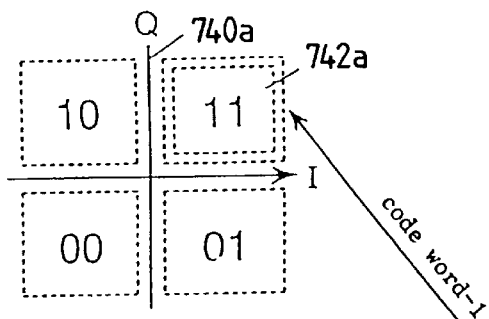
Subchannel-1 (SRQAM:$D_1$=2bit)
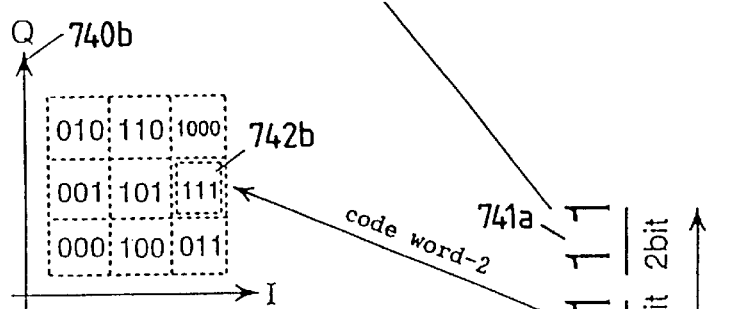
Subchannel-2 (36-SRQAM:$D_2$=3bit+1/8bit)
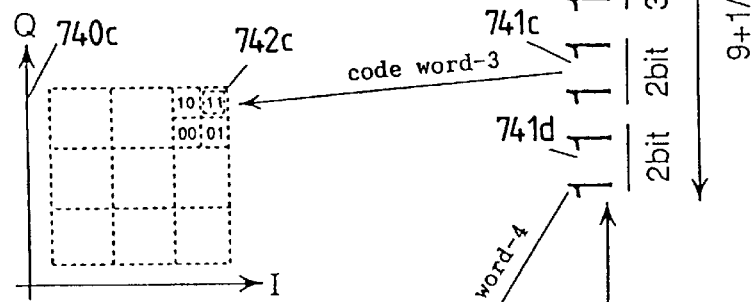
Subchannel-3 (144-SRQAM:$D_3$=2bit)
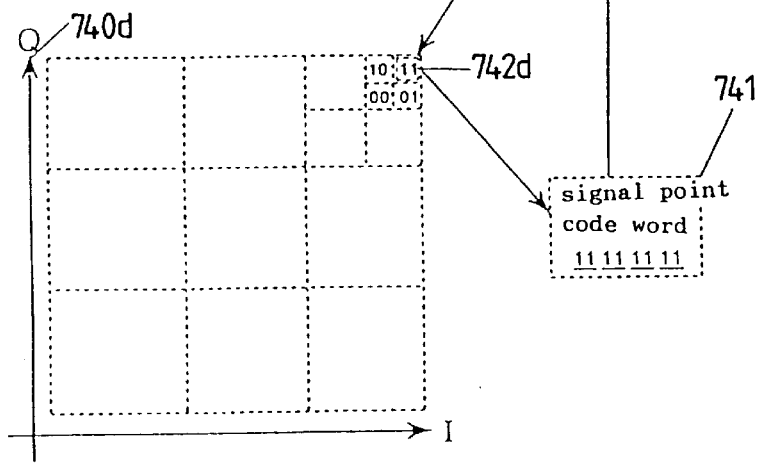
Subchannel-4 (576-SRQAM:$D_4$=2bit)

FIG. 112
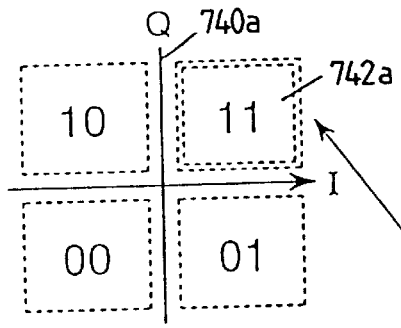
Subchannel-1 (SRQAM:D1=2bit)
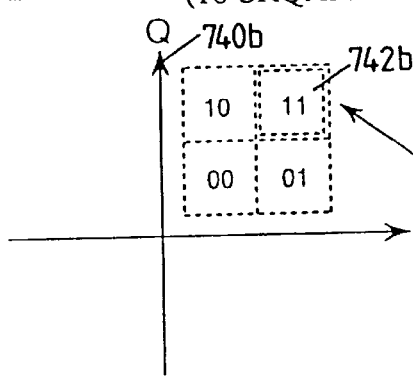
Subchannel-2 (16-SRQAM:D2=2bit)
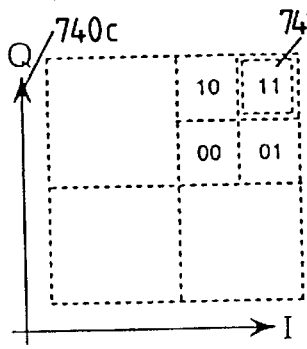
Subchannel-3 (64-SRQAM:D3=2bit)
Subchannel-4 (256-SRQAM:D4=2bit)
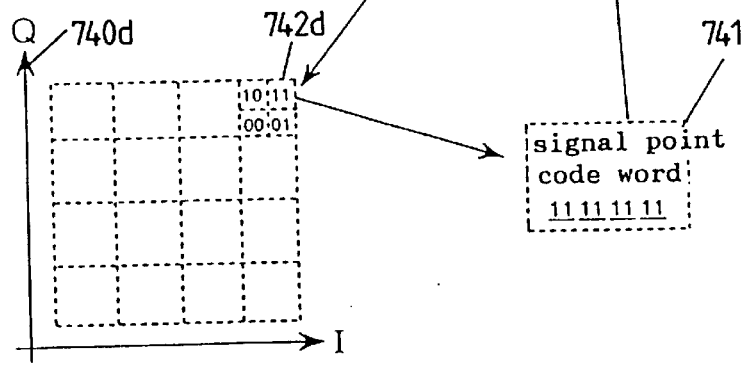

Trellis Encoder (Ratio:3/4)

MAGNETIC RECORDING AND PLAYBACK APPARATUS

BACKGROUND OF THE INVENTION

1. Field of the Invention

The present invention relates to a communication system for transmission/reception of a digital signal through modulation of its carrier wave and demodulation of the modulated signal.

2. Description of the Prior Art

Digital communication systems have been used in various fields. Particularly, digital video signal transmission techniques have been improved remarkably.

Among them is a digital TV signal transmission method. So far, such digital TV signal transmission system are in particular use for e.g. transmission between TV stations. They will soon be utilized for terrestrial and/or satellite broadcast service in every country of the world.

The TV broadcast systems including HDTV, PCM music, FAX, and other information service are now demanded to increase desired data in quantity and quality for satisfying millions of sophisticated viewers. In particular, the data has to be increased in a given bandwidth of frequency allocated for TV broadcast service. The data to be transmitted is always abundant and provided as much as handled with up-to-date techniques of the time. It is ideal to modify or change the existing signal transmission system corresponding to an increase in the data amount with time.

However, the TV broadcast service is a public business and cannot go further without considering the interests and benefits of viewers. It is essential to have any new service appreciable with existing TV receivers and displays. More particularly, the compatibility of a system is much desired for providing both old and new services simultaneously or one new service which can be intercepted by either of the existing and advanced receivers.

It is understood that any new digital TV broadcast system to be introduced has to be arranged for data extension in order to respond to future demands and technological advantages and also, for compatible action to allow the existing receivers to receive transmissions.

The expansion capability and compatible performance of prior art digital TV system will be explained.

A digital satellite TV system is known in which NTSC TV signals compressed to an about 6 Mbps are multiplexed by time division modulation of 4 PSK and transmitted on 4 to 20 channels while HDTV signals are carried on a single channel. Another digital HDTV system is provided in which HDTV video data compressed to as small as 15 Mbps are transmitted on a 16 or 32 QAM signal through ground stations.

Such a known satellite system permits HDTV signals to be carried on one channel by a conventional manner, thus occupying a band of frequencies equivalent to same channels of NTSC signals. This causes the corresponding NTSC channels to be unavailable during transmission of the HDTV signal. Also, the compatibility between NTSC and HDTV receivers or displays is hardly concerned and data expansion capability needed for matching a future advanced mode is utterly disregarded.

Such a common terrestrial HDTV system offers an HDTV service on conventional 16 or 32 QAM signals without any modification. In any analogue TV broadcast service, there are developed a lot of signal attenuating or shadow regions within its service area due to structural obstacles, geographical inconveniences, or signal interference from a neighbor station. When the TV signal is an analogue form, it can be intercepted more or less at such signal attenuating regions although its reproduced picture is low in quality. If TV signal is a digital form, it can rarely be reproduced at an acceptable level within the regions. This disadvantage is critically hostile to the development of any digital TV system.

This problem is caused due to the fact that the conventional modulation systems such QAM arrange the signal points at constant intervals. There have been no such systems that can change or modulate the arrangement of signal points.

SUMMARY OF THE INVENTION

It is an object of the present invention, for solving the foregoing disadvantages, to provide a communication system arranged for compatible use for both the existing NTSC and introducing HDTV broadcast services, particularly via satellite and also, for minimizing signal attenuating or shadow regions of its service area on the grounds.

A communication system according to the present invention intentionally varies signal points, which used to be disposed at uniform intervals, to perform the signal transmission/reception. For example, if applied to a QAM signal, the communication system comprises two major sections: a transmitter having a signal input circuit, a modulator circuit for producing m numbers of signal points, in a signal vector field through modulation of a plurality of out-of-phase carrier waves using an input signal supplied from the input circuit, and a transmitter circuit for transmitting a resultant modulated signal; and a receiver having an input circuit for receiving the modulated signal, a demodulator circuit for demodulating one-bit signal points of a QAM carrier wave, and an output circuit.

In operation, the input signal containing a first data stream of n values and a second data stream is fed to the modulator circuit of the transmitter where a modified m-bit QAM carrier wave is produced representing m signal points in a vector field. The m signal points are divided into n signal point groups to which the n values of the first data stream are assigned respectively. Also, data of the second data stream are assigned to m/n signal points or sub groups of each signal point group. Then, a resultant transmission signal is transmitted from the transmitter circuit. Similarly, a third data stream can be propagated.

At the p-bit demodulator circuit, p>m, of the receiver, the first data stream of the transmission signal is first demodulated through dividing p signal points in a signal space diagram into n signal point groups. Then, the second data stream is demodulated through assigning p/n values to p/n signal points of each corresponding signal point group for reconstruction of both the first and second data streams. If the receiver is at P=n, the n signal point groups are reclaimed and assigned the n values for demodulation and reconstruction of the first data stream.

Upon receiving the same transmission signal from the transmitter, a receiver equipped with a large sized antenna and capable of large-data modulation can reproduce both the first and second data streams. A receiver equipped with a small sized antenna and capable of small-data modulation can reproduce the first data stream only. Accordingly, the compatibility of the signal transmission system will be ensured. When the first data stream is an NTSC TV signal or low frequency band component of an HDTV signal and the second data stream is a high frequency band component of the HDTV signal, the small-data modulation receiver can reconstruct the NTSC TV signal and the large-data modulation receiver can reconstruct the HDTV signal. As understood, a digital NTSC/HDTV simultaneously broadcast service will be feasible using the compatibility of the signal transmission system of the present invention.

More specifically, the communication system of the present invention comprises: a transmitter having a signal input circuit, a modulator circuit for producing m signal points, in a signal vector field through modulation of a plurality of out-of-phase carrier waves using an input signal supplied from the input, and a transmitter circuit for transmitting a resultant modulated signal, in which the main procedure includes receiving an input signal containing a first data stream of n values and a second data stream, dividing the m signal points of the signal into n signal point groups, assigning the n values of the first data stream to the n signal point groups respectively, assigning data of the second data stream to the signal points of each signal point group respectively, and transmitting the resultant modulated signal; and a receiver having an input circuit for receiving the modulated signal, a demodulator circuit for demodulating p signal points of a QAM carrier wave, and an output circuit, in which the main procedure includes dividing the p signal points into n signal point groups, demodulating the first data stream of which n values are assigned to the n signal point groups respectively, and demodulating the second data stream of which p/n values are assigned to p/n signal points of each signal point group respectively. For example, a transmitter 1 produces a modified m-bit QAM signal of which first, second, and third data streams, each carrying n values, are assigned to relevant signal point groups with a modulator 4. The signal can be intercepted and reproduced the first data stream only by a first receiver 23, both the first and second data streams by a second receiver 33, and all the first, second, and third streams by a third receiver 43.

More particularly, a receiver capable of demodulation of n-bit data can reproduce n bits from a multiple-bit modulated carrier wave carrying an m-bit data where m>n, thus allowing the communication system to have compatibility and capability of future extension. Also, a multi-level signal transmission will be possible by shifting the signal points of QAM so that a nearest signal point to the origin point of I-axis and Q-axis coordinates is spaced nf from the origin where f is the distance of the nearest point from each axis and n is more than 1.

Accordingly, a compatible digital satellite broadcast service for both the NTSC and HDTV systems will be feasible when the first data stream carries an NTSC signal and the second data stream carries a difference signal between NTSC and HDTV. Hence, the capability of corresponding to an increase in the data amount to be transmitted will be ensured. Also, at the ground, its service area will be increased while signal attenuating areas are decreased.

BRIEF DESCRIPTION OF THE DRAWINGS

FIGS. 59(a) and 59(b) are diagrams showing assignment of signal points of the modified 4 ASK signal of the fifth embodiment;

FIGS. 59(c) and 59(d) show a multiple state which is realized by converting a present recording from two-levels to four-levels and dividing it into two groups.

FIG. 98 is a diagram showing a four-level transmission of the sixth embodiment;

FIG. 111 is a view showing an assignment of codes according to the third embodiment;

FIG. 112 is a view showing an assignment of an extended 36 QAM according to the third embodiment;

FIG. 118 is a view illustrating communication capacities and traffic distribution according to the eighth embodiment;

FIG. 119(a) is a diagram showing a time slot assignment of a conventional system;

FIG. 119(b) is a diagram showing a time slot assignment according to the eighth embodiment;

FIG. 120(a) is a diagram showing a time slot assignment of a conventional TDMA system;

FIG. 120(b) is a diagram showing a time slot assignment according to a TDMA system of the eighth embodiment;

FIG. 121 is a block diagram showing a one-level transmitter/receiver according to the eighth embodiment;

FIG. 122 is a block diagram showing a two-level transmitter/receiver according to the eighth embodiment;

FIG. 123 is a block diagram showing an OFDM type transmitter/receiver according to the ninth embodiment;

FIG. 124 is a view illustrating a principle of the OFDM system according to the ninth embodiment;

FIG. 125(a) is a view showing a frequency assignment of a modulation signal of a conventional system;

FIG. 125(b) is a view showing a frequency assignment of a modulation signal according to the ninth embodiment;

FIG. 126(a) is a view showing a frequency assignment of a transmission signal of the ninth embodiment;

Figure 126:
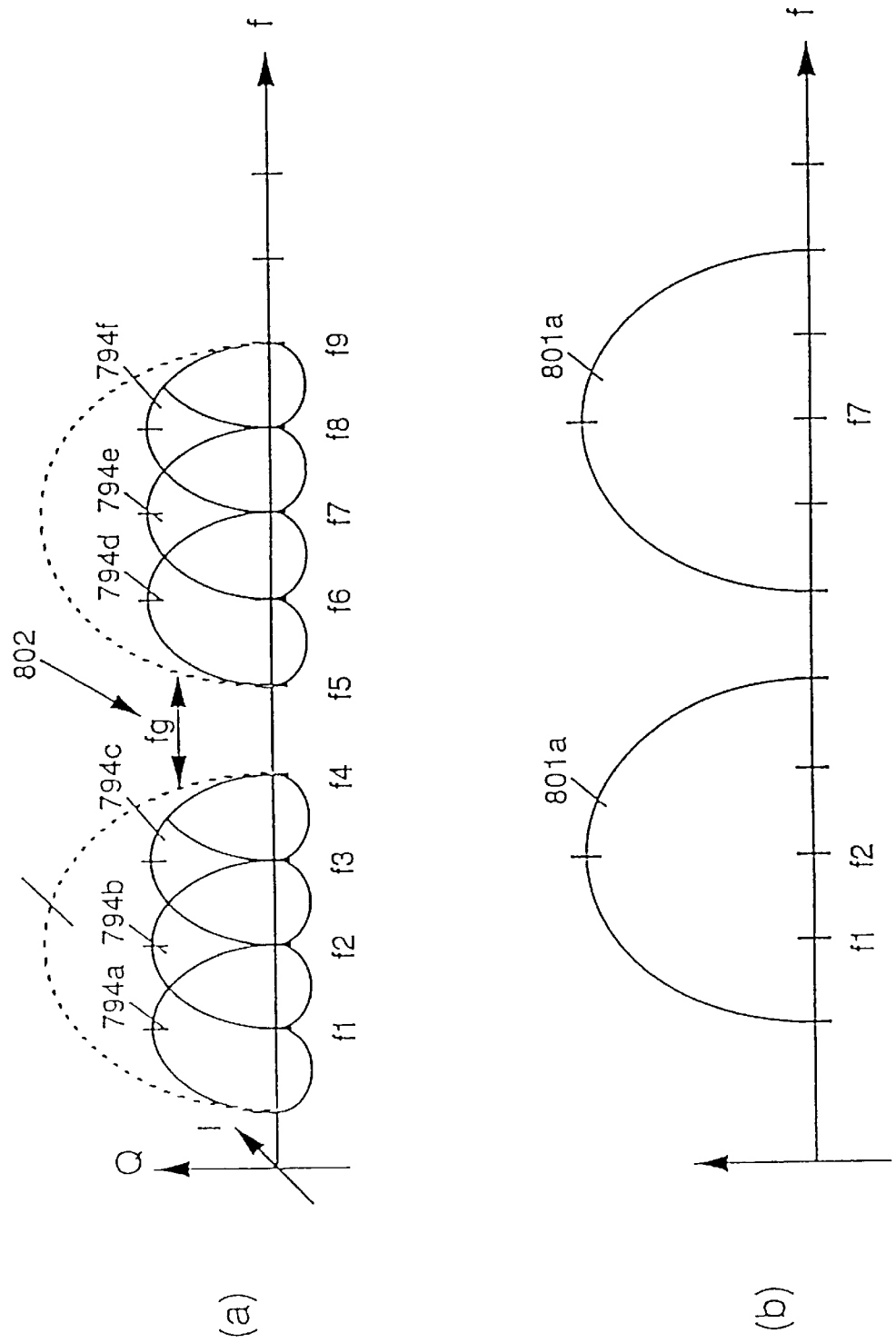
Figure 127:
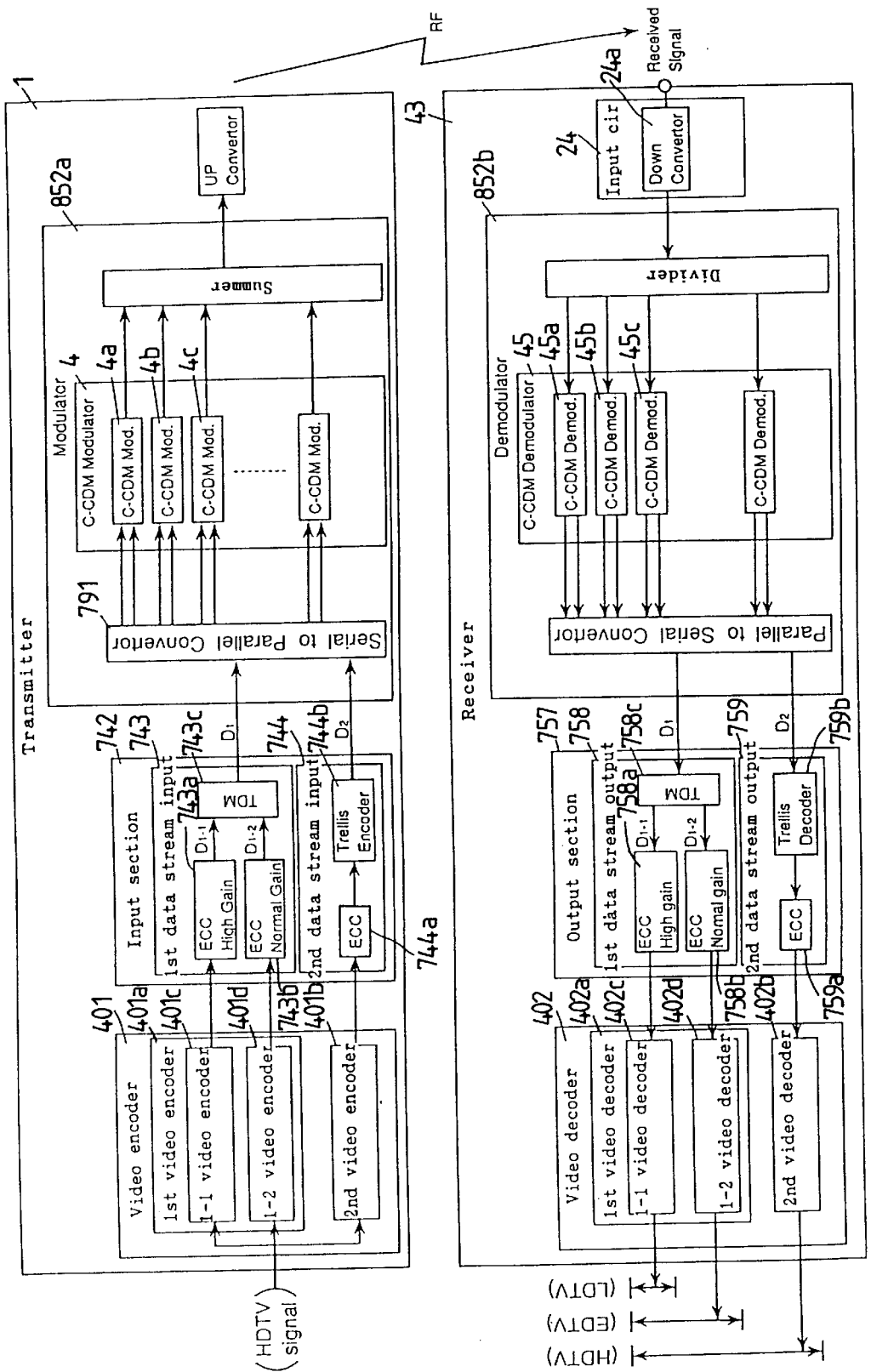
Figure 128:
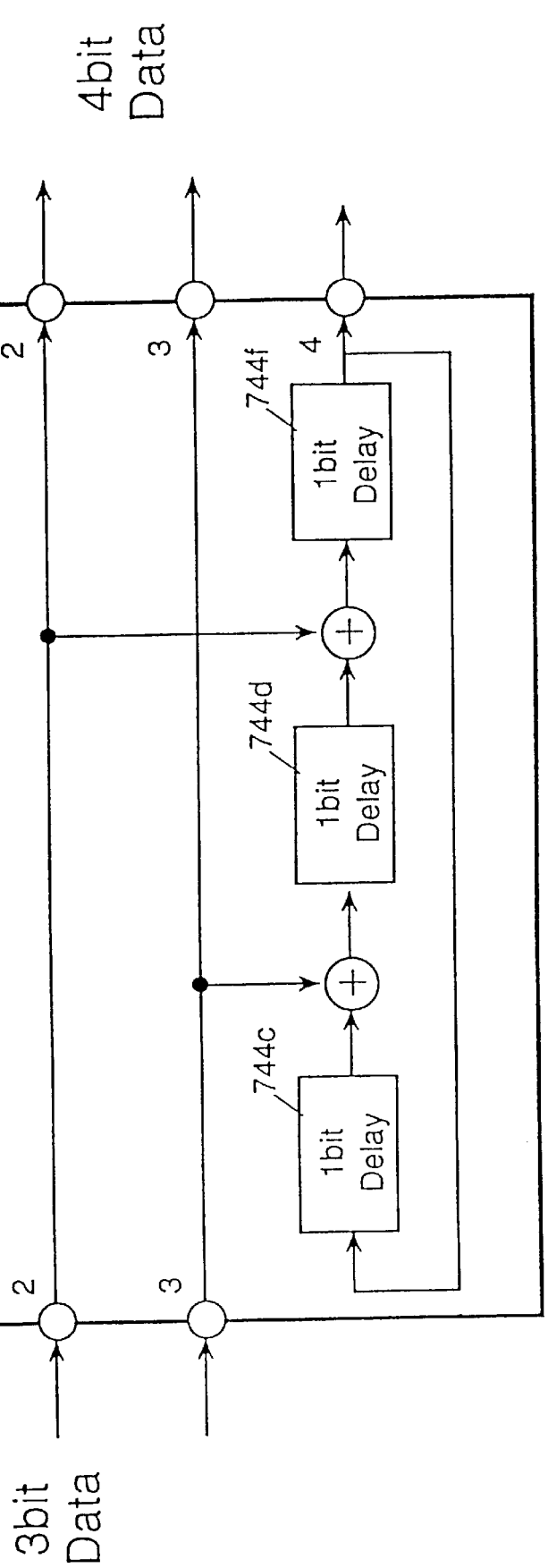
Figure 129:
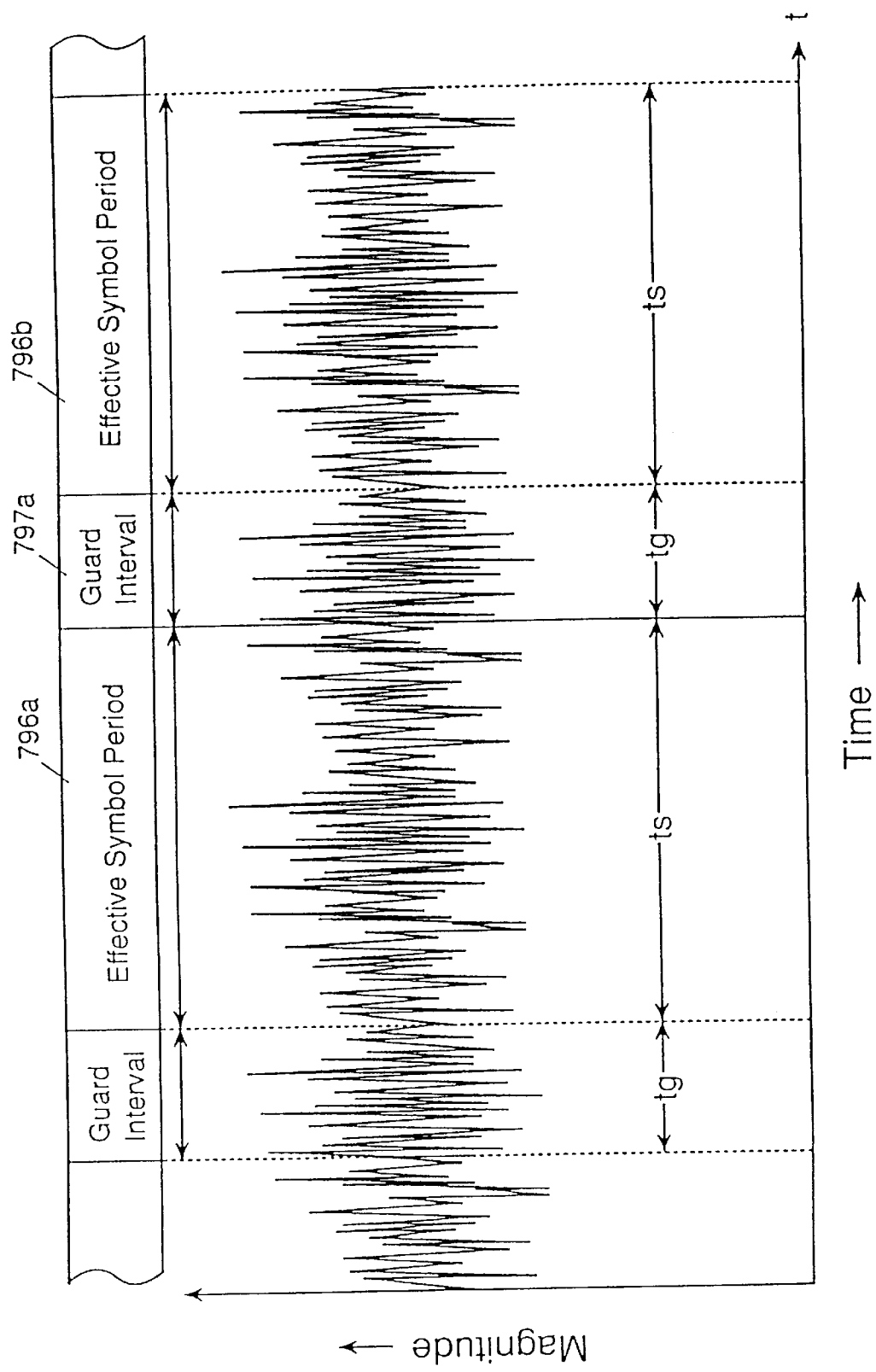
Figure 130:
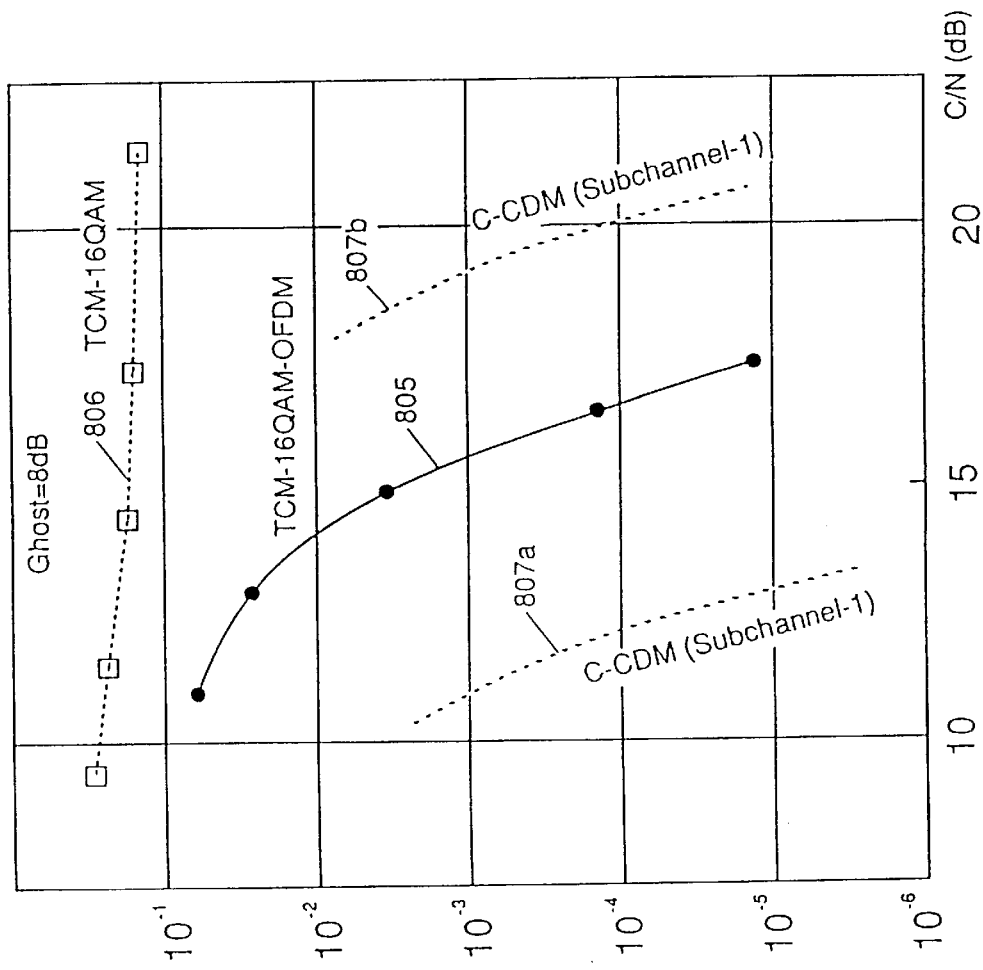
Figure 131:
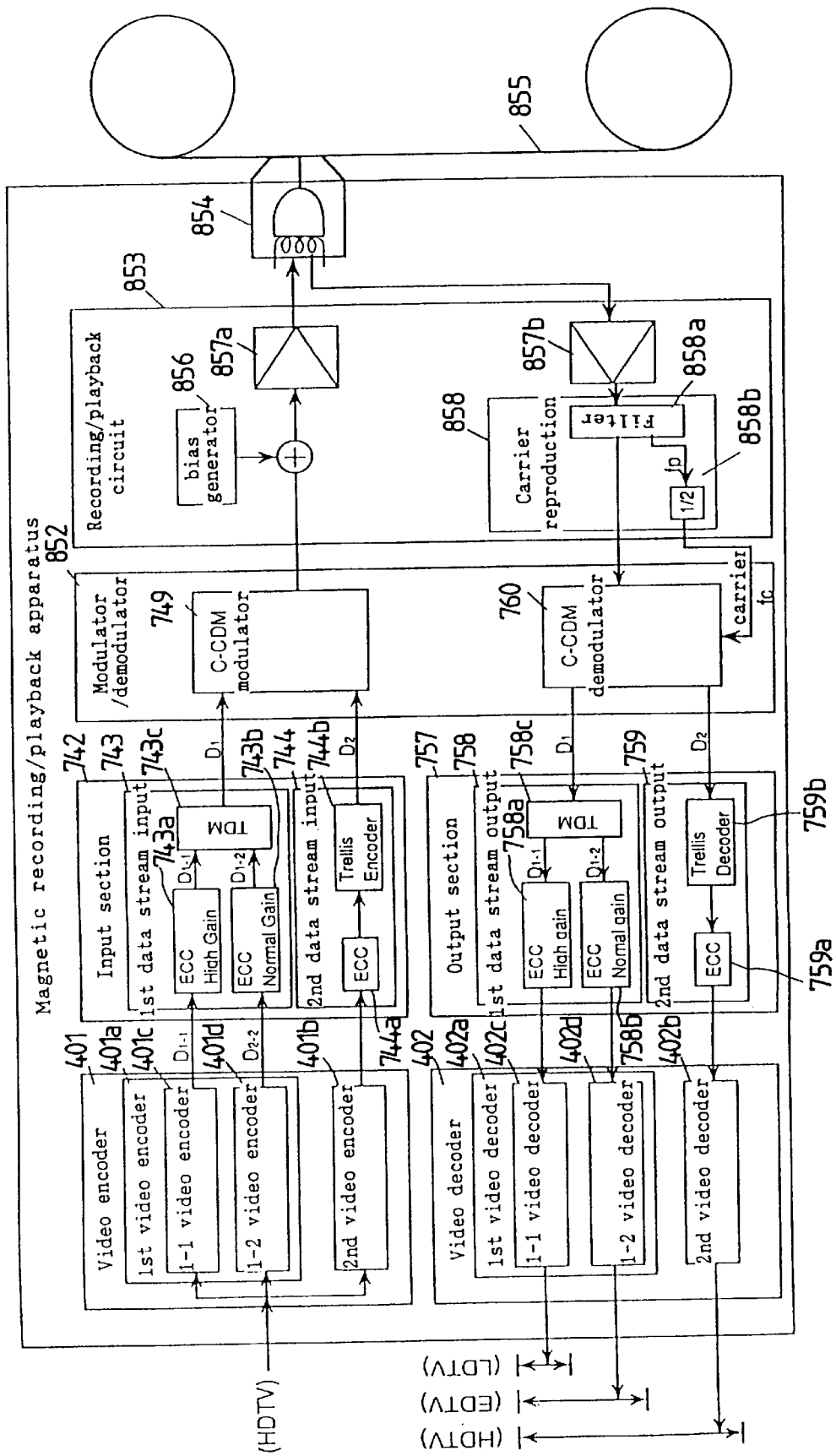
Figure 132:
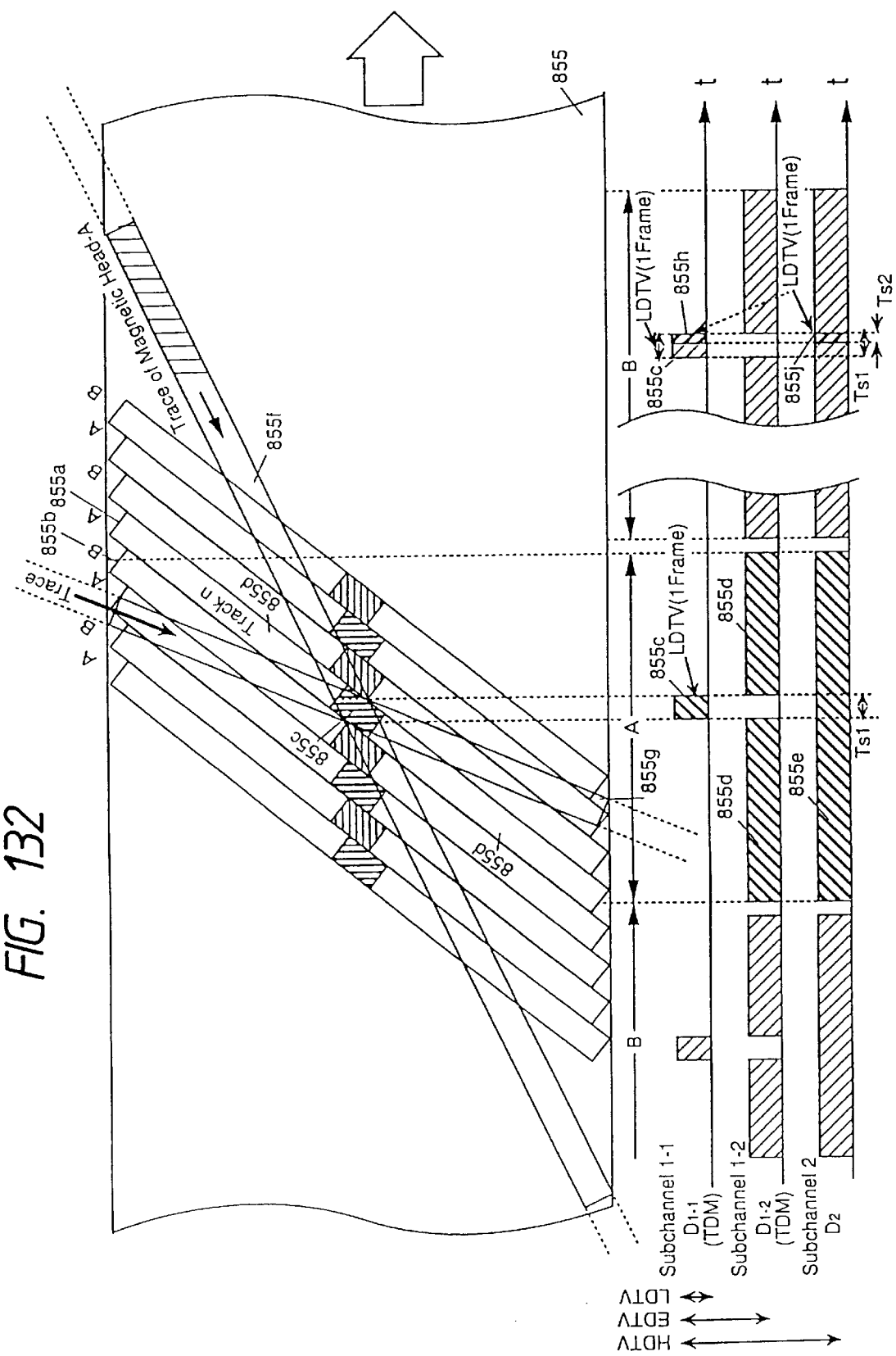
Figure 133:
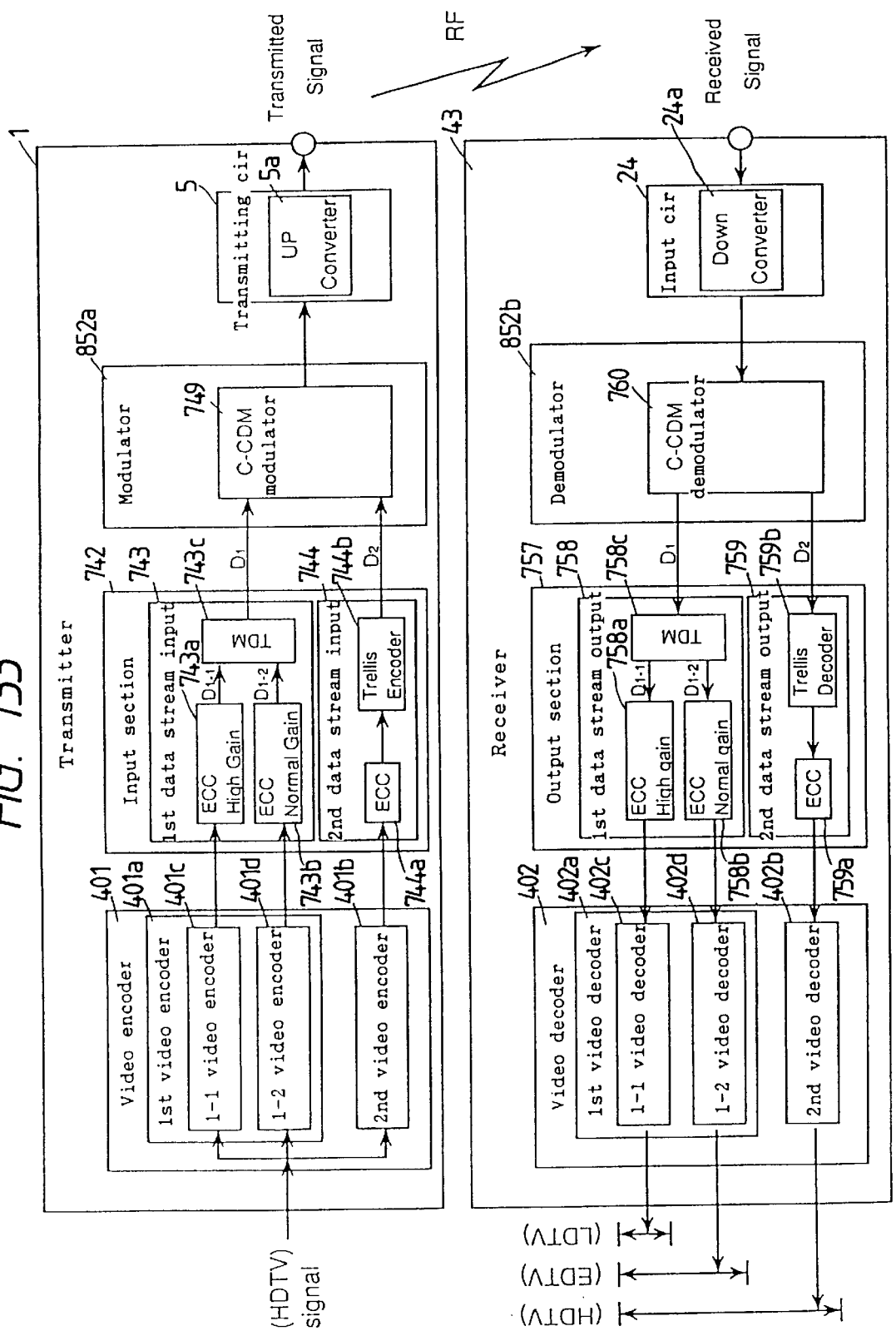
Figure 134:
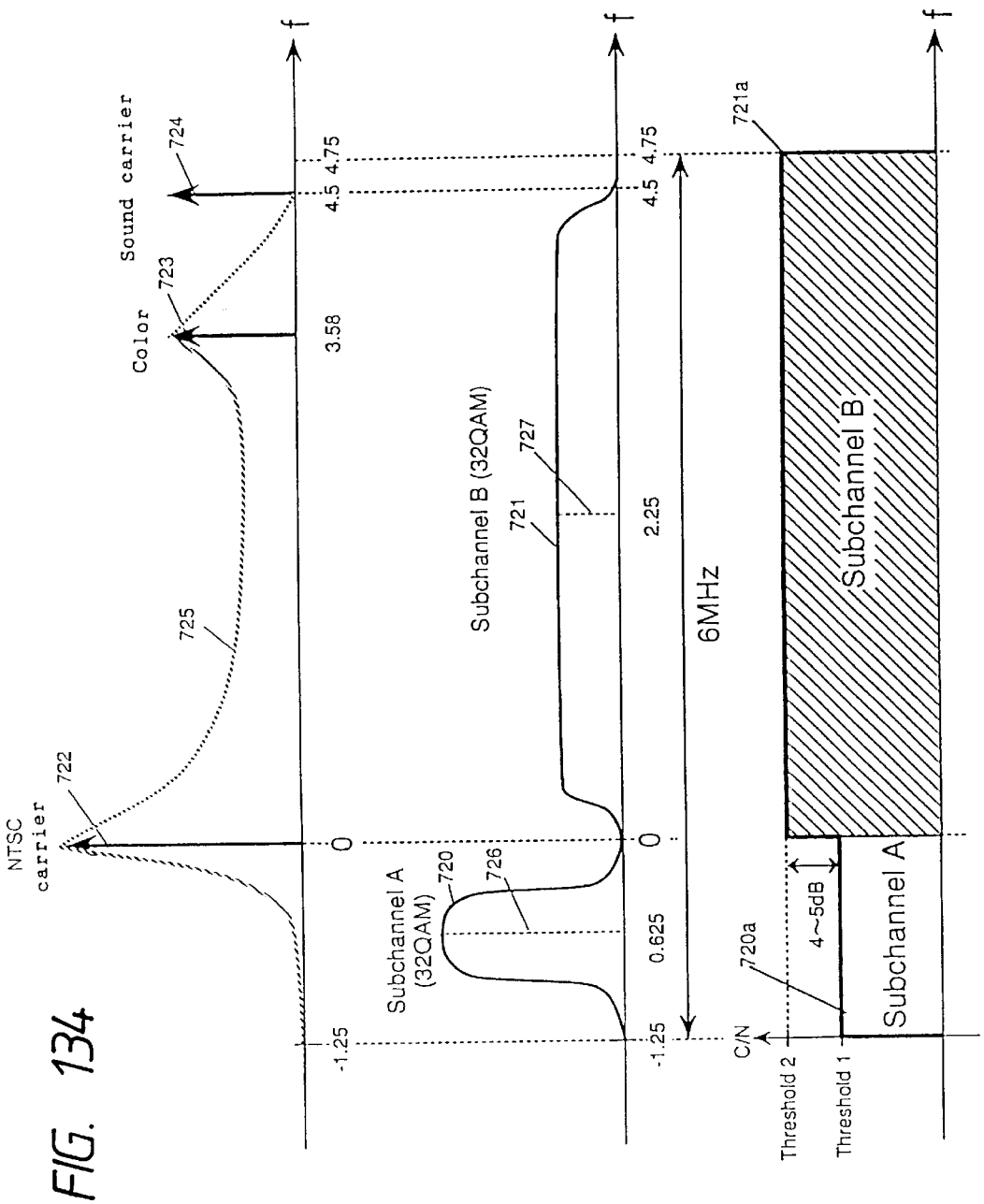
Figure 135:
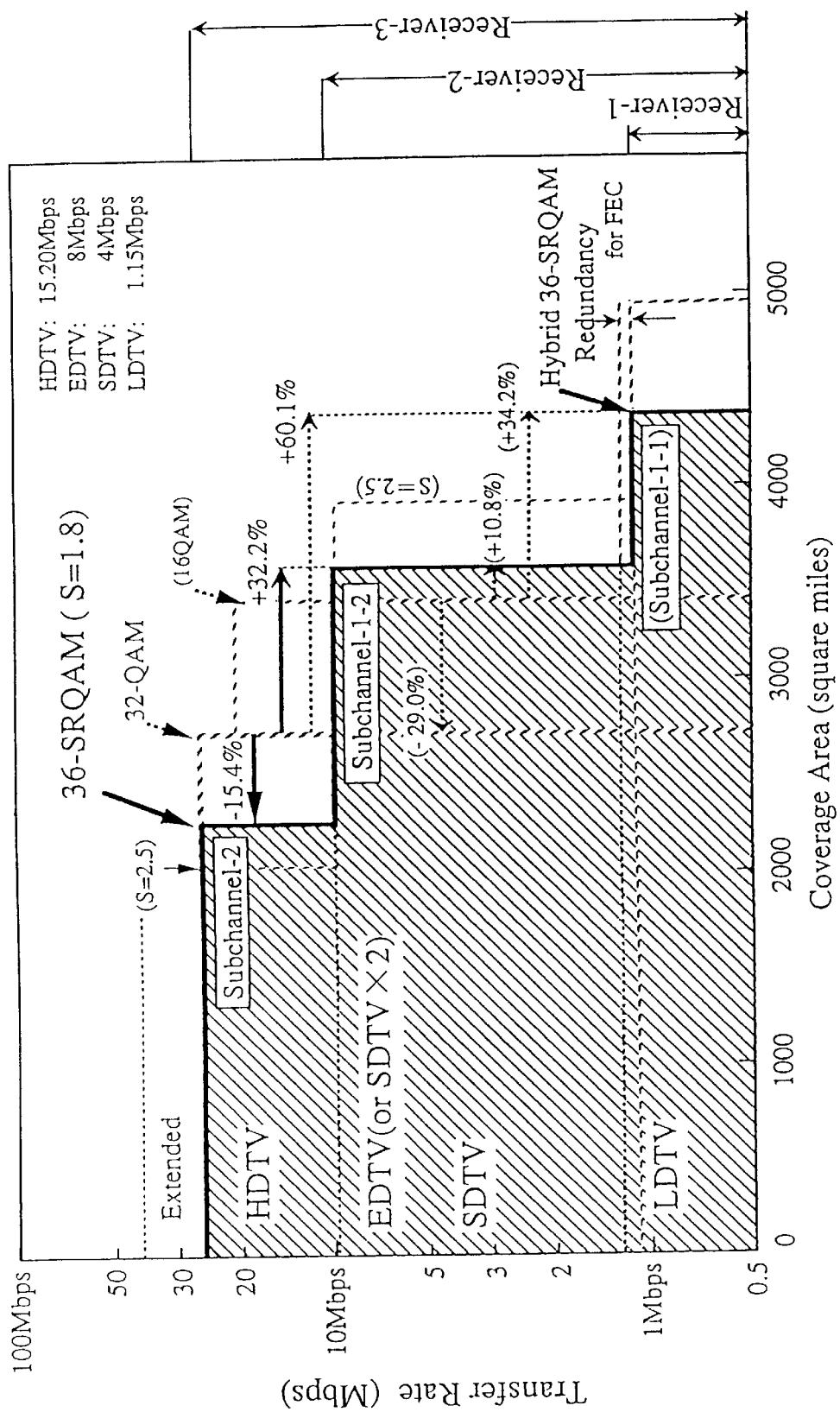
Figure 136:
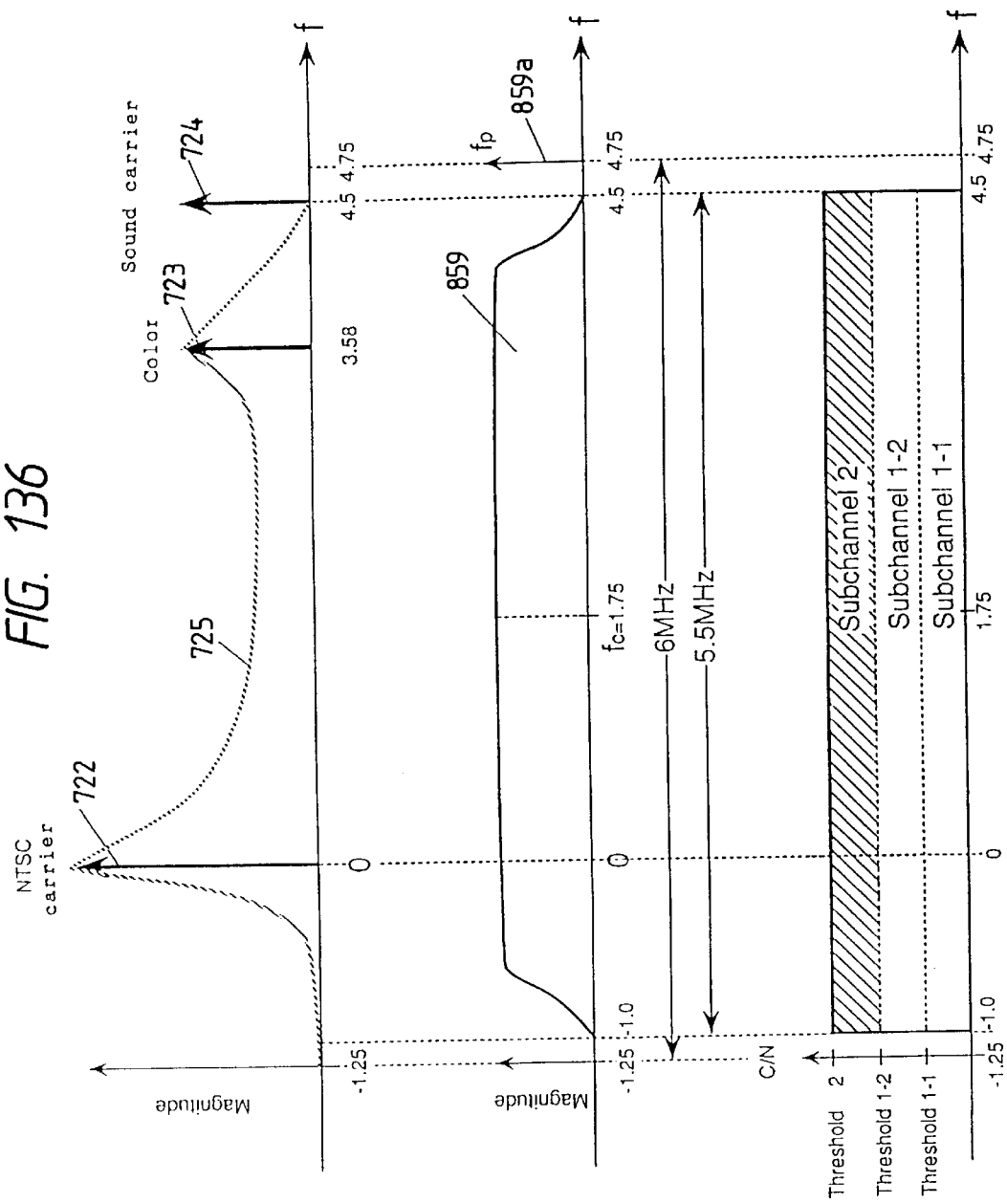
Figure 137:
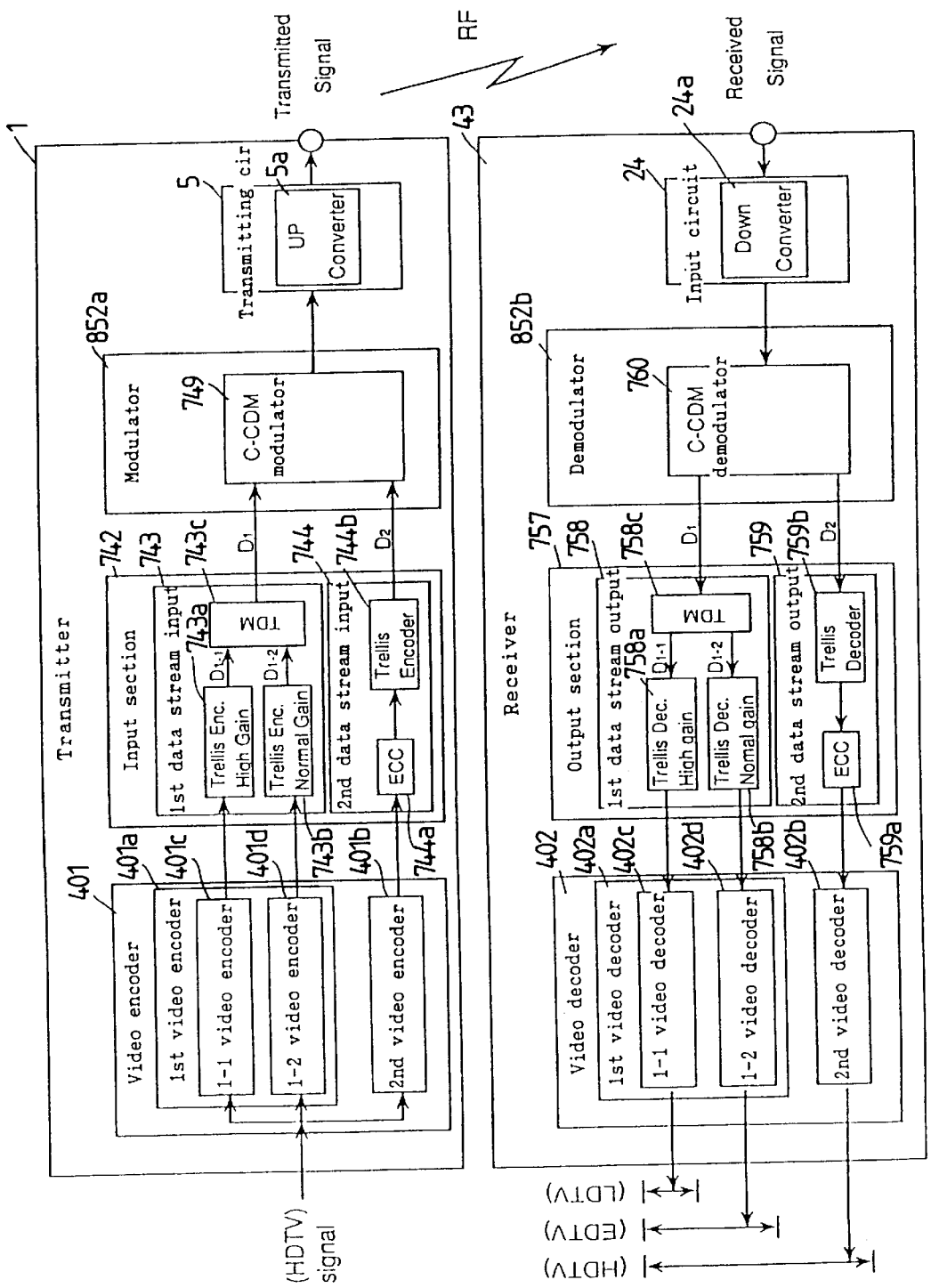
Figure 138:
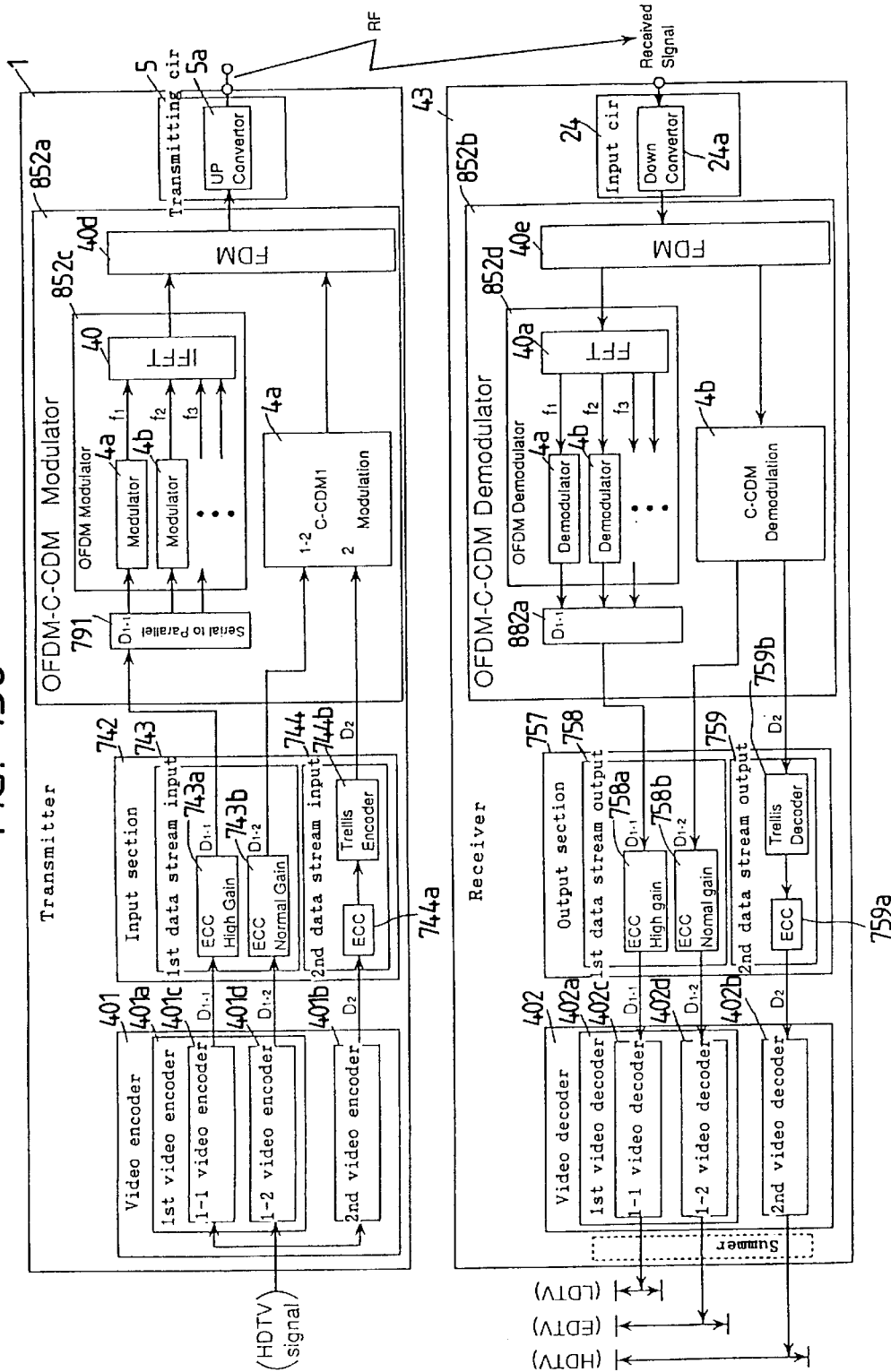

FIG. 126(b) is a view showing a frequency assignment of a receiving signal according to the ninth embodiment;

FIG. 127 is a block diagram showing a transmitter/receiver according to the ninth embodiment;

FIG. 128 is a block diagram showing a Trellis encoder according to the fifth embodiment;

FIG. 129 is a view showing a time assignment of effective symbol periods and guard intervals according to the ninth embodiment;

FIG. 130 is a graphic diagram showing a relation between C/N rate and error rate according to the ninth embodiment;

FIG. 131 is a block diagram showing a magnetic recording/playback apparatus according to the fifth embodiment;

FIG. 132 is a view showing a recording format of track on the magnetic tape and a travelling of a head;

FIG. 133 is a block diagram showing a transmitter/receiver according to the third embodiment;

FIG. 134 is a diagram showing a frequency assignment of a conventional broadcasting;

FIG. 135 is a diagram showing a relation between service area and picture quality in a three-level signal transmission system according to the third embodiment;

FIG. 136 is a diagram showing a frequency assignment in case the multi-level signal transmission system according to the third embodiment is combined with an FDM;

FIG. 137 is a block diagram showing a transmitter/receiver according to the third embodiment, in which Trellis encoding is adopted; and FIG. 138 is a block diagram showing a transmitter/receiver according to the ninth embodiment, in which a part of low frequency band signal is transmitted by OFDM.

DETAILED DESCRIPTION OF THE PREFERRED EMBODIMENTS

Embodiment 1

One embodiment of the present invention will be described referring to the relevant drawings.

Figure 1:
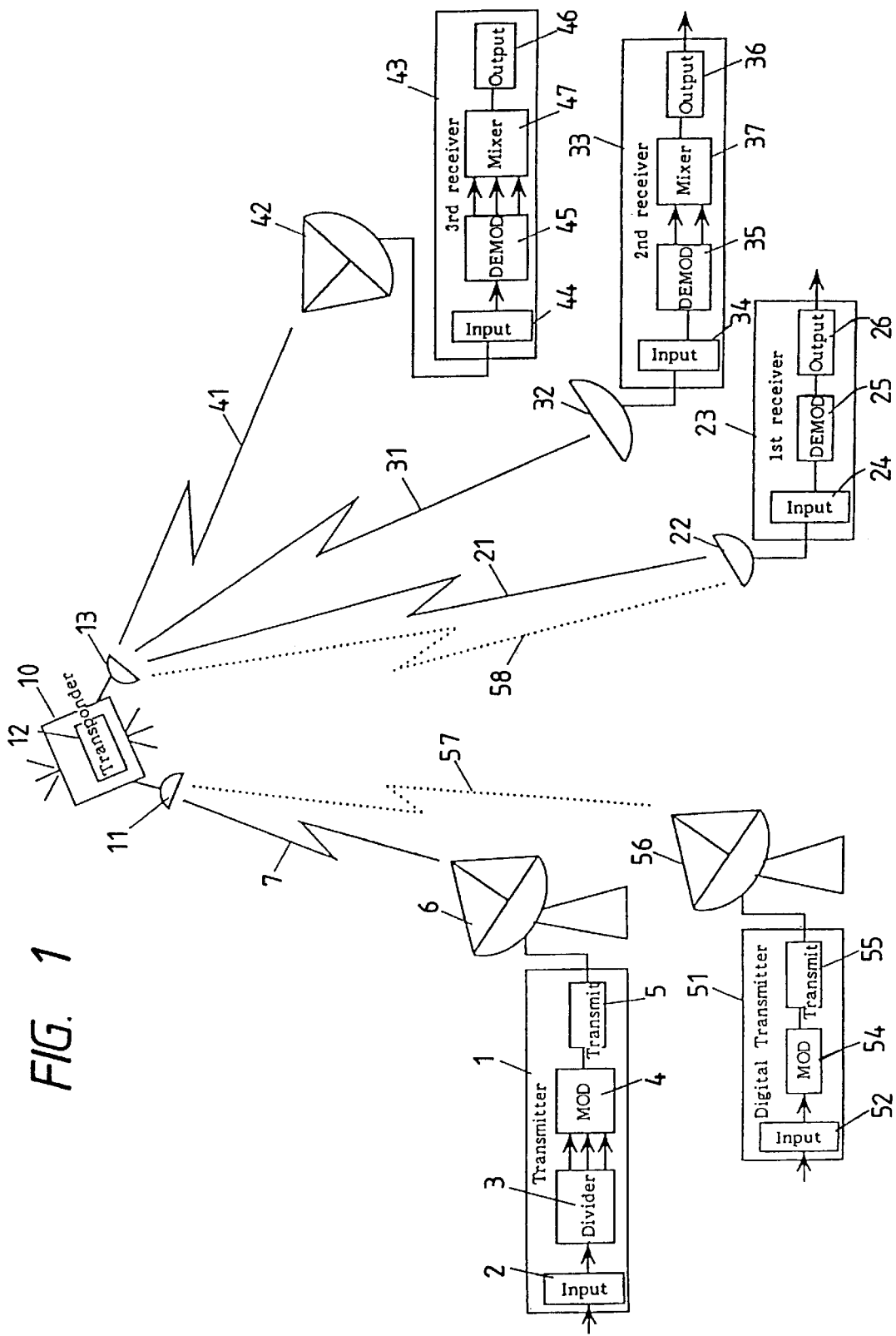
FIG. 1 is a schematic view of the entire arrangement of a signal transmission system showing a first embodiment of the present invention.

FIG. 1 shows the entire arrangement of a signal transmission system according to the present invention. A transmitter 1 comprises an input unit 2, a divider circuit 3, a modulator 4, and a transmitter unit 5. In action, each input multiplex signal is divided by the divider circuit 3 into three groups, a first data stream D1, a second data stream D2, a third data stream D3, which are then modulated by the modulator 4 before transmitted from the transmitter unit 5. The modulated signal is sent up from an antenna 6 through an uplink 7 to a satellite 10 where it is intercepted by an uplink antenna 11 and amplified by a transponder 12 before being transmitted from a downlink antenna 13 towards the ground.

The transmission signal is then sent down through three downlinks 21, 32, and 41 to a first 23, a second 33, and a third receiver 43 respectively. In the first receiver 23, the signal intercepted by an antenna 22 is fed through an input unit 24 to a demodulator 25 where its first data stream only is demodulated, while the second and third data streams are not recovered, before transmitted further from an output unit 26.

Similarly, the second receiver 33 allows the first and second data streams of the signal intercepted by an antenna 32 and fed from an input unit 34 to be demodulated by a demodulator 35 and then, summed by a summer 37 to a single data stream which is then transmitted further from an output unit 36.

The third receiver 43 allows all the first, second, and third data streams of the signal intercepted by an antenna 42 and fed from an input unit 44 to be demodulated by a demodulator 45 and then, summed by a summer 47 to a single data stream which is then transmitted further from an output unit 46.

As understood, the three discrete receivers 23, 33, and 43 have their respective demodulators of different characteristics such that their outputs demodulated from the same frequency band signal of the transmitter 1 contain data of different sizes. More particularly, three different but compatible data can simultaneously be carried on a given frequency band signal to their respective receivers. For example, each of three, existing NTSC, HDTV, and super HDTV, digital signals is divided into a low, a high, and a super high frequency band components which represent the first, the second, and the third data stream respectively.

Accordingly, the three different TV signals can be transmitted on a one-channel frequency band carrier for simultaneous reproduction of a medium, a high, and a super high resolution TV image respectively.

In service, the NTSC TV signal is intercepted by a receiver accompanied with a small antenna for demodulation of a small-sized data, the HDTV signal is intercepted by a receiver accompanied with a medium antenna for demodulation of medium-sized data, and the super HDTV signal is intercepted by a receiver accompanied with a large antenna for demodulation of large-sized data. Also, as illustrated in FIG. 1, a digital NTSC TV signal containing only the first data stream for digital NTSC TV broadcasting service is fed to a digital transmitter 51 where it is received by an input unit 52 and modulated by a demodulator 54 before transmitted further from a transmitter unit 55. The demodulated signal is then sent up from an antenna 56 through an uplink 57 to the satellite 10 which in turn transmits the same through a downlink 58 to the first receiver 23 on the ground.

The first receiver 23 demodulates with its demodulator 25 the modulated digital signal supplied from the digital transmitter 51 to the original first data stream signal. Similarly, the same modulated digital signal can be intercepted and demodulated by the second 33 or third receiver 42 to the first data stream or NTSC TV signal. In summary, the three discrete receivers 23, 33, and 43 all can intercept and process a digital signal of the existing TV system for reproduction.

The arrangement of the signal transmission system will be described in more detail.

Figure 2:
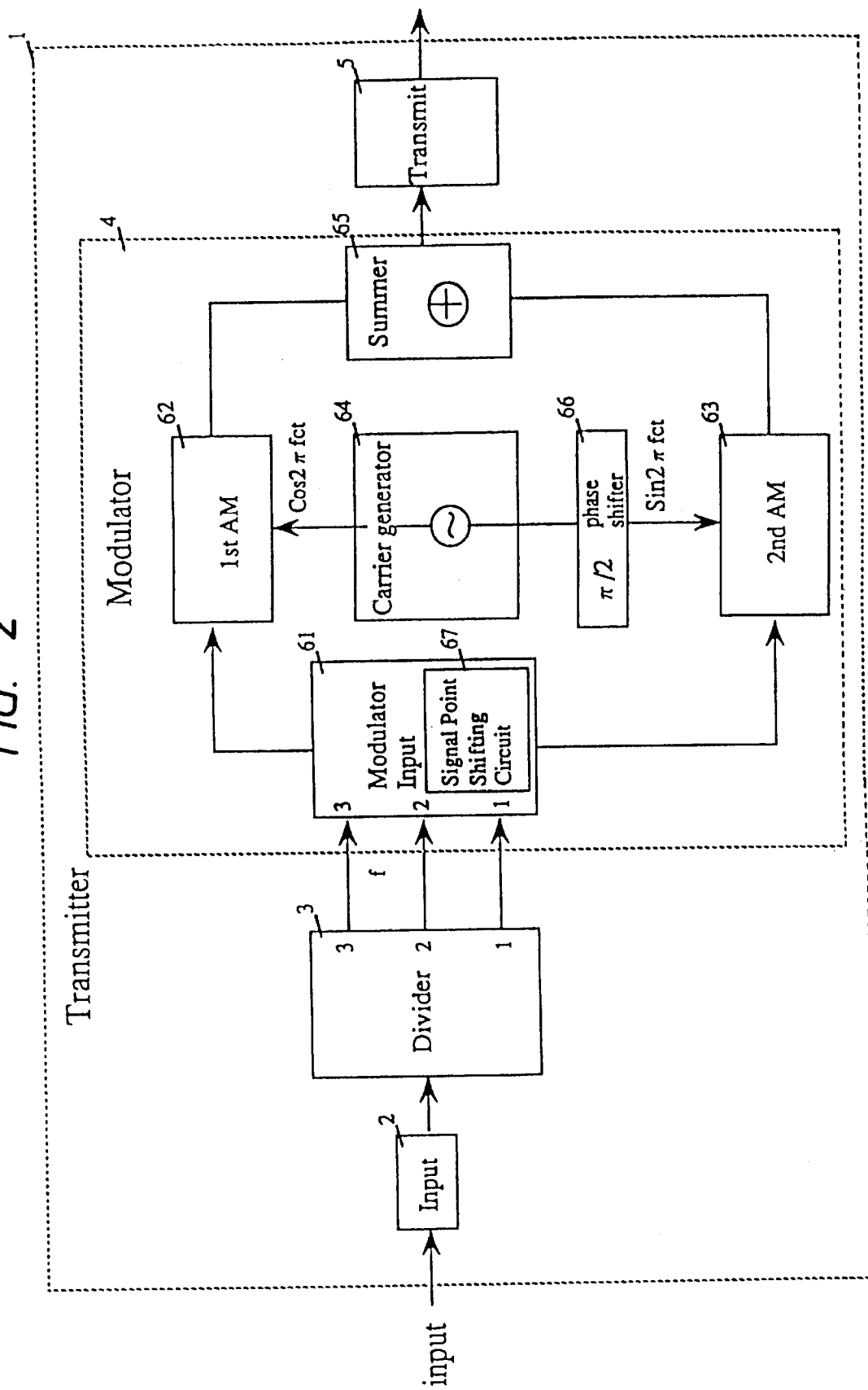
FIG. 2 is a block diagram of a transmitter of the first embodiment.

FIG. 2 is a block diagram of the transmitter 1, in which an input signal is fed across the input unit 2 and divided by the divider circuit 3 into three digital signals containing a first, a second, and a third data stream respectively.

Assuming that the input signal is a video signal, its low frequency band component is assigned to the first data stream, its high frequency band component to the second data stream, its super-high frequency band component to the third data stream. The three different frequency band signals are fed to a modulator input 61 of the modulator 4. Here, a signal point modulating/changing circuit 67 modulates or changes the positions of the signal points according to an externally given signal. The modulator 4 is arranged for amplitude modulation on two 90°-out-of-phase carriers respectively which are then summed to a multiple QAM signal. More specifically, the signal from the modulator input 61 is fed to both a first 62 and a second AM modulator 63. Also, a carrier wave of $\cos(2\pi fct)$ produced by a carrier generator 64 is directly fed to the first AM modulator 62 and also, to a $\pi/2$ phase shifter 66 where it is 90° shifted in phase to a $\sin(2\pi fct)$ form prior to transmitted to the second AM modulator 63. The two amplitude modulated signals from the first and second AM modulators 62, 63 are summed by a summer 65 to a transmission signal which is then transferred to the transmitter unit 5 for output. The procedure is well known and will no further be explained.

The QAM signal will now be described in a common 8×8 or 16 state constellation referring to the first quadrant of a space diagram in FIG. 3. The output signal of the modulator 4 is expressed by a sum vector of two, $A\cos 2\pi fct$ and $B\cos 2\pi fct$, vectors 81, 82 which represent the two 90°-out-of-phase carriers respectively. When the distal point of a sum vector from the zero point represents a signal point, the 16 QAM signal has 16 signal points determined by a combination of four horizontal amplitude values $a_1, a_2, a_3, a_4$ and four vertical amplitude values $b_1, b_2, b_3, b_4$. The first quadrant in FIG. 3 contains four signal points 83 at $C_{11}$, 84 at $C_{12}$, 85 at $C_{22}$, and 86 at $C_{21}$.

$C_{11}$ is a sum vector of a vector 0-$a_1$ and a vector 0-$b_1$ and thus, expressed as $C_{11}=a_1\cos2\pi fct-b_1\sin2\pi fct=A\cos(2\pi fct+d\pi/2)$.

Figure 3:
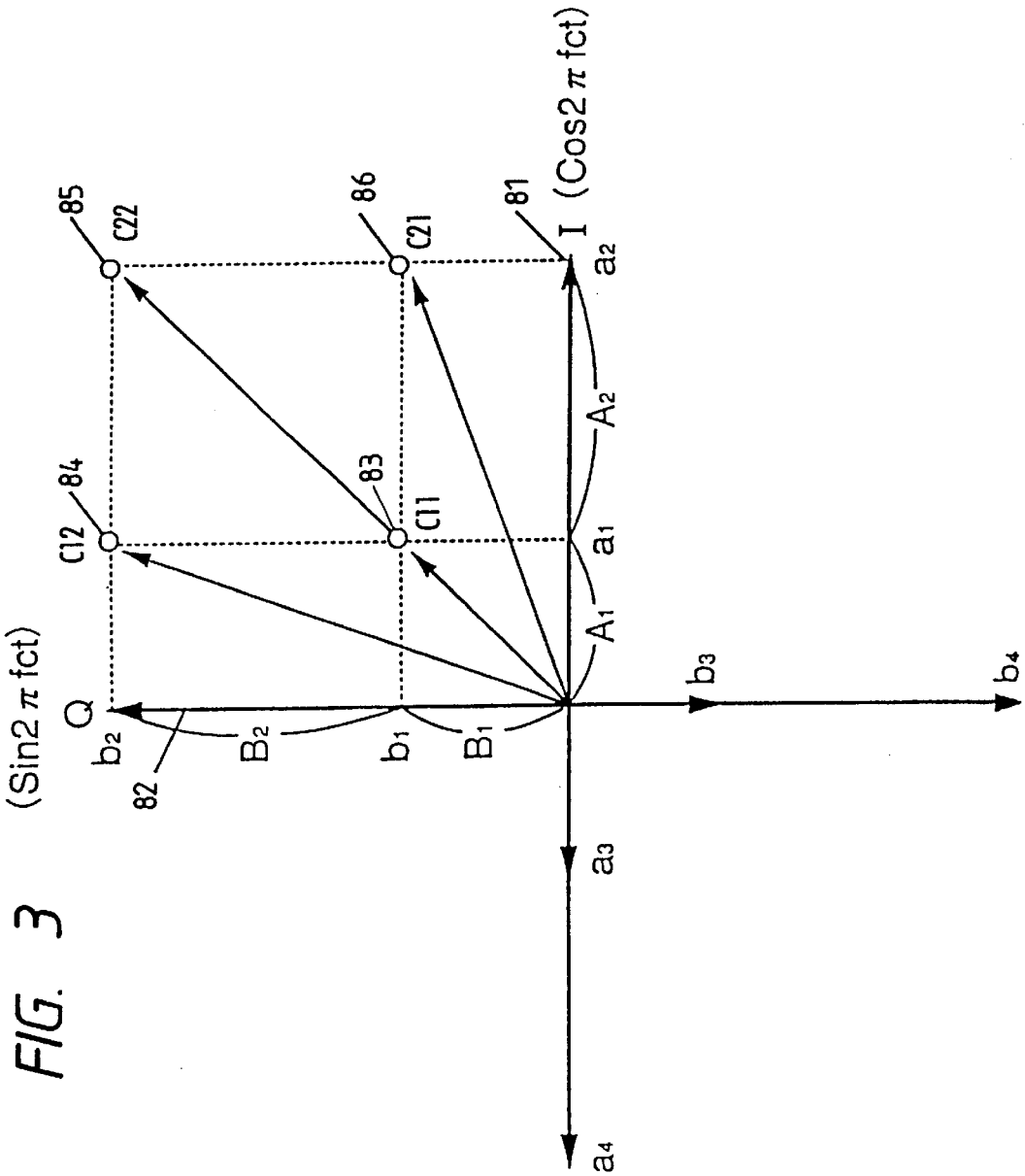
FIG. 3 is a vector diagram showing a transmission signal of the first embodiment.

It is now assumed that the distance between 0 and $a_1$ in the orthogonal coordinates of FIG. 3 is $A_1$, between $a_1$ and $a_2$ is $A_2$, between 0 and $b_1$ is $B_1$, and between $b_1$ and $b_2$ is $B_2$.

Figure 4:
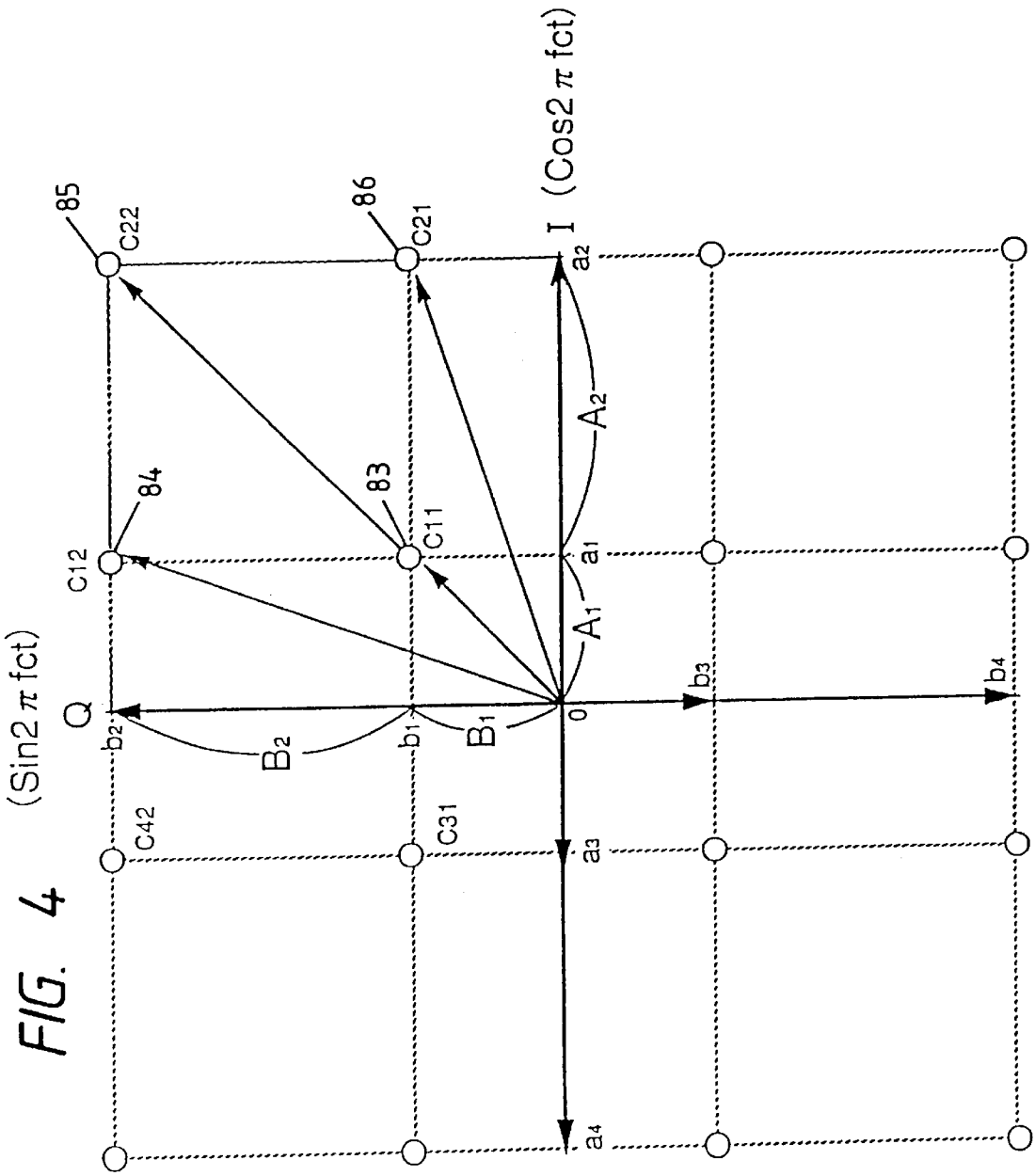
FIG. 4 is a vector diagram showing a transmission signal of the first embodiment.

As shown in FIG. 4, the 16 signal points are allocated in a vector coordinate, in which each point represents a four-bit pattern thus to allow the transmission of four bit data per period or time slot.

Figure 5:
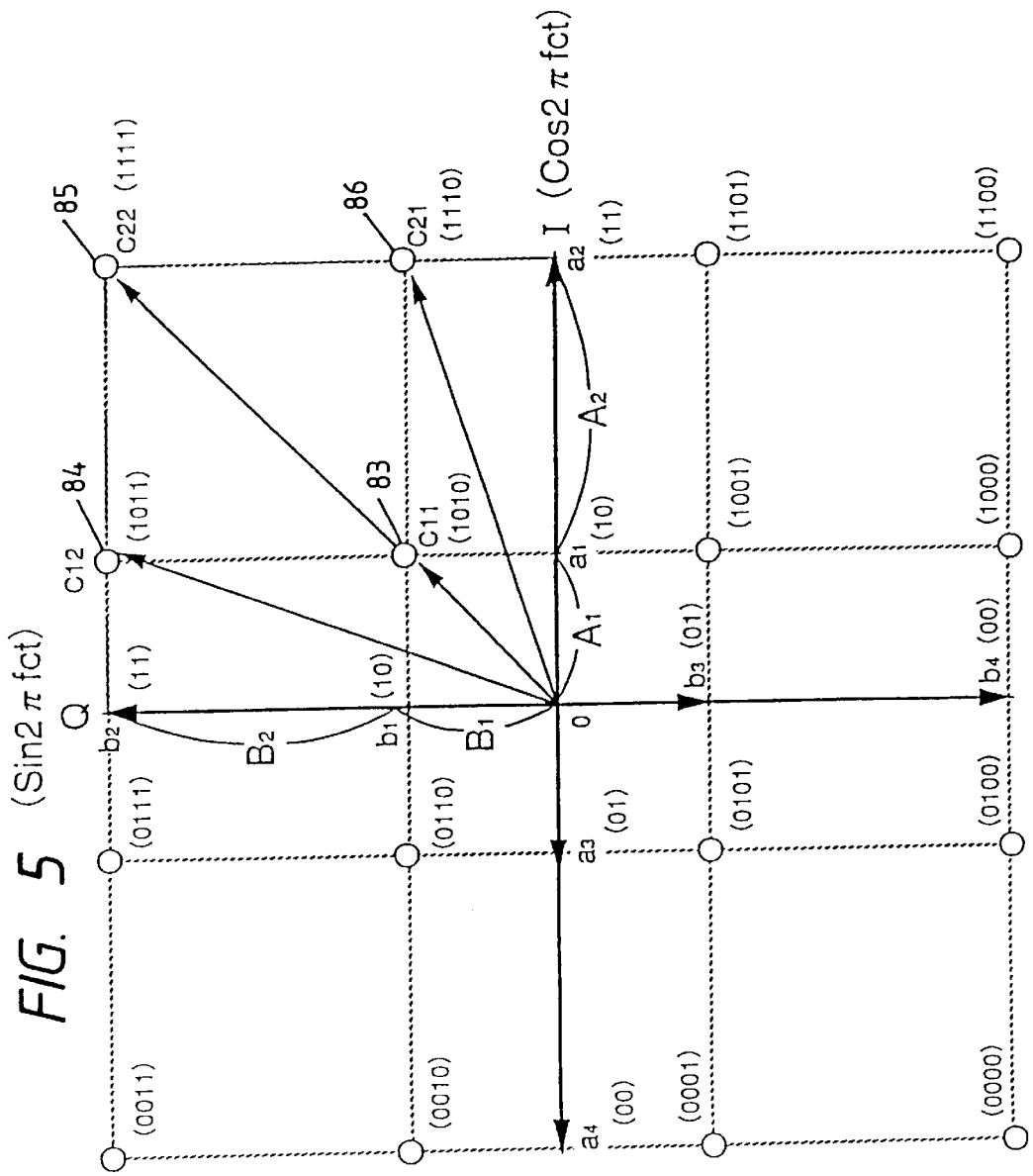
FIG. 5 is a view showing an assignment of binary codes to signal points according to the first embodiment.

FIG. 5 illustrates a common assignment of two-bit patterns to the 16 signal points.

When the distance between two adjacent signal points is great, it will be identified by the receiver with much ease. Hence, it is desired to space the signal points at greater intervals. If two particular signal points are allocated near to each other, they are rarely distinguished and error rate will be increased. Therefore, it is most preferred to have the signal points spaced at equal intervals as shown in FIG. 5, in which the 16 QAM signal is defined by $A_1=A_2/2$.

Figure 6:
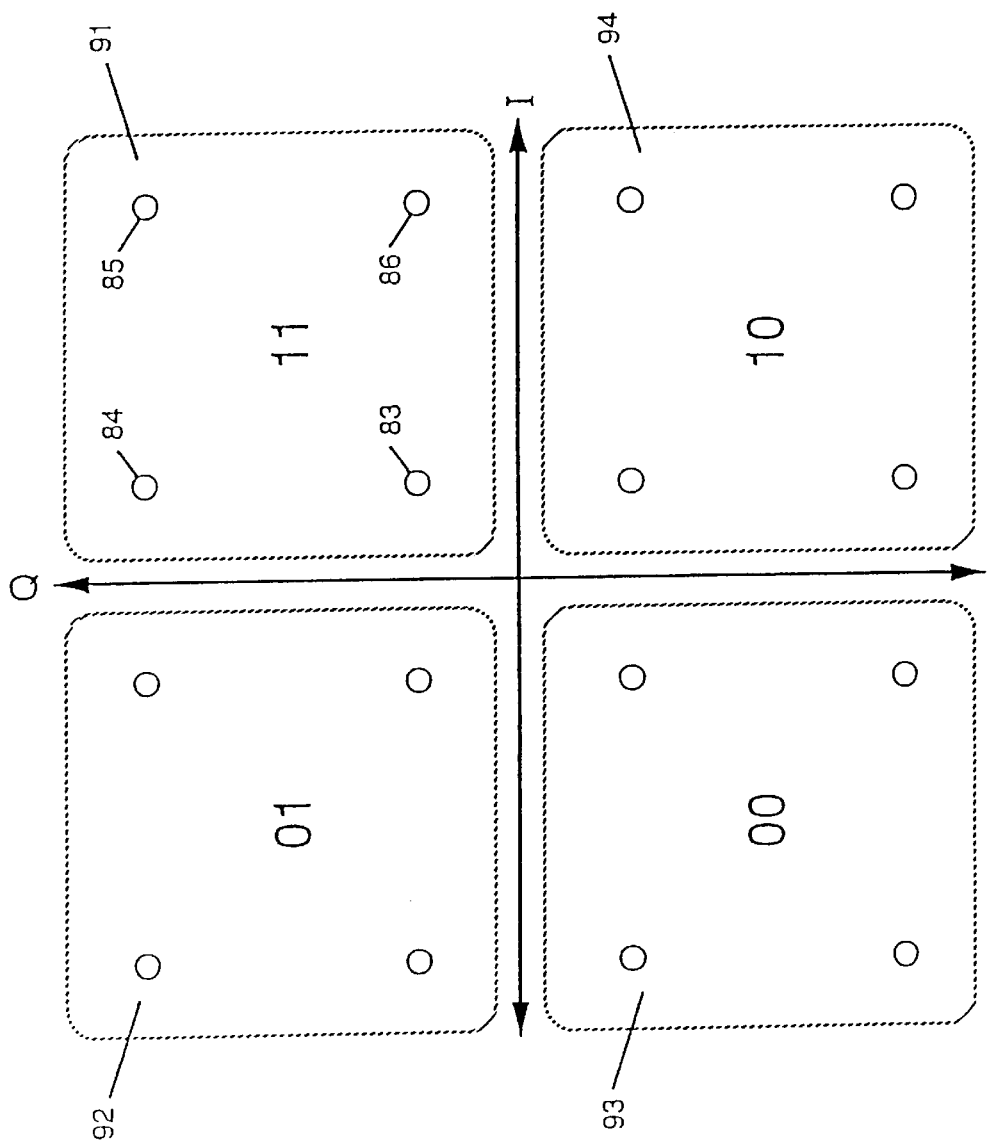
FIG. 6 is a view showing an assignment of binary codes to signal point groups according to the first embodiment.
Figure 7:
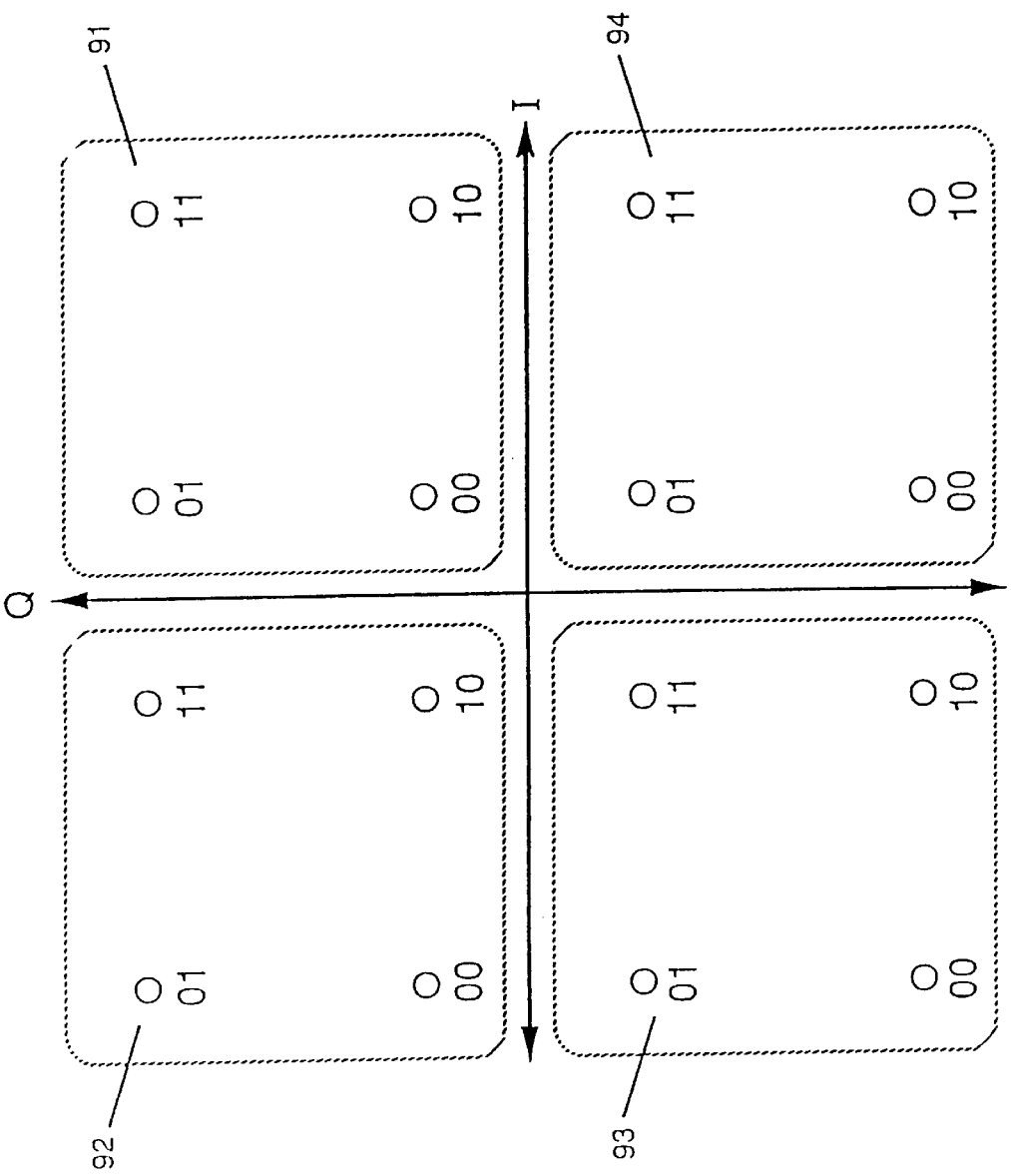
FIG. 7 is a view showing an assignment of binary codes to signal points in each signal point group according to the first embodiment.

The transmitter 1 of the embodiment is arranged to divide an input digital signal into a first, a second, and a third data or bit stream. The 16 signal points or groups of signal points are divided into four groups. Then, 4 two-bit patterns of the first data stream are assigned to the four signal point groups respectively, as shown in FIG. 6. More particularly, when the two-bit pattern of the first data stream is 11, one of four signal points of the first signal point group 91 in the first quadrant is selected depending on the content of the second data stream for transmission. Similarly, when 01, one signal point of the second signal point group 92 in the second quadrant is selected and transmitted. When 00, one signal point of the third signal point group 93 in the third quadrant is transmitted and when 10, one signal point of the fourth signal point group 94 in the fourth quadrant is transmitted. Also, 4 two-bit patterns in the second data stream of the 16 QAM signal, or e.g. 16 four-bit patterns in the second data stream of a 64-state QAM signal, are assigned to four signal points or sub signal point groups of each of the four signal point groups 91, 92, 93, 94 respectively, as shown in FIG. 7. It should be understood that the assignment is symmetrical between any two quadrants. The assignment of the signal points to the four groups 91, 92, 93, 94 is determined by priority to the two-bit data of the first data stream. As the result, two-bit data of the first data stream and two-bit data of the second data stream can be transmitted independently. Also, the first data stream will be demodulated with the use of a common 4 PSK receiver having a given antenna sensitivity. If the antenna sensitivity is higher, a modified type of the 16 QAM receiver of the present invention will intercept and demodulate both the first and second data stream with equal success.

Figure 8:
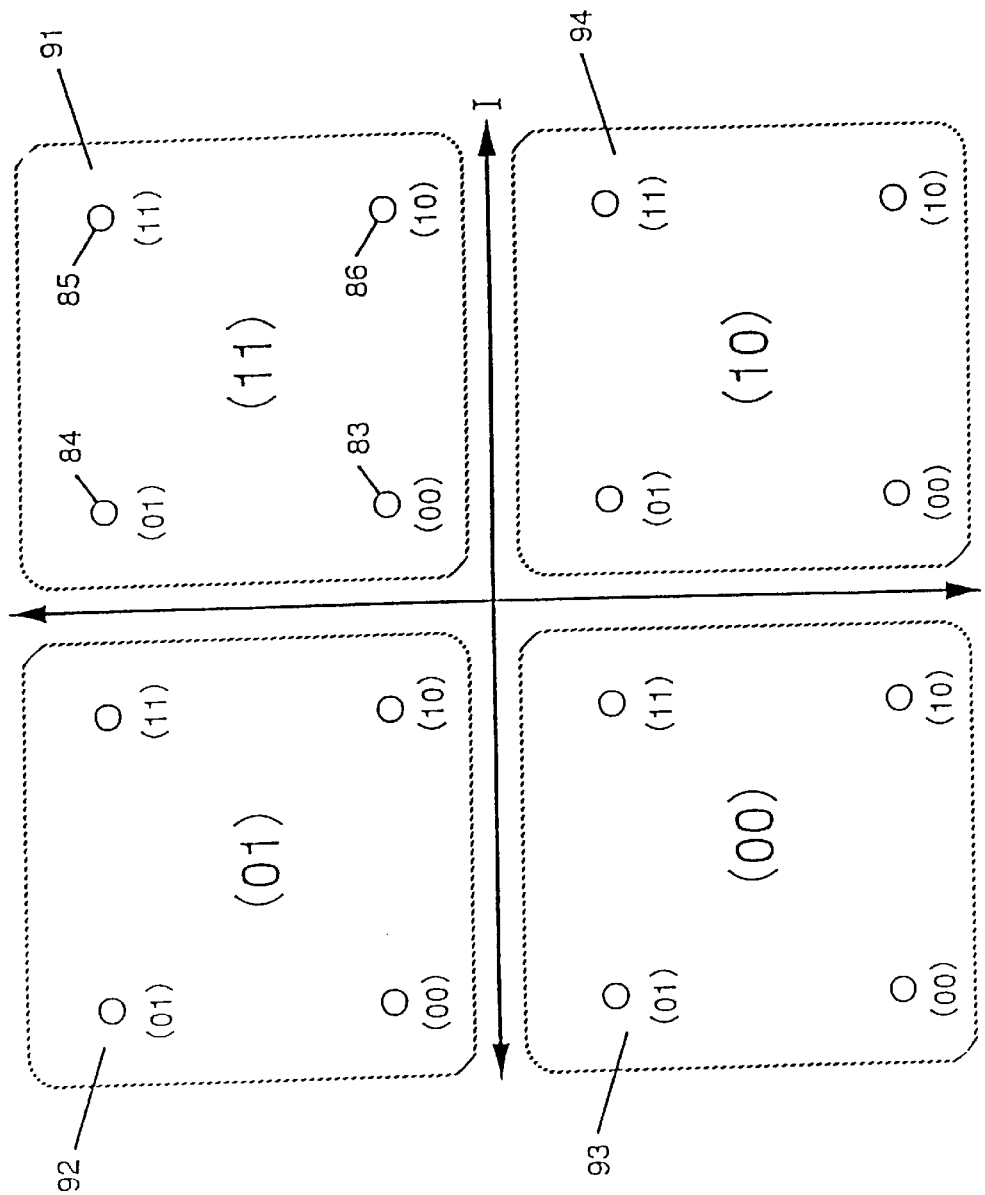
FIG. 8 is a view showing another assignment of binary codes to signal point groups and their signal points according to the first embodiment.

FIG. 8 shows an example of the assignment of the first and second data streams in two-bit patterns.

When the low frequency band component of an HDTV video signal is assigned to the first data stream and the high frequency component to the second data stream, the 4 PSK receiver can produce an NTSC-level picture from the first data stream and the 16- or 64-state QAM receiver can produce an HDTV picture from a composite reproduction signal of the first and second data streams.

Figure 9:
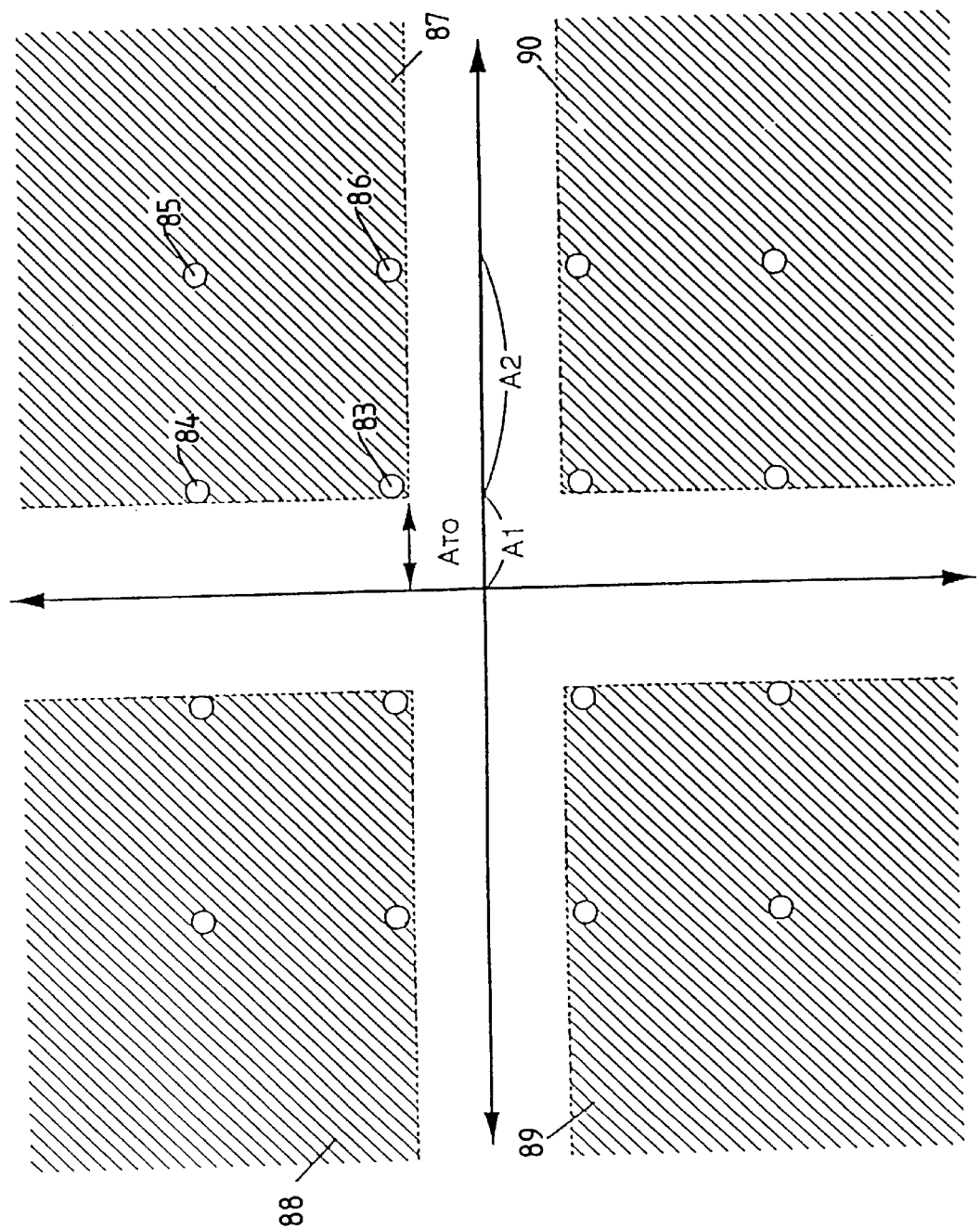
FIG. 9 is a view showing threshold values of the signal point groups according to the first embodiment.

Since the signal points are allocated at equal intervals, there is developed in the 4 PSK receiver a threshold distance between the coordinate axes and the shaded area of the first quadrant, as shown in FIG. 9. If the threshold distance is $A_{T0}$, a PSK signal having an amplitude of $A_{T0}$ will successfully be intercepted. However, the amplitude has to be increased to a three times greater value or $3A_{T0}$ for transmission of a 16 QAM signal while the threshold distance $A_{T0}$ being maintained. More particularly, the energy for transmitting the 16 QAM signal is needed nine times greater than that for sending the 4 PSK signal. Also, when the 4 PSK signal is transmitted in a 16 QAM mode, energy waste will be high and reproduction of a carrier signal will be troublesome. Above all, the energy available for satellite transmitting is not abundant but strictly limited to minimum use. Hence, no large-energy-consuming signal transmitting system will be put into practice until more energy for satellite transmission is available. It is expected that a great number of the 4 PSK receivers are introduced into the market as digital TV broadcasting is soon in service. After introduction to the market, the 4 PSK receivers will hardly be shifted to higher sensitivity models because a signal intercepting characteristic gap between the two, old and new, models is high. Therefore, the transmission of the 4 PSK signals must not be abandoned.

In this respect, a new system is desperately needed for transmitting the signal point data of a quasi 4 PSK signal in the 16 QAM mode with the use of less energy. Otherwise, the limited energy at a satellite station will degrade the entire transmission system.

Figure 10:
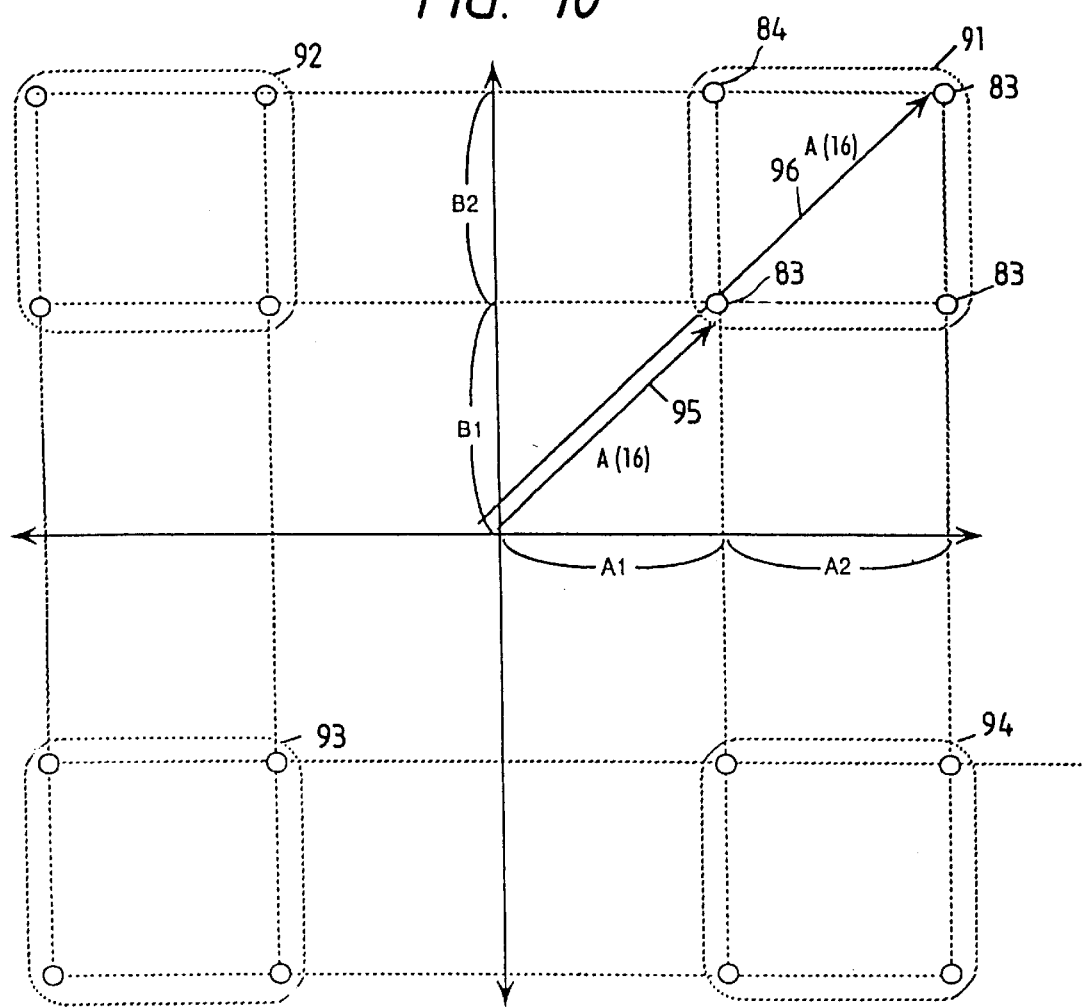
FIG. 10 is a vector diagram of a modified 16 QAM signal of the first embodiment.

The present invention resides in a multiple signal level arrangement in which the four signal point groups 91, 92, 93 94 are allocated at a greater distance from each other, as shown in FIG. 10, for minimizing the energy consumption required for 16 QAM modulation of quasi 4 PSK signals.

Figure 17:
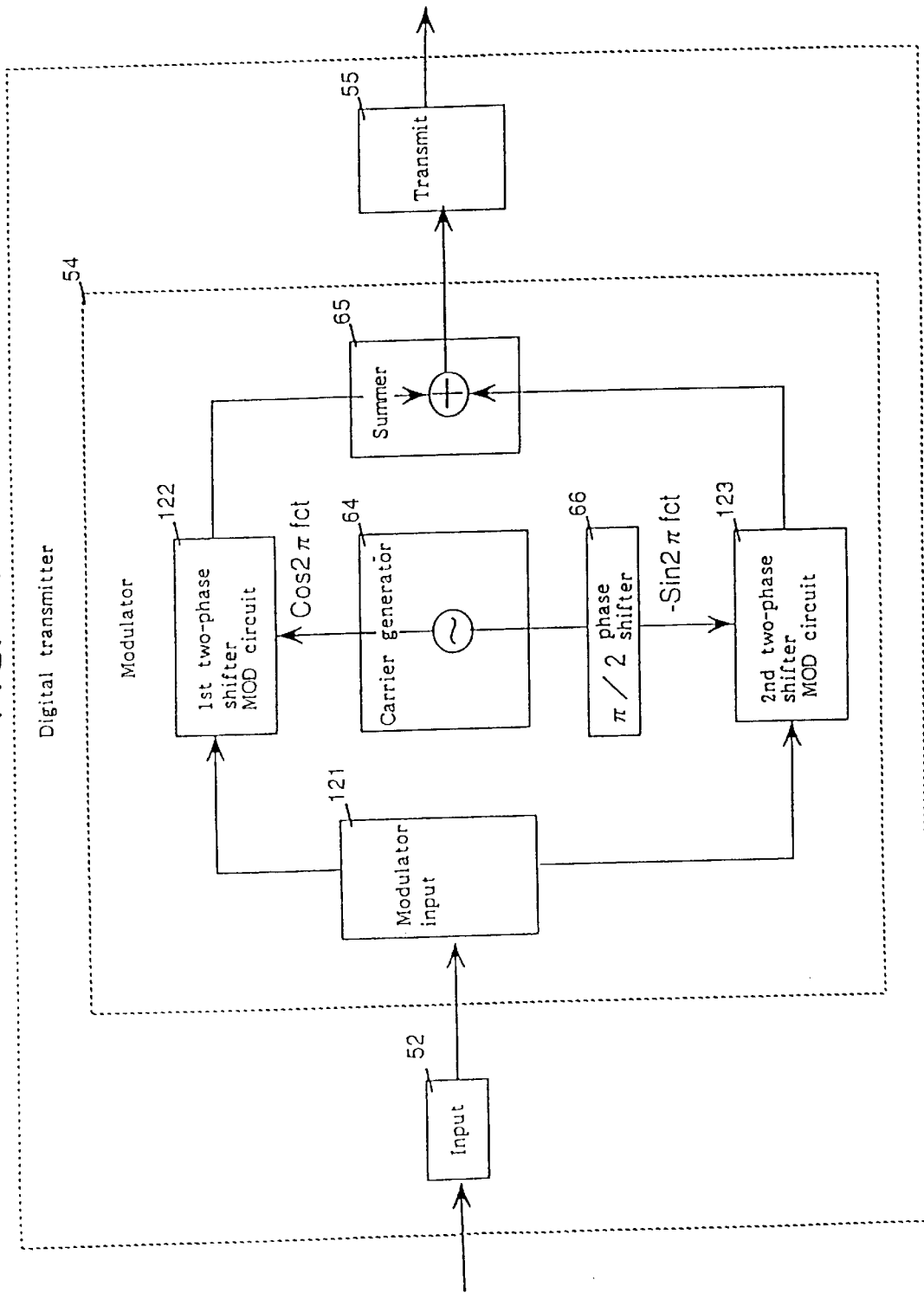
FIG. 17 is a block diagram of a digital transmitter of the first embodiment.

For clarifying the relation between the signal receiving sensitivity and the transmitting energy, the arrangement of the digital transmitter 51 and the first receiver 23 will be described in more detail referring to FIG. 1. Both the digital transmitter 51 and the first receiver 23 are formed of known types for data transmission or video signal transmission e.g. in TV broadcasting service. As shown in FIG. 17, the digital transmitter 51 is a 4 PSK transmitter equivalent to the multiple-bit QAM transmitter 1, shown in FIG. 2, without AM modulation capability. In operation, an input signal is fed through an input unit 52 to a modulator 54 where it is divided by a modulator input 121 to two components. The two components are then transferred to a first two-phase modulator circuit 122 for phase modulation of a base carrier and a second two-phase modulator circuit 123 for phase modulation of a carrier which is 90° out of phase with the base carrier respectively. Two outputs of the first and second two-phase modulator circuits 122, 123 are then summed by a summer 65 to a composite modulated signal which is further transmitted from a transmitter unit 55.

Figure 18:
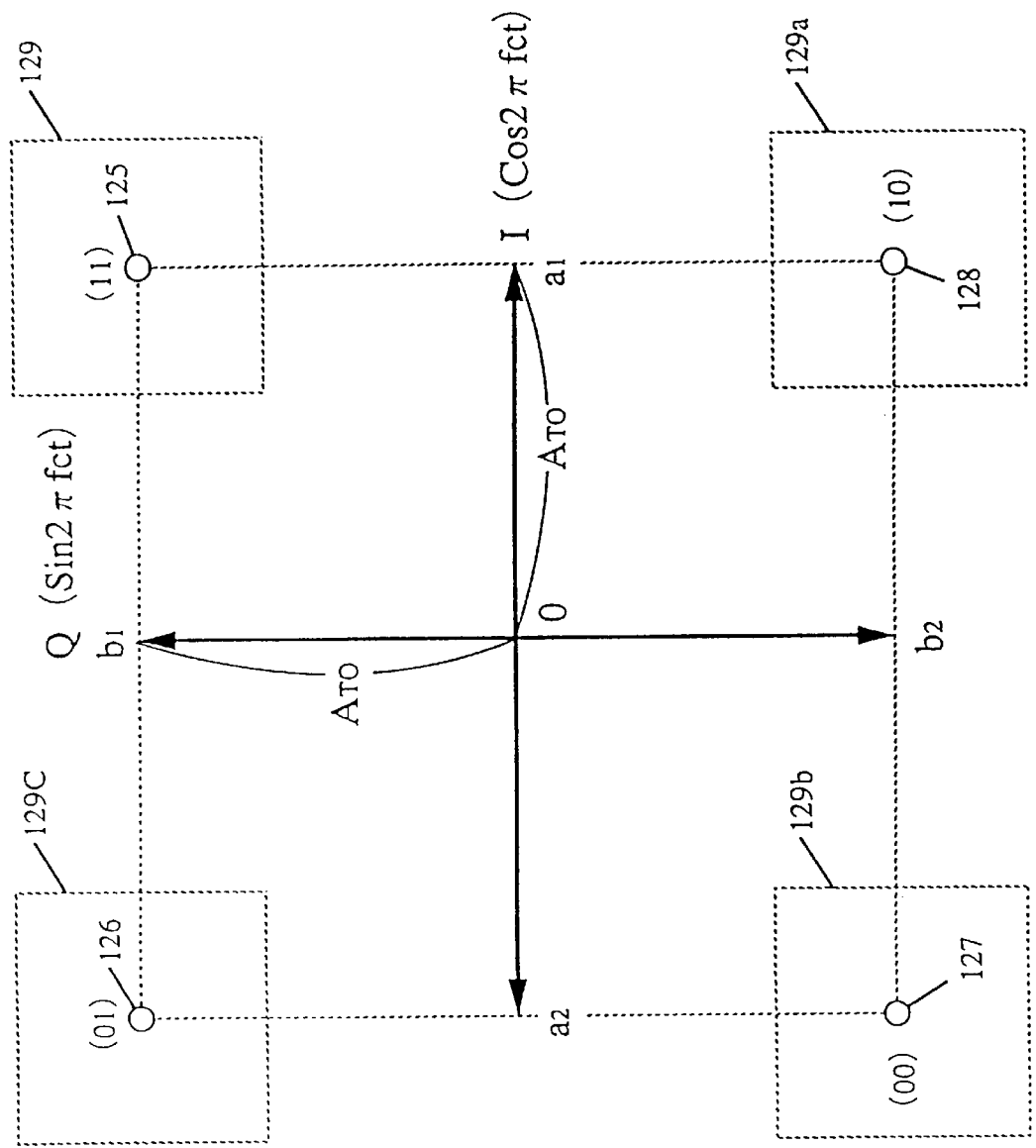
FIG. 18 is a signal space diagram of a 4 PSK modulated signal of the first embodiment.

The resultant modulated signal is shown in the space diagram of FIG. 18.

It is known that the four signal points are allocated at equal distances for achieving optimum energy utilization. FIG. 18 illustrates an example where the four signal points 125, 126, 127, 128 represent 4 two-bit patterns, 11, 01, 00, and 10 respectively. It is also desired for successful data transfer from the digital transmitter 51 to the first receiver 23 that the 4 PSK signal from the digital transmitter 51 has an amplitude of not less than a given level. More specifically, when the minimum amplitude of the 4 PSK signal needed for transmission from the digital transmitter 51 to the first receiver 23 of 4 PSK mode, or the distance between 0 and $a_1$ in FIG. 18 is $A_{T0}$, the first receiver 23 successfully intercept any 4 PSK signal having an amplitude of more than $A_{T0}$.

The first receiver 23 is arranged to receive at its small-diameter antenna 22 a desired or 4 PSK signal which is transmitted from the transmitter 1 or digital transmitter 51 respectively through the transponder 12 of the satellite 10 and demodulate it with the demodulator 24. In more particular, the first receiver 23 is substantially designed for interception of a digital TV or data communications signal of 4 PSK or 2 PSK mode.

Figure 19:
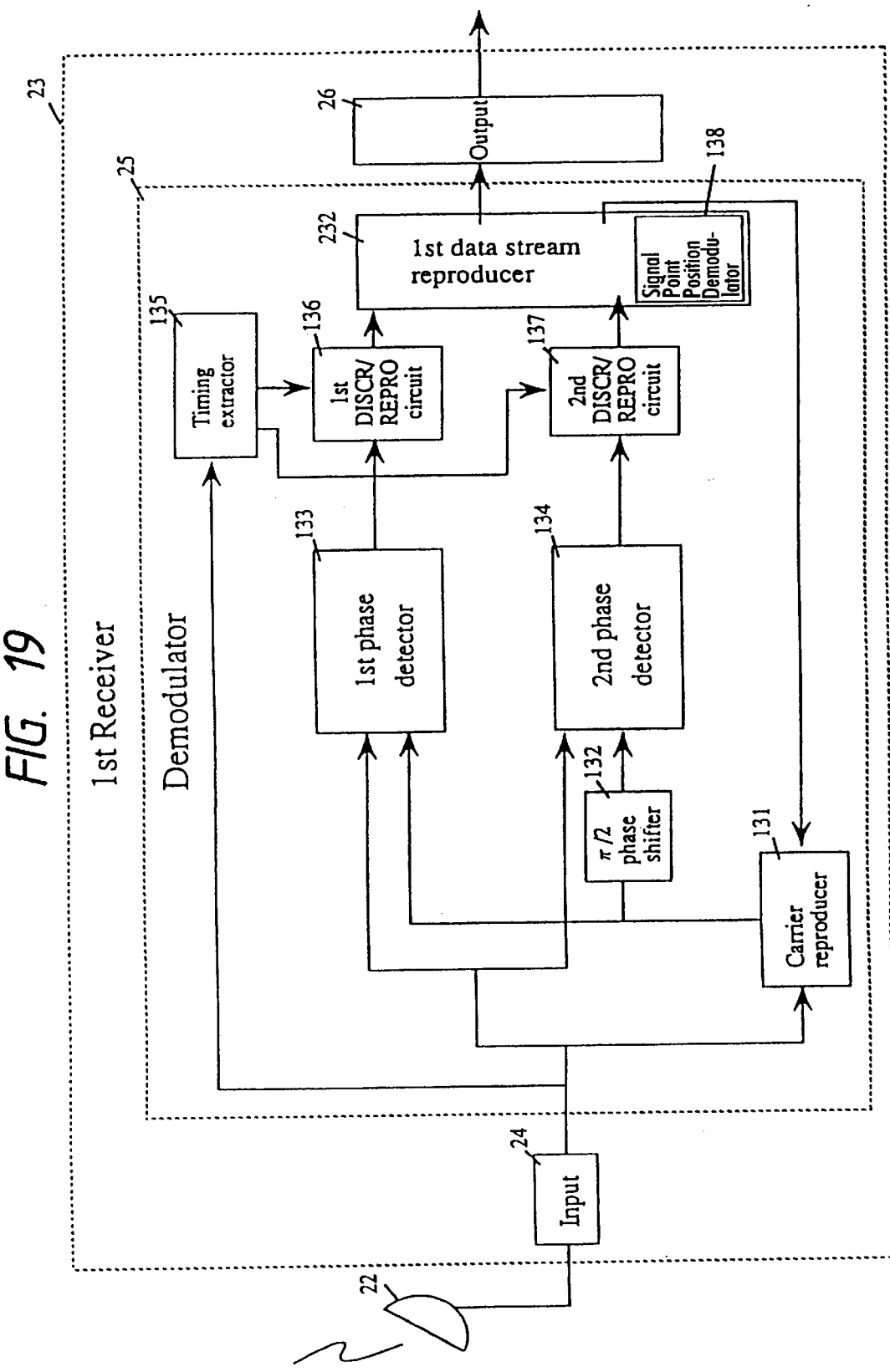
FIG. 19 is a block diagram of a first receiver of the first embodiment.

FIG. 19 is a block diagram of the first receiver 23 in which an input signal received by the antenna 22 from the satellite 12 is fed through the input unit 24 to a carrier reproducing circuit 131 where a carrier wave is demodulated and to a $\pi/2$ phase shifter 132 where a 90° phase carrier wave is demodulated. Also, two 90°-out-of-phase components of the input signal are detected by a first 133 and a second phase detector circuit 134 respectively and transferred to a first 136 and a second discrimination/demodulation circuit 137 respectively. Two demodulated components from their respective discrimination/demodulation circuits 136 and 137, which have separately been discriminated at units of time slot by means of timing signals from a timing wave extracting circuit 135, are fed to a first data stream reproducing unit 232 where they are summed to a first data stream signal which is then delivered as an output from the output unit 26.

Figure 20:
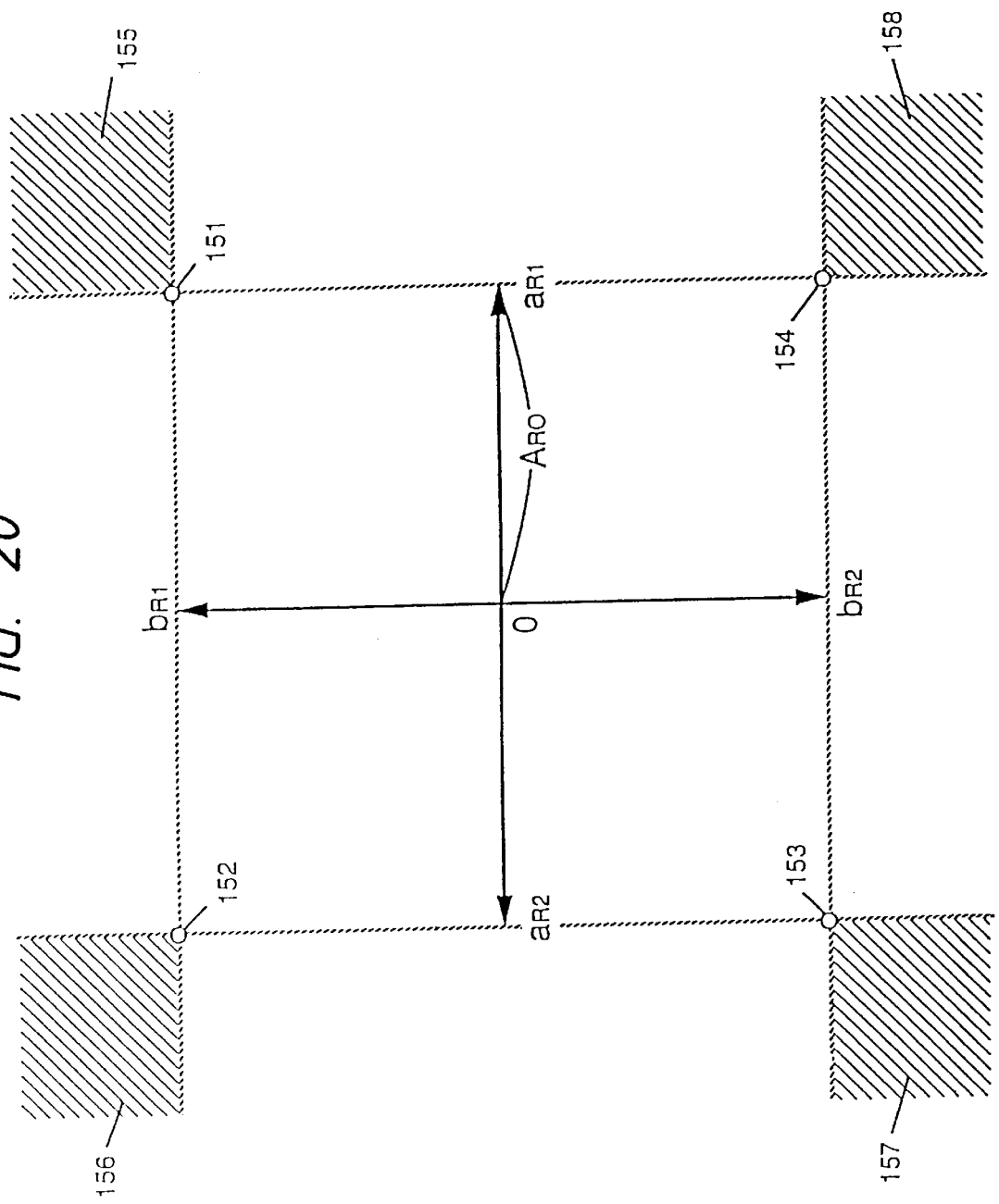
FIG. 20 is a signal space diagram of a 4 PSK modulated signal of the first embodiment.

The input signal to the first receiver 23 will now be explained in more detail referring to the vector diagram of FIG. 20. The 4 PSK signal received by the first receiver 23 from the digital transmitter 51 is expressed in an ideal form without transmission distortion and noise, using four signal points 151, 152, 153, 154 shown in FIG. 20.

Figure 25A:
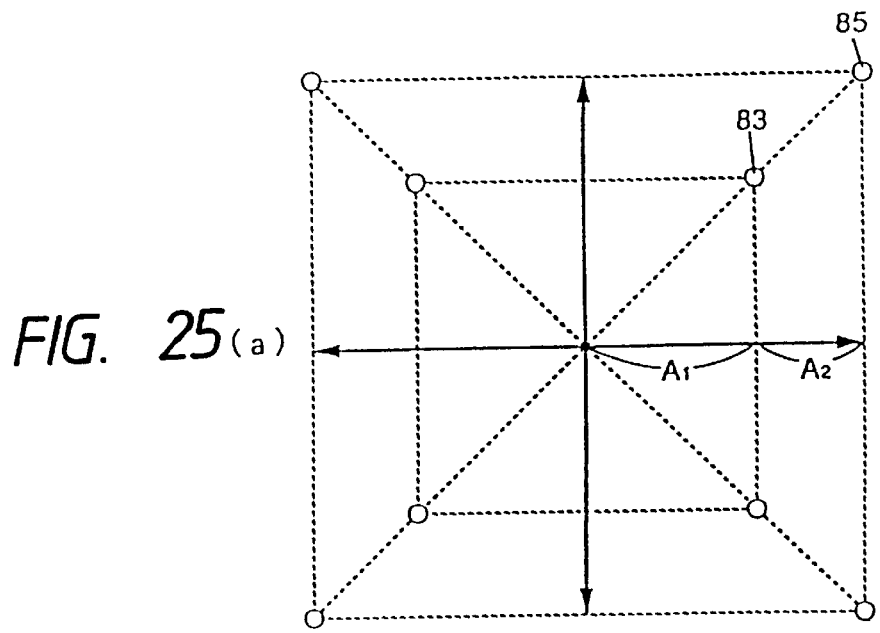
FIGS. 25(a) and 25(b) are vector diagrams showing an 8 and a 16 QAM signal of the first embodiment respectively.
Figure 25B:
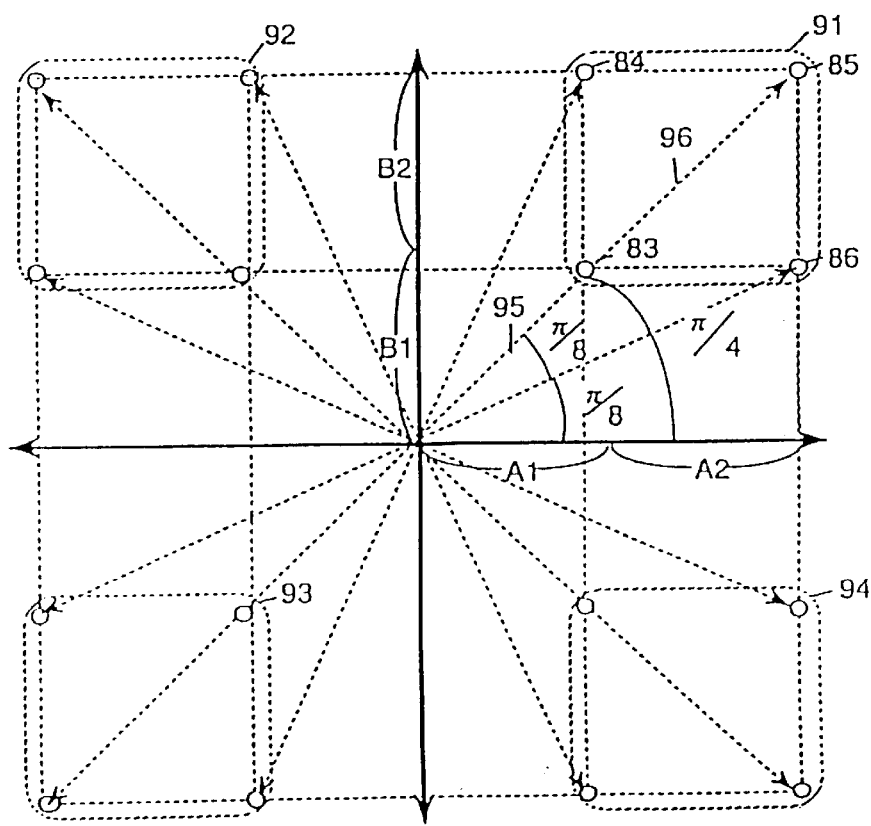

In practice, the real four signal points appear in particular extended areas about the ideal signal positions 151, 152, 153, 154 respectively due to noise, amplitude distortion, and phase error developed during transmission. If one signal point is unfavorably displaced from its original position, it will hardly be distinguished from its neighbor signal point and the error rate will thus be increased. As the error rate increases to a critical level, the reproduction of data becomes less accurate. For enabling the data reproduction at a maximum acceptable level of the error rate, the distance between any two signal points should be far enough to be distinguished from each other. If the distance is $1A_{R0}$, the signal point 151 of a 4 PSK signal at close to a critical error level has to stay in a first discriminating area 155 denoted by the hatching of FIG. 20 and determined by $|0-a_{R1}| \geq A_{R0}$ and $|0-b_{R0}| \geq A_{R0}$. This allows the signal transmission system to reproduce carrier waves and thus, demodulate a wanted signal. When the minimum radius of the antenna 22 is set to $r_0$, the transmission signal of more than a given level can be intercepted by any receiver of the system. The amplitude of a 4 PSK signal of the digital transmitter 51 shown in FIG. 18 is minimum at $A_{T0}$ and thus, the minimum amplitude $A_{R0}$ of a 4 PSK signal to be received by the first receiver 23 is determined equal to $A_{T0}$. As the result, the first receiver 23 can intercept and demodulate the 4 PSK signal from the digital transmitter 51 at the maximum acceptable level of the error rate when the radius of the antenna 22 is more than $r_0$. If the transmission signal is of modified 16- or 64-state QAM mode, the first receiver 23 may find difficult to reproduce its carrier wave. For compensation, the signal points are increased to eight which are allocated at angles of $(\pi/4+n\pi/2)$ as shown in FIG. 25(a) and its carrier wave will be reproduced by a 16× multiplication technique. Also, if the signal points are assigned to 16 locations at angles of $n\pi/8$ as shown in FIG. 25(b), the carrier of a quasi 4 PSK mode 16 QAM modulated signal can be reproduced with the carrier reproducing circuit 131 which is modified for performing 16× frequency multiplication. At the time, the signal points in the transmitter 1 should be arranged to satisfy $A_1/(A_1+A_2)=\tan(\pi/8)$.

Here, a case of receiving a QPSK signal will be considered. Similarly to the manner performed by the signal point modulating/changing circuit 67 in the transmitter shown in FIG. 2, it is also possible to modulate the positions of the signal points of the QPSK signal shown in FIG. 18 (amplitude-modulation, pulse-modulation, or the like). In this case, the signal point demodulating unit 138 in the first receiver 23 demodulates the position modulated or position changed signal. The demodulated signal is outputted together with the first data stream.

The 16 PSK signal of the transmitter 1 will now be explained referring to the vector diagram of FIG. 9. When the horizontal vector distance $A_1$ of the signal point 83 is greater than $A_{T0}$ of the minimum amplitude of the 4 PSK signal of the digital transmitter 51, the four signal points 83, 84, 85, 86 in the first quadrant of FIG. 9 stay in the shaded or first 4 PSK signal receivable area 87. When received by the first receiver 23, the four points of the signal appear in the first discriminating area of the vector field shown in FIG. 20. Hence, any of the signal points 83, 84, 85, 86 of FIG. 9 can be translated into the signal level 151 of FIG. 20 by the first receiver 23 so that the two-bit pattern of 11 is assigned to a corresponding time slot. The two-bit pattern of 11 is identical to 11 of the first signal point group 91 or first data stream of a signal from the transmitter 1. Equally, the first data stream will be reproduced at the second, third, or fourth quadrant. As the result, the first receiver 23 reproduces two-bit data of the first data stream out of the plurality of data streams in a 16-, 32-, or 64-state QAM signal transmitted from the transmitter 1. The second and third data streams are contained in four segments of the signal point group 91 and thus, will not affect on the demodulation of the first data stream. They may however affect the reproduction of a carrier wave and an adjustment, described later, will be needed.

If the transponder of a satellite supplies an abundance of energy, the forgoing technique of 16 to 64-state QAM mode transmission will be feasible. However, the transponder of the satellite in any existing satellite transmission system is strictly limited in the power supply due to its compact size and the capability of solar batteries. If the transponder or satellite is increased in size thus weight, its launching cost will soar. This disadvantage will rarely be eliminated by traditional techniques unless the cost of launching a satellite rocket is reduced to a considerable level. In the existing system, a common communications satellite provides as low as 20 W of power supply and a common broadcast satellite offers 100 W to 200 W at best. For transmission of such a 4 PSK signal in the symmetrical 16-state QAM mode as shown in FIG. 9, the minimum signal point distance is needed $3A_{T0}$ as the 16 QAM amplitude is expressed by $2A_1=A_2$. Thus, the energy needed for the purpose is nine times greater than that for transmission of a common 4 PSK signal, in order to maintain compatibility. Also, any conventional satellite transponder can hardly provide a power for enabling such a small antenna of the 4 PSK first receiver to intercept a transmitted signal therefrom. For example, in the existing 40 W system, 360 W is needed for appropriate signal transmission and will be unrealistic in the respect of cost.

It would be understood that the symmetrical signal state QAM technique is most effective when the receivers equipped with the same sized antennas are employed corresponding to a given transmitting power. Another novel technique will however be preferred for use with the receivers equipped with different sized antennas.

In more detail, while the 4 PSK signal can be intercepted by a common low cost receiver system having a small antenna, the 16 QAM signal is intended to be received by a high cost, high quality, multiple-bit modulating receiver system with a medium or large sized antenna which is designed for providing highly valuable services, e.g. HDTV entertainments, to a particular person who invests more money. This allows both 4 PSK and 16 QAM signals, if desired, with a 64 DMA, to be transmitted simultaneously with the help of a small increase in the transmitting power.

For example, the transmitting power can be maintained low when the signal points are allocated at $A_1=A_2$ as shown in FIG. 10. The amplitude A(4) for transmission of 4 PSK data is expressed by a vector 96 equivalent to a square root of $(A_1+A_2)^2+(B_1+B_2)^2$. Then, $|A(4)|^2=A_1^2+B_1^2=A_{T0}^2+A_{T0}^2=2A_{T0}^2$
$|A(6)|^2=(A_1+A_2)^2+(B_1+B_2)^2=4A_{T0}^2+4A_{T0}^2=8_{T0}^2$
$|A(16)|/|A(4)|=2$ Accordingly, the 16 QAM signal can be transmitted at a two times greater amplitude and a four times greater transmitting energy than those needed for the 4 PSK signal. A modified 16 QAM signal according to the present invention will not be demodulated by a common receiver designed for symmetrical, equally distanced signal point QAM. However, it can be demodulated with the second receiver 33 when two threshold $A_1$ and $A_2$ are predetermined to appropriate values. At FIG. 10, the minimum distance between two signal points in the first segment of the signal point group 91 is $A_1$ and $A_2/2A_1$ is established as compared with the distance $2A_1$ of 4 PSK. Then, as $A_1=A_2$, the distance becomes ½. This explains that the signal receiving sensitivity has to be two times greater for the same error rate and four times greater for the same signal level. For having a four times greater value of sensitivity, the radius $r_2$ of the antenna 32 of the second receiver 33 has to be two times greater than the radius $r_1$ of the antenna 22 of the first receiver 23 thus satisfying $r_2=2r_1$. For example, the antenna 32 of the second receiver 33 is 60 cm diameter when the antenna 22 if the first receiver 23 is 30 cm. In this manner, the second data stream representing the high frequency component of an HDTV will be carried on a signal channel and demodulated successfully. As the second receiver 33 intercepts the second data stream or a higher data signal, its owner can enjoy a return of high investment. Hence, the second receiver 33 of a high price may be accepted. As the minimum energy for transmission of 4 PSK data is predetermined, the ratio $n_{16}$ of modified 16 APSK transmitting energy to 4 PSK transmitting energy will be calculated to the antenna radius $r_2$ of the second receiver 33 using a ratio between $A_1$ and $A_2$ shown in FIG. 10.

In particular, $n_{16}$ is expressed by $((A_1+A_2)/A_1)^2$ which is the minimum energy for transmission of 4 PSK data. As the signal point distance suited for modified 16 QAM interception is $A_2$, the signal point distance for 4 PSK interception is $2A_1$, and the signal point distance ratio is $A_2/2A_1$, the antenna radius $r_2$ is determined as shown in FIG. 11, in which the curve 101 represents the relation between the transmitting energy ratio $n_{16}$ and the radius $r_2$ of the antenna 22 of the second receiver 23.

Also, the point 102 indicates transmission of common 16 QAM at the equal distance signal state mode where the transmitting energy is nine times greater and thus will no more be practical. As apparent from the graph of FIG. 11, the antenna radius $r_2$ of the second receiver 23 cannot be reduced further even if $n_{16}$ is increased more than 5 times.

Figure 11:
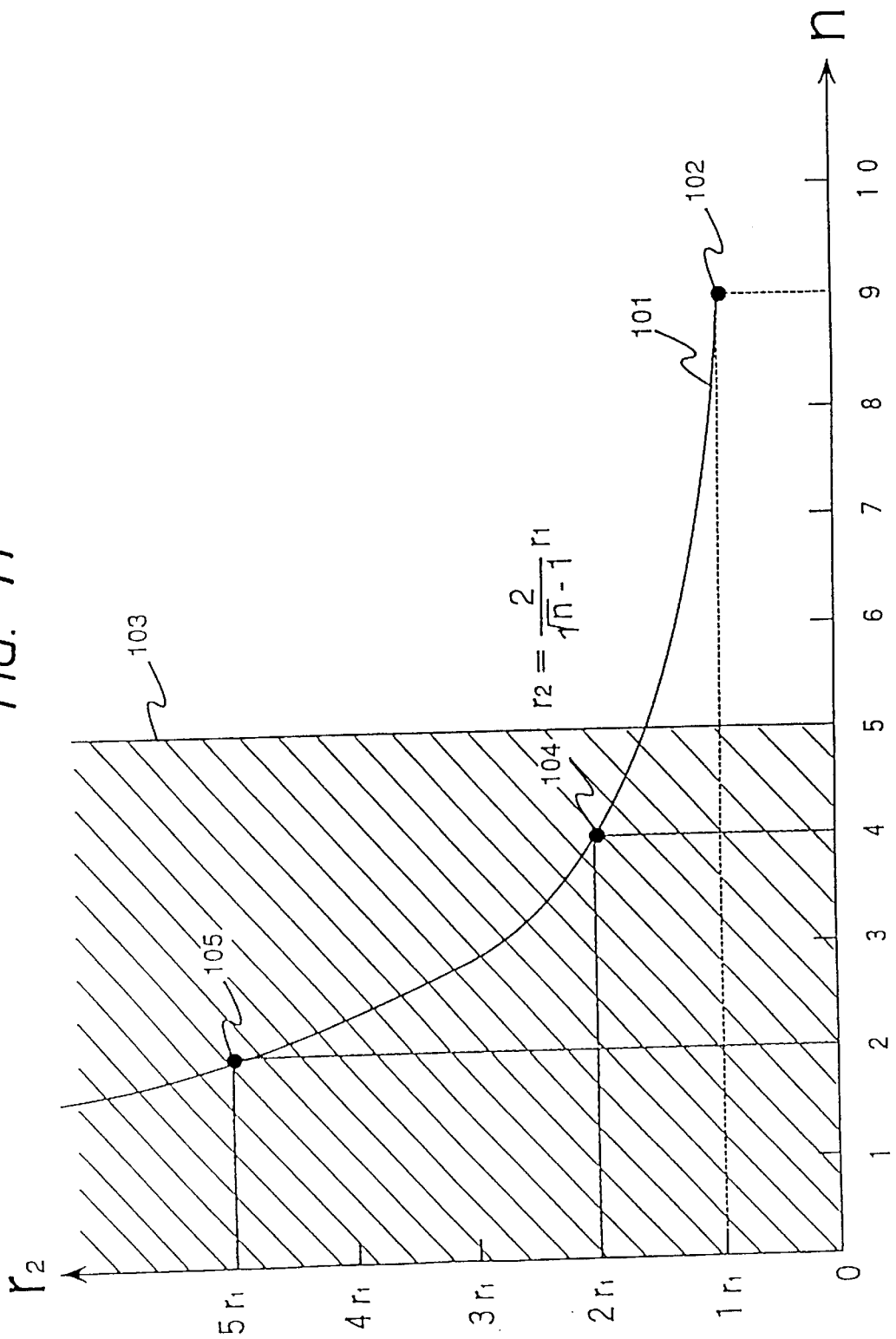
FIG. 11 is a graphic diagram showing the relation between antenna radius $r_2$ and transmission energy ratio n according to the first embodiment.

The transmitting energy at the satellite is limited to a small value and thus, $n_{16}$ preferably stays not more than 5 times the value, as denoted by the hatching of FIG. 11. The point 104 within the hatching area 103 indicates, for example, that the antenna radius $r_2$ of a two times greater value is matched with a 4× value of the transmitting energy. Also, the point 105 represents that the transmission energy should be doubled when $r_2$ is about 5× greater. Those values are all within a feasible range.

The value of $n_6$ not greater than 5× value is expressed using $A_1$ and $A_2$ as:

$n_{16}=((A_1+A_2)/A_1)^2 \leq 5$

Hence, $A_2 \leq 1.23A_1$.

If the distance between any two signal point group segments shown in FIG. 10 is 2A(4) and the maximum amplitude is 2A(16), A(4) and A(16)–A(4) are proportional to $A_1$ and $A_2$ respectively. Hence, $(A(16))^2 \leq 5(A(14))^2$ is established.

The action of a modified 64 ASPK transmission will be described as the third receiver 43 can perform 64-state QAM demodulation.

Figure 12:
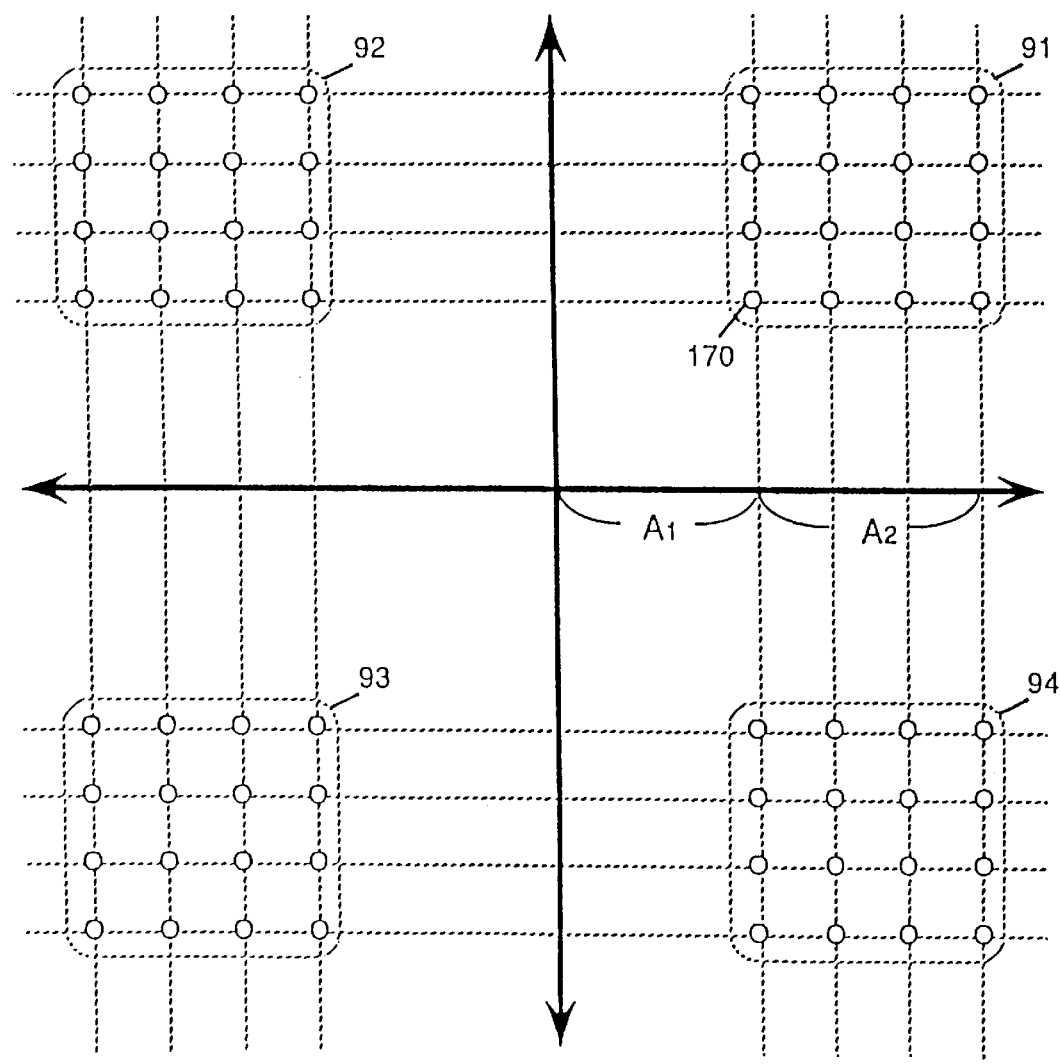
FIG. 12 is a view showing the signal points of a modified 64 QAM signal of the first embodiment.

FIG. 12 is a vector diagram in which each signal point group segment contains 16 signal points as compared with 4 signal points of FIG. 10. The first signal point group segment 91 in FIG. 12 has a 4×4 matrix of 16 signal points allocated at equal intervals including the point 170. For providing compatibility with 4 PSK, $A_1 \geq A_{T0}$ has to be satisfied. If the radius of the antenna 42 of the third receiver 43 is $r_3$ and the transmitting energy is $n_{64}$, the equation is expressed as:

$r_3^2=\{6^2/(n-1)\}r_1^2$

Figure 13:
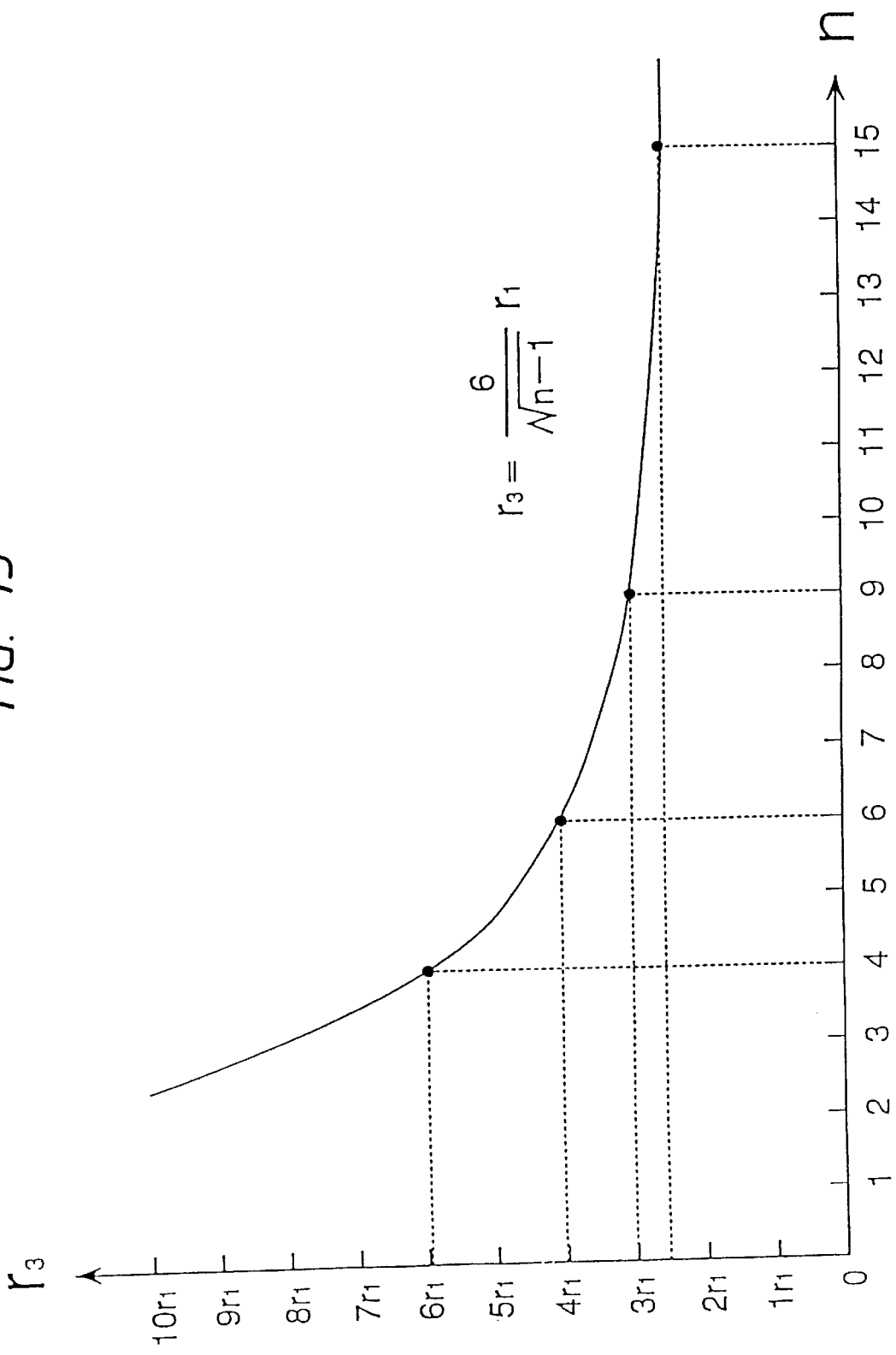
FIG. 13 is a graphic diagram showing the relation between antenna radius $r_3$ and transmission energy ratio n according to the first embodiment.

This relation between $r_3$ and n of a 64 QAM signal is also shown in the graphic representation of FIG. 13.

It is understood that the signal point assignment shown in FIG. 12 allows the second receiver 33 to demodulate only two-bit patterns of 4 PSK data. Hence, it is desired for having compatibility between the first, second, and third receivers that the second receiver 33 is arranged capable of demodulating a modified 16 QAM form from the 64 QAM modulated signal.

Figure 14:
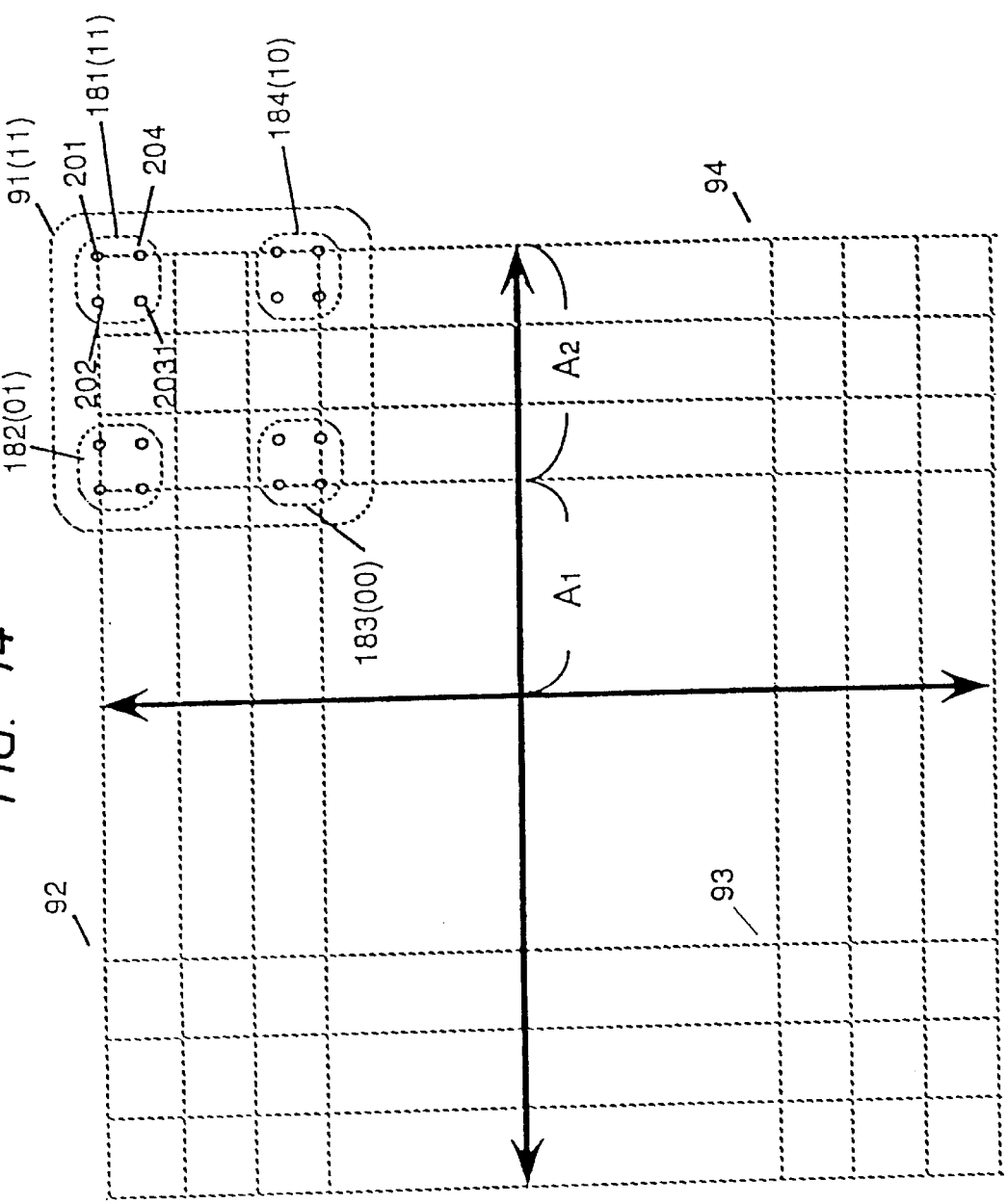
FIG. 14 is a vector diagram showing signal point groups and their signal points of the modified 64 QAM signal of the first embodiment.

The compatibility between the three discrete receivers can be implemented by three-level grouping of signal points, as illustrated in FIG. 14. The description will be made referring to the first quadrant in which the first signal point group segment 91 represents the two-bit pattern 11 of the first data stream.

In particular, a first sub segment 181 in the first signal point group segment 91 is assigned the two-bit pattern 11 of the second data stream. Equally, a second 182, a third 183, and a fourth sub segment 184 are assigned 01, 00, and 10 of the same respectively. This assignment is identical to that shown in FIG. 7.

The signal point allocation of the third data stream will now be explained referring to the vector diagram of FIG. 15 which shows the first quadrant. As shown, the four signal points 201, 205, 209, 213 represent the two-bit pattern of 11, the signal points 202, 206, 210, 214 represent 01, the signal points 203, 207, 211, 215 represent 00, and signal points 204, 208, 212, 216 represent 10. Accordingly, the two-bit patterns of the third data stream can be transmitted separately of the first and second data streams. In other words, two-bit data of the three different signal levels can be transmitted respectively.

As understood, the present invention permits not only transmission of six-bit data but also interception of three, two-bit, four-bit, and six-bit, different bit length data with their respective receivers while the signal compatibility remains between three levels.

The signal point allocation for providing compatibility between the three levels will be described.

Figure 15:
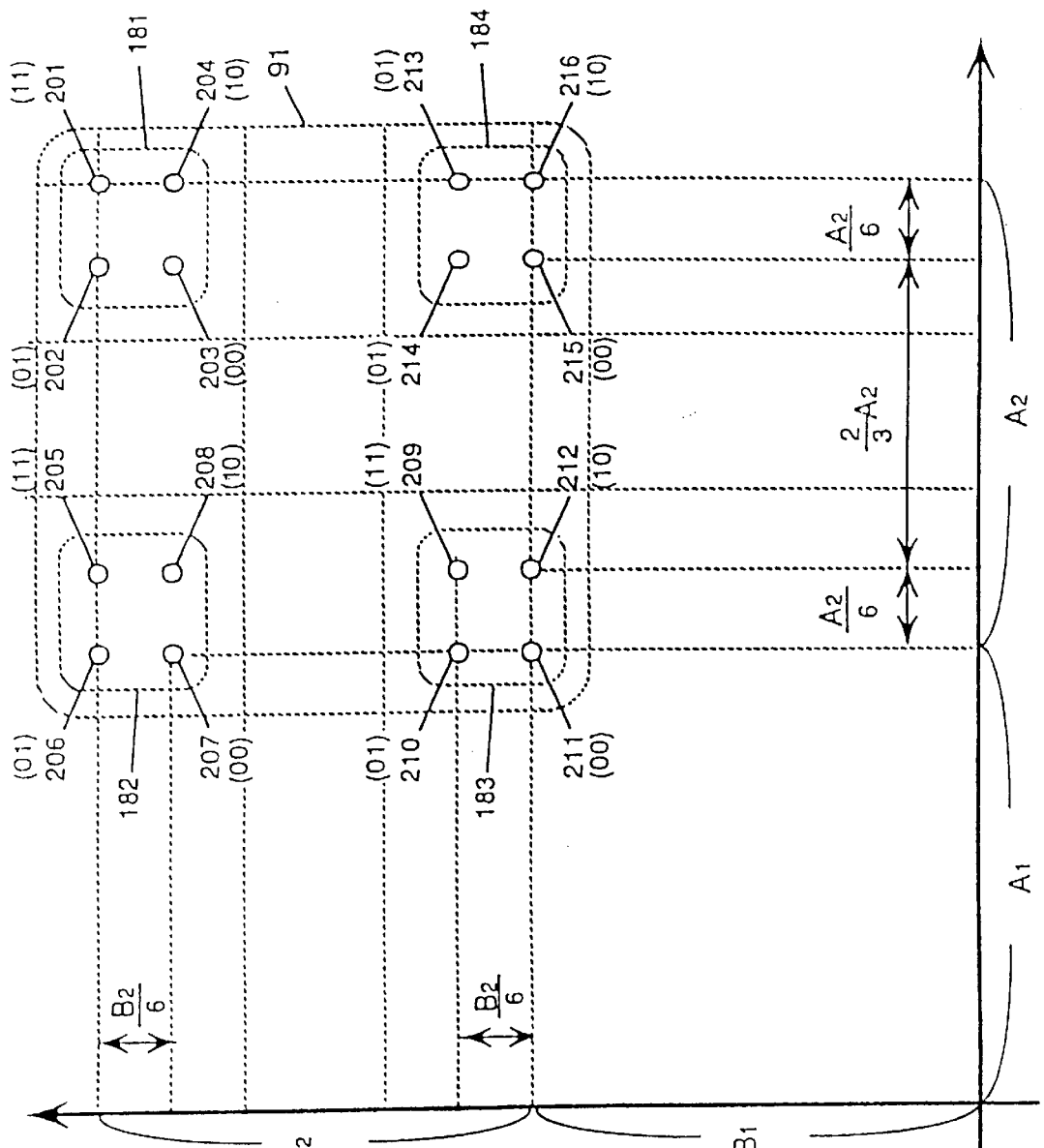
FIG. 15 is an explanatory view showing the relation between $A_1$ and $A_2$ of the modified 64 QAM signal of the first embodiment.

As shown in FIG. 15, $A_1 \geq A_{T0}$ is essential for allowing the first receiver 23 to receive the first data stream.

It is needed to space any two signal points from each other by such a distance that the sub segment signal points, e.g. 182, 183, 184, of the second data stream shown in FIG. 15 can be distinguished from the signal point 91 shown in FIG. 10.

FIG. 15 shows that they are spaced by $2/3A_2$. In this case, the distance between the two signal points 201 and 202 in the first sub segment 181 is $A_2/6$. The transmitting energy needed for signal interception with the third receiver 43 is now calculated. If the radius of the antenna 32 is $r_3$ and the needed transmitting energy is $n_{64}$ times the 4 PSK transmitting energy, the equation is expressed as:

$$r_3^2 = (12r_1)^2/(n-1)$$

Figure 16:
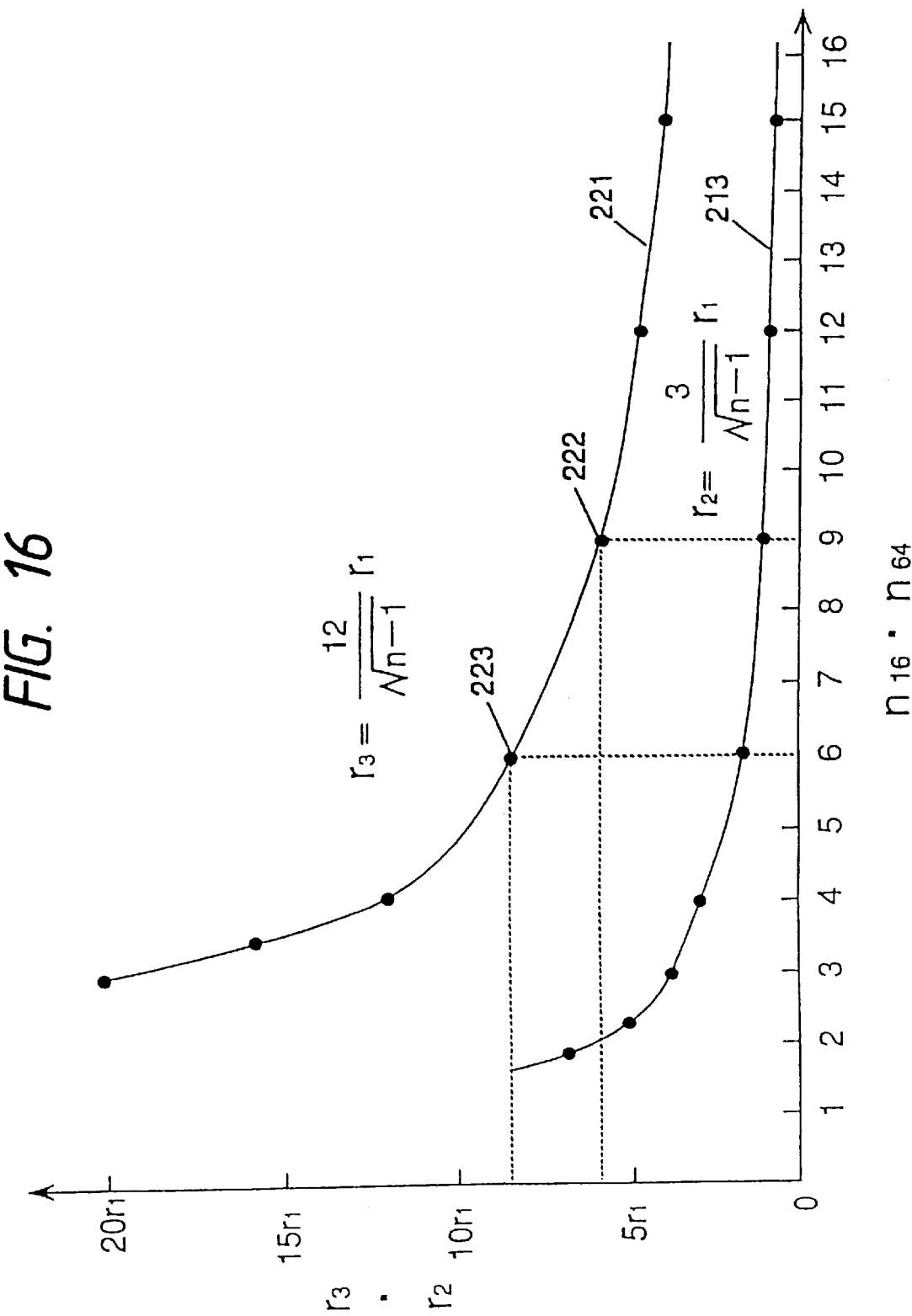
FIG. 16 is a graph diagram showing the relation between antenna radius $r_2$, $r_3$ and transmission energy ratio $n_{16}$, $n_{64}$ respectively according to the first embodiment.

This relation is also denoted by the curve 221 in FIG. 16. For example, if the transmitting energy is 6 or 9 times greater than that for 4 PSK transmission at the point 223 or 222, the antenna 32 having a radius of 8× or 6× value respectively can intercept the first, second, and third data streams for demodulation. As the signal point distance of the second data stream is close to $2/3A_2$, the relation between $r_1$ and $r_2$ is expressed by:

$$r_2^2 = (3r_1)^2/(n-1)$$

Therefore, the antenna 32 of the second receiver 33 has to be a little bit increased in radius as denoted by the curve 213.

As understood, while the first and second data streams are transmitted trough a traditional satellite which provides a small signal transmitting energy, the third data stream can also be transmitted through a future satellite which provides a greater signal transmitting energy without interrupting the action of the first and second receivers 23, 33 or with no need of modification of the same and thus, both the compatibility and the advancement will highly be ensured.

The signal receiving action of the second receiver 33 will first be described. As compared with the first receiver 23 arranged for interception with a small radius $r_1$ antenna and demodulation of the 4 PSK modulated signal of the digital transmitter 51 or the first data stream of the signal of the transmitter 1, the second receiver 33 is adopted for perfectly demodulating the 16 signal state two-bit data, shown in FIG. 10, or second data stream of the 16 QAM signal from the transmitter 1. In total, four-bit data including also the first data stream can be demodulated. The ratio between $A_1$ and $A_2$ is however different in the two transmitters. The two different data are loaded to a demodulation controller 231 of the second receiver 33, shown in FIG. 21, which in turn supplies their respective threshold values to the demodulating circuit for AM demodulation.

Figure 21:
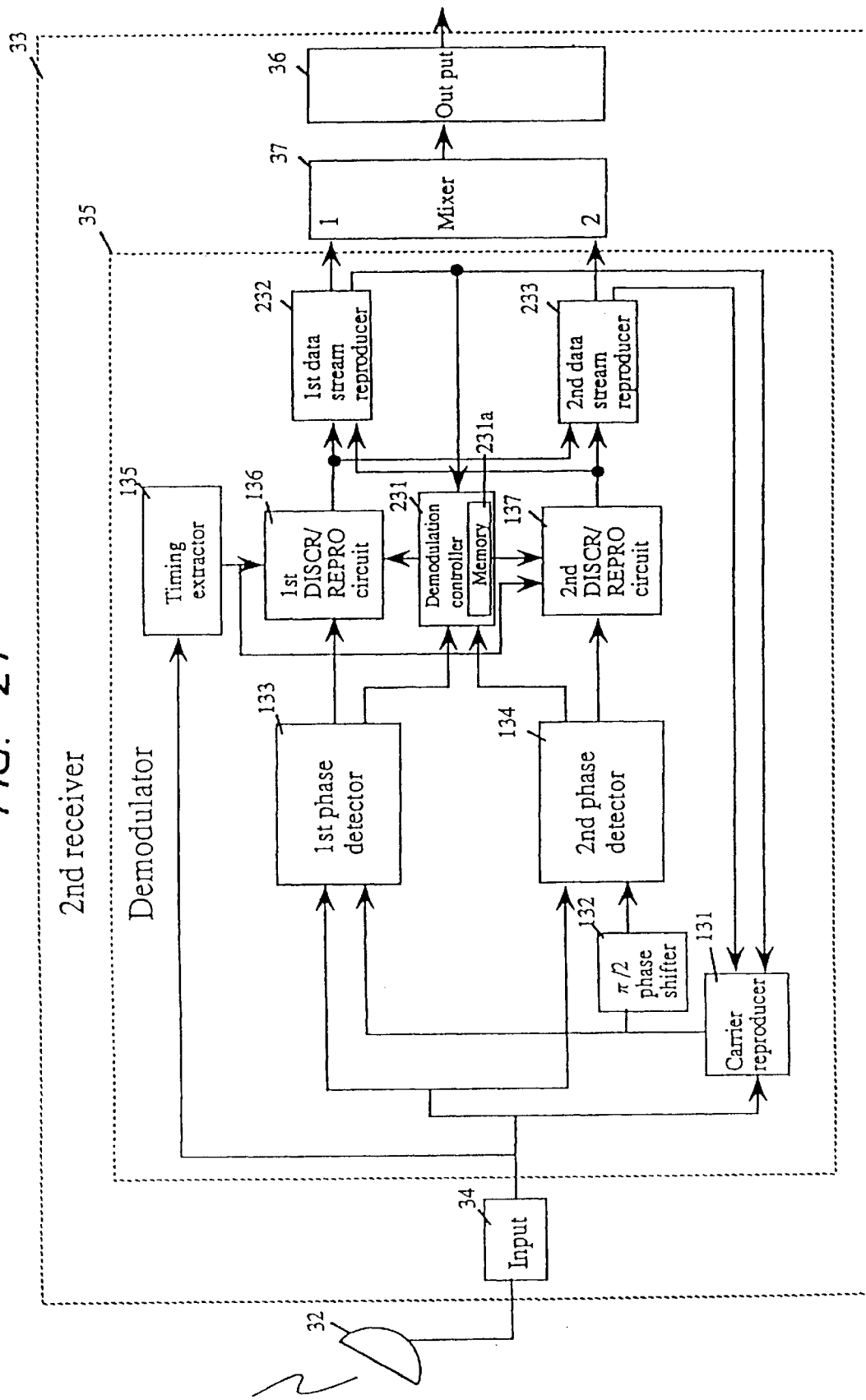
FIG. 21 is a block diagram of a second receiver of the first embodiment.
Figure 22:
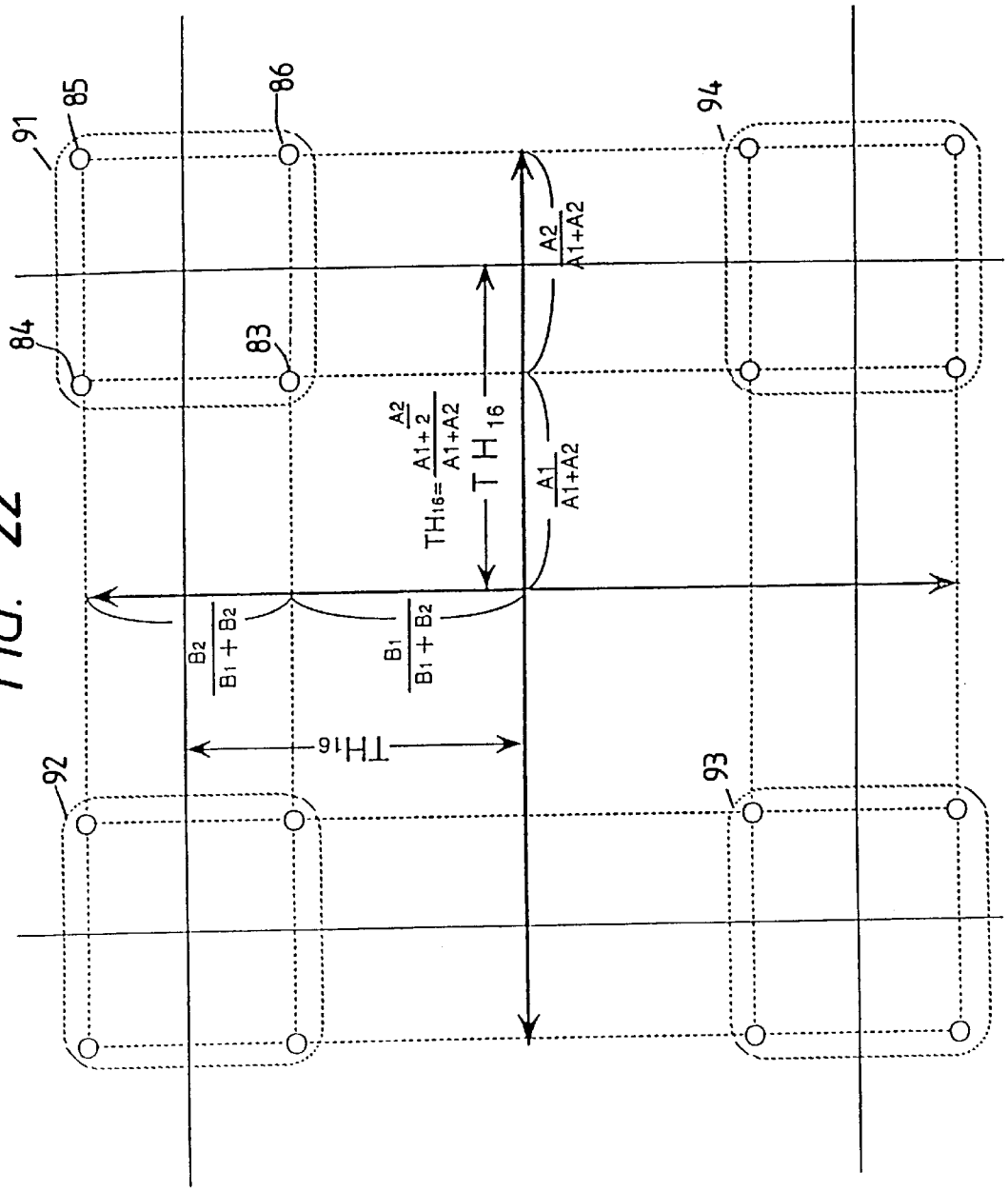
FIG. 22 is a vector diagram of a modified 16 QAM signal of the first embodiment.

The block diagram of the second receiver 33 in FIG. 21 is similar in basic construction to that of the first receiver 23 shown in FIG. 19. The difference is that the radius $r_2$ of the antenna 32 is greater than $r_1$ of the antenna 22. This allows the second receiver 33 to identify a signal component involving a smaller signal point distance. The demodulator 35 of the second receiver 33 also contains a first 232 and a second data stream reproducing unit 233 in addition to the demodulation controller 231. There is provided a first discrimination/reproduction circuit 136 for AM demodulation of modified 16 QAM signals. As understood, each carrier is a four-bit signal having two, positive and negative, threshold values about the zero level. As apparent from the vector diagram, of FIG. 22, the threshold values are varied depending on the transmitting energy of a transmitter since the transmitting signal of the embodiment is a modified 16 QAM signal. When the reference threshold is $TH_{16}$, it is determined by, as shown in FIG. 22:

$$TH_{16} = (A_1 + A_2/2)/(A_1 + A_2)$$

The various data for demodulation including $A_1$ and $A_2$ or $TH_{16}$, and the value m for multiple-bit modulation are also transmitted from the transmitter 1 as carried in the first data stream. The demodulation controller 231 may be arranged for recovering such demodulation data through statistic process of the received signal.

Figure 26:
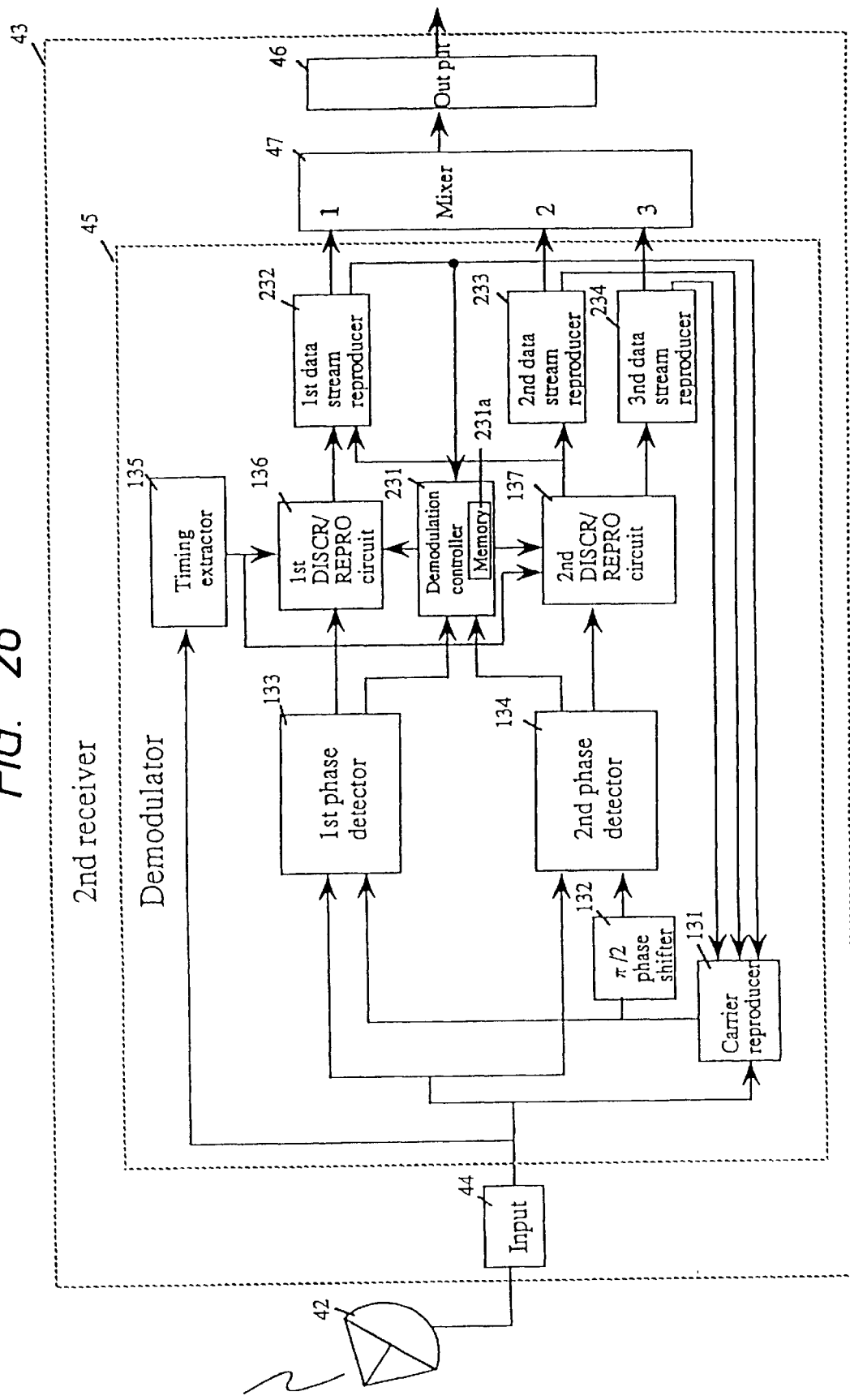
FIG. 26 is a block diagram of a third receiver of the first embodiment.

A way of determining the shift factor $A_1/A_2$ will described with reference to FIG. 26. A change of the shift factor $A_1/A_2$ causes a change of the threshold value. Increase of a difference of a value of $A_1/A_2$ set at the receiver side from a value of $A_1/A_2$ set at the transmitter side will increase the error rate. Referring to FIG. 26, the demodulated signal from the second data stream reproducing unit 233 may be fed back to the demodulation controller 231 to change the shift factor $A_1/A_2$ in a direction to increase the error rate. By this arrangement, the third receiver 43 may not demodulate the shift factor $A_1/A_2$, so that the circuit construction can be simplified. Further, the transmitter may not transmit the shift factor $A_1/A_2$, so that the transmission capacity can be increased. This technique can be applied also to the second receiver 33.

The demodulation controller 231 has a memory 231a for storing therein different threshold values (i.e., the shift factors, the number of signal points, the synchronization rules, etc.) which correspond to different channels of TV broadcast. When receiving one of the channels again, the values corresponding to the receiving channel will be read out of the memory to thereby stabilize the reception quickly.

If the demodulation data is lost, the demodulation of the second data stream will hardly be executed. This will be explained referring to a flow chart shown in FIG. 24.

Even if the demodulation data is not available, demodulation of the 4 PSK at Step 313 and of the first data stream at Step 301 can be implemented. At Step 302, the demodulation data retrieved by the first data stream reproducing unit 232 is transferred to the demodulation controller 231. If m is 4 or 2 at Step 303, the demodulation controller 231 triggers demodulation of 4 PSK or 2 PSK at Step 313. If not, the procedure moves to Step 310. At Step 305, two threshold values $TH_8$ and $TH_{16}$ are calculated. The threshold value $TH_{16}$ for AM demodulation is fed at Step 306 from the demodulation controller 231 to both the first 136 and the second discrimination/reproduction circuit 137. Hence, demodulation of the modified 16 QAM signal and reproduction of the second data stream can be carried out at Steps 307 and 315 respectively. At Step 308, the error rate is examined and if high, the procedure returns to Step 313 for repeating the 4 PSK demodulation.

As shown in FIG. 22, the signal points 85, 83, are aligned on a line at an angle of $\cos(\omega t + n\pi/2)$ while 84 and 86 are off the line. Hence, the feedback of a second data stream transmitting carrier wave data from the second data stream reproducing unit 233 to a carrier reproducing circuit 131 is carried out so that no carrier needs to be extracted at the timing of the signal points 84 and 86.

The transmitter 1 is arranged to transmit carrier timing signals at intervals of a given time with the first data stream for the purpose of compensation for no demodulation of the second data stream. The carrier timing signal enables to identify the signal points 83 and 85 of the first data stream regardless of demodulation of the second data stream. Hence, the reproduction of carrier wave can be triggered by the transmitting carrier data to the carrier reproducing circuit 131.

Figure 23:
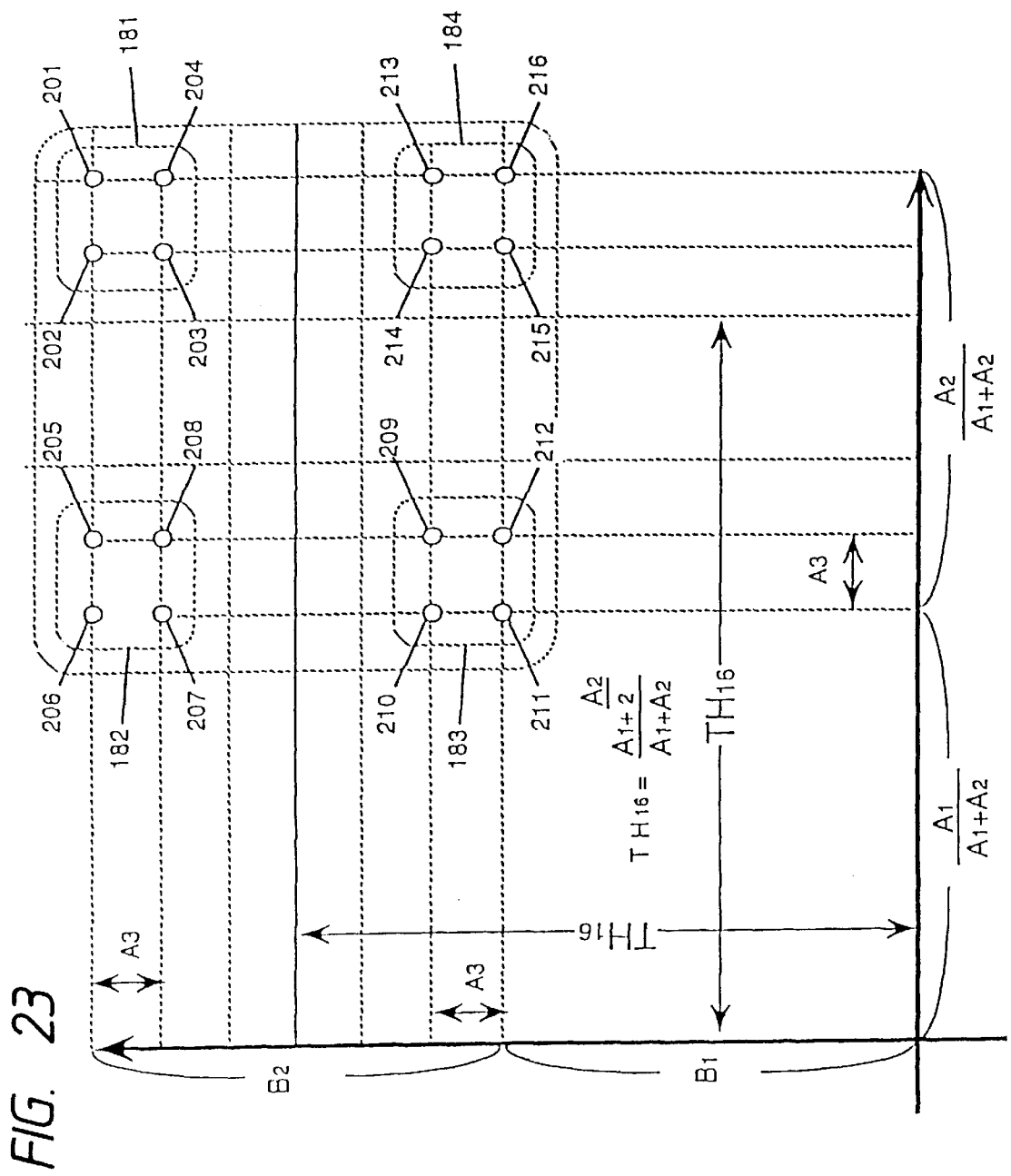
FIG. 23 is a vector diagram of a modified 64 QAM signal of the first embodiment.
Figure 24:
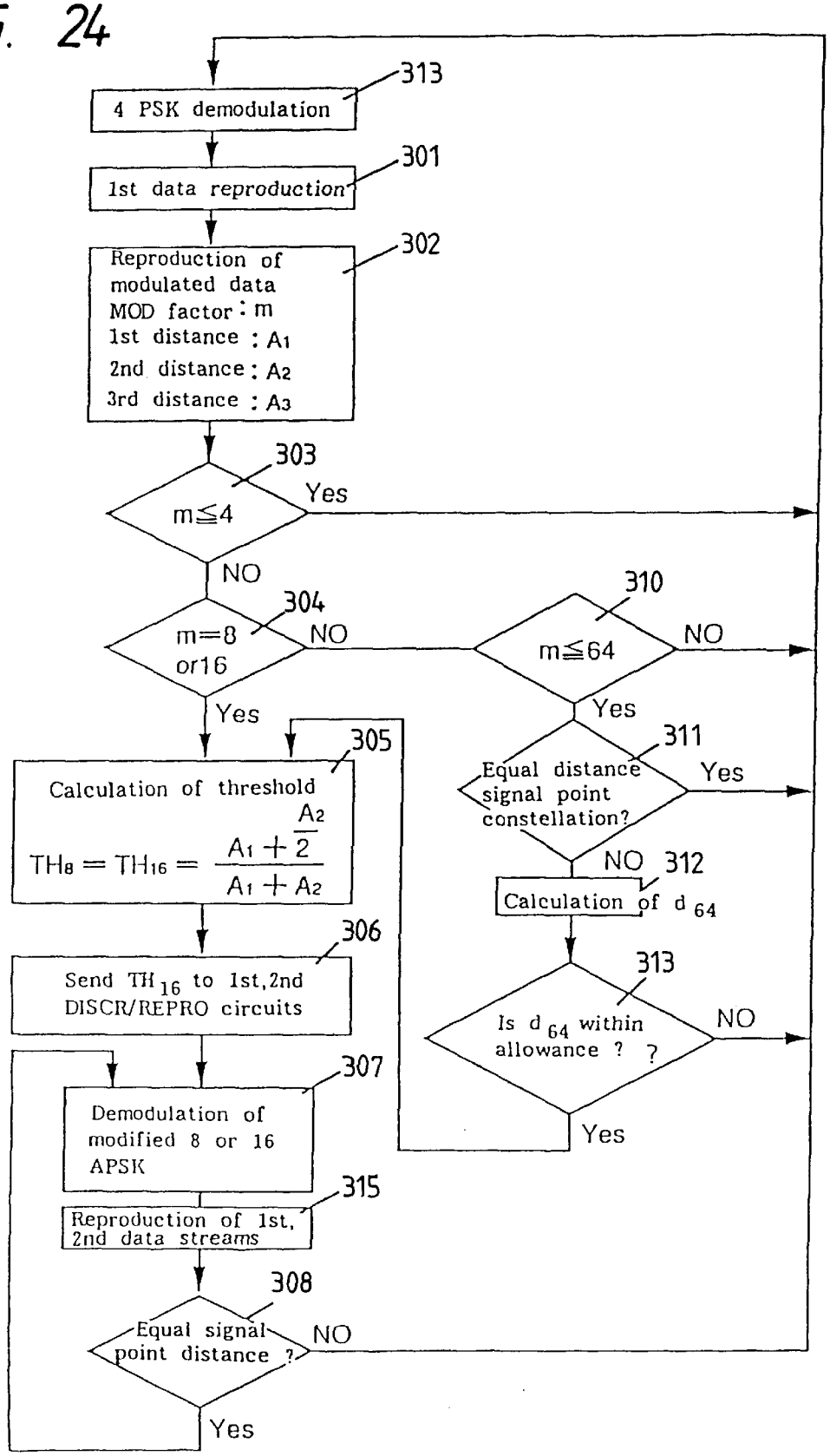
FIG. 24 is a flow chart showing an action of the first embodiment.

It is then examined at Step 304 of the flow chart of FIG. 24 whether m is 16 or not upon receipt of such a modified 64 QAM signal as shown in FIG. 23. At Step 310, it is also examined whether m is more than 64 or not. If it is determined at Step 311 that the received signal has no equal distance signal point constellation, the procedure goes to Step 312. The signal point distance $TH_{64}$ of the modified 64 QAM signal is calculated from:

$$TH_{64} = (A_1 + A_2/2)/(A_1 + A_2)$$

This calculation is equivalent to that of $TH_{16}$ but its resultant distance between signal points is smaller.

If the signal point distance in the first sub segment 181 is $A_3$, the distance between the first 181 and the second sub segment 182 is expressed by $(A_2 - 2A_3)$. Then, the average distance is $(A_2 - 2A_3)/(A_1 + A_2)$ which is designated as $d_{64}$. When $d_{64}$ is smaller than $T_2$ which represents the signal point discrimination capability of the second receiver 33, any two signal points in the segment will hardly be distinguished from each other. This judgement is executed at Step 313. If $d_{64}$ is out of a permissive range, the procedure moves back to Step 313 for 4 PSK mode demodulation. If $d_{64}$ is within the range, the procedure advances to Step 305 for allowing the demodulation of 16 QAM at Step 307. If it is determined at Step 308 that the error rate is too high, the procedure goes back to Step 313 for 4 PSK mode demodulation.

When the transmitter 1 supplied a modified 8 QAM signal such as shown in FIG. 25(a) in which all the signal points are at angles of $\cos(2\pi f + n \cdot \pi/4)$, the carrier waves of the signal are lengthened to the same phase and will thus be reproduced with much ease. At the time, two-bit data of the first data stream are demodulated with the 4-PSK receiver while one-bit data of the second data stream is demodulated with the second receiver 33 and the total of three-bit data can be reproduced.

The third receiver 43 will be described in more detail. FIG. 26 shows a block diagram of the third receiver 43 similar to that of the second receiver 33 in FIG. 21. The difference is that a third data stream reproducing unit 234 is added and also, the discrimination/reproduction circuit has a capability of identifying eight-bit data. The antenna 42 of the third receiver 43 has a radius $r_3$ greater than $r_2$ thus allowing smaller distance state signals, e.g. 32- or 64-state QAM signals, to be demodulated. For demodulation of the 64 QAM signal, the first discrimination/reproduction circuit 136 has to identify 8 digital levels of the detected signal in which seven different threshold levels are involved. As one of the threshold values is zero, three are contained in the first quadrant.

Figure 27:
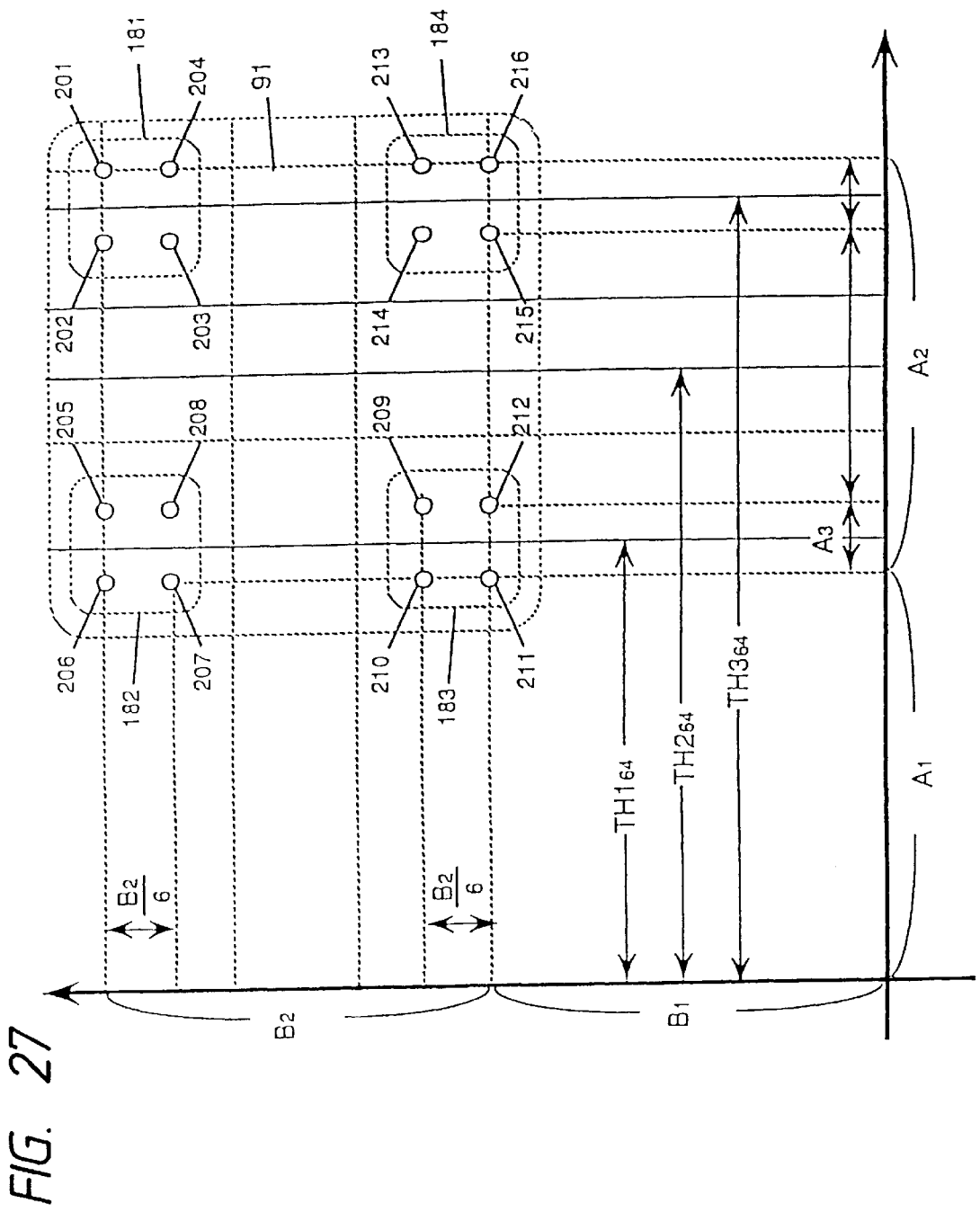
FIG. 27 is a view showing signal points of the modified 64 QAM signal of the first embodiment.

FIG. 27 shows a space diagram of the signal in which the first quadrant contains three different threshold values.

As shown in FIG. 27, when the three normalized threshold values are $TH1_{64}$, $TH2_{64}$, and $TH3_{64}$, they are expressed by:

$$TH1_{64} = (A_1 + A_3/2)/(A_1 + A_2)$$

$$TH2_{64} = (A_1 + A_2/2)/(A_1 + A_2)$$

and $$TH3_{64} = (A_1 + A_2 - A_3/2)/(A_1 + A_2).$$

Through AM demodulation of a phase detected signal using the three threshold values, the third data stream can be reproduced like the first and second data stream explained with FIG. 21. The third data stream contains e.g. four signal points 201, 202, 203, 204 at the first sub segment 181 shown in FIG. 23 which represent 4 values of two-bit pattern. Hence, six digits or modified 64 QAM signals can be demodulated.

Figure 28:
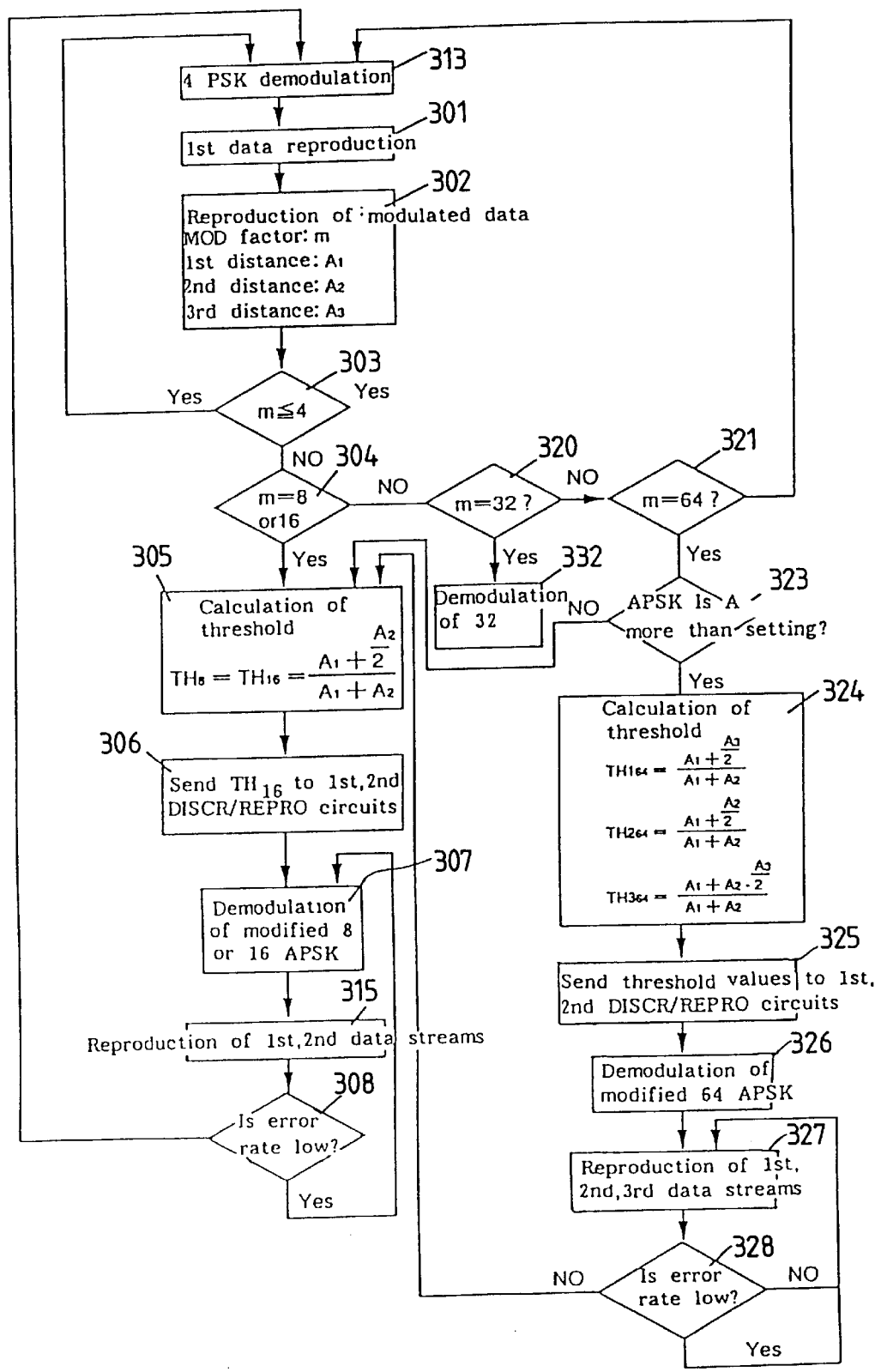
FIG. 28 is a flow chart showing another action of the first embodiment.

The demodulation controller 231 detects the value m, $A_1$, $A_2$, and $A_3$ from the demodulation data contained in the first data stream demodulated at the first data stream reproducing unit 232 and calculates the three threshold values $TH1_{64}$, $TH2_{64}$, and $TH3_{64}$ which are then fed to the first 136 and the second discrimination/reproduction circuit 137 so that the modified 64 QAM signal is demodulated with certainty. Also, if the demodulation data have been scrambled, the modified 64 QAM signal can be demodulated only with a specific or subscriber receiver. FIG. 28 is a flow chart showing the action of the demodulation controller 231 for modified 64 QAM signals. The difference from the flow chart for demodulation of 16 QAM shown in FIG. 24 will be explained. The procedure moves from Step 304 to Step 320 where it is examined whether m=32 or not. If m=32, demodulation of 32 QAM signals is executed at Step 322. If not, the procedure moves to Step 321 where it is examined whether m=64 or not. If yes, $A_3$ is examined at Step 323. If $A_3$ is smaller than a predetermined value, the procedure moves to Step 305 and the same sequence as of FIG. 24 is implemented. If it is judged at Step 323 that $A_3$ is not smaller than the predetermined value, the procedure goes to Step 324 where the threshold values are calculated. At Step 325, the calculated threshold values are fed to the first and second discrimination/reproduction circuits and at Step 326, the demodulation of the modified 64 QAM signal is carried out. Then, the first, second, and third data streams are reproduced at Step 327. At Step 328, the error rate is examined. If the error rate is high, the procedure moves to Step 305 where the 16 QAM demodulation is repeated and if low, the demodulation of the 64 QAM is continued.

The action of carrier wave reproduction needed for execution of a satisfactory demodulating procedure will now be described. The scope of the present invention includes reproduction of the first data stream of a modified 16 or 64 QAM signal with the use of a 4 PSK receiver. However, a common 4 PSK receiver rarely reconstructs carrier waves, thus failing to perform a correct demodulation. For compensation, some arrangements are necessary at both the transmitter and receiver sides.

Two techniques for the compensation are provided according to the present invention. A first technique relates to transmission of signal points aligned at angles of $(2n-1)\pi/4$ at intervals of a given time. A second technique offers transmission of signal points arranged at intervals of an angle of $n\pi/8$.

Figure 38:
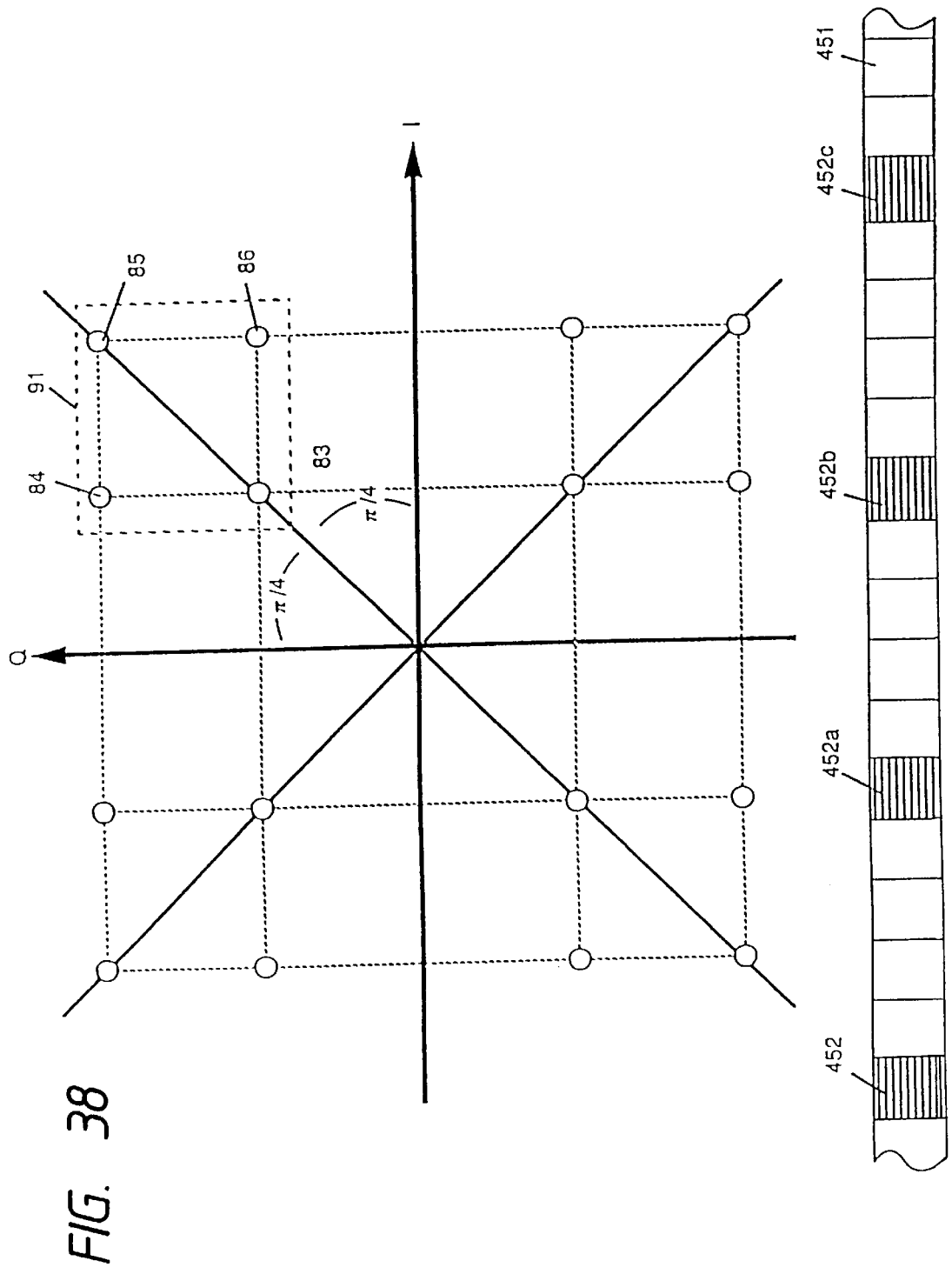
FIG. 38 is a vector diagram of a modified 16 QAM signal of the third embodiment.
Figure 41:
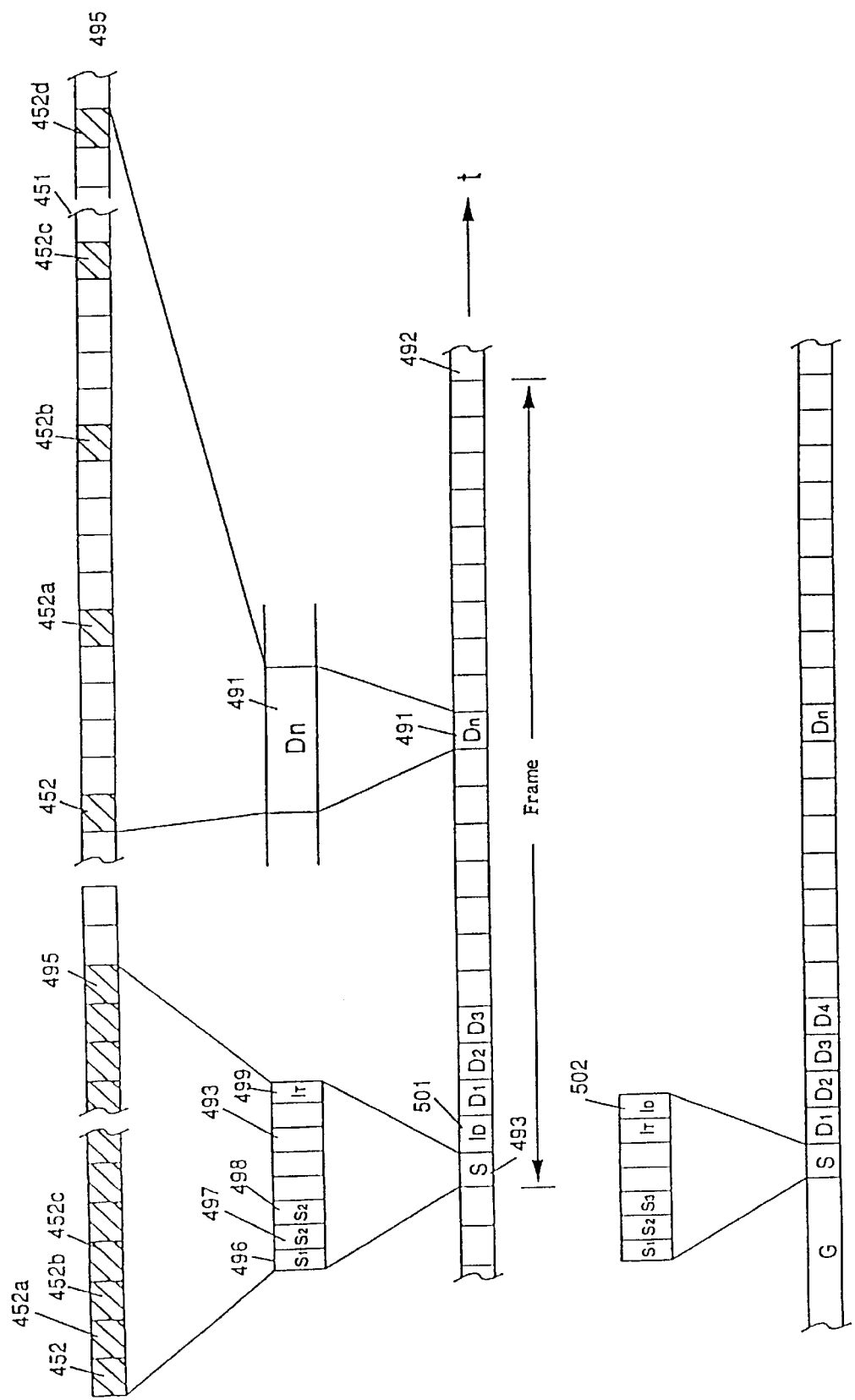
FIG. 41 is a diagram of assignment of data components on a time base according to the third embodiment.

According to the first technique, the eight signal points including 83 and 85 are aligned at angles of $\pi/4$, $3\pi/4$, $5\pi/4$, and $7\pi/4$, as shown in FIG. 38. In action, at least one of the eight signal points is transmitted during sync time slot periods 452, 453, 454, 455 arranged at equal intervals of a time in a time slot gap 451 shown in the time chart of FIG. 38. Any desired signal points are transmitted during the other time slots. The transmitter 1 is also arranged to assign a data for the time slot interval to the sync timing data region 499 of a sync data block, as shown in FIG. 41.

The content of a transmitting signal will be explained in more detail referring to FIG. 41. The time slot group 451 containing the sync time slots 452, 453, 454, 455 represents a unit data stream or block 491 carrying a data of Dn.

The sync time slots in the signal are arranged at equal intervals of a given time determined by the time slot interval or sync timing data. Hence, when the arrangement of the sync time slots is detected, reproduction of carrier waves will be executed slot by slot through extracting the sync timing data from their respective time slots. Such a sync timing data S is contained in a sync block 493 accompanied at the front end of a data frame 492, which consists of a number of the sync time slots denoted by the hatching in FIG. 41. Accordingly, the data to be extracted for carrier wave reproduction are increased, thus allowing the 4 PSK receiver to reproduce desired carrier waves at higher accuracy and efficiency.

The sync block 493 comprises sync data regions 496, 497, 498,—containing sync data S1, S2, S3,—respectively which include unique words and demodulation data. The phase sync signal assignment region 499 is accompanied at the end of the sync block 493, which holds a data of $I_T$ including information about interval arrangement and assignment of the sync time slots.

The signal point data in the phase sync time slot has a particular phase and can thus be reproduced by the 4 PSK receiver. Accordingly, $I_T$ in the phase sync signal assignment region 499 can be retrieved without error thus ensuring the reproduction of carrier waves at accuracy.

As shown in FIG. 41, the sync block 493 is followed by a demodulation data block 501 which contains demodulation data about threshold voltages needed for demodulation of the modified multiple-bit QAM signal. This data is essential for demodulation of the multiple-bit QAM signal and may preferably be contained in a region 502 which is a part of the sync block 493 for ease of retrieval.

Figure 42:
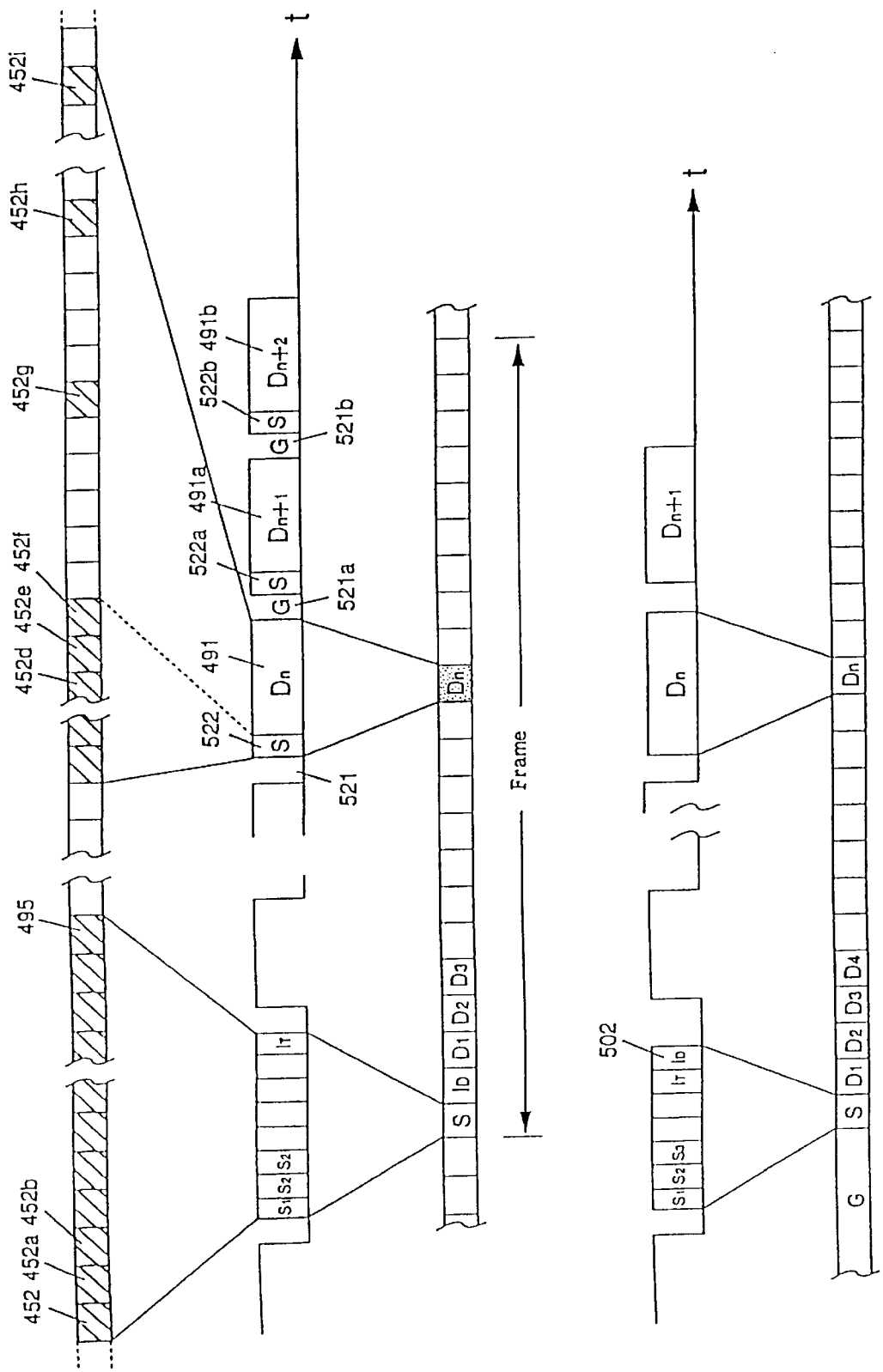
FIG. 42 is a diagram of assignment of data components on a time base in TDMA action according to the third embodiment.

FIG. 42 shows the assignment of signal data for transmission of burst form signals through a TDMA method.

The assignment is distinguished from that of FIG. 41 by the fact that a guard period 521 is inserted between any two adjacent Dn data blocks 491, 491 for interruption of the signal transmission. Also, each data block 491 is accompanied at front end a sync region 522 thus forming a data block 492. During the sync region 522, the signal points at a phase of $(2n-1)\pi/4$ are only transmitted. Accordingly, the carrier wave reproduction will be feasible with the 4 PSK receiver. More specifically, the sync signal and carrier waves can be reproduced through the TDMA method.

Figure 43:
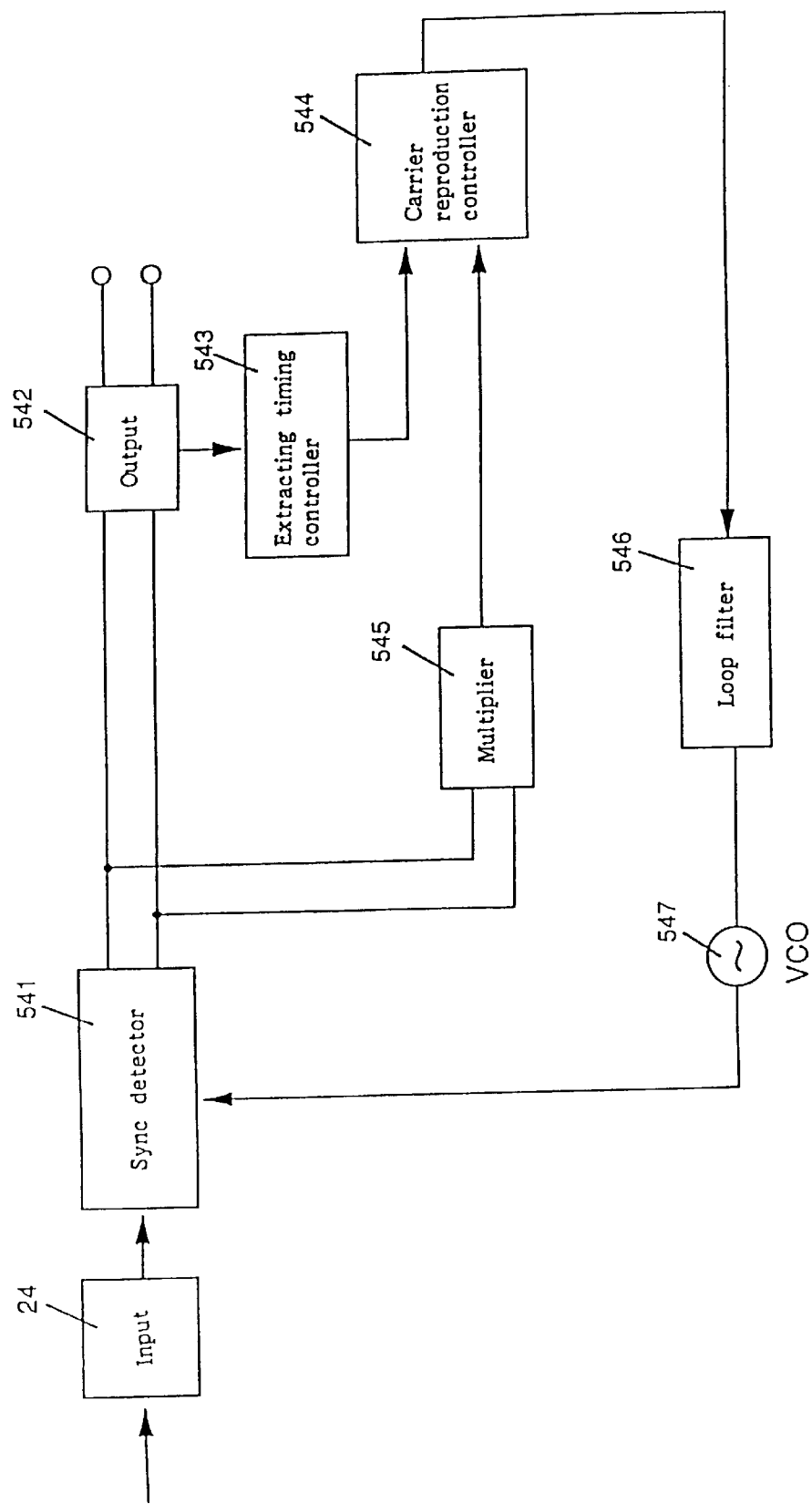
FIG. 43 is a block diagram of a carrier reproducing circuit of the third embodiment.
Figure 44:
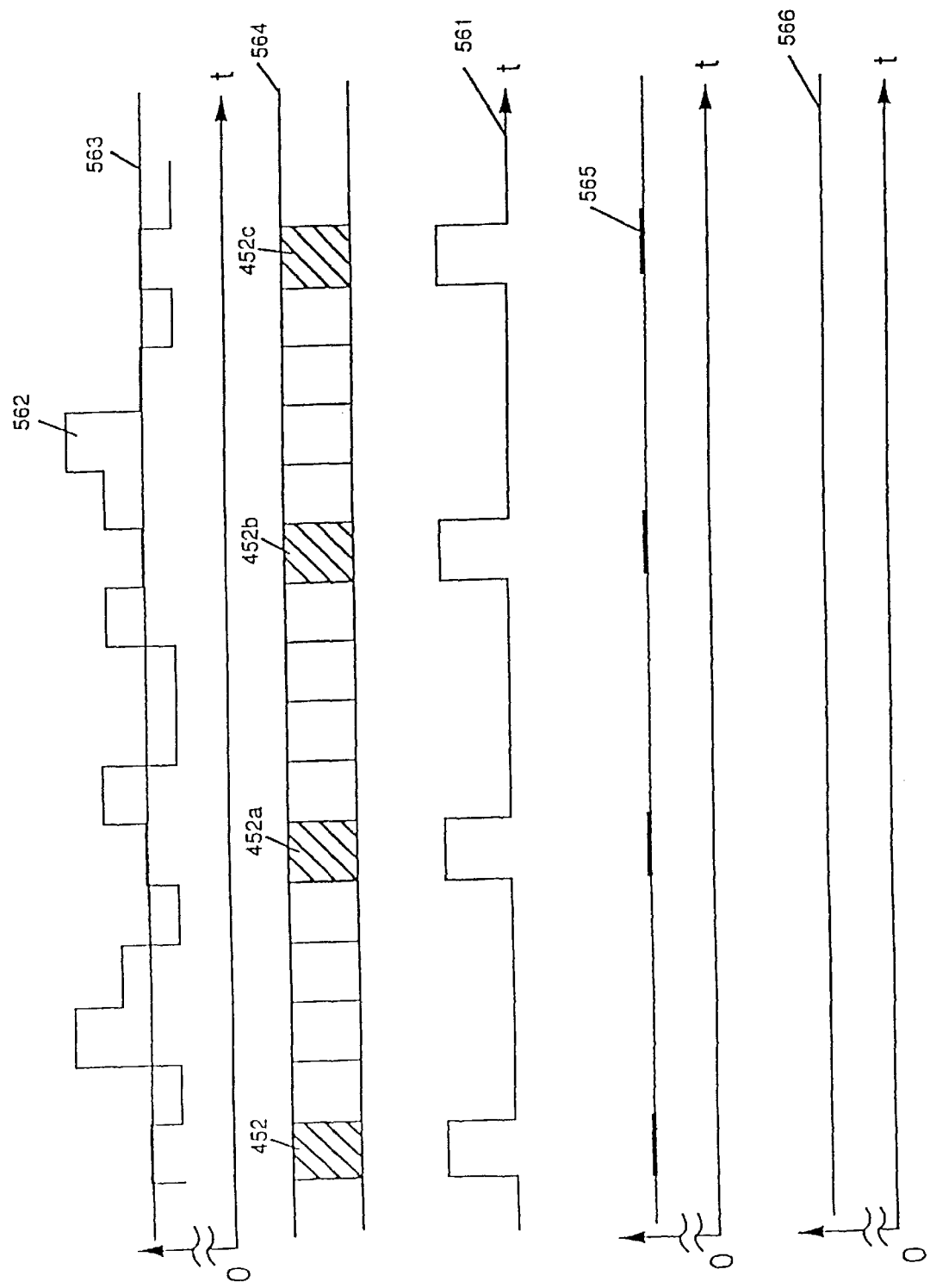
FIG. 44 is a diagram showing the principle of carrier wave reproduction according to the third embodiment.

The carrier wave reproduction of the first receiver 23 shown in FIG. 19 will be explained in more detail referring to FIGS. 43 and 44. As shown in FIG. 43, an input signal is fed through the input unit 24 to a sync detector circuit 541 where it is sync detected. A demodulated signal from the sync detector 541 is transferred to an output circuit 542 for reproduction of the first data stream. A data of the phase sync signal assignment data region 499 (shown in FIG. 41) is retrieved with an extracting timing controller circuit 543 so that the timing of sync signals of $(2n-1)\pi/4$ data can be acknowledged and transferred as a phase sync control pulse 561 shown in FIG. 44 to a carrier reproduction controlling circuit 544. Also, the demodulated signal of the sync detector circuit 541 is fed to a frequency multiplier circuit 545 where it is 4× multiplied prior to transmitted to the carrier reproduction controlling circuit 544. The resultant signal denoted by 562 in FIG. 44 contains a true phase data 563 and other data. As illustrated in a time chart 564 of FIG. 44, the phase sync time slots 452 carrying the $(2n-1)\pi/4$ data are also contained at equal intervals. At the carrier reproducing controlling circuit 544, the signal 562 is sampled by the phase sync control pulse 561 to produce a phase sample signal 565 which is then converted through sample-hold action to a phase signal 566. The phase signal 566 of the carrier reproduction controlling circuit 544 is fed across a loop filter 546 to a VCO 547 where its relevant carrier wave is reproduced. The reproduced carrier is then sent to the sync detector circuit 541.

Figure 39:
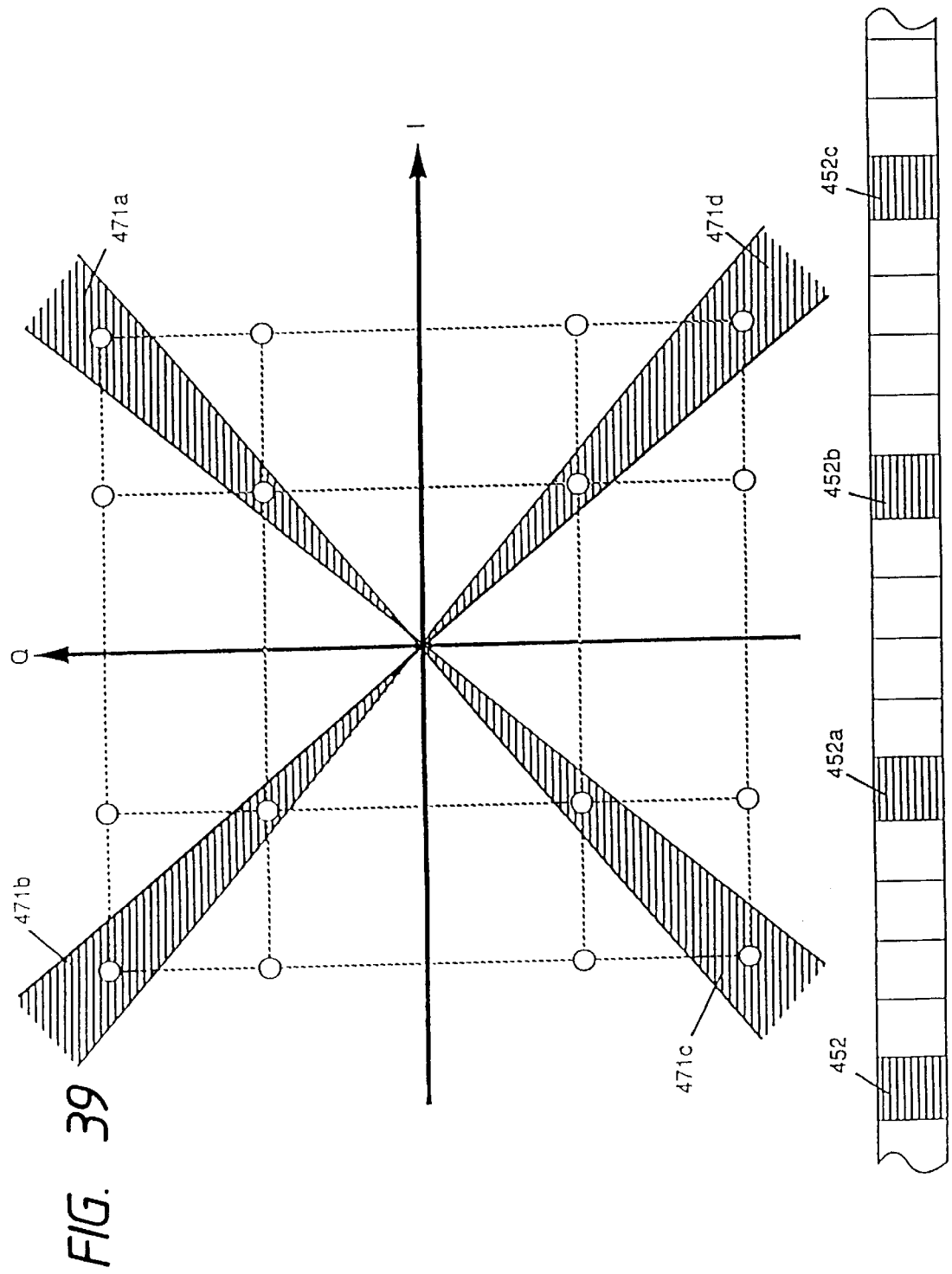
FIG. 39 is a vector diagram of the modified 16 QAM signal of the third embodiment.

In this manner, the signal point data of the $(2n-1)\pi/4$ phase denoted by the shaded areas in FIG. 39 is recovered and utilized so that a correct carrier wave can be reproduced by 4× or 16× frequency multiplication. Although a plurality of phases are reproduced at the time, the absolute phases of the carrier can be successfully be identified with the used of a unique word assigned to the sync region 496 shown in FIG. 41.

Figure 40:
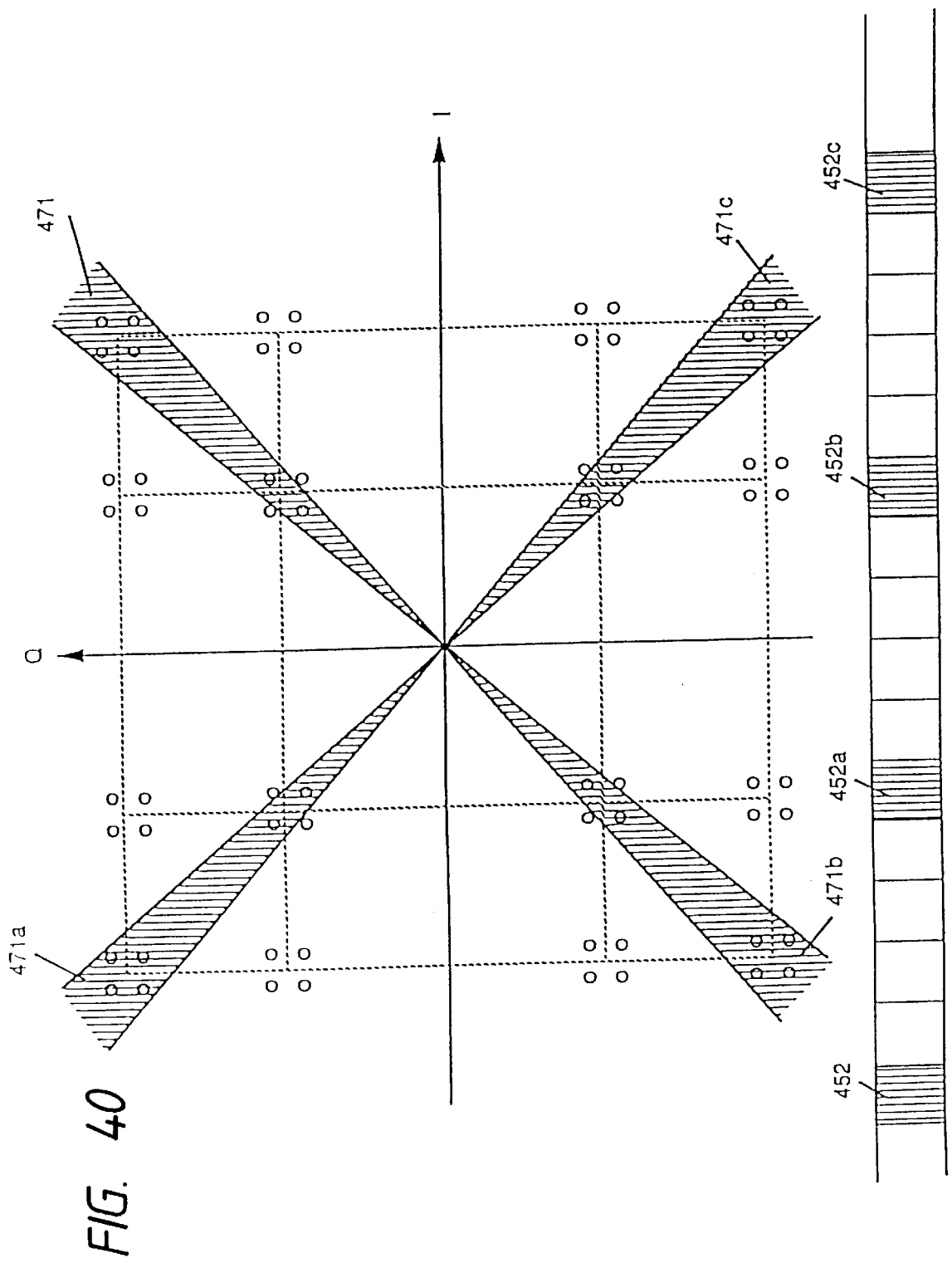
FIG. 40 is a vector diagram of a modified 64 QAM signal of the third embodiment.

For transmission of a modified 64 QAM signal such as shown in FIG. 40, signal points in the phase sync areas 471 at the $(2-1)\pi/4$ phase denoted by the hatching are assigned to the sync time slots 452, 452b, etc. Its carrier can hardly be reproduced with a common 4 PSK receiver but successfully with the first receiver 23 of 4 PSK mode provided with the carrier reproducing circuit of the embodiment.

The foregoing carrier reproducing circuit is of COSTAS type. A carrier reproducing circuit of reverse modulation type will now be explained according to the embodiment.

Figure 45:
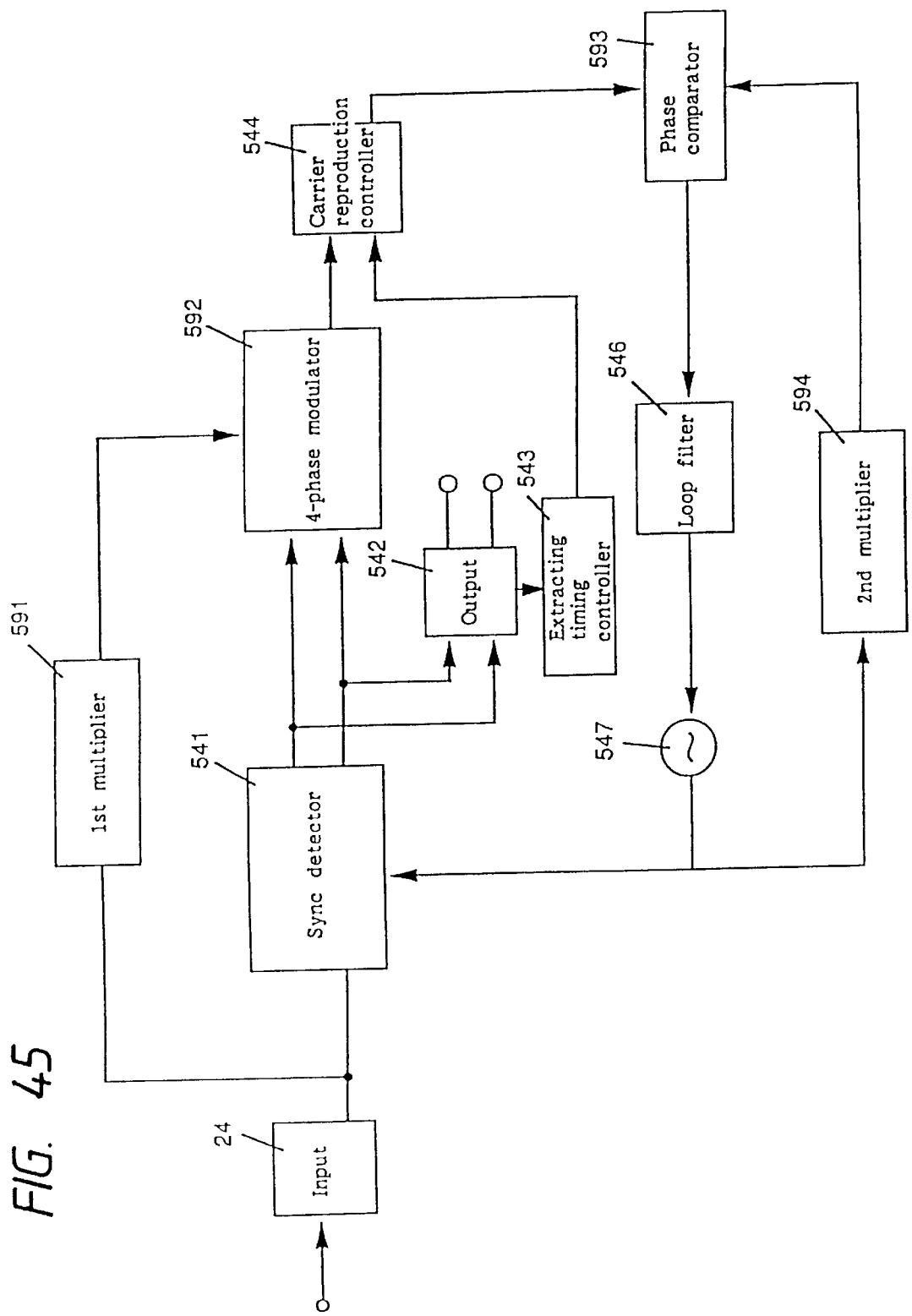
FIG. 45 is a block diagram of a carrier reproducing circuit for reverse modulation of the third embodiment.

FIG. 45 shows a reverse modulation type carrier reproducing circuit according to the present invention, in which a received signal is fed from the input unit 24 to a sync detector circuit 541 for producing a demodulated signal. Also, the input signal is delayed by a first delay circuit 591 to a delay signal. The delay signal is then transferred to a quadrature phase modulator circuit 592 where it is reverse demodulated by the demodulated signal from the sync detector circuit 541 to a carrier signal. The carrier signal is fed through a carrier reproduction controller circuit 544 to a phase comparator 593. A carrier wave produced by a VCO 547 is delayed by a second delay circuit 594 to a delay signal which is also fed to the phase comparator 593. At the phase comparator 594, the reverse demodulated carrier signal is compared in phase with the delay signal thus producing a phase difference signal. The phase difference signal sent through a loop filter 546 to the VCO 547 which in turn produces a carrier wave arranged in phase with the received carrier wave. In the same manner as of the COSTAS carrier reproducing circuit shown in FIG. 43, an extracting timing controller circuit 543 performs sampling of signal points contained in the hatching areas of FIG. 39. Accordingly, the carrier wave of a 16 or 64 QAM signal can be reproduced with the 4 PSK demodulator of the first receiver 23.

Figure 46:
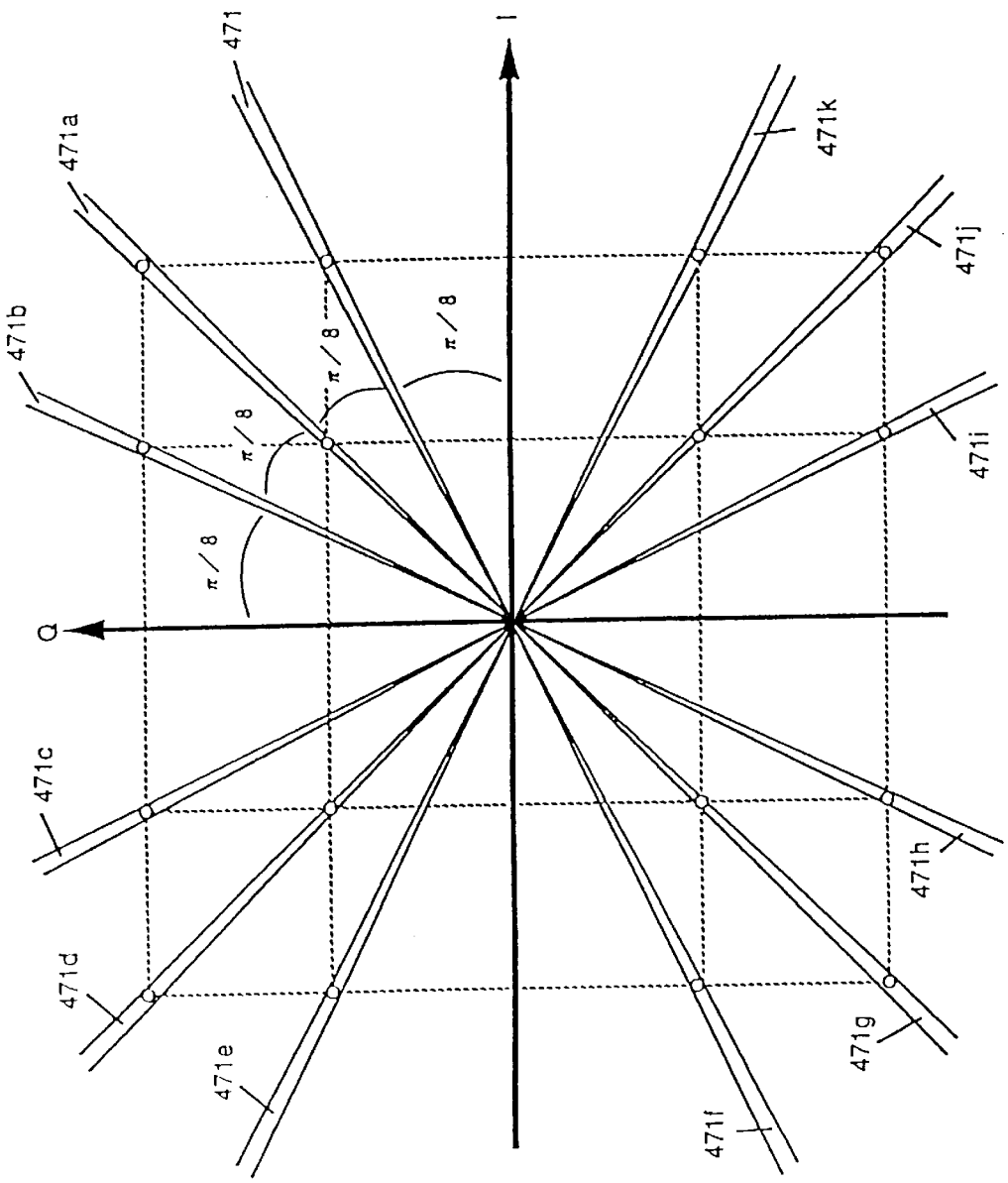
FIG. 46 is a diagram showing an assignment of signal points of the 16 QAM signal of the third embodiment.

The reproduction of a carrier wave by 16× frequency multiplication will be explained. The transmitter 1 shown in FIG. 1 is arranged to modulate and transmit a modified 16 QAM signal with assignment of its signal points at $n\pi/8$ phase as shown in FIG. 46. At the first receiver 23 shown in FIG. 19, the carrier wave can be reproduced with its COSTAS carrier reproduction controller circuit containing a 16× multiplier circuit 661 shown in FIG. 48. The signal points at each $n\pi/8$ phase shown in FIG. 46 are processed at the first quadrant b the action of the 16× multiplier circuit 661, whereby the carrier will be reproduced by the combination of a loop filter 546 and a VCO 541. Also, the absolute phase may be determined from 16 different phases by assigning a unique word to the sync region.

Figure 48:
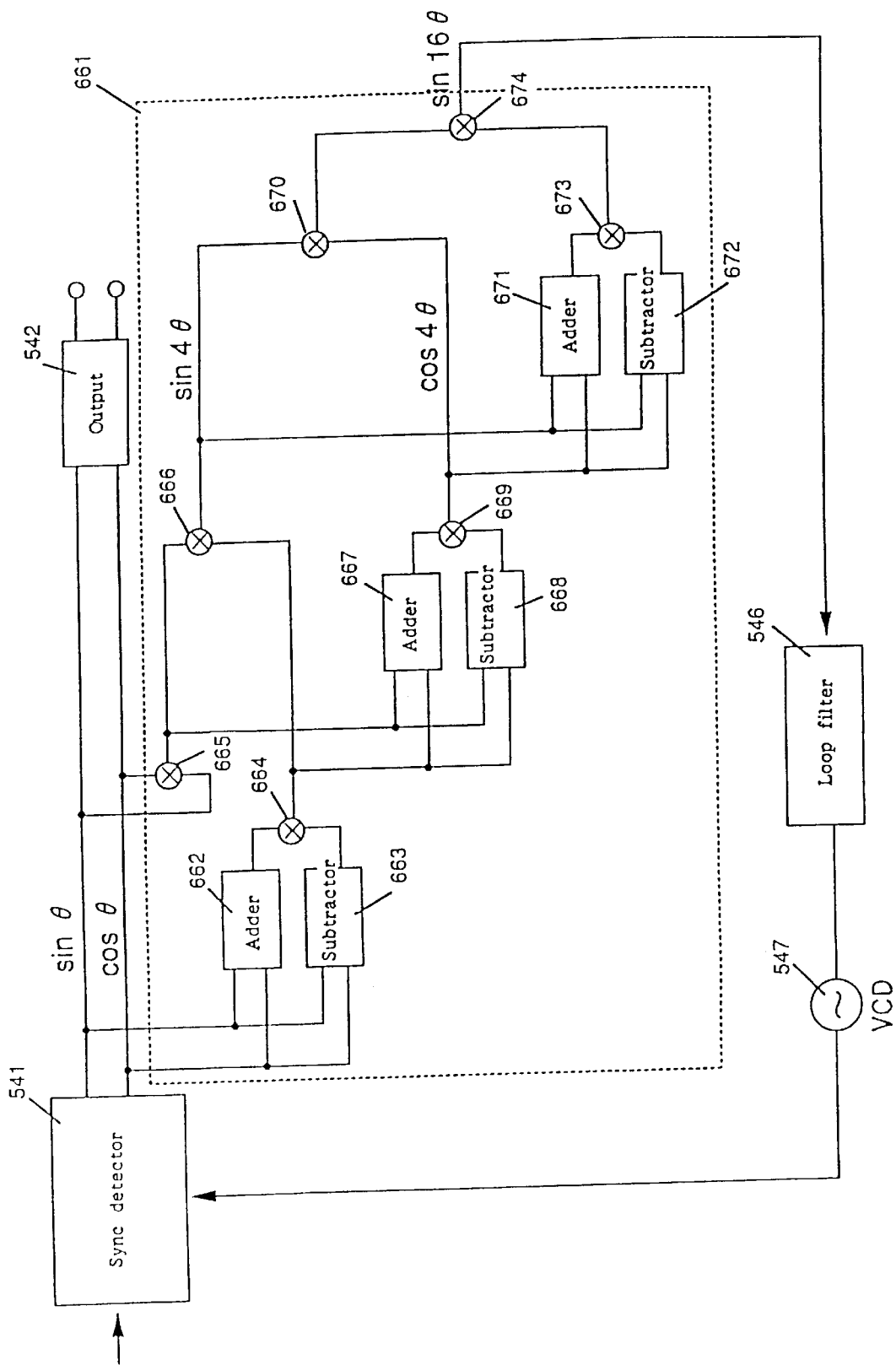
FIG. 48 is a block diagram of a carrier reproducing circuit for 16× multiplication of the third embodiment.

The arrangement of the 16× multiplier circuit will be explained referring to FIG. 48. A sum signal and a difference signal are produced from the demodulated signal by an adder circuit 662 and a subtracter circuit 663 respectively and then, multiplied each other by a multiplier 664 to a cos 2θ signal. Also, a multiplier 665 produces a sin 2θ signal. The two signals are then multiplied by a multiplier 666 to a sin 4θ signal.

Similarly, a sin 8θ signal is produced from the two, sin 2θ and cos 2θ, signals by the combination of an adder circuit 667, a subtracter circuit 668, and a multiplier 670. Furthermore, a sin 16θ signal is produced by the combination of an adder circuit 671, a subtracter circuit 672, and a multiplier 673. Then, the 16× multiplication is completed.

Through the foregoing 16× multiplication, the carrier wave of all the signal points of the modified 16 QAM signal shown in FIG. 46 will successfully be reproduced without extracting particular signal points.

Figure 47:
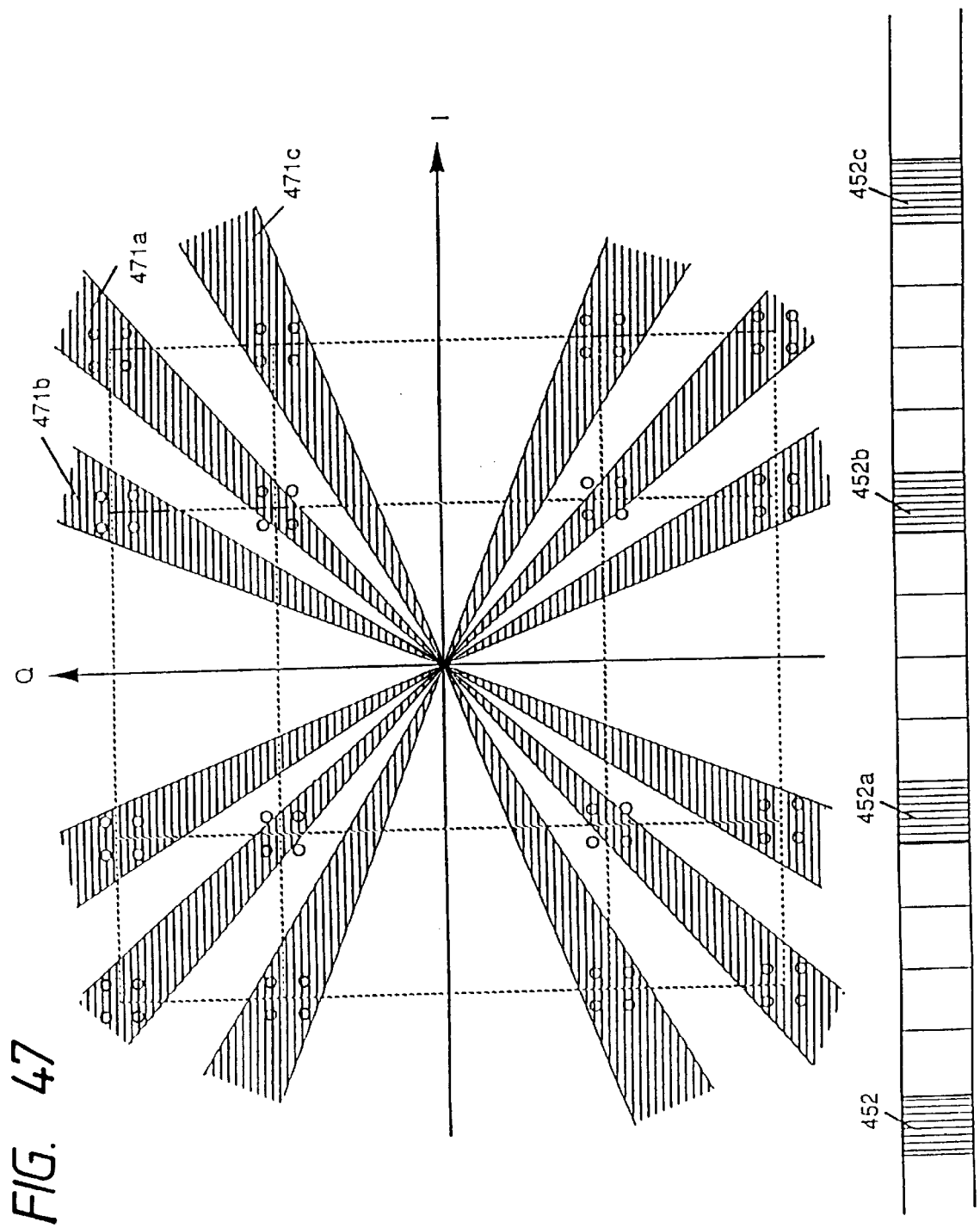
FIG. 47 is a diagram showing an assignment of signal points of the 64 QAM signal of the third embodiment.

However, reproduction of the carrier wave of the modified 64 QAM signal shown in FIG. 47 can involve an increase in the error rate due to dislocation of some signal points from the sync areas 471.

Two techniques are known for compensation for the consequences. One is inhibiting transmission of the signal points dislocated from the sync areas. This causes the total amount of transmitted data to be reduced but allows the arrangement to be facilitated. The other is providing the sync time slots as described in FIG. 38. In more particular, the signal points in the nπ/8 sync phase areas, e.g. 471 and 471a, are transmitted during the period of the corresponding sync time slots in the time slot group 451. This triggers an accurate synchronizing action during the period thus minimizing phase error.

As now understood, the 16× multiplication allows the simple 4 PSK receiver to reproduce the carrier wave of a modified 16 or 64 QAM signal. Also, the insertion of the sync time slots causes the phasic accuracy to be increased during the reproduction of carrier waves from a modified 64 QAM signal.

As set forth above, the signal transmission system of the present invention is capable of transmitting a plurality of data on a single carrier wave simultaneously in the multiple signal level arrangement.

More specifically, three different level receivers which have discrete characteristics of signal intercepting sensitivity and demodulating capability are provided in relation to one single transmitter so that any one of them can be selected depending on a wanted data size to be demodulated which is proportional to the price. When the first receiver of low resolution quality and low price is acquired together with a small antenna, its owner can intercept and reproduce the first data stream of a transmission signal. When the second receiver of medium resolution quality and medium price is acquired together with a medium antenna, its owner can intercept and reproduce both the first and second data streams of the signal. When the third receiver of high resolution quality and high price is acquired with a large antenna, its owner can intercept and reproduce all the first, second, and third data streams of the signal.

If the first receiver is a home-use digital satellite broadcast receiver of low price, it will overwhelmingly be welcome by a majority of viewers. The second receiver accompanied with the medium antenna costs more and will be accepted by not common viewers but particular people who wants to enjoy HDTV services. The third receiver accompanied with the large antenna at least before the satellite output is increased, is not appropriated for home use and will possibly be used in relevant industries. For example, the third data stream carrying super HDTV signals is transmitted via a satellite to subscriber cinemas which can thus play video tapes rather than traditional movie films and run movies business at low cost.

When the present invention is applied to a TV signal transmission service, three different quality pictures are carried on one signal channel wave and will offer compatibility with each other. Although the first embodiment refers to a 4 PSK, a modified 8 QAM, a modified 16 QAM, and a modified 64 QAM signal, other signals will also be employed with equal success including a 32 QAM, a 256 QAM, an 8 PSK, a 16 PSK, a 32 PSK signal. It would be understood that the present invention is not limited to a satellite transmission system and will be applied to a terrestrial communications system or a cable transmission system.

Embodiment 2

A second embodiment of the present invention is featured in which the physical multi-level arrangement of the first embodiment is divided into small levels through e.g. discrimination in error correction capability, thus forming a logic multi-level construction. In the first embodiment, each multi-level channel has different levels in the electric signal amplitude or physical demodulating capability. The second embodiment offers different levels in the logic reproduction capability such as error correction. For example, the data $D_1$ in a multi-level channel is divided into two, $D_{1-1}$ and $D_{1-2}$, components and $D_{1-1}$ is more increased in the error correction capability than $D_{1-2}$ for discrimination. Accordingly, as the error detection and correction capability is different between $D_{1-1}$ and $D_{1-2}$ at demodulation, $D_{1-1}$ can successfully be reproduced within a given error rate when the C/N level of an original transmitting signal is by so low as disable the reproduction of $D_{1-2}$. This will be implemented using the logic multi-level arrangement.

More specifically, the logic multi-level arrangement consists of dividing data of a modulated multi-level channel and discriminating distances between error correction codes by mixing error correction codes with product codes for varying error correction capability. Hence, a more multi-level signal can be transmitted.

In fact, a $D_1$ channel is divided into two sub channels $D_{1-1}$ and $D_{1-2}$ and a $D_2$ channel is divided into two sub channels $D_{2-1}$ and $D_{2-2}$.

Figure 85:
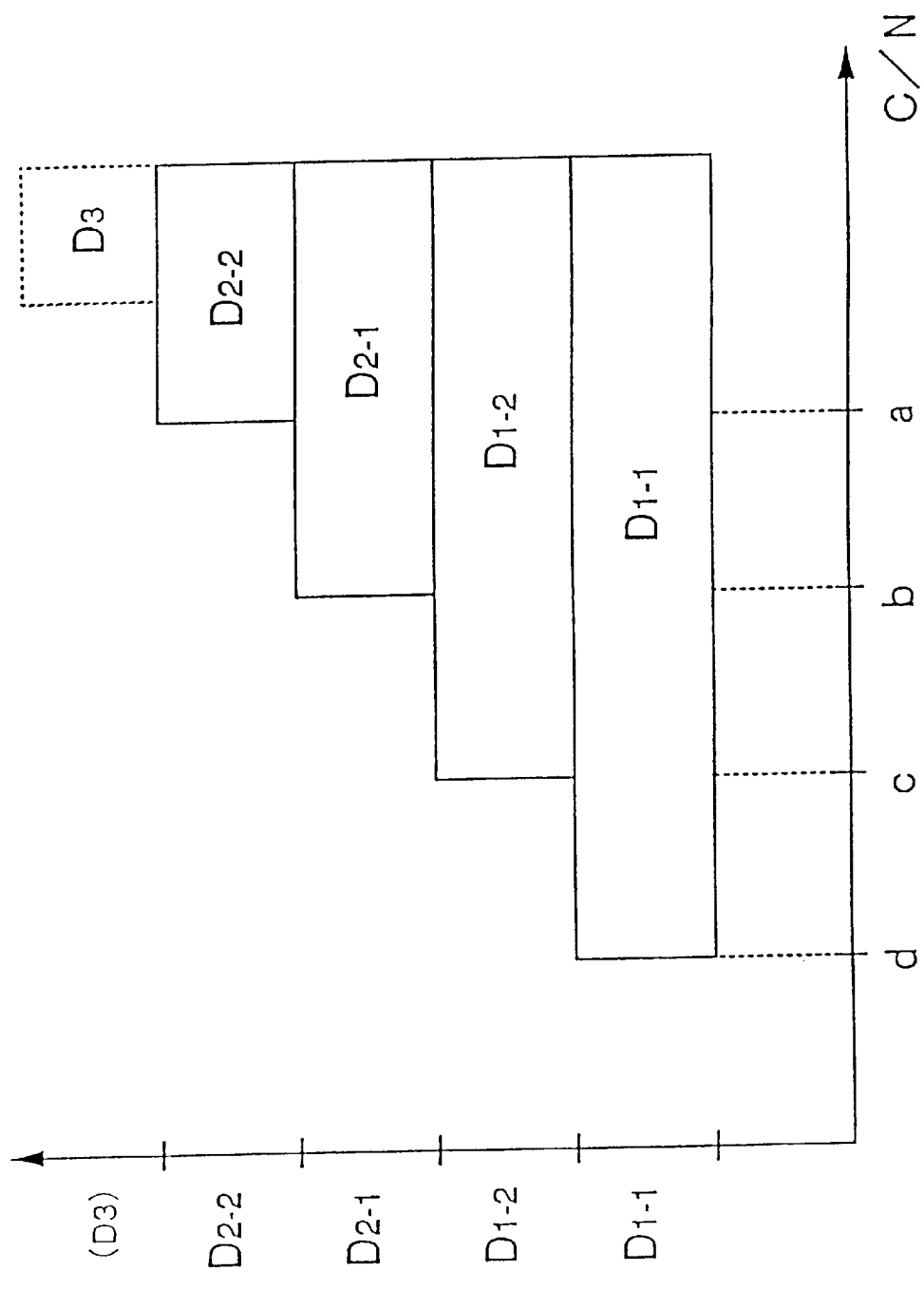
FIG. 85 is a graphic diagram showing the relation between C/N and level according to the second embodiment.
Figure 86:
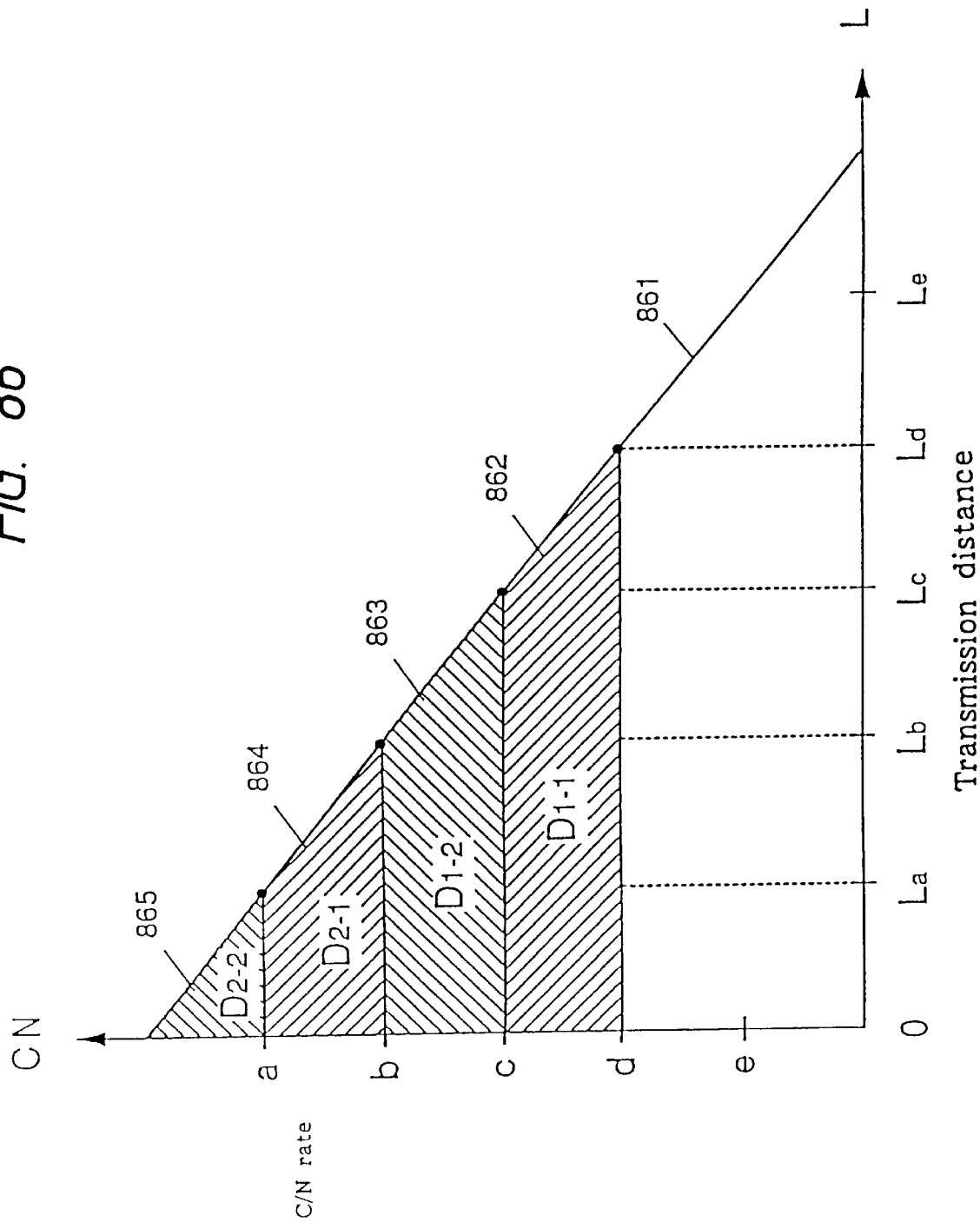
FIG. 86 is a graphic diagram showing the relation between C/N and transmission distance according to the second embodiment.
Figure 87:
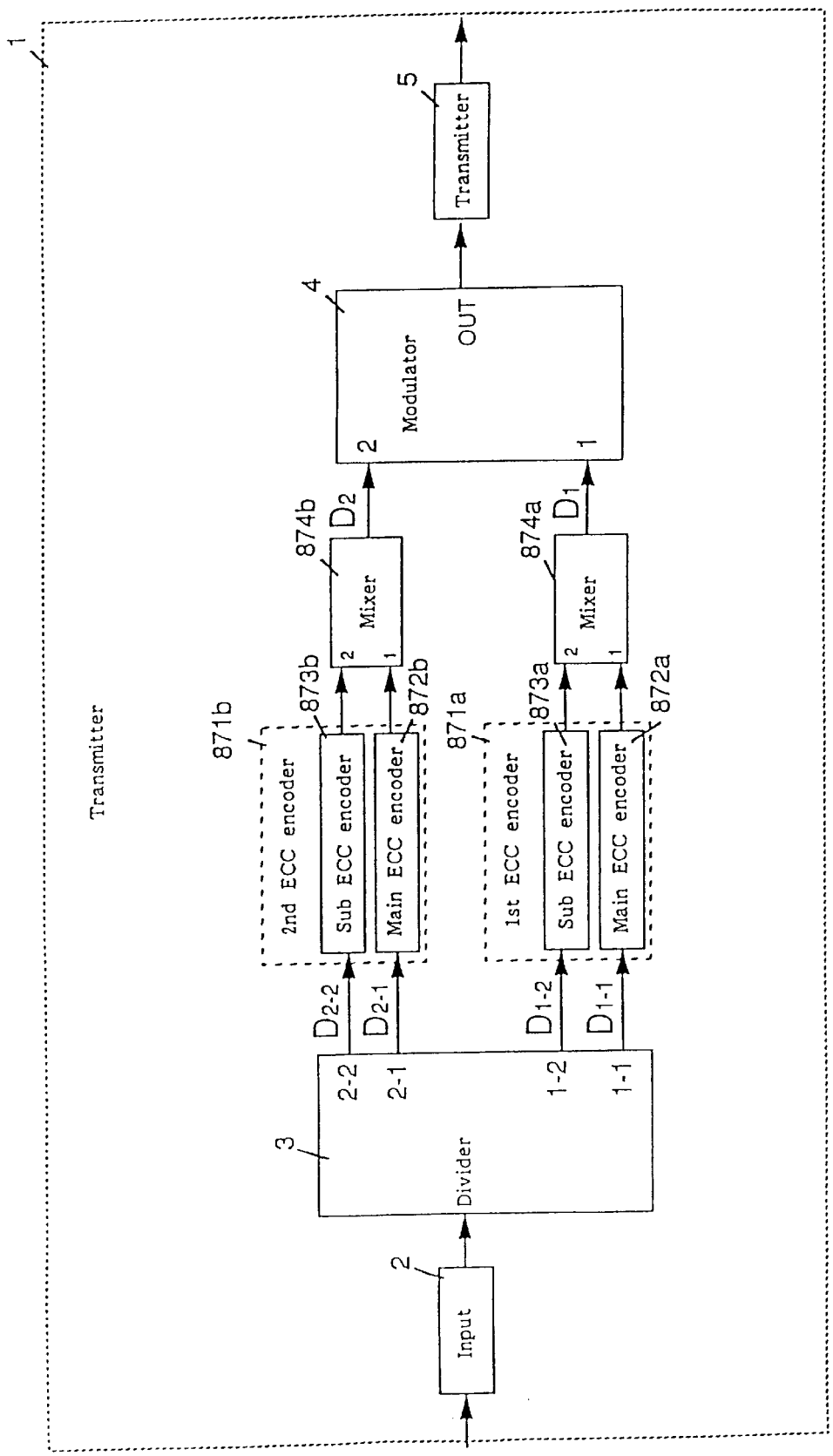
FIG. 87 is a block diagram of a transmission of the second embodiment.

This will be explained in more detail referring to FIG. 87 in which $D_{1-1}$ is reproduced from a lowest C/N signal. If the C/N rate is d at minimum, three components $D_{1-2}$, $D_{2-1}$ and $D_{2-2}$ cannot be reproduced while $D_{1-1}$ is reproduced. If C/N is not less than c, $D_{1-2}$ can also be reproduced. Equally, when C/N is b, $D_{2-1}$ is reproduced and when C/N is a, $D_{2-2}$ is reproduced. As the C/N rate increases, the reproducible signal levels are increased in number. The lower the C/N, the fewer the reproducible signal levels. This will be explained in the form of relation between transmitting distance and reproducible C/N value referring to FIG. 86. In common, the C/N value of a received signal is decreased in proportion to the distance of transmission as expressed by the real line 861 in FIG. 86. It is now assumed that the distance from a transmitter antenna to a receiver antenna is La when C/N=a, Lb when C/N=b, Lc when C/N=c, Ld when C/N=d, and Le when C/N=e. If the distance from the transmitter antenna is greater than Ld, $D_{1-1}$ can be reproduced as shown in FIG. 85 where the receivable area 862 is denoted by the hatching. In other words, $D_{1-1}$ can be reproduced within a most extended area. Similarly, $D_{1-2}$ can be reproduced in an area 863 when the distance is not more than Lc. In this area 863 containing the area 862, $D_{1-1}$ can with no doubt be reproduced. In a small area 854, $D_{2-1}$ can be reproduced and in a smallest area 865, $D_{2-2}$ can be reproduced. As understood, the different data levels of a channel can be reproduced corresponding to degrees of declination in the C/N rate. The logic multi-level arrangement of the signal transmission system of the present invention can provide the same effect as of a traditional analogue transmission system in which th amount of receivable data is gradually lowered as the C/N rate decreases.

The construction of the logic multi-level arrangement will be described in which there are provided two physical levels and two logic levels. FIG. 87 is a block diagram of a transmitter 1 which is substantially identical in construction to that shown in FIG. 2 and described previously in the first embodiment and will no further be explained in detail. The only difference is that error correction code encoders are added as abbreviated to ECC encoders. The divider circuit 3 has four outputs 1-1, 1-2, 2-1, and 2-2 through which four signals $D_{1-1}$, $D_{1-2}$, $D_{2-1}$, and $D_{2-2}$ divided from an input signal are delivered. The two signals $D_{1-1}$ and $D_{1-2}$ are fed to two, main and sub, ECC encoders 872a, 873a of a first ECC encoder 871a respectively for converting to error correction code forms.

The main ECC encoder 872a has a higher error correction capability than that of the sub ECC encoder 873a. Hence, $D_{1-1}$ can be reproduced at a lower rate of C/N than $D_{1-2}$ as apparent from the CN-level diagram of FIG. 85. More particularly, the logic level of $D_{1-1}$ is less affected by declination of the C/N than that of $D_{1-2}$. After error correction code encoding, $D_{1-1}$ and $D_{1-2}$ are summed by a summer 874a to a $D_1$ signal which is then transferred to the modulator 4. The other two signals $D_{2-1}$ and $D_{2-2}$ of the divider circuit 3 are error correction encoded by two, main and sub, ECC encoders 872b, 873b of a second ECC encoder 871b respectively and then, summed by a summer 874b to a $D_2$ signal which is transmitted to the modulator 4. The main ECC encoder 872b is higher in the error correction capability than the sub ECC encoder 873b. The modulator 4 in turn produces from the two, $D_1$ and $D_2$, input signals a multi-level modulated signal which is further transmitted from the transmitter unit 5. As understood, the output signal from the transmitter 1 has two physical levels $D_1$ and $D_2$ and also, four logic levels $D_{1-1}, D_{1-2}, D_{2-1}$, and $D_{2-2}$ based on the two physical levels for providing different error correction capabilities.

Figure 88:
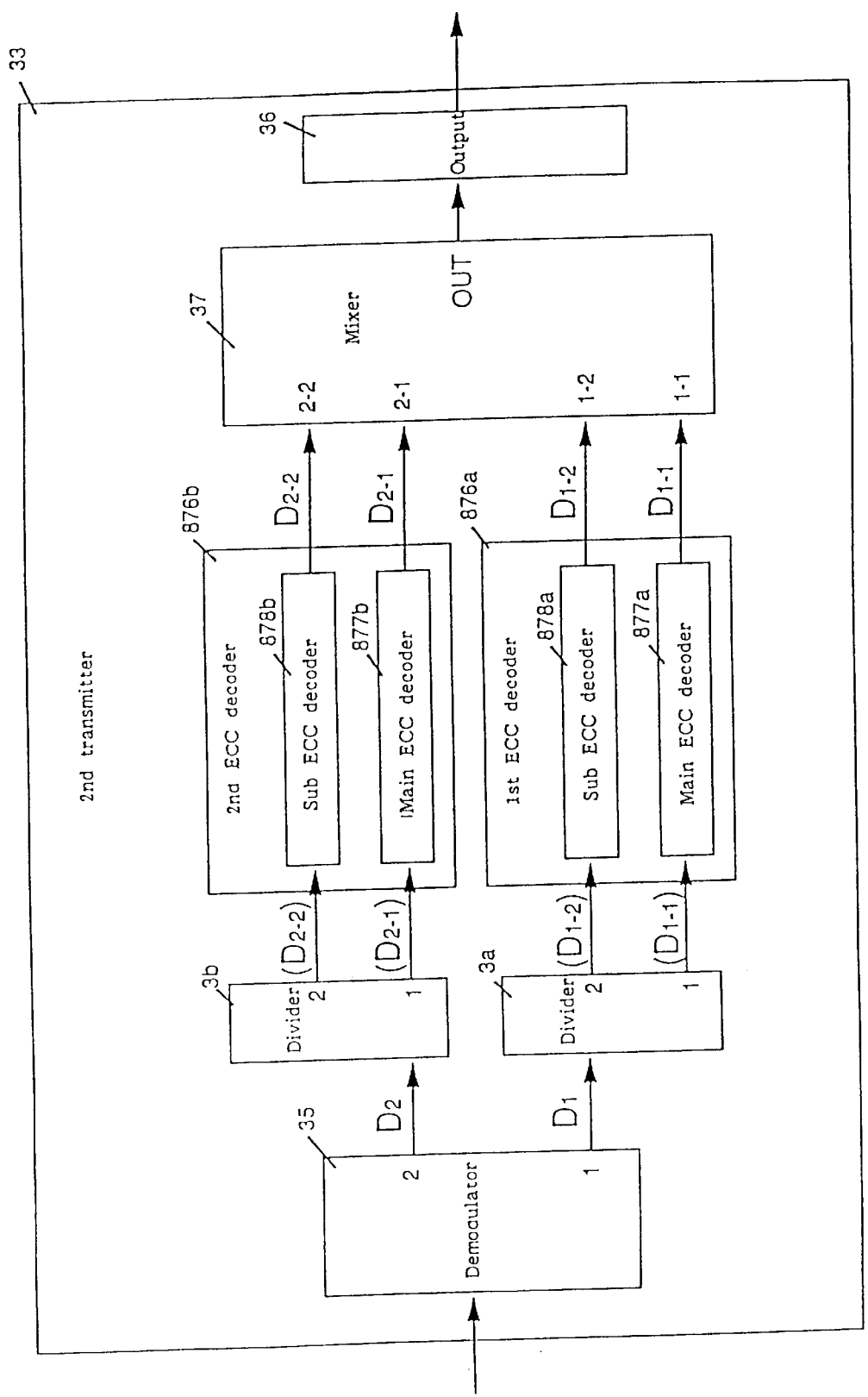
FIG. 88 is a block diagram of a receiver of the second embodiment.

The reception of such a multi-level signal will be explained. FIG. 88 is a block diagram of a second receiver 33 which is almost identical in construction to that shown in FIG. 21 and described in the first embodiment. The second receiver 33 arranged for intercepting multi-level signals from the transmitter 1 shown in FIG. 87 further comprises a first 876a and a second ECC decoder 876b, in which the demodulation of QAM, or any of ASK, PSK, and FSK if desired, is executed.

As shown in FIG. 88, a receiver signal is demodulated by the demodulator 35 to the two, $D_1$ and $D_2$, signals which are then fed to two dividers 3a and 3b respectively where they are divided into four logic levels $D_{1-1}, D_{1-2}, D_{2-1}$ and $D_{2-2}$. The four signals are transferred to the first 876a and the second ECC decoder 876b in which $D_{1-1}$ is error corrected by a main ECC decoder 877a, $D_{1-2}$ by a sub ECC decoder 878a, $D_{2-1}$ by a main ECC decoder 877b, $D_{2-2}$ by a sub ECC decoder 878b before all sent to the summer 37. At the summer 37, the four, $D_{1-1}, D_{1-2}, D_{2-2}$, and $D_{2-2}$, error corrected signals are summed to a signal which is then delivered from the output unit 36.

Since $D_{1-1}$ and $D_{2-1}$ are higher in the error correction capability than $D_{1-2}$ and $D_{2-2}$ respectively, the error rate remains less than a given value although C/N is fairly low as shown in FIG. 85 and thus, an original signal will be reproduced successfully.

The action of discriminating the error correction capability between the main ECC decoders 877a, 877b and the sub ECC decoders 878a, 878b will now be described in more detail. It is a good idea for having a difference in the error correction capability to use in the sub ECC decoder a common coding technique, e.g. Reed-Solomon or BCH method, having a standard code distance and in the main ECC decoder, another encoding technique in which the distance between correction codes is increased using Reed-Solomon codes, their product codes, or other long-length codes. A variety of known techniques for increasing the error correction code distance have been introduced and will no more explained. The present invention can be associated with any known technique for having the logic multi-level arrangement.

Figure 89:
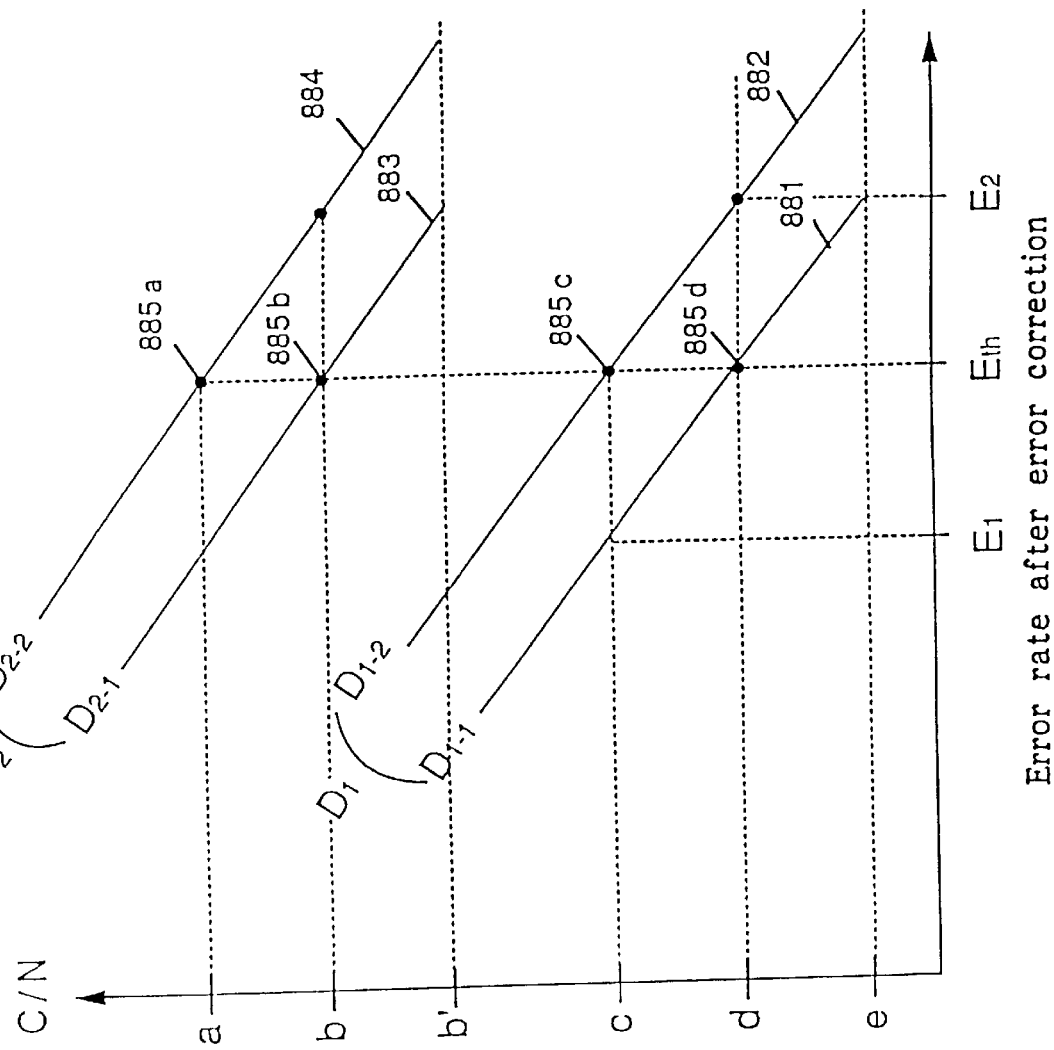
FIG. 89 is a graphic diagram showing the relation between C/N and error rate according to the second embodiment.

The logic multi-level arrangement will be explained in conjunction with a diagram of FIG. 89 showing the relation between C/N and error rate after error correction. As shown, the straight line 881 represents $D_{1-1}$ at the C/N and error rate relation and the line 882 represents $D_{1-2}$ at same.

As the C/N rate of an input signal decreases, the error rate increases after error correction. If C/N is lower than a given value, the error rate exceeds a reference value Eth determined by the system design standards and no original data will normally be reconstructed. When C/N is lowered to less than e, the $D_1$ signal fails to be reproduced as expressed by the line 881 of $D_{1-1}$ in FIG. 89. When e≦C/N<d, $D_{1-1}$ of the $D_1$ signal exhibits a higher error rate than Eth and will not be reproduced.

When C/N is d at the point 885d, $D_{1-1}$ having a higher error correction capability than $D_{1-2}$ becomes not higher in the error rate than Eth and can be reproduced. At the time, the error rate of $D_{1-2}$ remains higher than Eth after error correction and will no longer be reproduced.

When C/N is increased up to c at the point 885c, $D_{1-2}$ becomes not higher in the error rate than Eth and can be reproduced. At the time, $D_{2-1}$ and $D_{2-2}$ remain in no demodulation state. After the C/N rate is increased further to b', the $D_2$ signal becomes ready to be demodulated.

When C/N is increased to b at the point 885b, $D_{2-1}$ of the $D_2$ signal becomes not higher in the error rate than Eth and can be reproduced. At the time, the error rate of $D_{2-2}$ remains higher than Eth and will not be reproduced. When C/N is increased up to a at the point 885a, $D_{2-2}$ becomes not higher than Eth and can be reproduced.

As described above, the four different signal logic levels divided from two, $D_1$ and $D_2$, physical levels through discrimination of the error correction capability between the levels, can be transmitted simultaneously.

Using the logic multi-level arrangement of the present invention in accompany with a multi-level construction in which at least a part of the original signal is reproduced even if data in a higher level is lost, digital signal transmission will successfully be executed without losing the advantageous effect of an analogue signal transmission in which transmitting data is gradually decreased as the C/N rate becomes low.

Thanking to up-to-data image data compression techniques, compressed image data can be transmitted in the logic multi-level arrangement for enabling a receiver station to reproduce a higher quality image than that of an analogue system and also, with not sharply but at steps declining the signal level for ensuring signal interception in a wider area. The present invention can provide an extra effect of the multi-layer arrangement which is hardly implemented by a known digital signal transmission system without deteriorating high quality image data.

Embodiment 3

A third embodiment of the present invention will be described referring to the relevant drawings.

Figure 29:
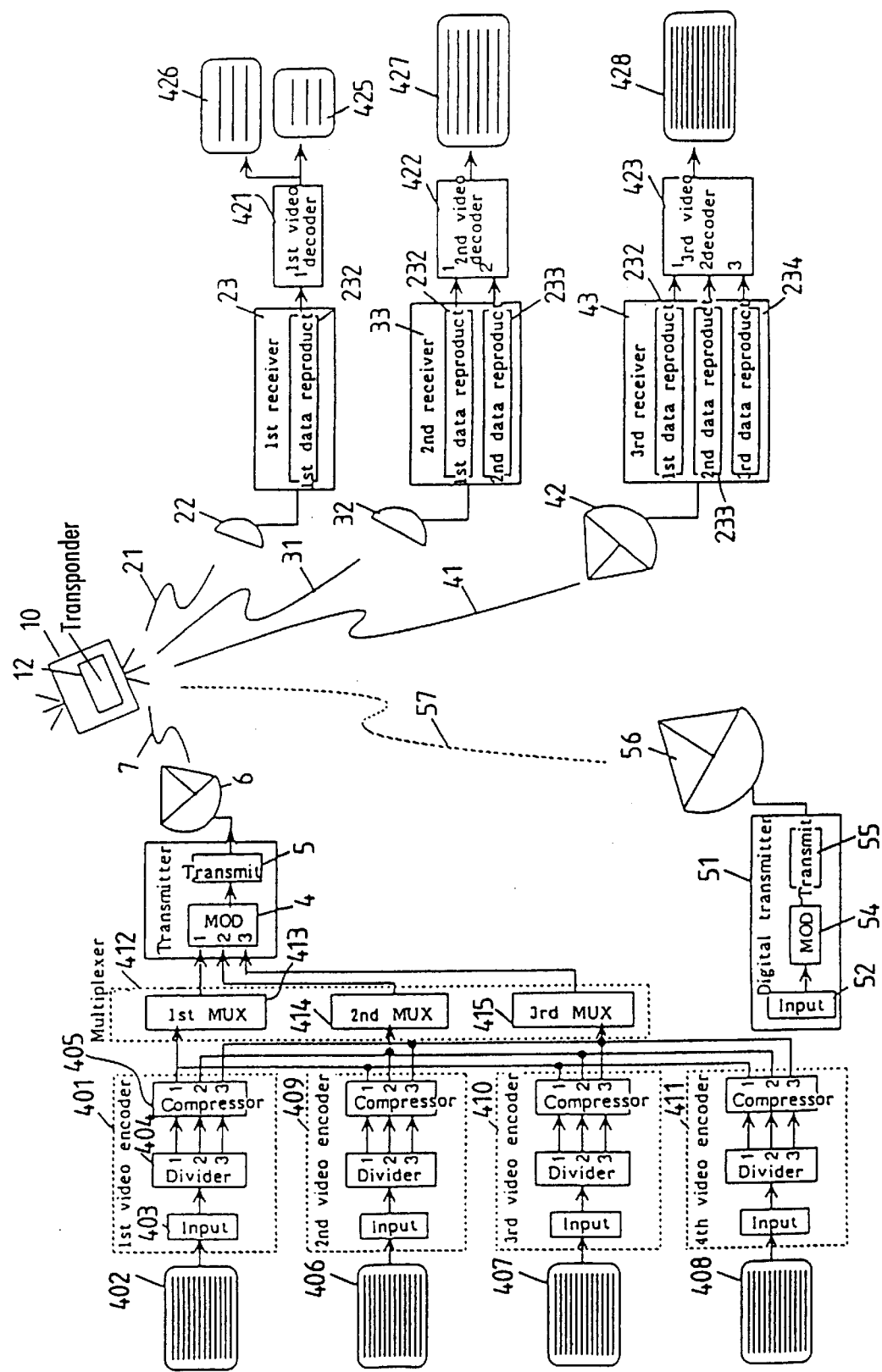
FIG. 29 is a schematic view of the entire arrangement of a signal transmission system showing a third embodiment of the present invention.

FIG. 29 is a schematic total view illustrating the third embodiment in the form of a digital TV broadcasting system. An input video signal 402 of super high resolution TV image is fed to an input unit 403 of a first video encoder 401. Then, the signal is divided by a divider circuit 404 into three, first, second, and third, data streams which are transmitted to a compressing circuit 405 for data compression before further delivered.

Similarly, three other input video signals 406, 407, and 408 are fed to a second 409, a third 410, and a fourth video encoder 411 respectively which all are arranged identical in construction to the first video encoder 401 for data compression.

The four first data streams from their respective encoders 401, 409, 410, 411 are transferred to a first multiplexer 413 of a multiplexer 412 where they are time multiplexed by TDM process to a first data stream multiplex signal which is fed to a transmitter 1.

A part or all of the four second data streams from their respective encoders 401, 409, 410, 411 are transferred to a second multiplexer 414 of the multiplexer 412 where they are time multiplexed to a second data stream multiplex signal which is then fed to the transmitter 1. Also, a part or all of the four third data streams are transferred to a third multiplexer 415 where they are time multiplexed to a third data stream multiplex signal which is then fed to the transmitter 1.

The transmitter 1 performs modulation of the three data stream signals with its modulator 4 by the same manner as described in the first embodiment. The modulated signals are sent from a transmitter unit 5 through an antenna 6 and an uplink 7 to a transponder 12 of a satellite 10 which in turn transmits it to three different receivers including a first receiver 23.

The modulated signal transmitted through a downlink 21 is intercepted by a small antenna 22 having a radius $r_1$ and fed to a first data stream reproducing unit 232 of the first receiver 23 where its first data stream only is demodulated. The demodulated first data stream is then converted by a first video decoder 421 to a traditional 425 or wide-picture NTSC or video output signal 426 of low image resolution.

Also, the modulated signal transmitted through a downlink 31 is intercepted by a medium antenna 32 having a radius $r_2$ and fed to a first 232 and a second data stream reproducing unit 233 of a second receiver 33 where its first and second data streams are demodulated respectively. The demodulated first and second data streams are then summed and converted by a second video decoder 422 to an HDTV or video output signal 427 of high image resolution and/or to the video output signals 425 and 426.

Also, the modulated signal transmitted through a downlink 41 is intercepted by a large antenna 42 having a radius $r_3$ and fed to a first 232, a second 233, and a third data stream reproducing unit 234 of a third receiver 43 where its first, second, and third data streams are demodulated respectively. The demodulated first, second, and third data streams are then summed and converted by a third video decoder 423 to a super HDTV or video output signal 428 of super high image resolution for use in a video theater or cinema. The video output signals 425, 426, and 427 can also be reproduced if desired. A common digital TV signal is transmitted from a conventional digital transmitter 51 and when intercepted by the first receiver 23, will be converted to the video output signal 426 such as a low resolution NTSC TV signal.

The first video encoder 401 will now be explained in more detail referring to the block diagram of FIG. 30. An input video signal of super high resolution is fed through the input unit 403 to the divider circuit 404 where it is divided into four components by sub-band coding process. In more particular, the input video signal is separated through passing a horizontal lowpass filer 451 and a horizontal highpass filter 452 of e.g. QMF mode to two, low and high, horizontal frequency components which are then subsampled to a half of their quantities by two subsamplers 453 and 454 respectively. The low horizontal component is filtered by a vertical lowpass filter 455 and a vertical highpass filter 456 to a low horizontal low vertical component or $H_L V_L$ signal and a low horizontal high vertical component or $H_L V_H$ signal respectively. The two, $H_L V_L$ and $H_L V_H$, signals are then subsampled to a half by two subsamplers 457 and 458 respectively and transferred to the compressing circuit 405.

The high horizontal component is filtered by a vertical lowpass filter 459 and a vertical highpass filter 460 to a high horizontal low vertical component or $H_H V_L$ signal and a high horizontal high vertical component or $H_H V_H$ signal respectively. The two, $H_H V_L$ and $H_H V_H$, signals are then subsampled to a half by two subsamplers 461 and 462 respectively and transferred to the compressing circuit 405.

$H_L V_L$ signal is preferably DCT compressed by a first compressor 471 of the compressing circuit 405 and fed to a first output 472 as the first data stream.

Also, $H_L V_H$ signal is compressed by a second compressor 473 and fed to a second output 464. $H_H V_L$ signal is compressed by a third compressor 463 and fed to the second output 464.

$H_H V_H$ signal is divided by a divider 465 into two, high resolution ($H_H V_H 1$) and super high resolution ($H_H V^H 2$), video signals which are then transferred to the second output 464 and a third output 468 respectively.

Figure 31:
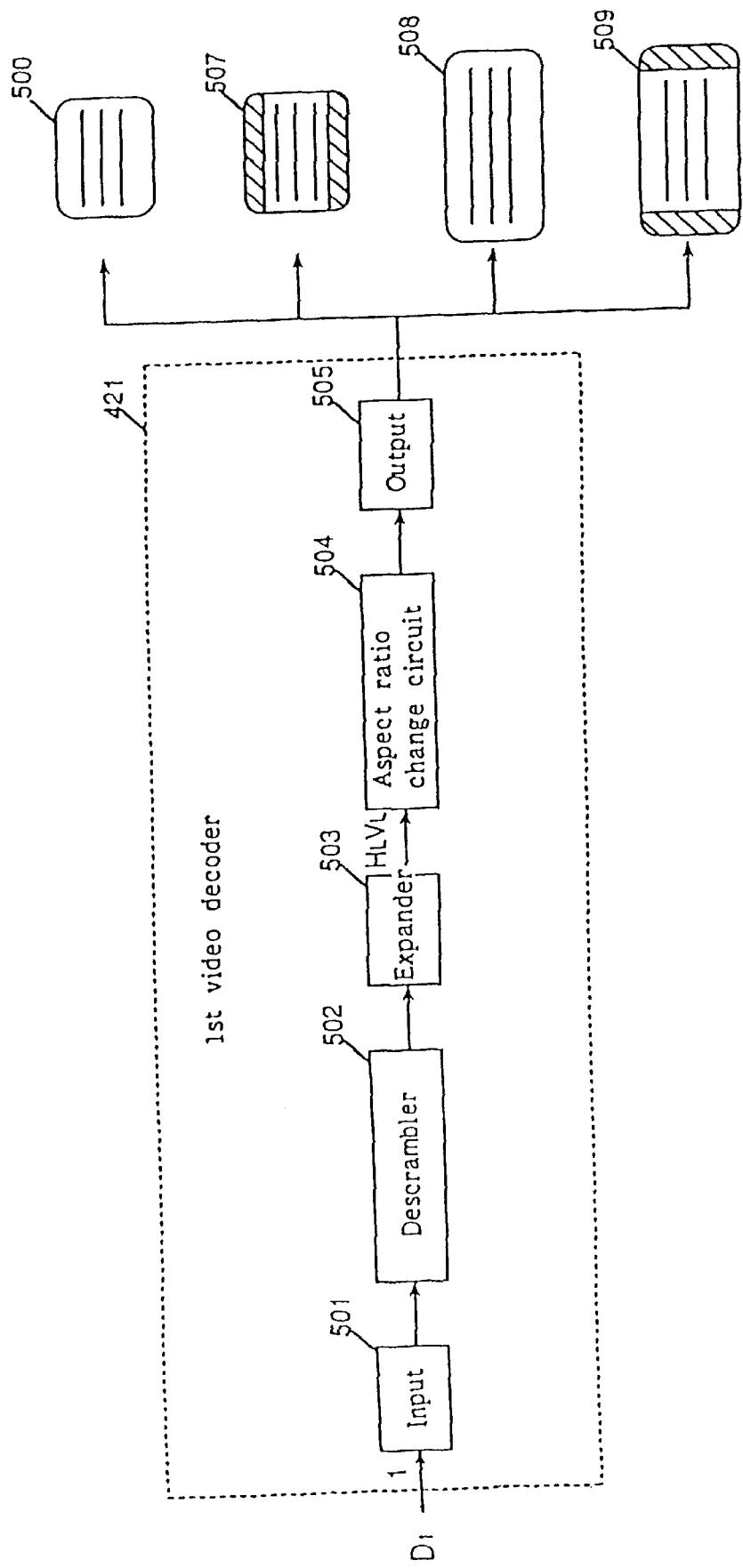
FIG. 31 is a block diagram of a first video decoder of the third embodiment.
Figure 32:
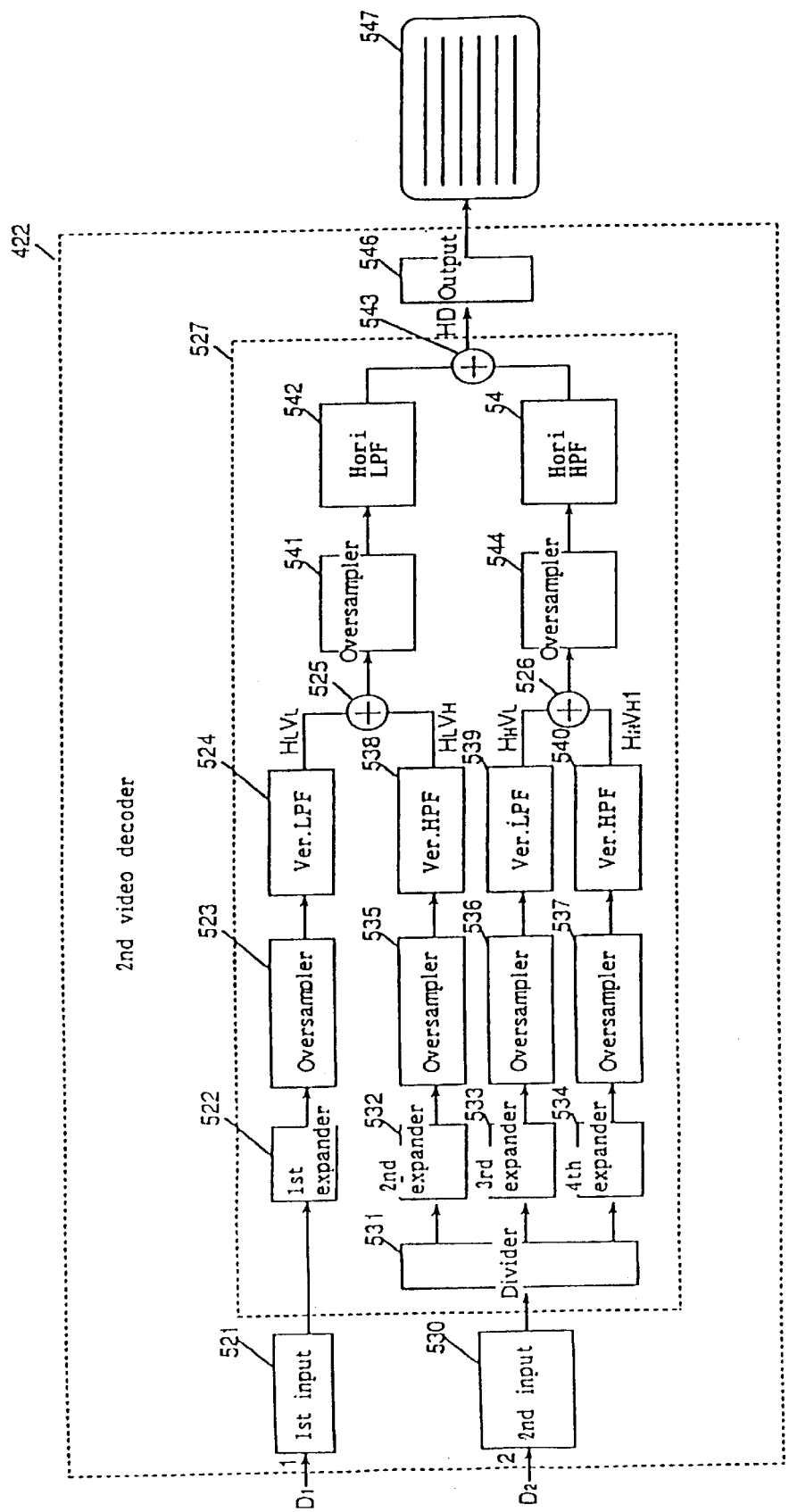
FIG. 32 is a block diagram of a second video decoder of the third embodiment.

The first video decoder 421 will now be explained in more detail referring to FIG. 31. The first data stream or $D_1$ signal of the first receiver 23 is fed through an input unit 501 to a descrambler 502 of the first video decoder 421 where it is descrambled. The descrambled $D_1$ signal is expanded by an expander 503 to $H_L V_L$ which is then fed to an aspect ratio changing circuit 504. Thus, $H_L V_L$ signal can be delivered through an output unit 505 as a standard 500, letterbox format 507, wide-screen 508, or sidepanel format NTSC signal 509. The scanning format may be of non-interlace or interlace type and its NTSC mode lines may be 525 or doubled to 1050 by double tracing. When the received signal from the digital transmitter 51 is a digital TV signal of 4 PSK mode, it can also be converted by the first receiver 23 and the first video decoder 421 to a TV picture. The second video decoder 422 will be explained in more detail referring to the block diagram of FIG. 32. The $D_1$ signal of the second receiver 33 is fed through a first input 521 to a first expander 522 for data expansion and then, transferred to an oversampler 523 where it is sampled at 2×. The oversampled signal is filtered by a vertical lowpass filter 524 to $H_L V_L$. Also, the $D_2$ signal of the second receiver 33 is fed through a second input 530 to a divider 531 where it is divided into three components which are then transferred to a second 532, a third 533, and a fourth expander 534 respectively for data expansion. The three expanded components are sampled at 2× by three oversamplers 535, 536, 537 and filtered by a vertical highpass 538, a vertical lowpass 539, and a vertical highpass filter 540 respectively. Then, $H_L V_L$ from the vertical lowpass filter 524 and $H_L V_H$ from the vertical highpass filter 538 are summed by an adder 525, sampled by an oversampler 541, and filtered by a horizontal lowpass filter 542 to a low frequency horizontal video signal. $H_H V_L$ from the vertical lowpass filter 539 and $H_H V_H 1$ from the vertical highpass filter 540 are summed by an adder 526, sampled by an oversampler 544, and filtered by a horizontal highpass filter 545 to a high frequency horizontal video signal. The two, high and low frequency, horizontal video signals are then summed by an adder 543 to a high resolution video signal HD which is further transmitted through an output unit 546 as a video output 547 of e.g. HDTV format. If desired a traditional NTSC video output can be reconstructed with equal success.

Figure 33:
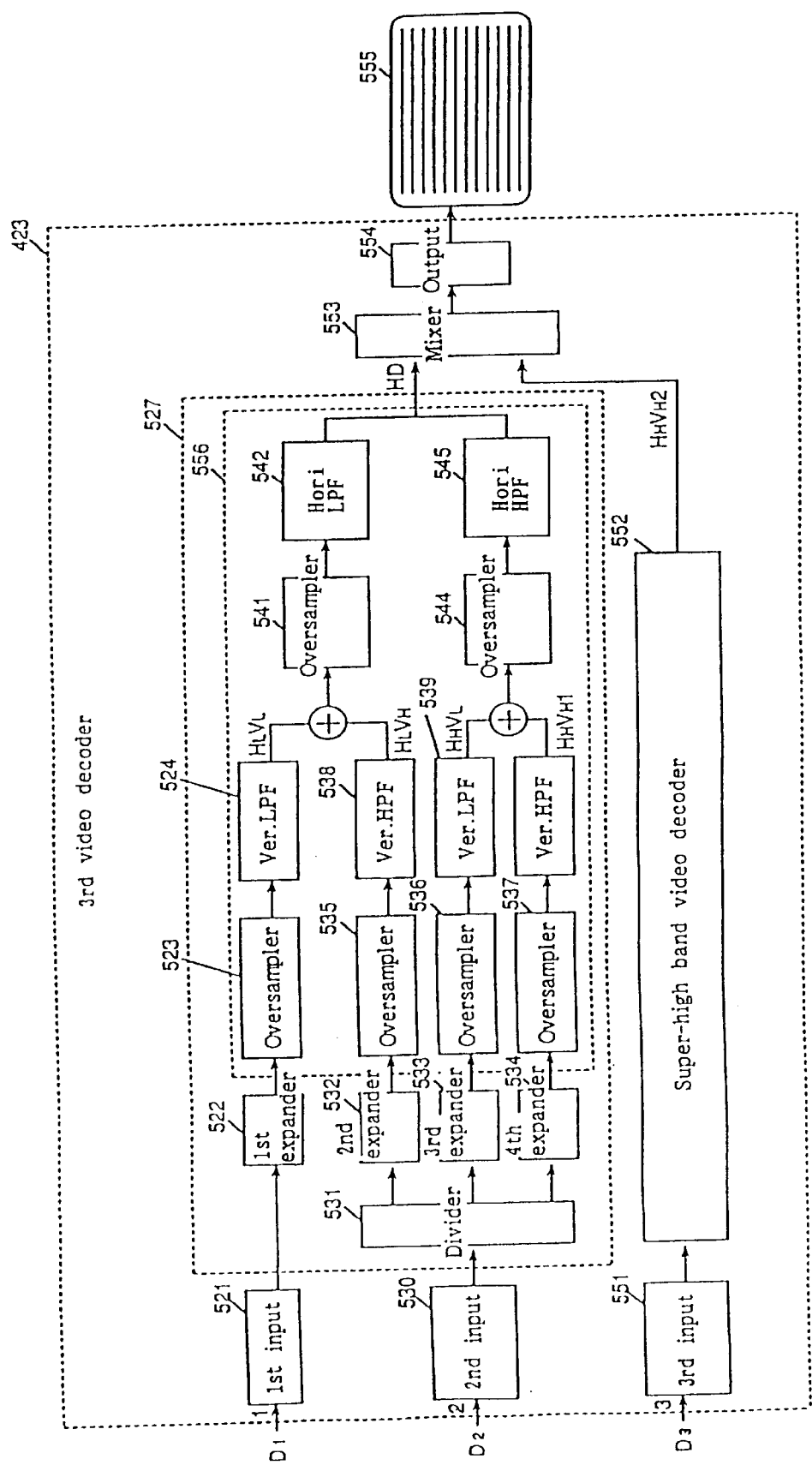
FIG. 33 is a block diagram of a third video decoder of the third embodiment.

FIG. 33 is a block diagram of the third video decoder 423 in which the $D_1$ and $D_2$ signals are fed through a first 521 and a second input 530 respectively to a high frequency band video decoder circuit 527 where they are converted to an HD signal by the same manner as above described. The $D_3$ signal is fed through a third input 551 to a super high frequency band video decoder circuit 552 where it is expanded, descrambled, and composed to $H_H V^H 2$ signal. The HD signal of the high frequency band video decoder circuit 527 and the $H_H V_H 2$ signal of the super high frequency band video decoder circuit 552 are summed by a summer 553 to a super high resolution TV or S-HD signal which is then delivered through an output unit 554 as a super resolution video output 555.

Figure 34:
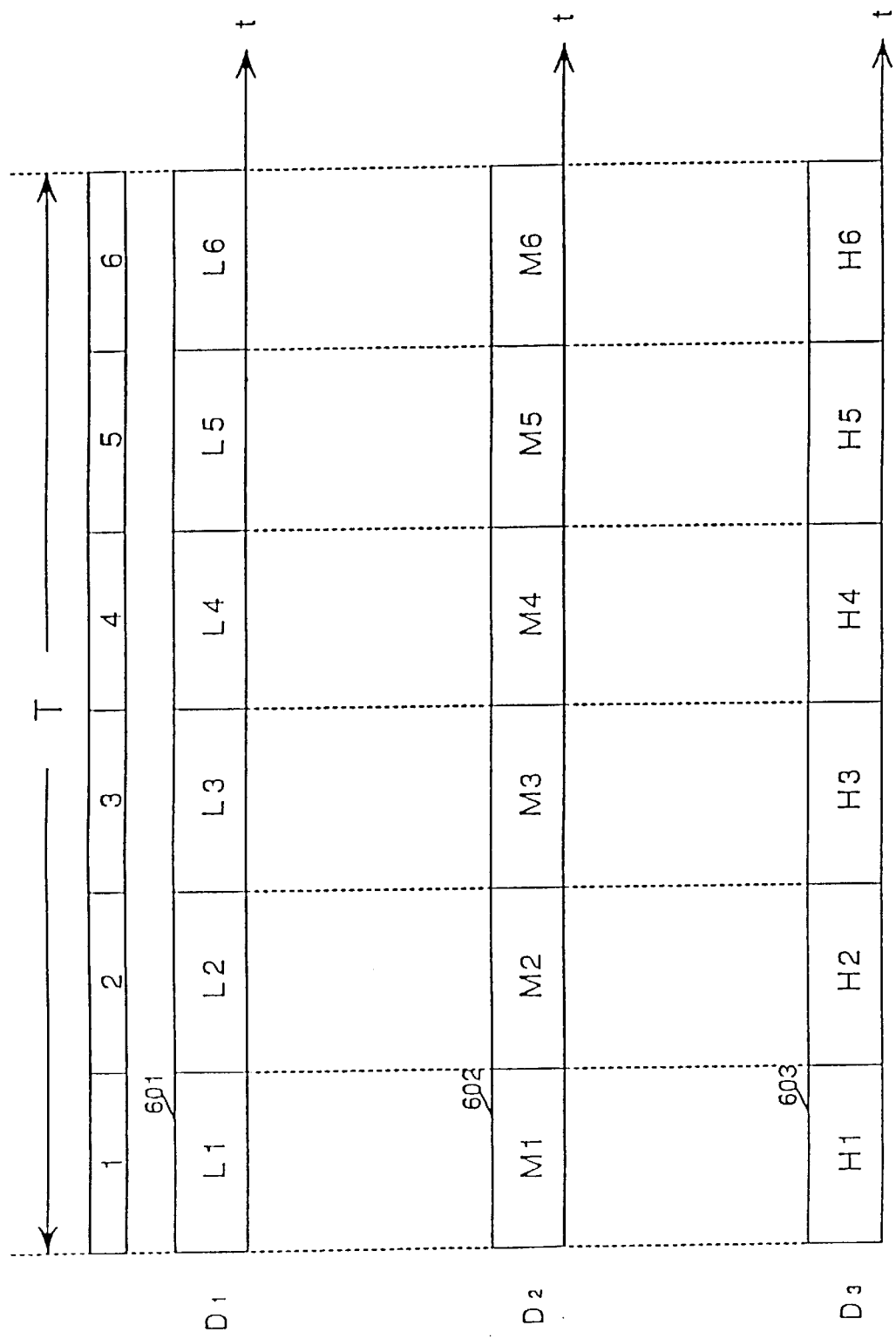
FIG. 34 is an explanatory view showing a time multiplexing of $D_1$, $D_2$, and $D_3$ signals according to the third embodiment.

The action of multiplexing in the multiplexer 412 shown in FIG. 29 will be explained in more detail. FIG. 34 illustrates a data assignment in which the three, first, second, and third, data streams $D_1$, $D_2$, $D_3$ contain in a period of T six NTSC channel data L1, L2, L3, L4, L5, L6, six HDTV channel data M1, M2, M3, M4, M5, M6 and six S-HDTV channel data H1, H2, H3, H4, H5, H6 respectively. In action, the NTSC or $D_1$ signal data L1 to L6 are time multiplexed by TDM process during the period T. More particularly, $H_L V_L$ of $D_1$ is assigned to a domain 601 for the first channel. Then, a difference data M1 between HDTV and NTSC or a sum of $H_L V_H$, $H_H V_L$, and $H_H V_H 1$ is assigned to a domain 602 for the first channel. Also, a difference data H1 between HDTV and super HDTV or $H_H V_H 2$ (See FIG. 30) is assigned to a domain 603 for the first channel.

The selection of the first channel TV signal will now be described. When intercepted by the first receiver 23 with a small antenna coupled to the first video decoder 421, the first channel signal is converted to a standard or widescreen NTSC TV signal as shown in FIG. 31. When intercepted by the second receiver 33 with a medium antenna coupled to the second video decoder 422, the signal is converted by summing L1 of the first data stream $D_1$ assigned to the domain 601 and M1 of the second data stream $D_2$ assigned to the domain 602 to an HDTV signal of the first channel equivalent in program to the NTSC signal.

When intercepted by the third receiver 43 with a large antenna coupled to the third video decoder 423, the signal is converted by summing L1 of $D_1$ assigned to the domain 601, M1 of $D_2$ assigned to the domain 602, and $H_1$ of $D_3$ assigned to the domain 603 to a super HDTV signal of the first channel equivalent in program to the NTSC signal. The other channel signals can be reproduced in an equal manner.

Figure 35:
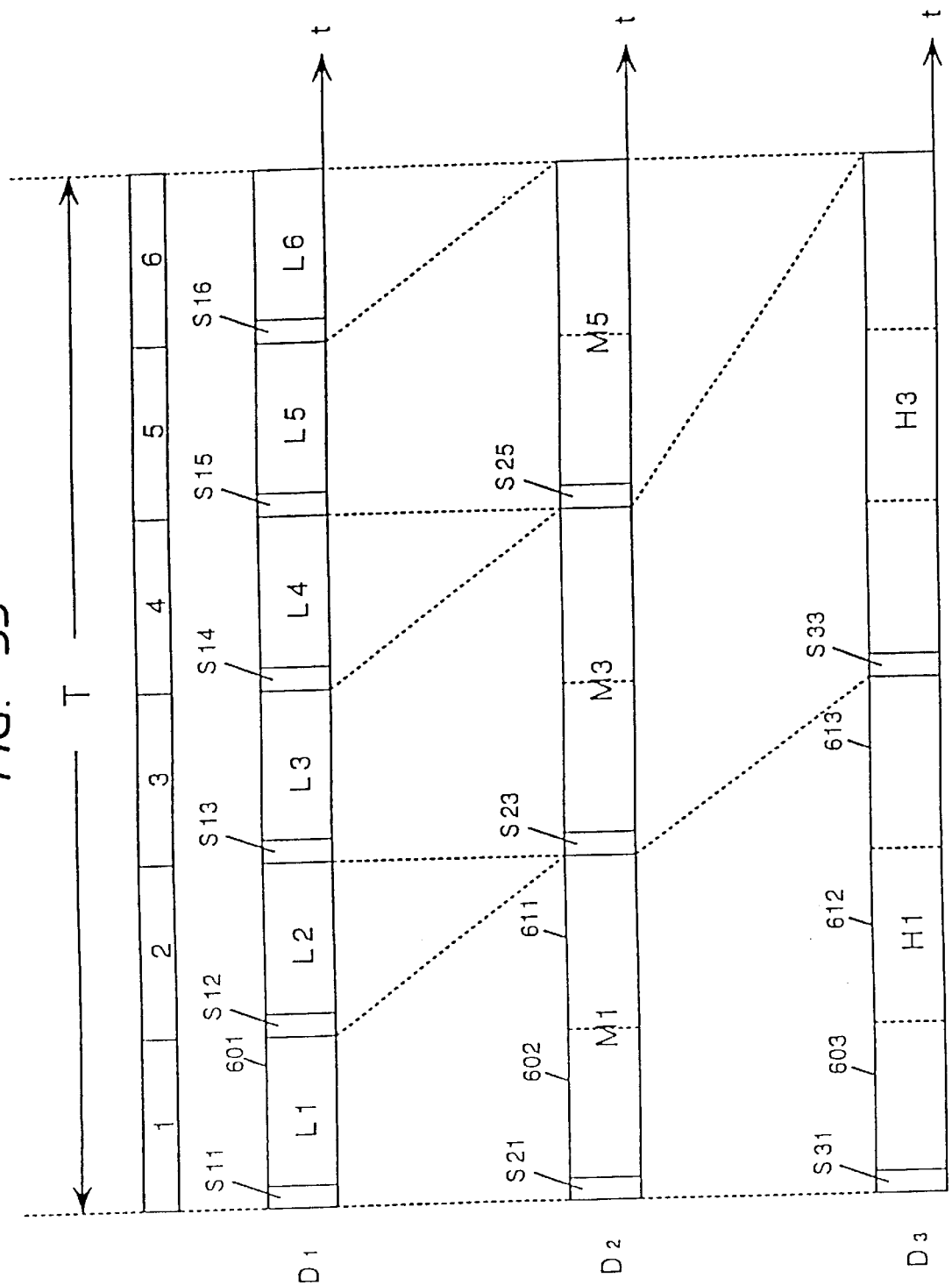
FIG. 35 is an explanatory view showing another time multiplexing of the $D_1$, $D_2$, and $D_3$ signals according to the third embodiment.

FIG. 35 shows another data assignment L1 of a first channel NTSC signal is assigned to a first domain 601. The domain 601 which is allocated at the front end of the first data stream $D_1$, also contains at front a data S11 including a descrambling data and the demodulation data described in the first embodiment. A first channel HDTV signal is transmitted as L1 and M1. M1 which is thus a difference data between NTSC and HDTV is assigned to two domains 602 and 611 of $D_2$. If $L_1$ is a compressed NTSC component of 6 Mbps, M1 is as two times higher as 12 Mbps. Hence, the total of L1 and M1 can be demodulated at 18 Mbps with the second receiver 33 and the second video decoder 423. According to current data compression techniques, HDTV compressed signals can be reproduced at about 15 Mbps. This allows the data assignment shown in FIG. 35 to enable simultaneous reproduction of an NTSC and HDTV first channel signal. However, this assignment allows no second channel HDTV signal to be carried. S21 is a descrambling data in the HDTV signal. A first channel super HDTV signal component comprises L1, M1, and H1. The difference data H1 is assigned to three domains 603, 612, and 613 of $D_3$. If the NTSC signal is 6 Mbps, the super HDTV is carried at as high as 36 Mbps. When a compressed rate is increased, super HDTV video data of about 2000 scanning line for reproduction of a cinema size picture for commercial use can be transmitted with an equal manner.

Figure 36:
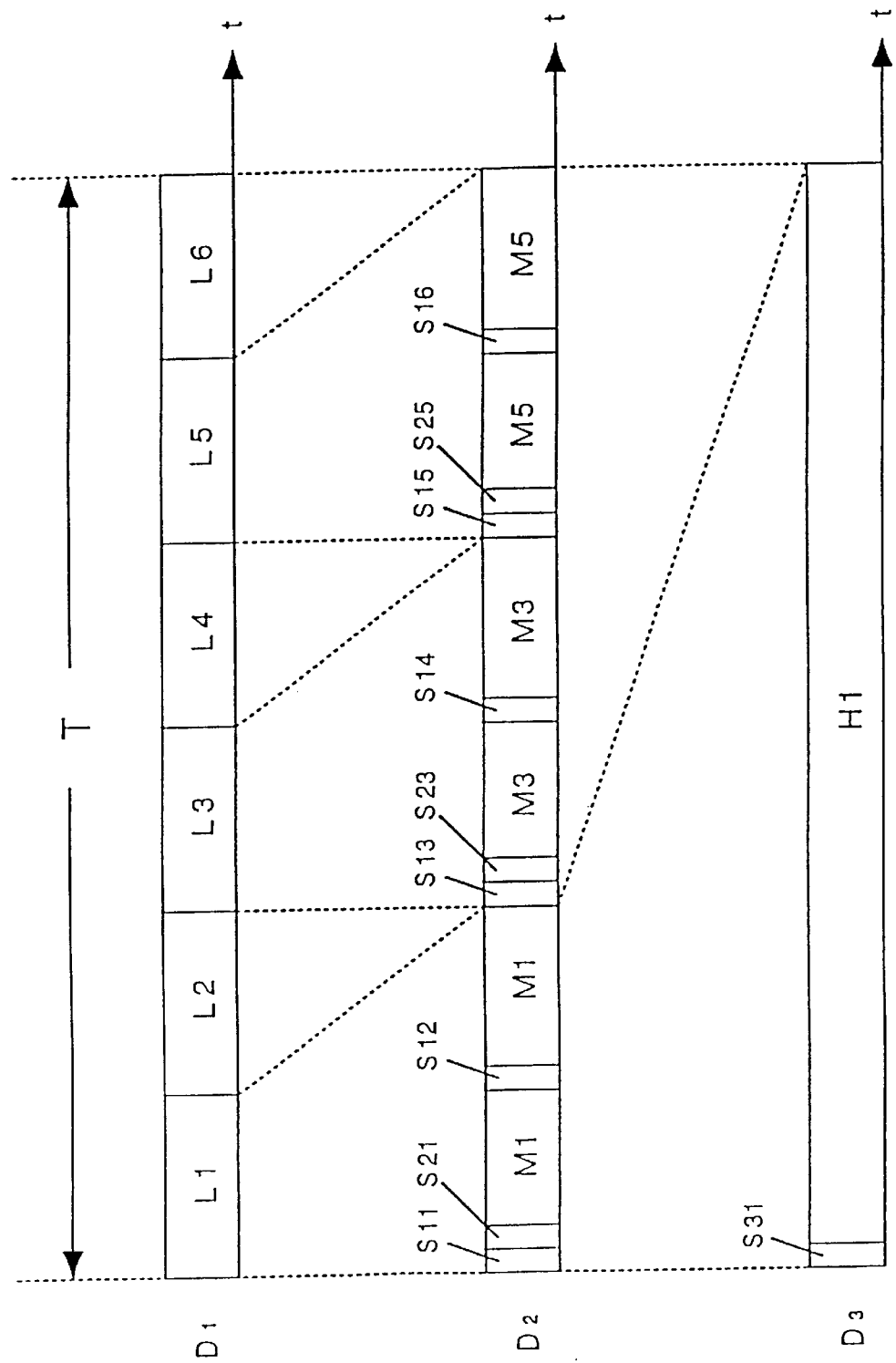
FIG. 36 is an explanatory view showing a further time multiplexing of the $D_1$, $D_2$, and $D_3$ signals according to the third embodiment.

FIG. 36 shows a further data assignment in which H1 of a super HDTV signal is assigned to six times domains. If a NTSC compressed signal is 6 Mbps, this assignment can carry as nine times higher as 54 Mbps of $D_3$ data. Accordingly, super HDTV data of higher picture quality can be transmitted.

The foregoing data assignment makes the use of one of two, horizontal and vertical, polarization planes of a transmission wave. When both the horizontal and vertical polarization planes are used, the frequency utilization will be doubled. This will be explained below.

Figure 49:
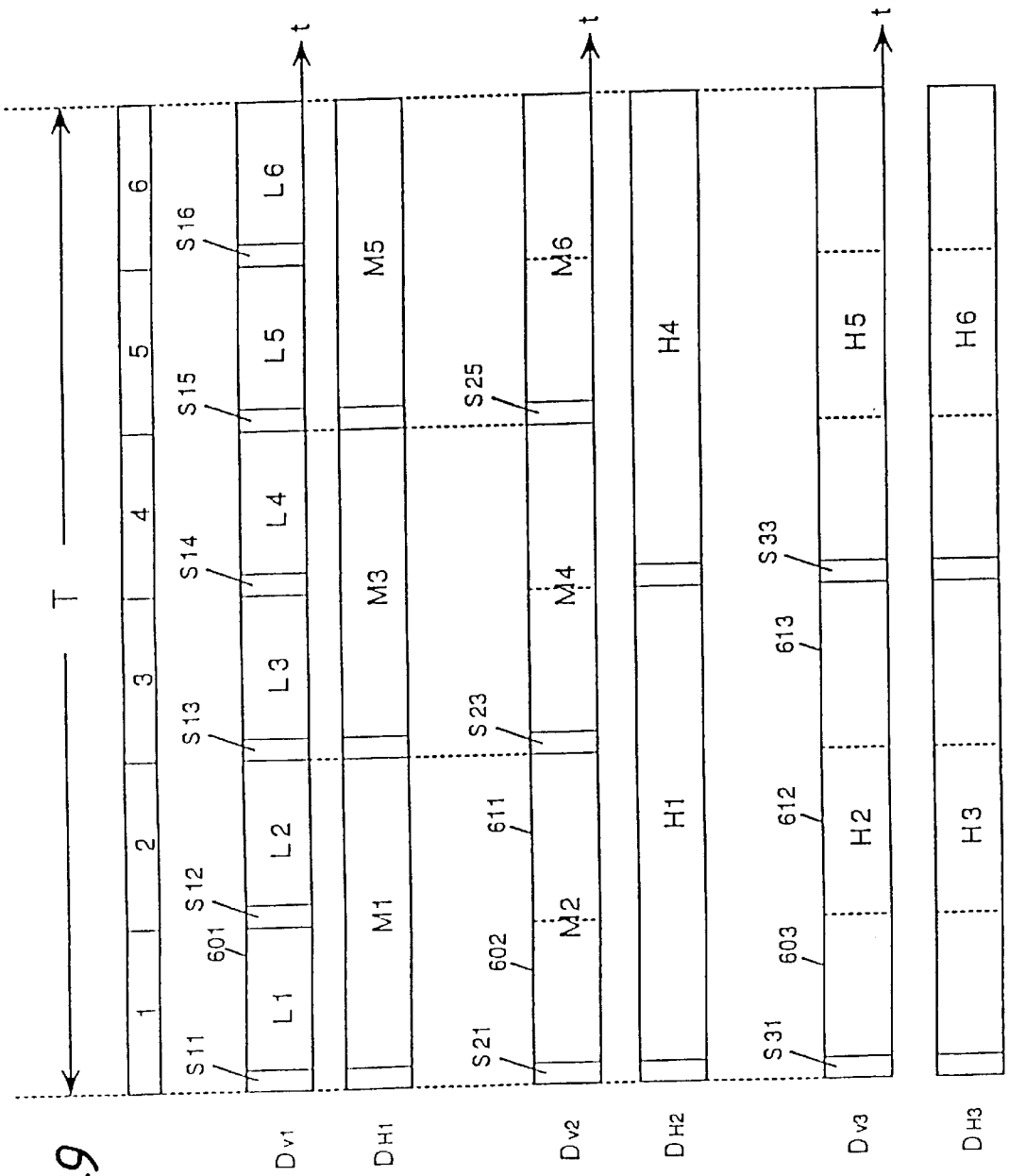
FIG. 49 is an explanatory view showing a time multiplexing of $D_{V1}$, $D_{H1}$, $D_{V2}$, $D_{H2}$, $D_{V3}$, and $D_{H3}$ signals according to the third embodiment.

FIG. 49 shows a data assignment in which $D_{V1}$ and $D_{H1}$ are a vertical and a horizontal polarization signal of the first data stream respectively, $D_{V2}$ and $D_{H2}$ are a vertical and a horizontal polarization signal of the second data stream respectively, and $D_{V3}$ and $D_{H3}$ are a vertical and a horizontal polarization signal of the third data stream respectively. The vertical polarization signal $D_{V1}$ of the first data stream carries a low frequency band or NTSC TV data and the horizontal polarization signal $D_{H1}$ carries a high frequency band or HDTV data. When the first receiver 23 is equipped with a vertical polarization antenna, it can reproduce only the NTSC signal. When the first receiver 23 is equipped with an antenna for both horizontally and vertically polarized waves, it can reproduce the HDTV signal through summing L1 and M1. More specifically, the first receiver 23 can provide compatibility between NTSC and HDTV with the use of a particular type antenna.

Figure 50:
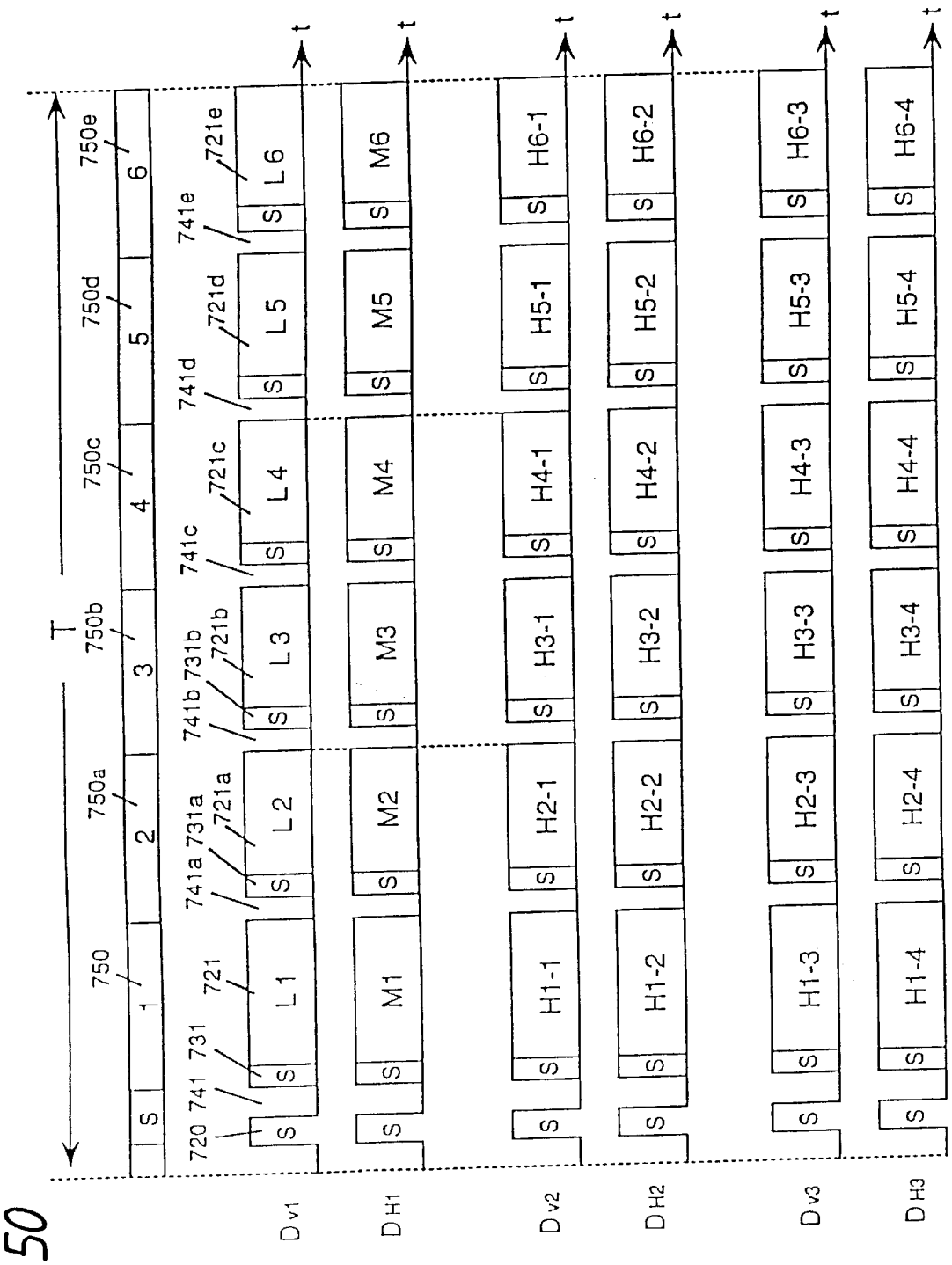
FIG. 50 is an explanatory view showing a TDMA time multiplexing of $D_{V1}$, $D_{H1}$, $D_{V2}$, $D_{H2}$, $D_{V3}$, and $D_{H3}$ signals according to the third embodiment.
Figure 51:
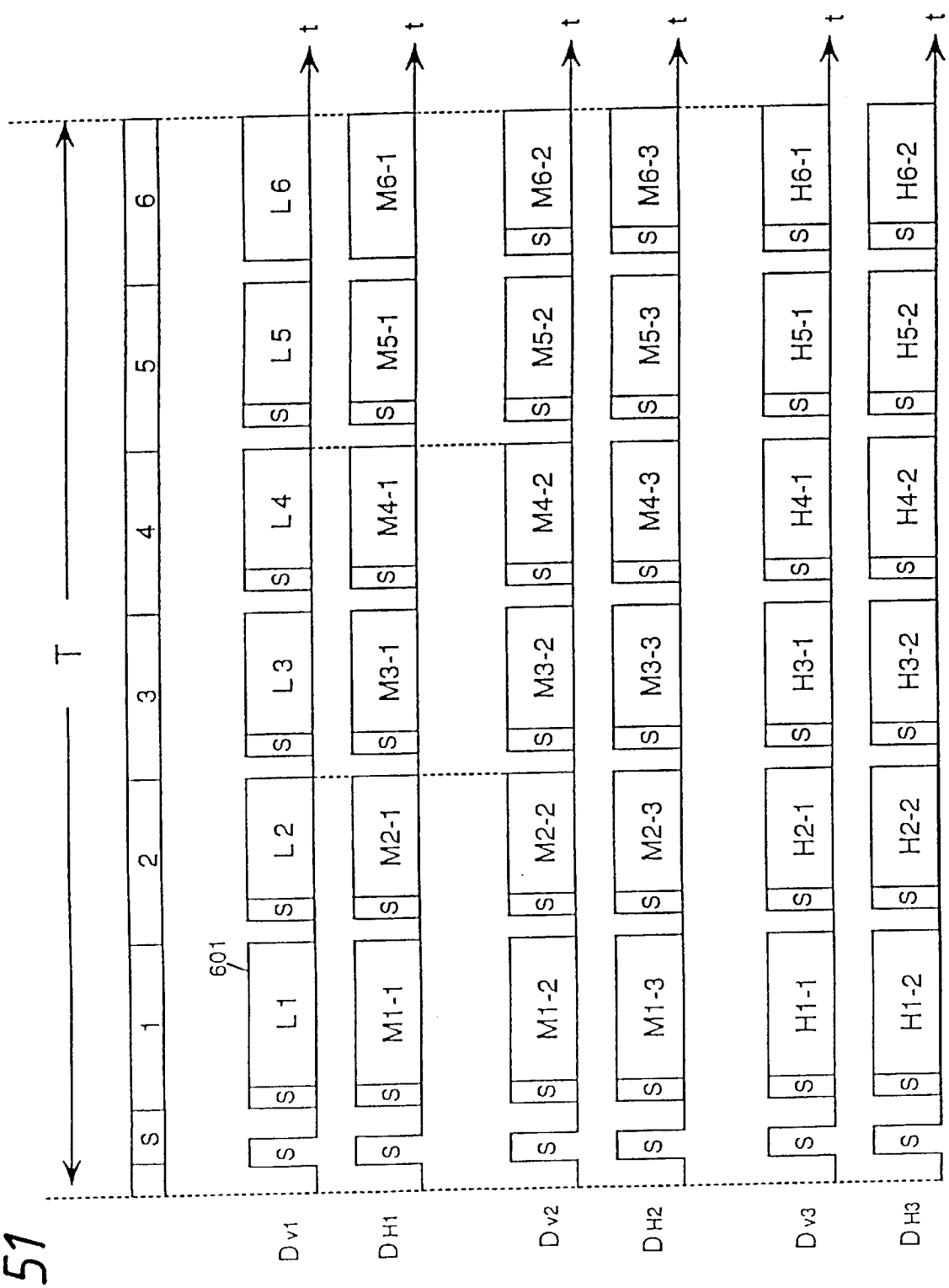
FIG. 51 is an explanatory view showing another TDMA time multiplexing of the $D_{V1}$, $D_{H1}$, $D_{V2}$, $D_{H2}$, $D_{V3}$, and $D_{H3}$ signals according to the third embodiment.

FIG. 50 illustrates a TDMA method in which each data burst 721 is accompanied at front a sync data 731 and a card data 741. Also, a frame sync data 720 is provided at the front of a fame. Like channels are assigned to like time slots. For example, a first time slot 750 carries NTSC, HDTV, and super HDTV data of the first channel simultaneously. The six time slots 750, 750a, 750b, 750c, 750d, 750e are arranged independent from each other. Hence, each station can offer NTSC, HDTV, and/or super HDTV services independently of the other stations through selecting a particular channel of the time slots. Also, the first receiver 23 can reproduce an NTSC signal when equipped with a horizontal polarization antenna and both NTSC and HDTV signals when equipped with a compatible polarization antenna. In this respect, the second receiver 33 can reproduce a super HDTV at lower resolution while the third receiver 43 can reproduce a full super HDTV signal. According to the third embodiment, a compatible signal transmission system will be constructed. It is understood that the data assignment is not limited to the burst mode TDMA method shown in FIG. 50 and another method such as time division multiplexing of continuous signals as shown in FIG. 49 will be employed with equal success. Also, a data assignment shown in FIG. 51 will permit a HDTV signal to be reproduced at high resolution.

As set forth above, the compatible digital TV signal transmission system of the third embodiment can offer three, super HDTV, HDTV, and conventional NTSC, TV broadcast services simultaneously. In addition, a video signal intercepted by a commercial station or cinema can be electronized.

The modified QAM of the embodiments is now termed as SRQAM and its error rate will be examined.

Figure 99:
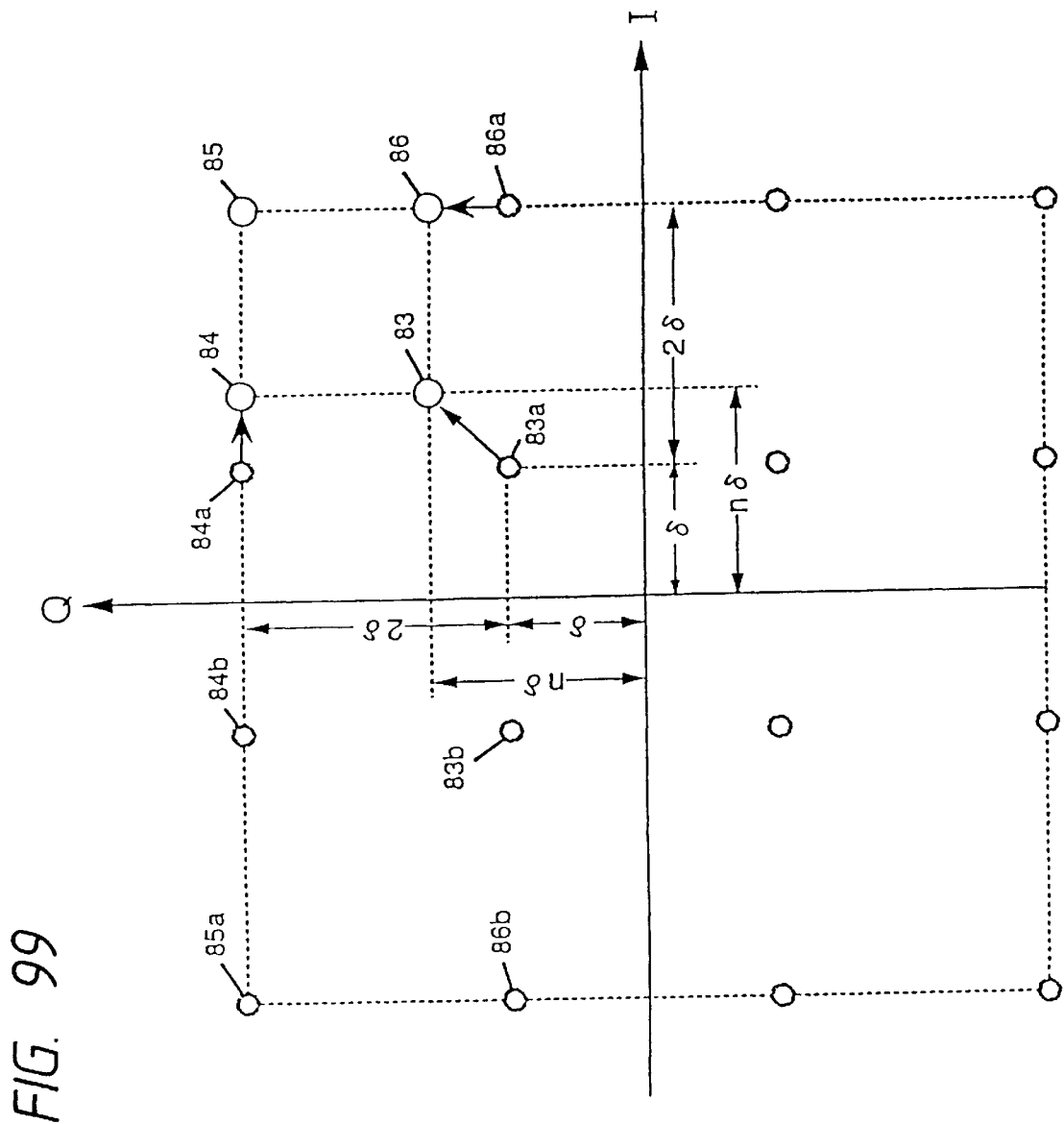
FIG. 99 is a vector diagram of a 16 SRQAM signal of the third embodiment.

First, the error rate in 16 SRQAM will be calculated. FIG. 99 shows a vector diagram of 16 SRQAM signal points. As apparent from the first quadrant, the 16 signal points of standard 16 QAM including 83a, 83b, 84a, 83a are allocated at equal intervals of 2δ.

The signal point 83a is spaced δ from both the I-axis and the Q-axis of the coordinate. It is now assumed that n is a shift value of the 16 SRQAM. In 16 SRQAM, the signal point 83a of 16 QAM is shifted to a signal point 83 where the distance from each axis is nδ. The shift value n is thus expressed as:

$$0 < n < 3.$$

The other signal points 84a and 86a are also shifted to two points 84 and 86 respectively.

If the error rate of the first data stream is $Pe_1$, it is obtained from:

$$Pe_{1-16} = \frac{1}{4}\left(erfc\left(\frac{n\delta}{\sqrt{2\sigma}}\right) + erfc\left(\frac{3\delta}{\sqrt{2\sigma}}\right)\right)$$

$$= \frac{1}{8} erfc\left(\frac{n\sqrt{\rho}}{\sqrt{9+n^2}}\right)$$

Also, the error rate $Pe_2$ of the second data stream is obtained from:

$$Pe_{2-16} = \frac{1}{2} erfc\left(\frac{\frac{3-n}{2}\delta}{\sqrt{2\sigma}}\right)$$

$$= \frac{1}{4} erfc\left(\frac{3-n}{2\sqrt{9+n^2}}\sqrt{\rho}\right)$$

Figure 100:
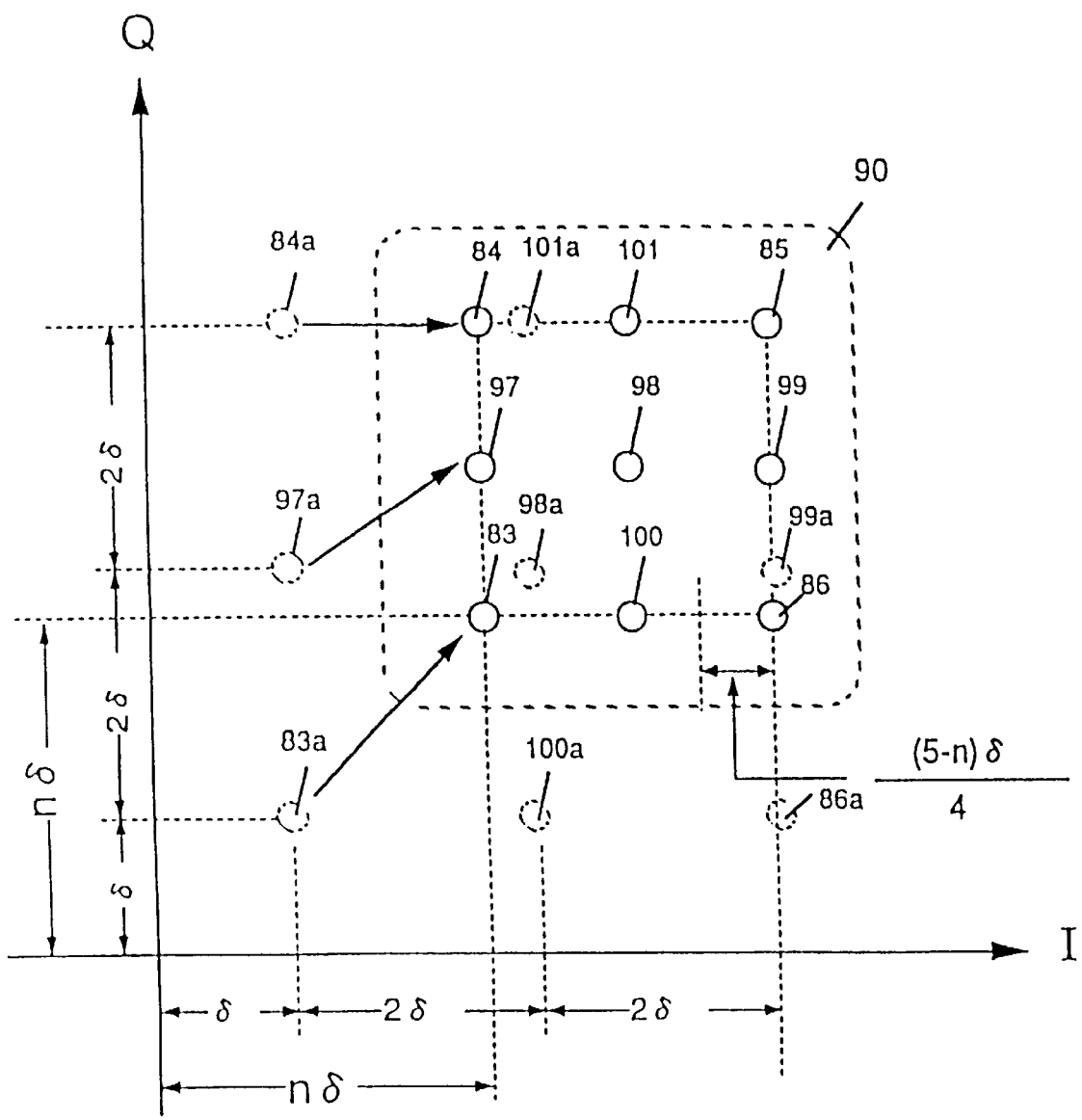
FIG. 100 is a vector diagram of a 32 SRQAM signal of the third embodiment.

The error rate of 36 or 32 SRQAM will be calculated. FIG. 100 is a vector diagram of a 36 SRQAM signal in which the distance between any two 36 QAM signal points is 2δ.

The signal point 83a of 36 QAM is spaced δ from each axis of the coordinate. It is now assumed that n is a shift value of the 16 SRQAM. In 36 SRQAM, the signal point 83a is shifted to a signal point 83 where the distance from each axis is nδ. Similarly, the nine 36 QAM signal points in the first quadrant are shifted to points 83, 84, 85, 86, 97, 98, 99, 100, 101 respectively. If a signal point group 90 comprising the nine signal points is regarded as a single signal point, the error rate $Pe_1$ in reproduction of only the first data stream $D_1$ with a modified 4 PSK receiver and the error rate $Pe_2$ in reproduction of the second data stream $D_2$ after discriminating the nine signal points of the group 90 from each other, are obtained respectively from:

$$Pe_{1-32} = \frac{1}{6} erfc\left(\frac{n\delta}{\sqrt{2\sigma}}\right)$$

$$= \frac{1}{6} erfc\left(\sqrt{\frac{6\rho}{5}} \times \frac{n}{\sqrt{n^2+2n+25}}\right)$$

$$Pe_{2-32} = \frac{2}{3} erfc\left(\frac{5-n}{4\sqrt{2}}\frac{\delta}{\rho}\right)$$

$$= \frac{2}{3} erfc\left(\sqrt{\frac{3\rho}{40}} \times \frac{5-n}{\sqrt{n^2+2n+25}}\right)$$

Figure 101:
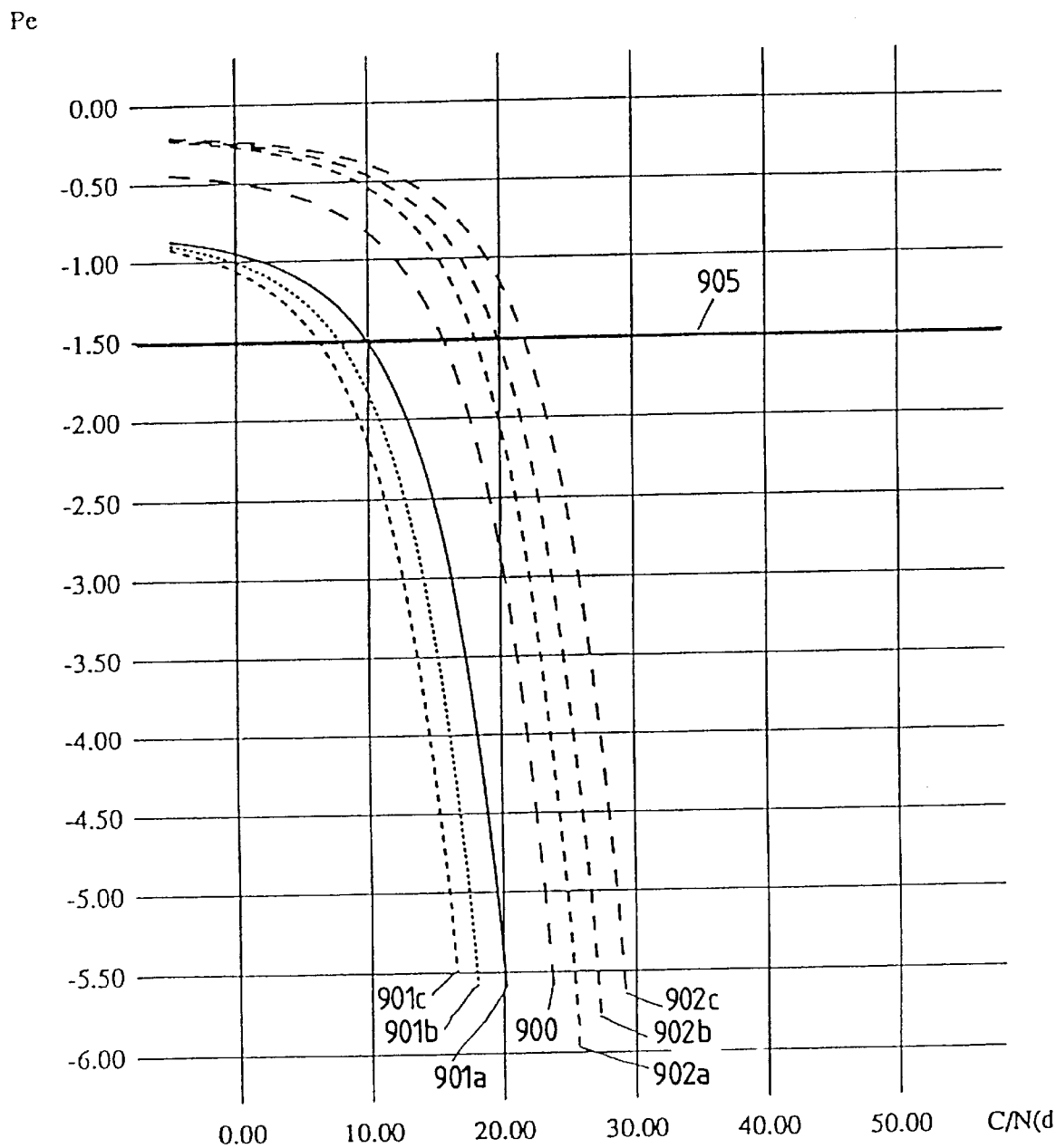
FIG. 101 is a graphic diagram showing the relation between C/N and error rate according to the third embodiment.

FIG. 101 shows the relation between error rate Pe and C/N rate in transmission in which the curve 900 represents a conventional or not modified 32 QAM signal. The straight line 905 represents a signal having $10^{-1.5}$ of the error rate. The curve 901a represents a $D_1$ level 32 SRQAM signal of the present invention at the shift rate n of 1.5. As shown, the C/N rate of the 32 SRQAM signal is 5 dB lower at the error rate of $10^{-1.5}$ than that of the conventional 32 QAM. This means that the present invention allows a $D_1$ signal to be reproduced at a given error rate when its C/N rate is relatively low.

The curve 902a represents a $D_2$ level SRQAM signal at n=1.5 which can be reproduced at the error rate of $10^{-1.5}$ only when its C/N rate is 2.5 dB higher than that of the conventional 32 QAM of the curve 900. Also, the curves 901b and 902b represent $D_1$ and $D_2$ SRQAM signals at n=2.0 respectively. The curves 902c represents a $D_2$ SRQAM signal at n=2.5. It is apparent that the C/N rate of the SRQAM signal at the error rate of $10^{-1.5}$ is 5 dB, 8 dB, and 10 dB higher at n=1.5, 2.0, and 2.5 respectively in the $D_1$ level and 2.5 dB lower in the $D_2$ level than that of a common 32 QAM signal.

Figure 103:
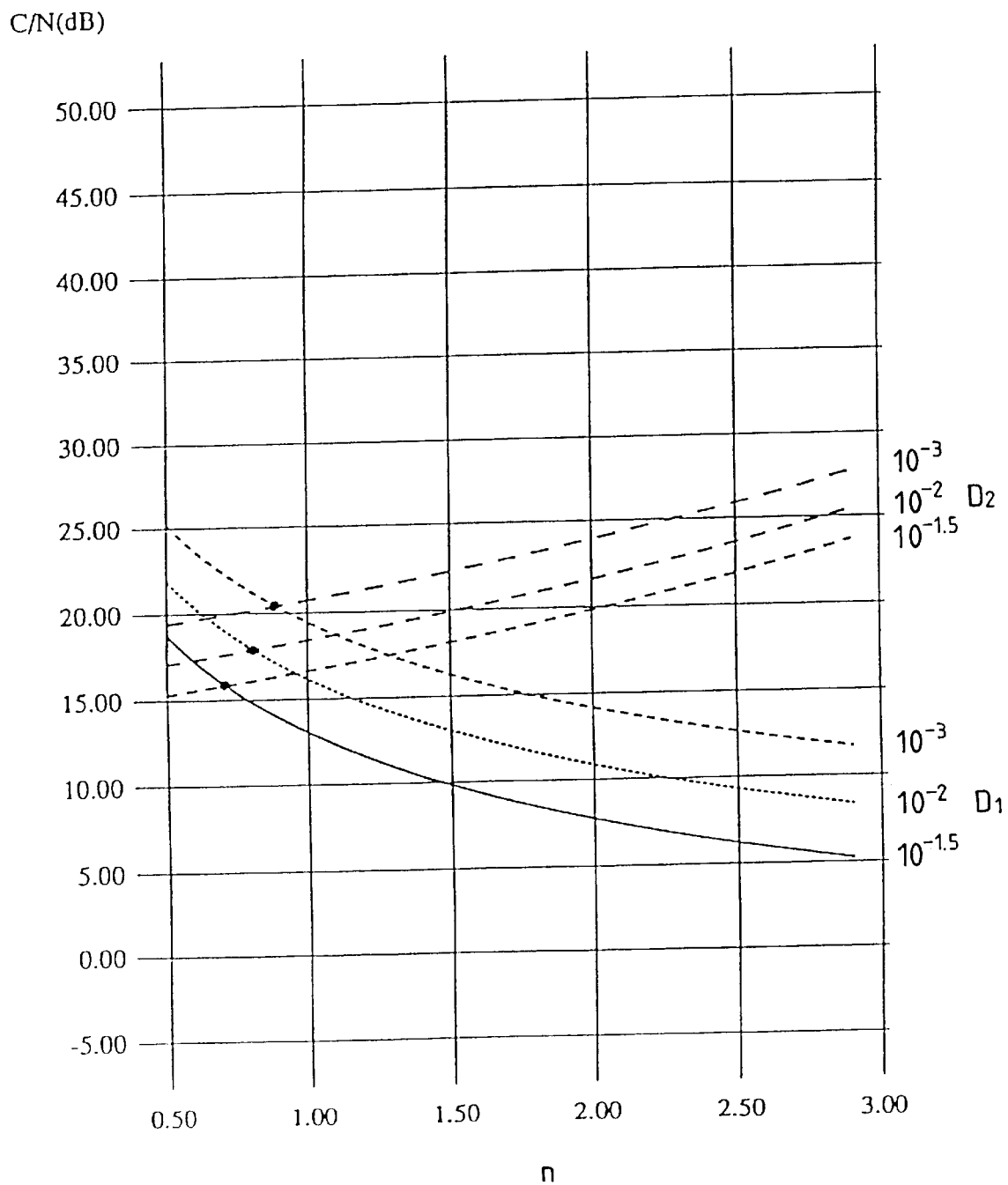
FIG. 103 is a graphic diagram showing the relation between shift distance n and C/N needed for transmission according to the third embodiment.

Shown in FIG. 103 is the C/N rate of the first and second data streams $D_1, D_2$ of a 32 SRQAM signal which is needed for maintaining a constant error rate against variation of the shift n. As apparent, when the shift n is more than 0.8, there is developed a clear difference between two C/N rates of their respective $D_1$ and $D_2$ levels so that the multi-level signal, namely first and second data, transmission can be implemented successfully. In brief, n>0.85 is essential for multi-level data transmission of the 32 SRQAM signal of the present invention.

Figure 102:
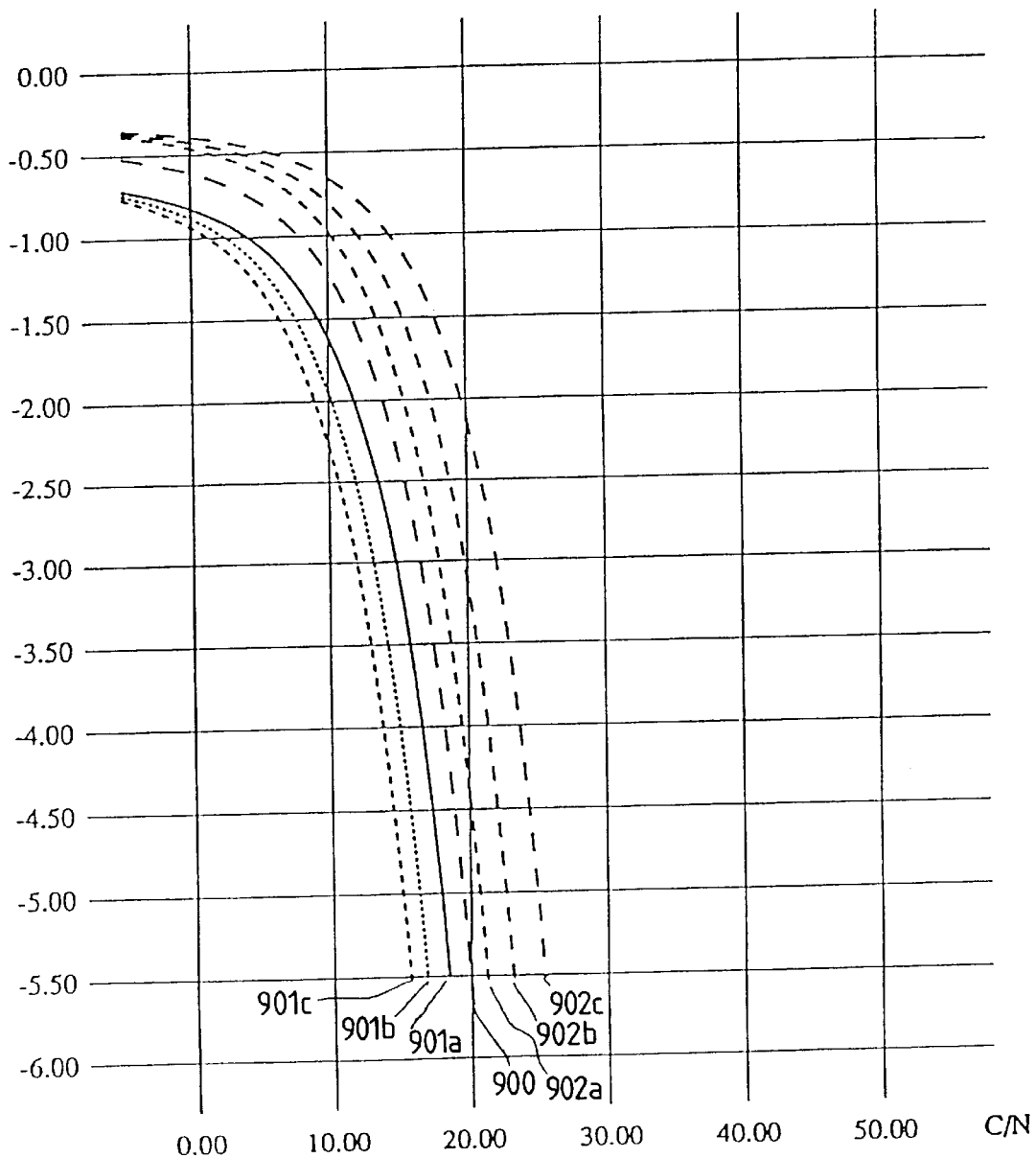
FIG. 102 is a graphic diagram showing the relation between C/N and error rate according to the third embodiment.

FIG. 102 shows the relation between the C/N rate and the error rate for 16 SRQAM signals. The curve 900 represents a common 16 QAM signal. The curves 901a, 901b, 901c and $D_1$ level or first data stream 16 SRQAM signals at n=1.2, 1.5, and 1.8 respectively. The curves 902a, 902b, 902c are $D_2$ level or second data stream 16 SRQAM signals at n=1.2, 1.5, and 1.8 respectively.

Figure 104:
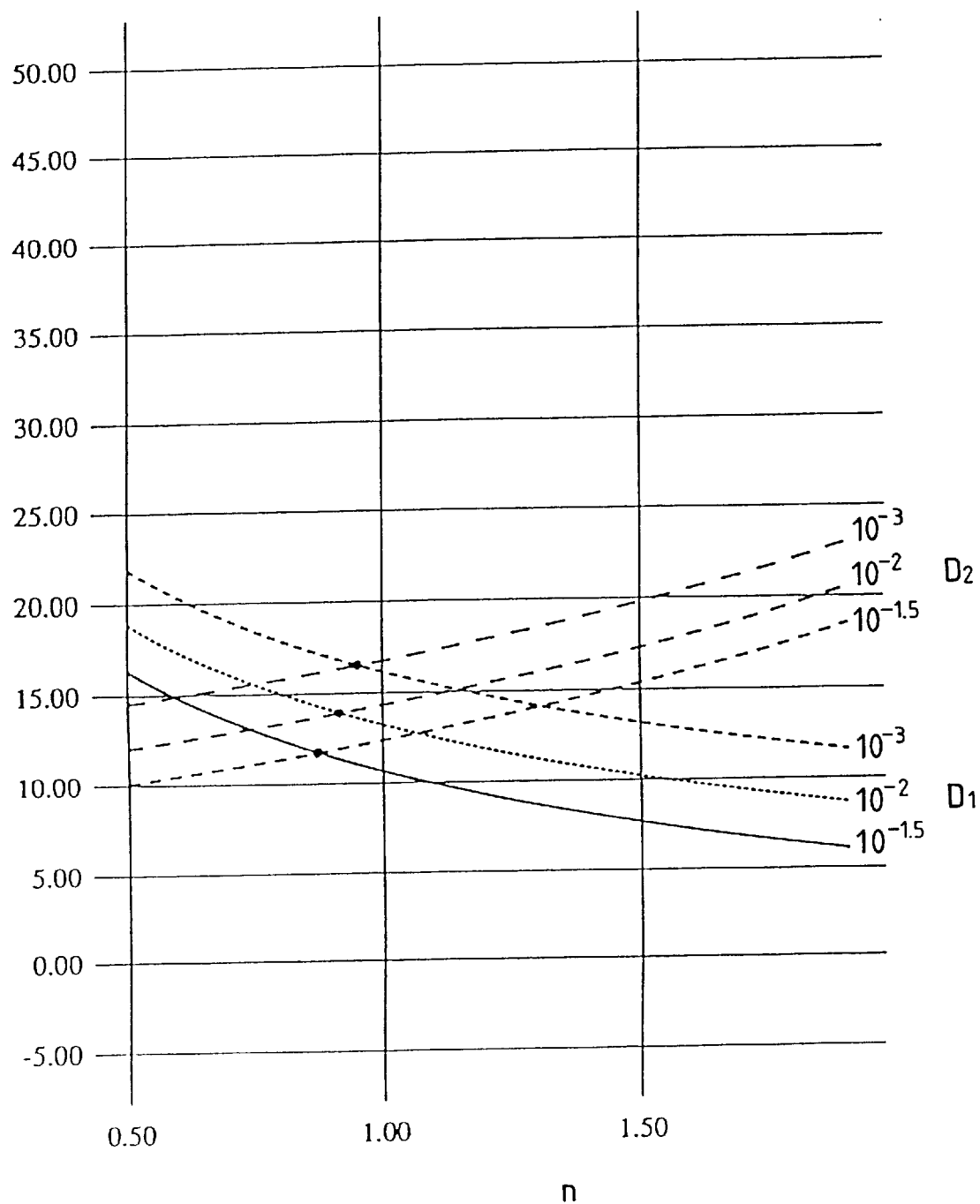
FIG. 104 is a graphic diagram showing the relation between shift distance n and C/N needed for transmission according to the third embodiment.

The C/N rate of the first and second data streams $D_1, D_2$ of a 16 SRQAM signal is shown in FIG. 104, which is needed for maintaining a constant error rate against variation of the shift n. As apparent, when the shift n is more than 0.9 (n>0.9), the multi-level data transmission of the 16 SRQAM signal will be executed.

Figure 105:
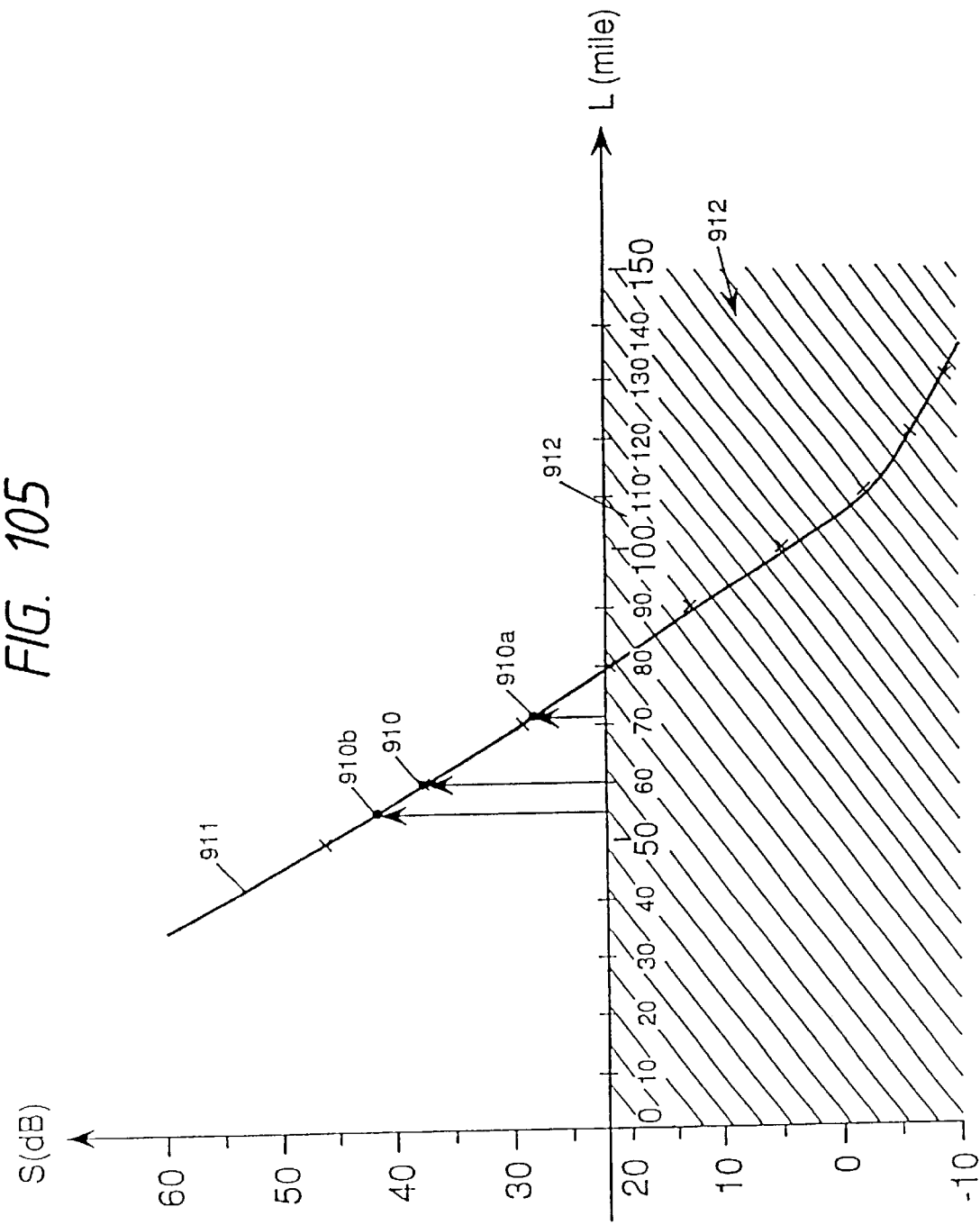
FIG. 105 is a graphic diagram showing the relation between signal level and distance from a transmitter antenna in terrestrial broadcast service according to the third embodiment.

One example of propagation of SRQAM signals of the present invention will now be described for use with a digital TV terrestrial broadcast service. FIG. 105 shows the relation between the signal level and the distance between a transmitter antenna and a receiver antenna in the terrestrial broad cast service. The curve 911 represents a transmitted signal from the transmitter antenna of 1250 feet high. It is assumed that the error rate essential for reproduction of an applicable digital TV signal is $10^{-1.5}$. The hatching area 912 represents a noise interruption. The point 910 represents a signal reception limit of a conventional 32 QAM signal at C/N=15 dB where the distance L is 60 miles and a digital HDTV signal can be intercepted at minimum.

The C/N rate varies 5 dB under a worse receiving condition such as bad weather. If a change in the relevant condition, e.g. weather, attenuates the C/N rate, the interception of an HDTV signal will hardly be ensured. Also, geographical conditions largely affect the propagation of signals and a decrease of about 10 dB at least will be unavoidable. Hence, successful signal interception within 60 miles will never be guaranteed and above all, a digital signal will be propagated harder than an analogue signal. It would be understood that the service area of a conventional digital TV broadcast service is less dependable.

Figure 106:
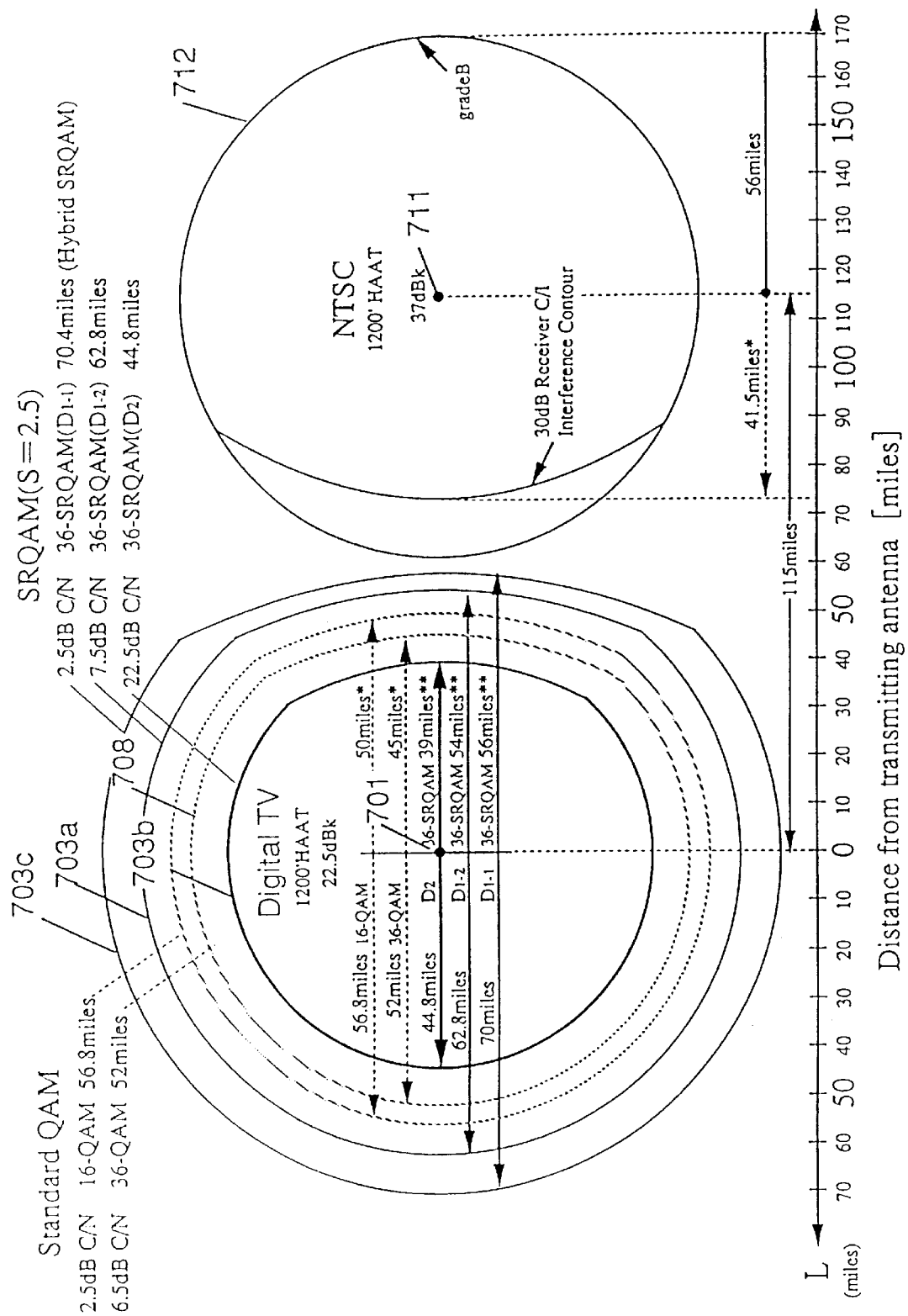
FIG. 106 is a diagram showing a service area of the 32 SRQAM signal of the third embodiment.

In case of the 32 SRQAM signal of the present invention, three-level signal transmission system is constituted as shown in FIGS. 133 and 137. This permits a low resolution NTSC signal of MPEG level to be carried on the 1-1 data stream $D_{1-1}$, a medium resolution TV data of e.g. NTSC system to be carried on the 1-2 data stream $D_{1-2}$, and a high frequency component of HDTV data to be carried on the second data stream $D_2$. Accordingly, the service area of the 1-2 data stream of the SRQAM signal is increased to a 70 mile point 910a while of the second data stream remains within a 55 mile point 910b, as shown in FIG. 105. FIG. 106 illustrates a computer simulation result of the service area of the 32 SRQAM signal of the present invention, which is similar to FIG. 53 but explains in more detail. As shown, the regions 708, 703c, 703a, 703b, 712 represent a conventional 32 QAM receivable area, a 1-1 data level $D_{1-1}$, receivable area, a 1-2 data level $D_{1-2}$ receivable area, a second data level $D_2$ receivable area, and a service area of a neighbor analogue TV station respectively. The conventional 32 QAM signal data used in this drawing is based on a conventionally disclosed one.

For common 32 QAM signal, the 60-mile-radius service area can be established theoretically. The signal level will however be attenuated by geographical or weather conditions and particularly, considerably declined at near the limit of the service area.

Figure 107:
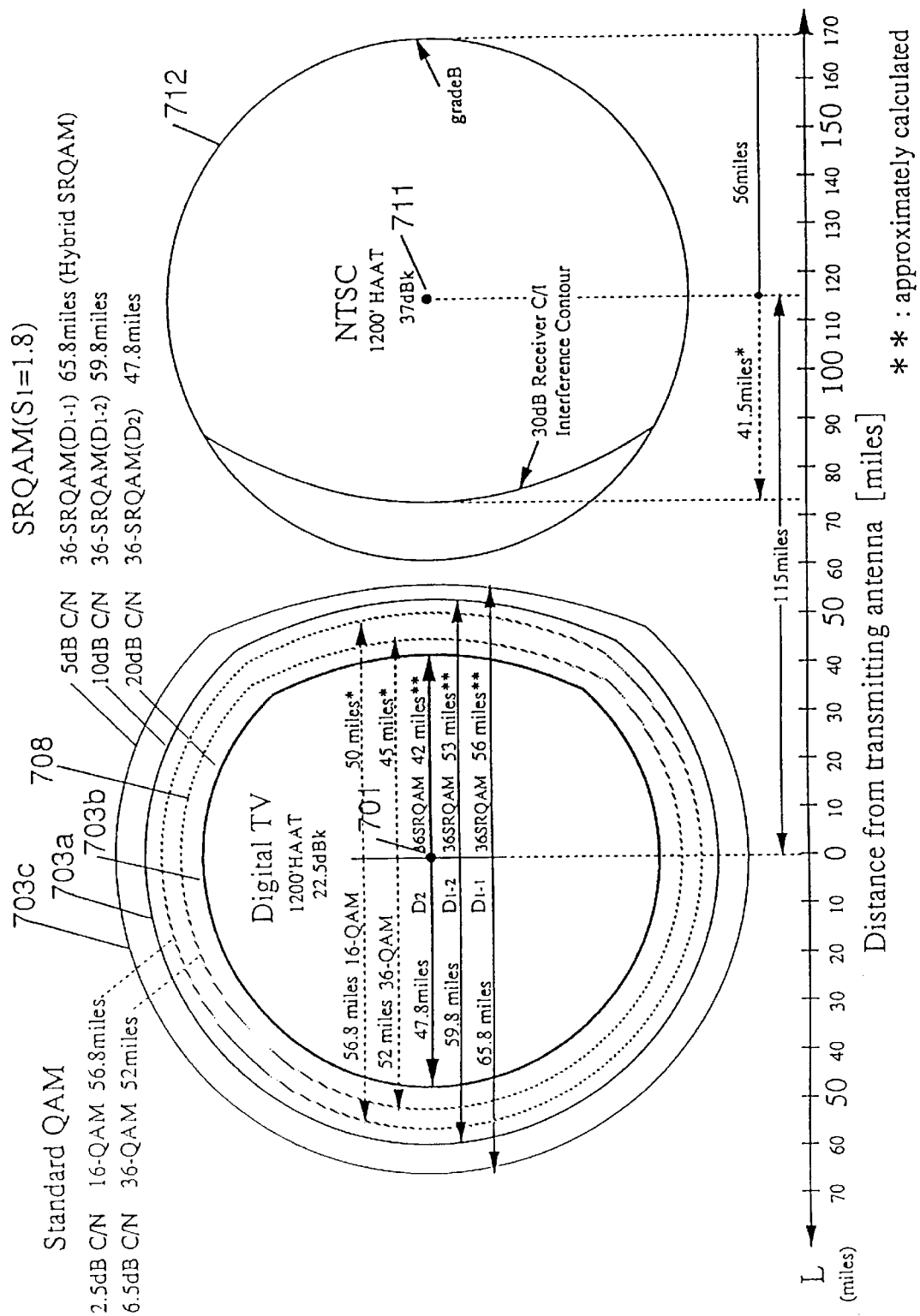
FIG. 107 is a diagram showing a service area of the 32SRQAM signal of the third embodiment.

If the low frequency band TV component of MPEG1 grade is carried on the 1-1 level $D_{1-1}$ data and the medium frequency band TV component of NTSC grade on the 1-2 level $D_{1-2}$ data and high frequency band TV component of HDTV on the second level $D_2$ data, the service area of the 32 SRQAM signal of the present invention is increased by 10 miles in radius for reception of an EDTV signal of medium resolution grade and 18 miles for reception of an LDTV signal of low resolution grade although decreased by 5 miles for reception of an HDTV signal of high resolution grade, as shown in FIG. 106. FIG. 107 shows a service area in case of a shift factor n or s=1.8. FIG. 135 shows the service area of FIG. 107 in terms of area.

More particularly, the medium resolution component of a digital TV broadcast signal of the SRQAM mode of the preset invention can successfully be intercepted in an unfavorable service region or shadow area where a conventional medium frequency band TV signal is hardly propagated and attenuated due to obstacles. Within at least the predetermined service area, the NTSC TV signal of the SRQAM mode can be intercepted by any traditional TV receiver. As the shadow or signal attenuating area developed by building structures and other obstacles or by interference of a neighbor analogue TV signal or produced in a low land is decreased to a minimum, TV viewers or subscribers will be increased in number.

Also, the HDTV service can be appreciated by only a few viewers who afford to have a set of high cost HDTV receiver and display, according to the conventional system. The system of the present invention allows a traditional NTSC, PAL, or SECAM receiver to intercept a medium resolution component of the digital HDTV signal with the use of an additional digital tuner. A majority of TV viewers can hence enjoy the service at less cost and will be increased in number. This will encourage the TV broadcast business and create an extra social benefit.

Furthermore, the signal receivable area for medium resolution or NTSC TV service according to the present invention is increased about 36% at n=2.5, as compared with the conventional system, As the service area thus the number of TV viewers is increased, the TV broadcast business enjoys an increasing profit. This reduces a risk in the development of a new digital TV business which will thus be encouraged to put into practice.

FIG. 107 shows the service area of a 32 SRQAM signal of the present invention in which the same effect will be ensured at n=1.8. Two service areas 703a, 703b of $D_1$ and $D_2$ signals respectively can be determined in extension for optimum signal propagation by varying the shift n considering a profile of HDTV and NTSC receiver distribution or geographical features. Accordingly, TV viewers will satisfy the service and a supplier station will enjoy a maximum of viewers.

This advantage is given when:

n>1.0

Hence, if the 32 SRQAM signal is selected, the shift n is determined by:

1<n<5

Also, if the 16 SRQAM signal is employed, n is determined by:

1<n<3

In the SRQAM mode signal terrestrial broadcast service in which the first and second data levels are created by shifting corresponding signal points as shown in FIGS. 99 and 100, the advantage of the present invention will be given when the shift n in a 16, 32, or 64 SRQAM signal is more than 1.0.

In the above embodiments, the low and high frequency band components of a video signal are transmitted as the first and second data streams. However, the transmitted signal may be an audio signal. In this case, low frequency or low resolution components of an audio signal may be transmitted as the first data stream, and high frequency or high resolution components of the audio signal may be transmitted as the second data stream. Accordingly, it is possible to receive high C/N portion in high sound quality, and low C/N portion in low sound quality. This can be utilized in PCM broadcast, radio, portable telephone and the like. In this case, the broadcasting area or communication distance can be expanded as compared with the conventional systems.

Furthermore, the third embodiment can incorporate a time division multiplexing (TDM) system as shown in FIG. 133. Utilization of the TDM makes it possible to increase the number of subchannels. An ECC encoder 743a and an ECC encoder 743b, provided in two subchannels, differentiate ECC code gains so as to make a difference between thresholds of these two subchannels. Whereby, an increase of channel number of the multi-level signal transmission can be realized. In this case, it is also possible to provide two Trellis encoders 743*a*, 743*b* as shown in FIG. 137 and differentiate their code gains. The explanation of this block diagram is substantially identical to that of later described block diagram of FIG. 131 which shows the sixth embodiment of the present invention and, therefore, will not described here.

In a simulation of FIG. 106, there is provided 5 dB difference of a coding gain between 1-1 subchannel $D_{1-1}$ and 1-2 subchannel $D_{1-2}$.

An SRQAM is the system applying a C-CDM (Constellation-Code Division Multiplex) of the present invention to a rectangle-QAM. A C-CDM, which is a multiplexing method independent of TDM or FDM, can obtain subchannels by dividing a constellation-code corresponding a code. An increase of the number of codes will bring an expansion of transmission capacity, which is not attained by TDM or FDM alone, while maintaining almost perfect compatibility with conventional communication apparatus. Thus C-CDM can bring excellent effects.

Figure 108:
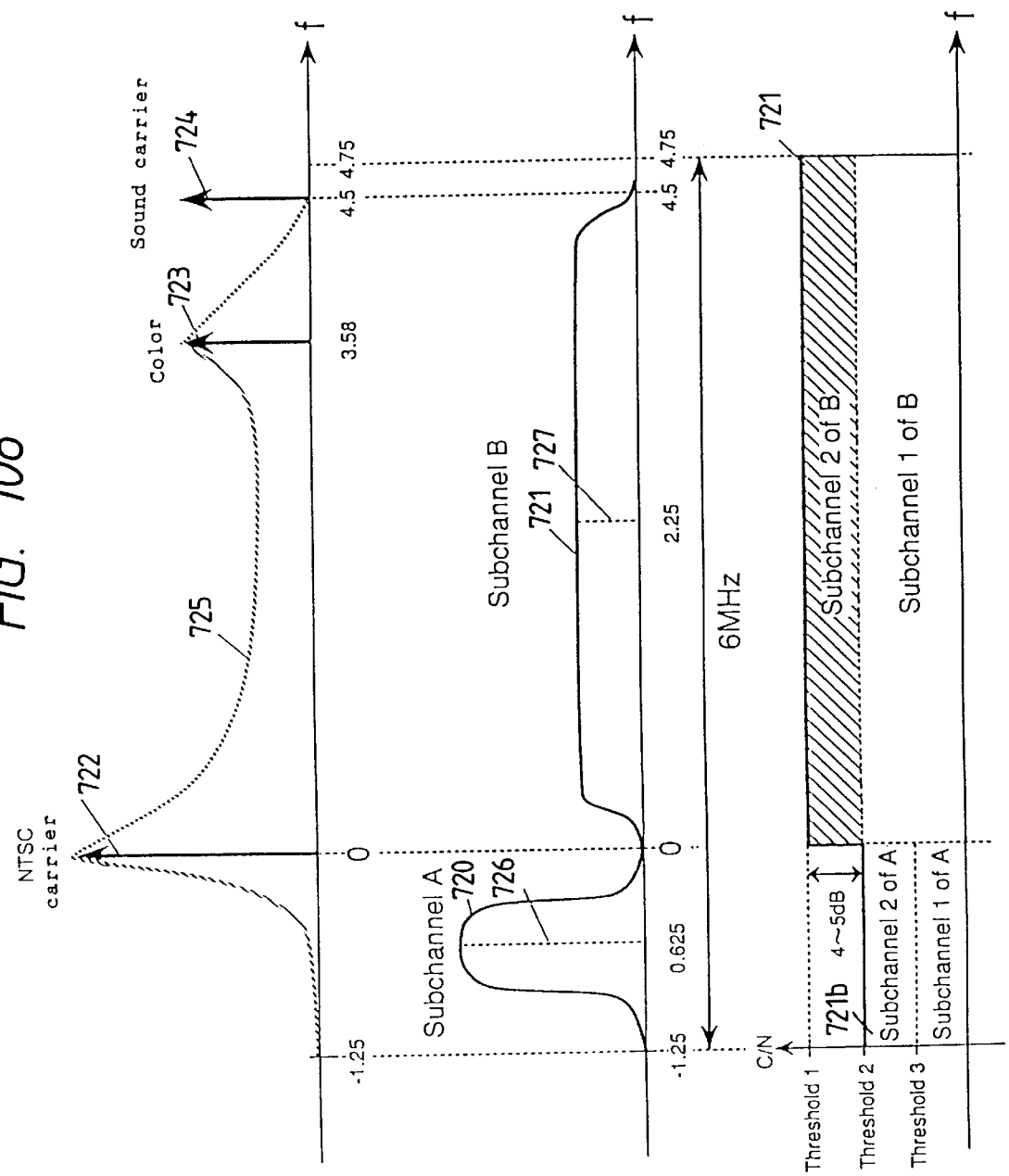
FIG. 108 is a diagram showing a frequency distribution profile of a TV signal of the third embodiment.

Although above embodiment combines the C-CDM and the TDM, it is also possible to combine the C-CDM with the FDM (Frequency Division Multiplex) to obtain similar modulation effect of threshold values. Such a system can be used for a TV broadcasting, and FIG. 108 shows a frequency distribution of a TV signal. A spectrum 725 represents a frequency distribution of a conventional analogue, e.g. NTSC, broadcasting signal. The largest signal is a video carrier 722. A color carrier 723 and a sound carrier 724 are not so large. There is known a method of using an FDM for dividing a digital broadcasting signal into two frequencies. In this case, a carrier is divided into a first carrier 726 and a second carrier 727 to transmit a first 720 and a second signal 721 respectively. An interference can be lowered by placing first and second carriers 726, 727 sufficiently far from the video carrier 722. The first signal 720 serves to transmit a low resolution TV signal at a large output level, while the second signal 721 serves to transmit a high resolution TV signal at a small output level. Consequently, the multi-level signal transmission making use of an FDM can be realized without being bothered by obstruction.

FIG. 134 shows an example of a conventional method using a 32 QAM system. As the subchannel A has a larger output than the subchannel B, a threshold value for the subchannel A, i.e. a threshold 1, can be set small 4~5 dB than a threshold value for the subchannel B, i.e. a threshold 2. Accordingly, a two-level broadcasting having 4~5 dB threshold difference can be realized. In this case, however, a large reduction of signal reception amount will occur if the receiving signal level decreases below the threshold 2. Because the second signal 721*a*, having a large information amount as shaded in the drawing, cannot be received in such a case and only the first signal 720*a*, having a small information amount, is received. Consequently, a picture quality brought by the second level will be extremely worse.

However, the present invention resolves this problem. According to the present invention, the first signal 720 is given by 32 SRQAM mode which is obtained through C-CDM modulation so that the subchannel A is divided into two subchannels 1 of A and 2 of A. The newly added subchannel 1 of $A_1$ having a lowest threshold value, carries a low resolution component. The second signal 721 is also given by 32 SRQAM mode, and a threshold value for the subchannel 1 of B is equalized with the threshold 2.

With this arrangement, the region in which a transmitted signal is not received when the signal level decreases below the threshold 2 is reduced to a shaded portion of the second signal 721*a* in FIG. 108. As the subchannel 1 of B and the subchannel A are both receivable, the transmission amount is not so much reduced in total. Accordingly, a better picture quality is reproduced even in the second level at the signal level of the threshold 2.

By transmitting a normal resolution component in one subchannel, it becomes possible to increase the number of multiple level and expand a low resolution service area. This low-threshold subchannel is utilized for transmitting important information such as sound information, sync information, headers of respective data, because these information carried on this low-threshold subchannel can be surely received. Thus stable reception is feasible. If a subchannel is newly added in the second signal 721 in the same manner, the level number of multi-level transmission can be increased in the service area. In the case where an HDTV signal has 1050 scanning lines, an new service area equivalent to 775 lines can be provided in addition to 525 lines.

Accordingly, the combination of the FDM and the C-CDM realizes an increase of service area. Although above embodiment divides a subchannel into two, it is needless to say it will also be preferable to divide it into three or more.

Figure 109:
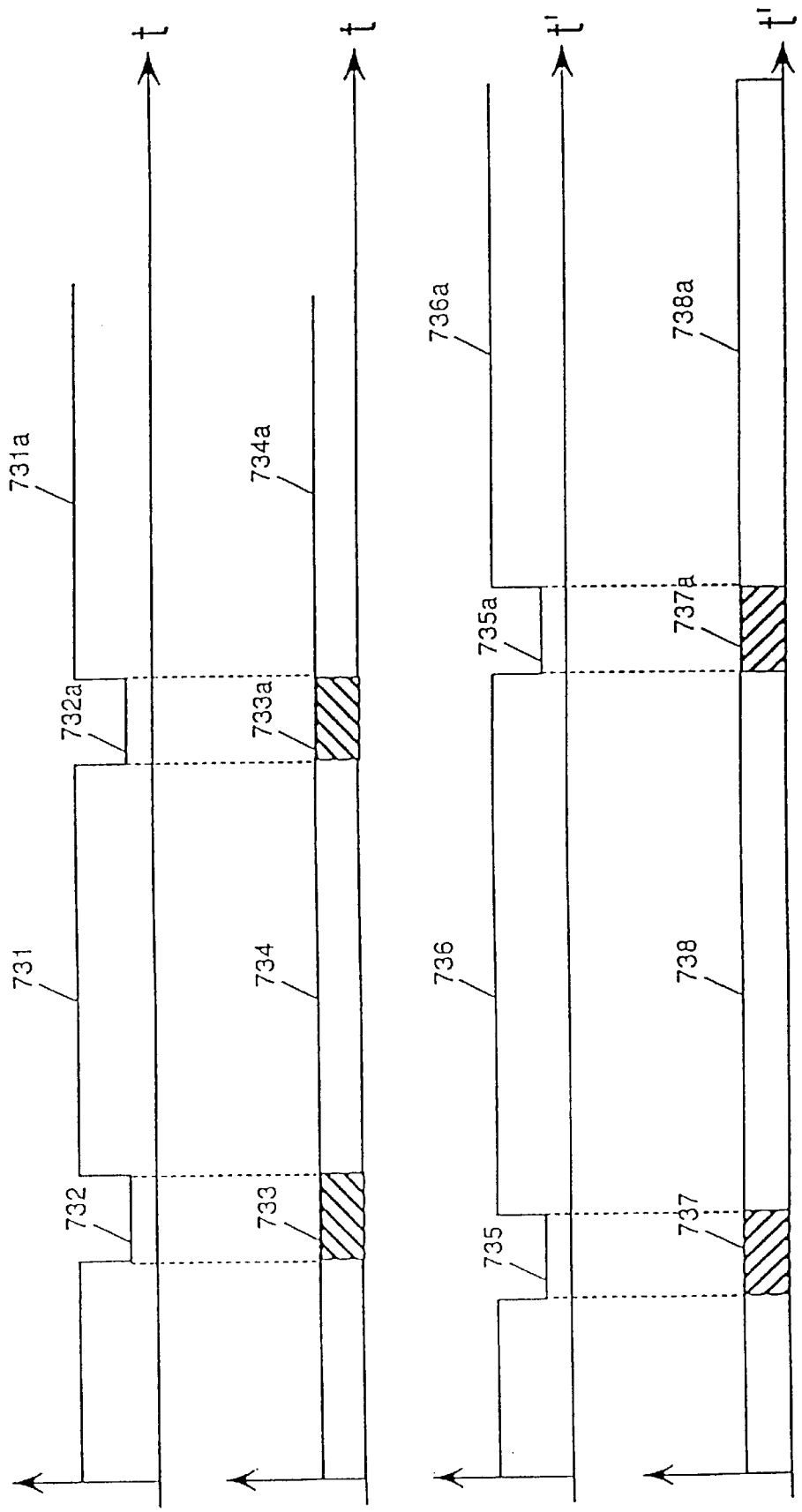
FIG. 109 is a diagram showing a time assignment of the TV signal of the third embodiment.

Next, a method of avoiding obstruction by combining the TDM and the C-CDM will be explained. As shown in FIG. 109, an analogue TV signal includes a horizontal retrace line portion 732 and a video signal portion 731. This method utilizes a low signal level of the horizontal retrace line portion 732 and non-display of obstruction on a picture plane during this period. By synchronizing a digital TV signal with an analogue TV signal, horizontal retrace line sync slots 733, 733*a* of the horizontal retrace line portion 732 can be used for transmission of an important, e.g. a sync, signal or numerous data at a high output level. Thus, it becomes possible to increase data amount or output level without increasing obstruction. The similar effect will be expected even if vertical retrace line sync slots 737, 737*a* are provided synchronously with vertical retrace line portions 735, 735*a*.

Figure 110:
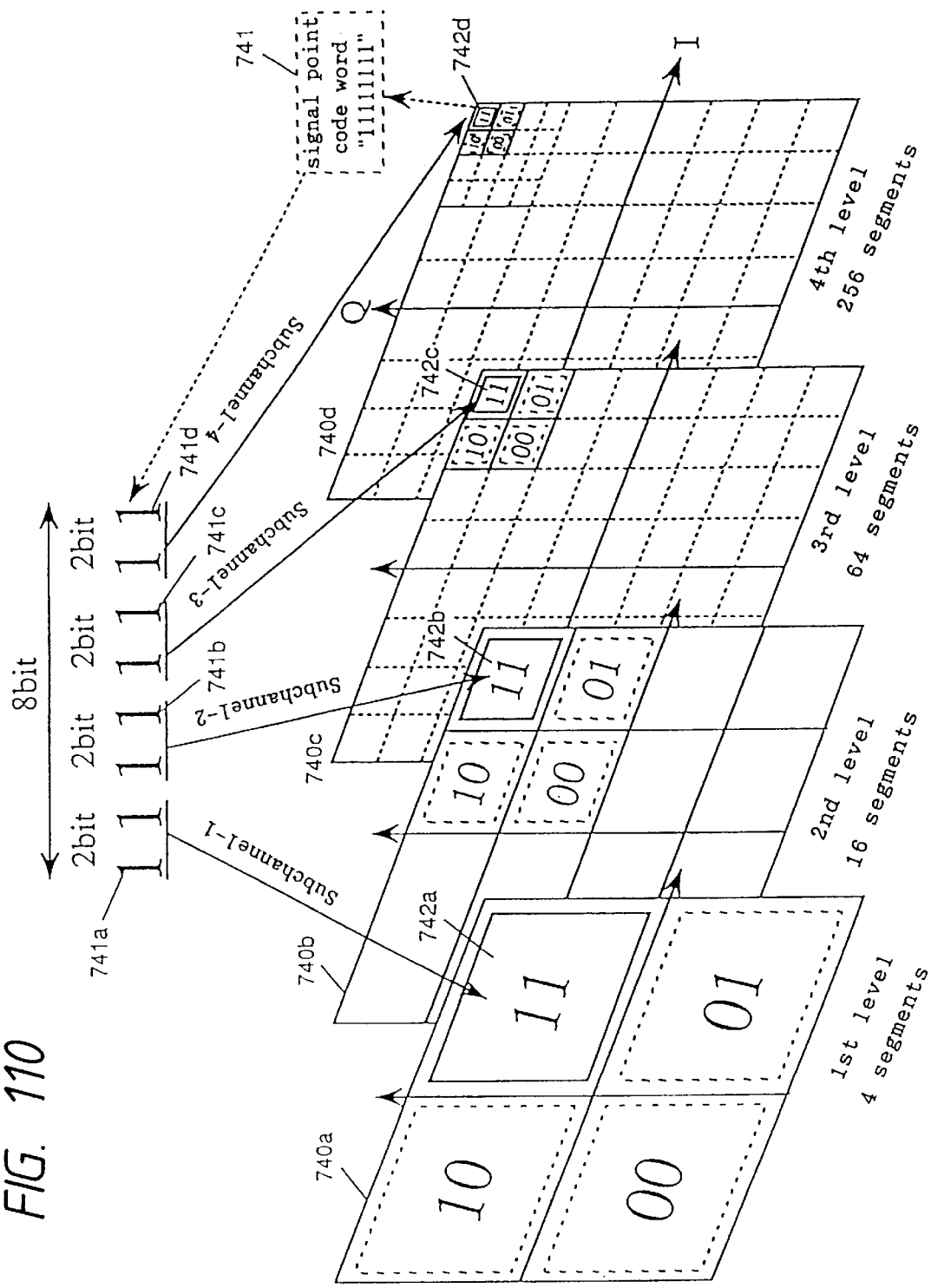
FIG. 110 is a diagram showing a principle of C-CDM of the third embodiment.

FIG. 110 shows a principle of the C-CDM. Furthermore, FIG. 111 shows a code assignment of the C-CDM equivalent to an expanded 16 QAM. FIG. 112 shows a code assignment of the C-CDM equivalent to an expanded 36 QAM. As shown in FIGS. 110 and 111, a 256 QAM signal is divided into four, 740*a*, 740*b*, 740*c*, 740*d*, levels which have 4, 16, 64, 256 segments, respectively. A signal code word 742*d* of 256 QAM on the fourth level 740*d* is "11111111" of 8 bit. This is split into four code words 741*a*, 741*b*, 741*c*, and 741*d* of 2-bit—i.e. "11", "11", "11", "11", which are then allocated on signal point regions 742*a*, 742*b*, 742*c*, 742*d* of first, second, third, fourth levels 740*a*, 740*b*, 740*c*, 740*d*, respectively. As a result, subchannels 1, 2, 3, 4 of 2 bit are created. This is termed as C-CDM (Constellation-Code Division Multiplex). FIG. 111 shows a detailed code assignment of the C-CDM equivalent to expanded 16 QAM , and FIG. 112 shows a detailed code assignment of the C-CDM equivalent to expanded 36 QAM. As the C-CDM is an independent multiplexing system, it can be combined with the conventional FDM (Frequency Division Multiplex) or TDM (Time Division Multiplex) to further increase the number of subchannels. In this manner, the C-CDM system realizes a novel multiplexing system. Although the C-CDM is explained by using a rectangle QAM, other modulation system having signal points, e.g. QAM, PSK, ASK, and even FSK if frequency regions are regarded as signal points, can be also used for this multiplexing in the same manner.

Embodiment 4

A fourth embodiment of the present invention will be described referring to the relevant drawings.

Figure 37:
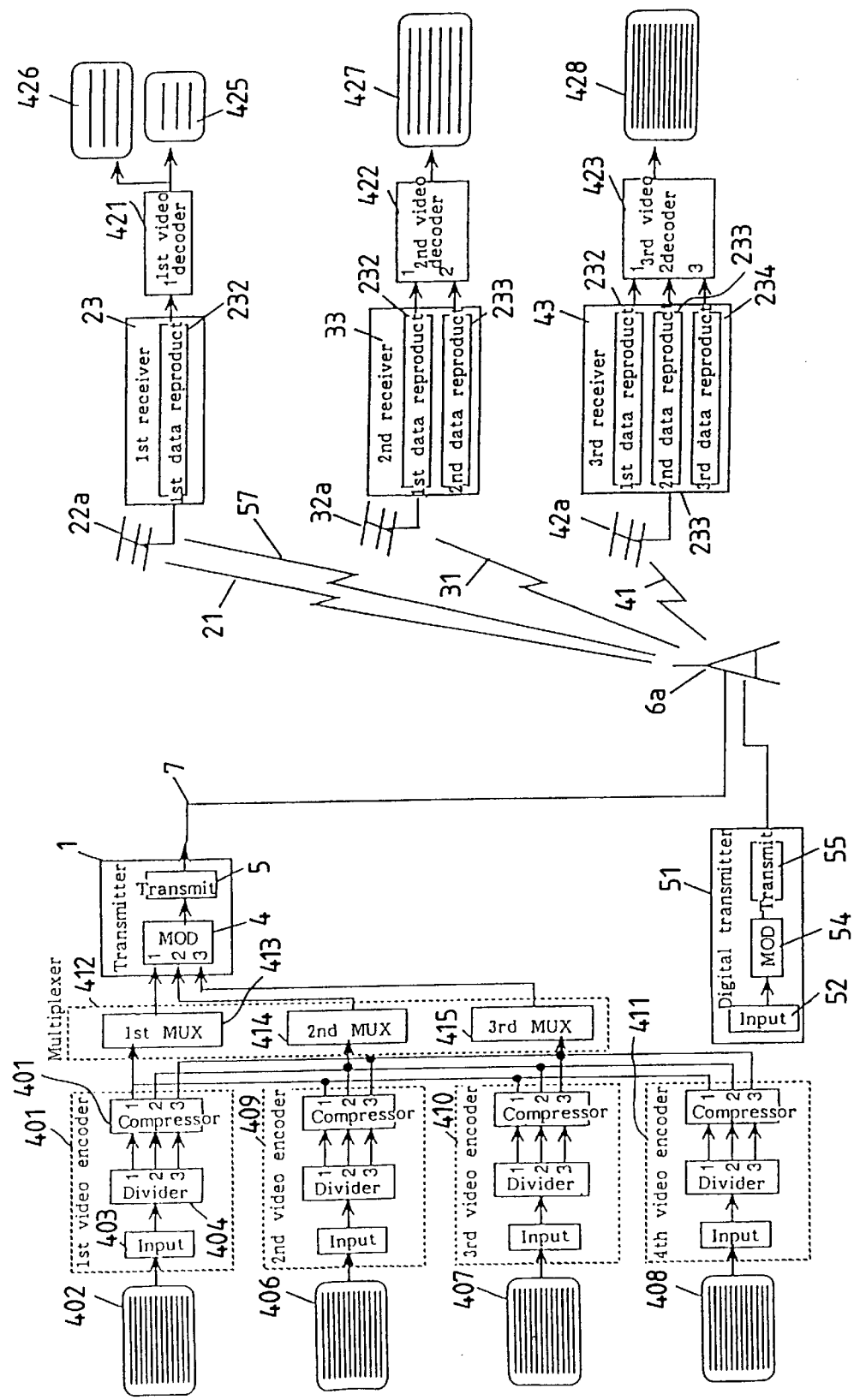
FIG. 37 is a schematic view of the entire arrangement of a signal transmission system showing a fourth embodiment of the present invention.

FIG. 37 illustrates the entire arrangement of a signal transmission system of the fourth embodiment, which is arranged for terrestrial service and similar in both construction and action to that of the third embodiment shown in FIG. 29. The difference is that the transmitter antenna 6 is replaced with a terrestrial antenna 6a and the receiver antennas 22, 23, 24 are replaced with also three terrestrial antennas 22a, 23a, 24a. The action of the system is identical to that of the third embodiment and will no more be explained. The terrestrial broadcast service unlike a satellite service depends much on the distance between the transmitter antenna 6a to the receiver antennas 22a, 32a, 42a. If a receiver is located far from the transmitter, the level of a received signal is low. Particularly, a common multi-level QAM signal can hardly be demodulated by the receiver which thus reproduces no TV program.

The signal transmission system of the present invention allows the first receiver 23 equipped with the antenna 22a, which is located at a far distance as shown in FIG. 37, to intercept a modified 16 or 64 QAM signal and demodulate at 4 PSK mode the first data stream or $D_1$ component of the received signal to an NTSC video signal so that a TV program picture of medium resolution can be displayed even if the level of the received signal is relatively low.

Also, the second receiver 33 with the antenna 32a is located at a medium distance from the antenna 6a and can thus intercept and demodulate both the first and second data streams or $D_1$ and $D_2$ components of the modified 16 or 64 QAM signal to an HDTV video signal which in turn produces an HDTV program picture.

The third receiver 43 with the antenna 42a is located at a near distance and can intercept and demodulate the first, second, and third data streams or $D_1$, $D_2$, and $D_3$ components of the modified 16 or 64 QAM signal to a super HDTV video signal which in turn produces a super HDTV picture in quality to a common movie picture.

The assignment of frequencies is determined by the same manner as of the time division multiplexing shown in FIGS. 34, 35, and 36. Like FIG. 34, when the frequencies are assigned t first to sixth channels, L1 of the $D_1$ component carries an NTSC data of the first channel, M1 of the D2 component carries an HDTV difference data of the first channel, and H1 of the $D_3$ component carries a super HDTV difference data of the first channel. Accordingly, NTSC, HDTV, and super HDTV data all can be carried on the same channel. If $D_2$ and $D_3$ of the other channels are utilized as shown in FIGS. 35 and 36, more data of HDTV and super HDTV respectively can be transmitted for higher resolution display.

As understood, the system allows three different but compatible digital TV signals to be carried on a single channel or using $D_2$ and $D_3$ regions of other channels. Also, the medium resolution TV picture data of each channel can be intercepted in a wider service area according to the present invention.

A variety of terrestrial digital TV broadcast systems employing a 16 QAM HDTV signal of 6 MHz bandwidth have been proposed. Those are however not compatible with the existing NTSC system and thus, have to be associated with a simulcast technique for transmitting NTSC signals of the same program on another channel. Also, such a common 16 QAM signal limits a service area. The terrestrial service system of the present invention allows a receiver located at a relatively far distance to intercept successfully a medium resolution TV signal with no use of an additional device nor an extra channel.

Figure 52:
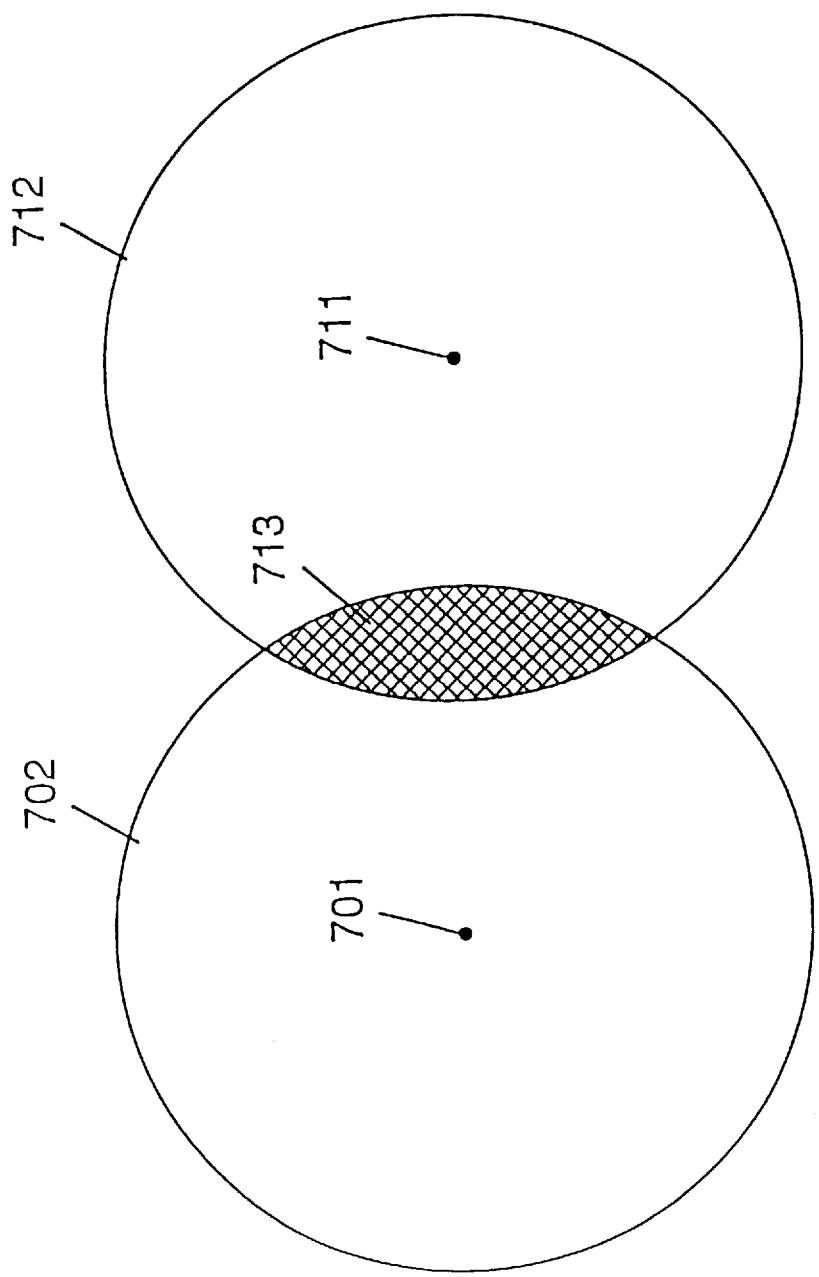
FIG. 52 is a diagram showing a signal interference region in a known transmission method according to the fourth embodiment.

FIG. 52. shows an interference region of the service area 702 of a conventional terrestrial digital HDTV broadcast station 701. As shown, the service area 702 of the conventional HDTV station 701 is intersected with the service area 712 of a neighbor analogue TV station 711. At the intersecting region 713, an HDTV signal is attenuated by signal interference from the analogue TV station 711 and will thus be intercepted with less consistency.

Figure 53:
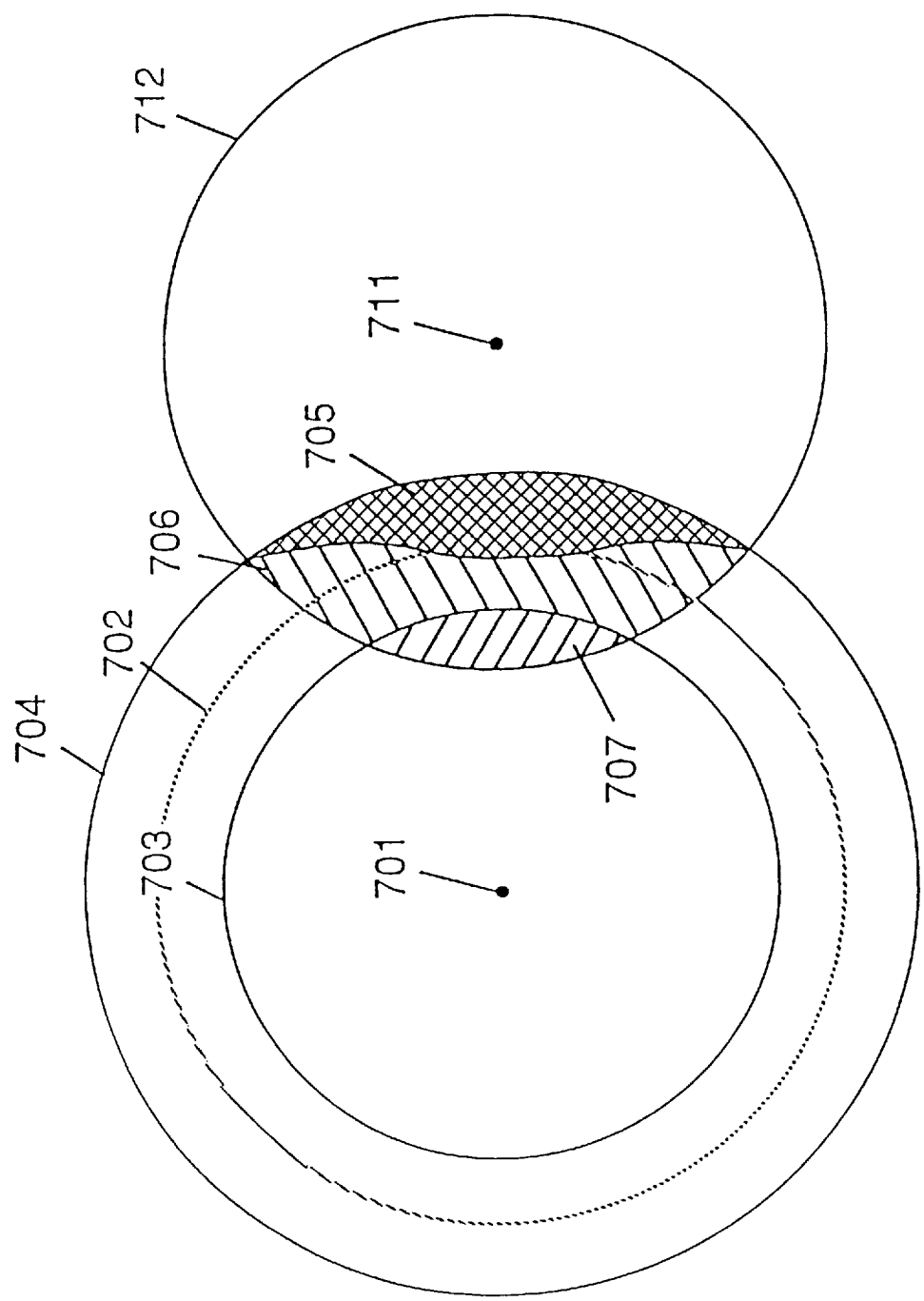
FIG. 53 is a diagram showing signal interference regions in a multi-level signal transmission method according to the fourth embodiment.

FIG. 53 shows an interference region associated with the multi-level signal transmission system of the present invention. The system is low in the energy utilization as compared with a conventional system and its service area 703 for HDTV signal propagation is smaller than the area 702 of the conventional system. In contrary, the service area 704 for digital NTSC or medium resolution TV signal propagation is larger than the conventional area 702. The level of signal interference from a digital TV station 701 of the system to a neighbor analogue TV station 711 is equivalent to that from a conventional digital TV station, such as shown in FIG. 52.

In the service area of the digital TV station 701, there are three interference regions developed by signal interference from the analogue TV station 711. Both HDTV and NTSC signals can hardly be intercepted in the first region 705. Although fairly interfered, an NTSC signal may be intercepted at an equal level in the second region 706 denoted by the left down hatching. The NTSC signal is carried on the first data stream which can be reproduced at a relatively low C/N rate and will thus be minimum affected when the C/N rate is declined by signal interference from the analogue TV station 711.

At the third region 707 denoted by the right down hatching, an HDTV signal can also be intercepted when signal interference is absent while the NTSC signal can constantly be intercepted at a low level.

Accordingly, the overall signal receivable area of the system will be increased although the service area of HDTV signals becomes a little bit smaller than that of the conventional system. Also, at the signal attenuating regions produced by interference from a neighbor analogue TV station, NTSC level signals of an HDTV program can successfully be intercepted as compared with the conventional system where no HDTV program is viewed in the same area. The system of the present invention much reduces the size of signal attenuating area and when increases the energy of signal transmission at a transmitter or transponder station, can extend the HDTV signal service area to an equal size to the conventional system. Also, NTSC level signals of a TV program can be intercepted more or less in a far distance area where no service is given by the conventional system or a signal interference area caused by an adjacent analogue TV station.

Figure 78:
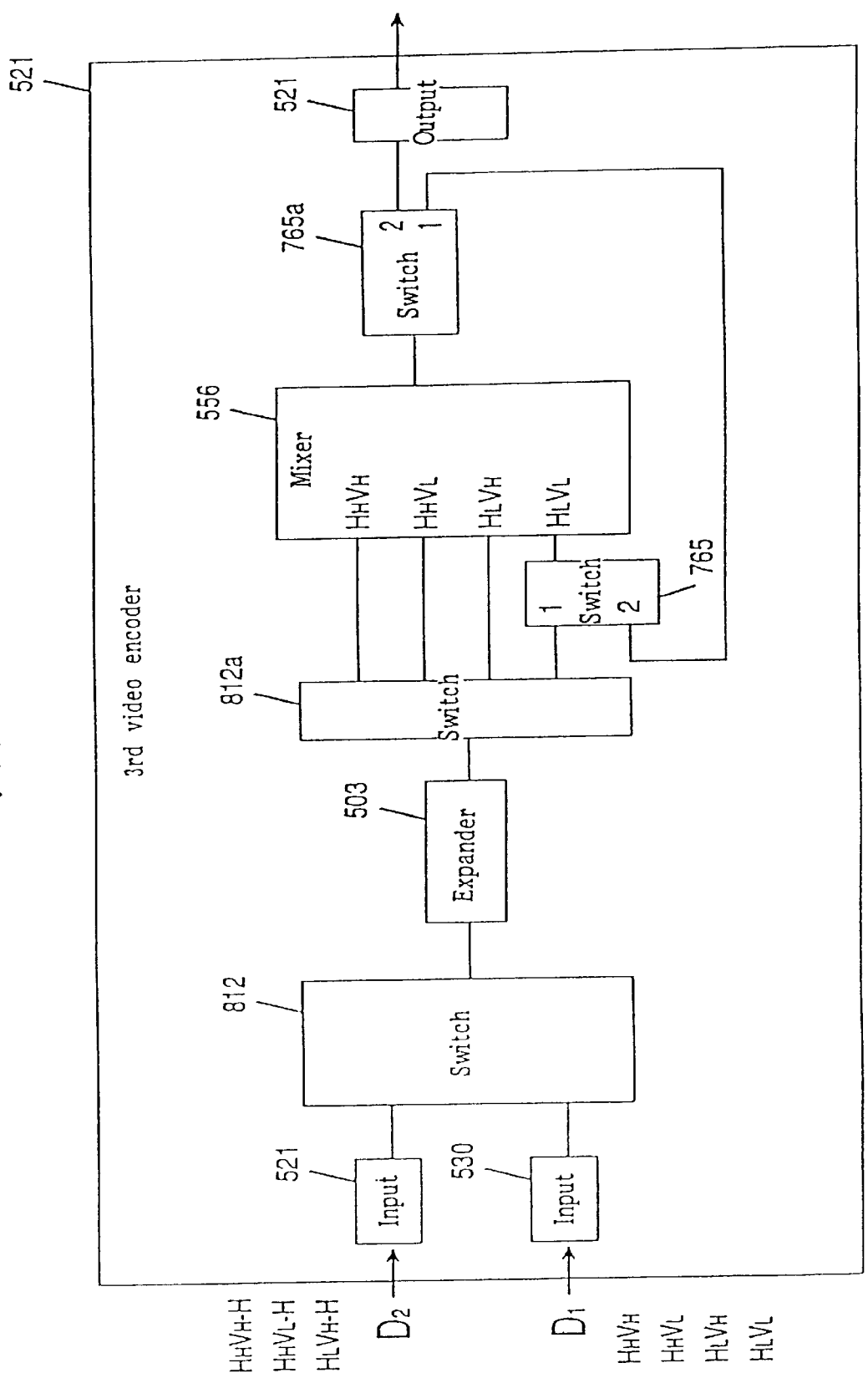
FIG. 78 is a block diagram of a video decoder of the fifth embodiment.

Although the embodiment employs a two-level signal transmission method, a three-level method such as shown in FIG. 78 will be used with equal success. If an HDTV signal is divided into three picture levels-HDTV, NTC, and low resolution NTSC, the service area shown in FIG. 53 will be increased from two levels to three levels where the signal propagation is extended radially and outwardly. Also, low resolution NTSC signals can be received at an acceptable level at the first signal interference region 705 where NTSC signals are hardly be intercepted in the two-level system. As understood, the signal interference is also involved from a digital TV station to an analogue TV station.

Figure 54:
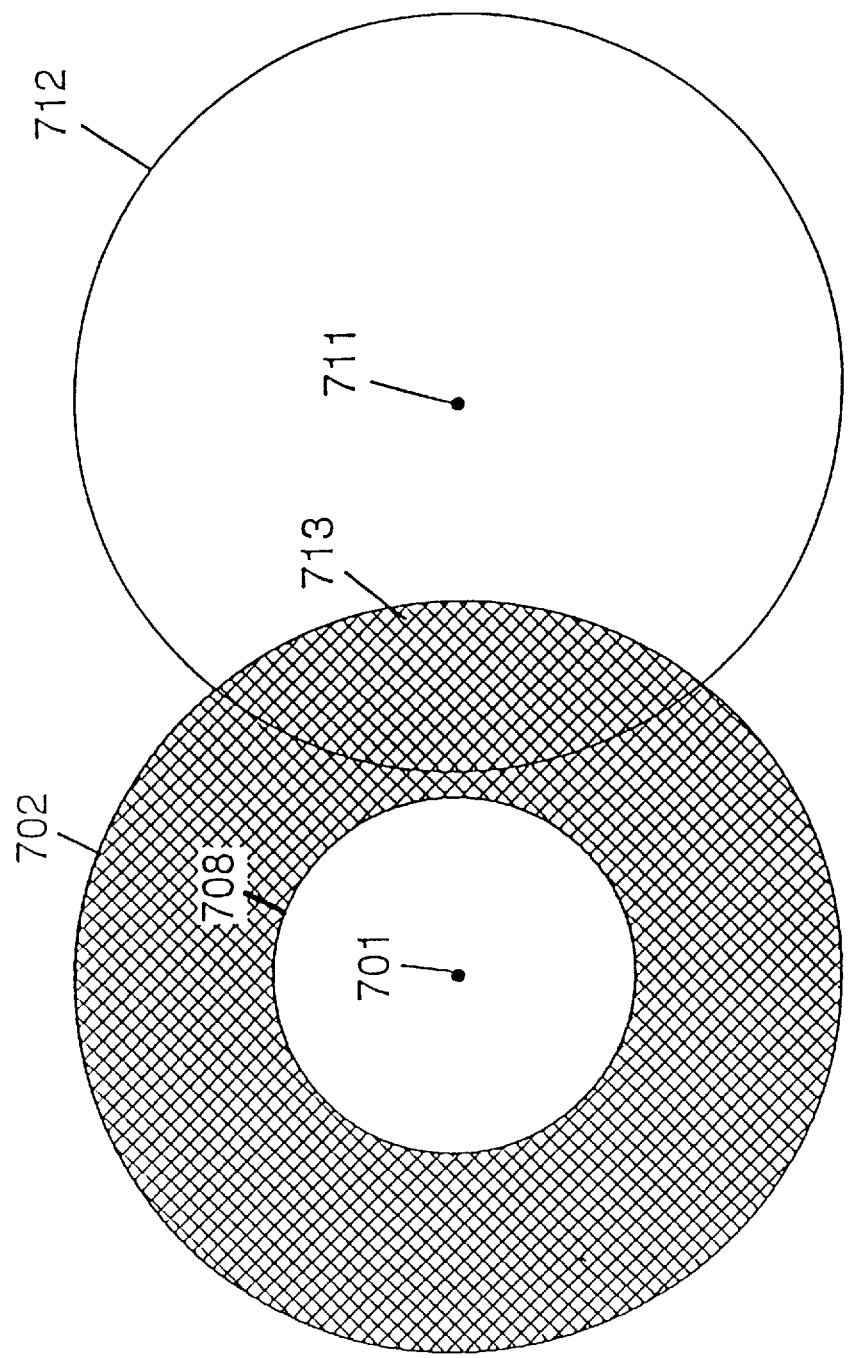
FIG. 54 is a diagram showing signal attenuating regions in the known transmission method according to the fourth embodiment.

The description will now be continued, provided that no digital TV station should cause a signal interference to any neighbor analogue TV station. According to a novel system under consideration in U.S.A., no-use channels of the existing service channels are utilized for HDTV and thus, digital signals must not interfere with analogue signals. For the purpose, the transmitting level of a digital signal has to be decreased lower than that shown in FIG. 53. If the digital signal is of conventional 16 QAM or 4 PSK mode, its HDTV service area 708 becomes decreased as the signal interference region 713 denoted by the cross hatching is fairly large as shown in FIG. 54. This results in a less number of viewers and sponsors, whereby such a digital system will have much difficulty to operate for profitable business.

Figure 55:
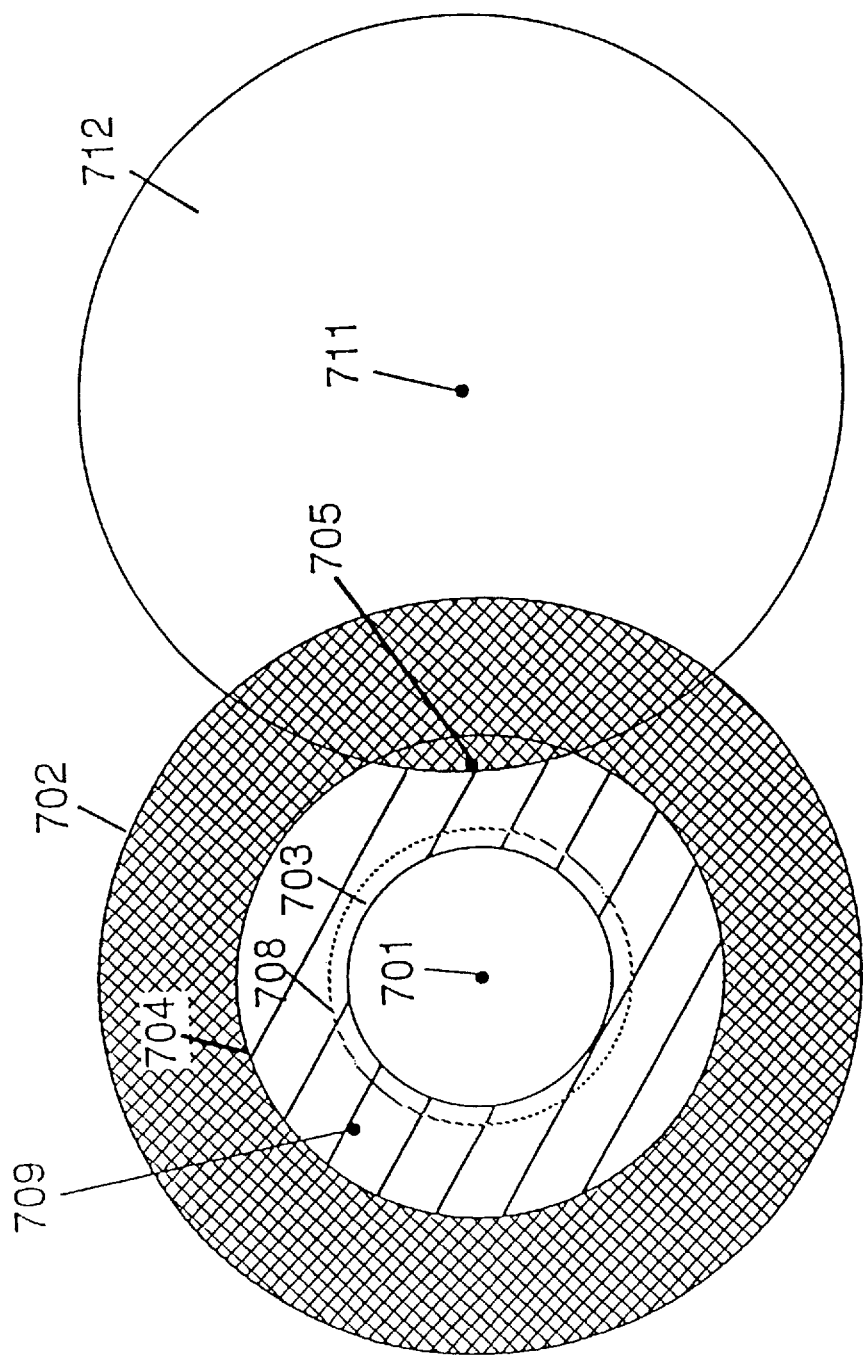
FIG. 55 is a diagram showing signal attenuating regions in the multi-level signal transmission method according to the fourth embodiment.

FIG. 55 shows a similar result according to the system of the present invention. As apparent, the HDTV signal receivable 703 is a little bit smaller than the equal area 708 of the conventional system. However, the lower resolution or NTSC TV signal receivable area 704 will be increased as compared with the conventional system. The hatching area represents a region where the NTSC level signal of a program can be received while the HDTV signal of the same is hardly intercepted. At the first interference region 705, both HDTV and NTSC signals cannot be intercepted due to signal interference from an analogue station 711.

When the level of signals is equal, the multi-level transmission system of the present invention provides a smaller HDTV service area and a greater NTSC service area for interception of an HDTV program at an NTSC signal level. Accordingly, the overall service area of each station is increased and more viewers can enjoy its TV broadcasting service. Furthermore, HDTV/NTSC compatible TV business can be operated with economical advantages and consistency. It is also intended that the level of a transmitting signal is increased when the control on averting signal interference to neighbor analogue TV stations is lessened corresponding to a sharp increase in the number of home-use digital receivers. Hence, the service area of HDTV signals will be increased and in this respect, the two different regions for interception of HDTV/NTSC and NTSC digital TV signal levels respectively, shown in FIG. 55, can be adjusted in proportion by varying the signal point distance in the first and/or second data stream. As the first data stream carries information about the signal point distance, a multi-level signal can be received with more certainty.

Figure 56:
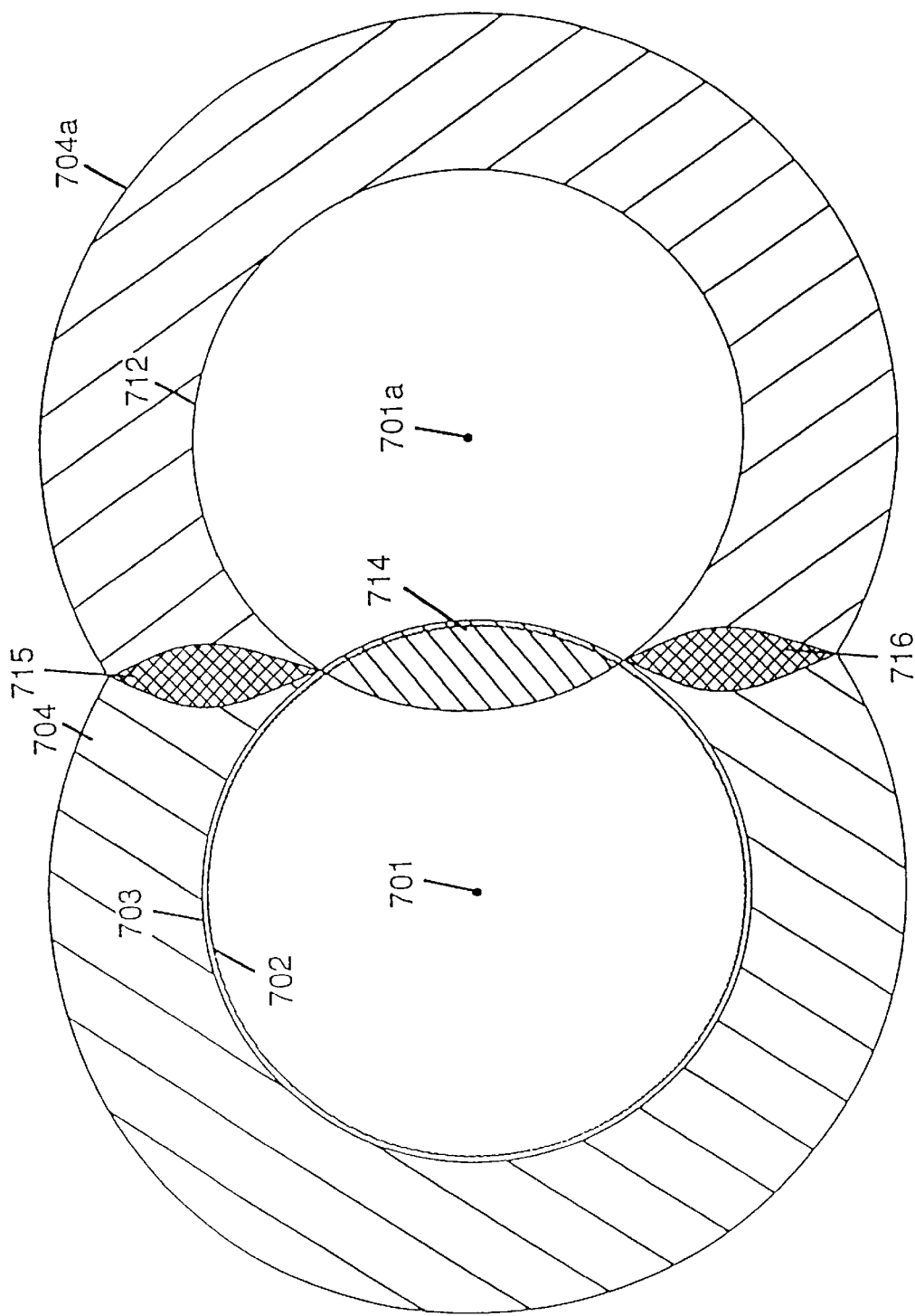
FIG. 56 is a diagram showing a signal interference region between two digital TV stations according to the fourth embodiment.

FIG. 56 illustrates signal interference between two digital TV stations in which a neighbor TV station 701a also provides a digital TV broadcast service, as compared with an analogue station in FIG. 52. Since the level of a transmitting signal becomes high, the HDTV service or high resolution TV signal receivable area 703 in increased to an extension equal to the service area 702 of an analogue TV system.

At the intersecting region 714 between two service areas of their respective stations, the received signal can be reproduced not to an HDTV level picture with the use of a common directional antenna due to signal interference but to an NTSC level picture with a particular directional antenna directed towards a desired TV station. If a highly directional antenna is used, the received signal from a target station will be reproduced to an HDTV picture. The low resolution signal receivable area 704 is increased larger than the analogue TV system service area 702 and a couple of intersecting regions 715, 716 developed by the two low resolution signal receivable areas 704 and 704a of their respective digital TV stations 701 and 701a permit the received signal from antenna directed one of the two stations to be reproduced to an NTSC level picture.

The HDTV service area of the multi-level signal transmission system of the present invention itself will be much increased when applicable signal restriction rules are withdrawn in a coming digital TV broadcast service maturity time.

At the time, the system of the present invention also provides as a wide HDTV signal receivable area as of the conventional system and particularly, allows its transmitting signal to be reproduced at an NTSC level in a further distance or intersecting areas where TV signals of the conventional system are hardly intercepted. Accordingly, signal attenuating or shadow regions in the service area will be minimized.

Embodiment 5

Figure 57:
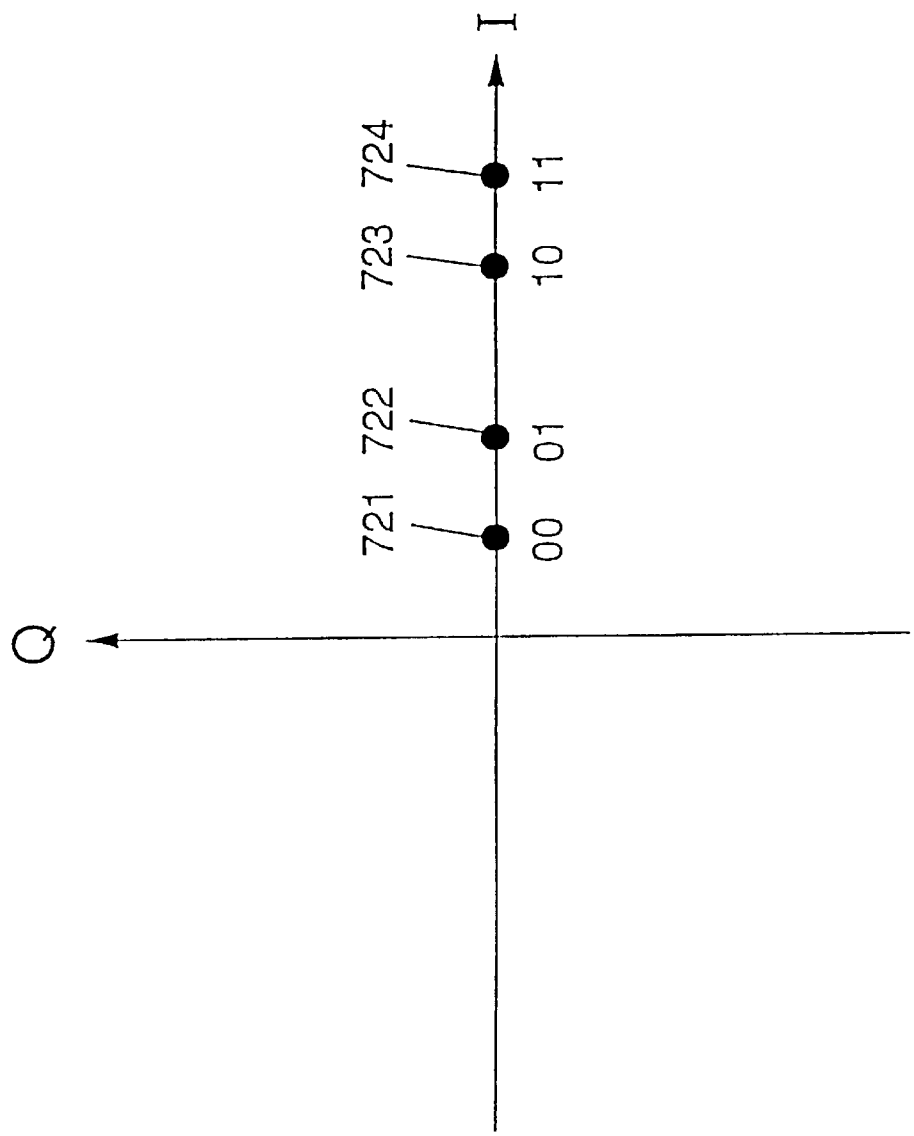
FIG. 57 is a diagram showing an assignment of signal points of a modified 4 ASK signal of the fifth embodiment.

A first embodiment of the present invention resides in amplitude modulation or ASK procedure. FIG. 57 illustrates the assignment of signal points of a 4-level ASK signal according to the fifth embodiment, in which four signal points are denoted by 721, 722, 723, and 724. The four-level transmission permits a 2-bit data to be transmitted in every cycle period. It is assumed that the four signal points 721, 722, 723, 724 represent two-bit patterns 00, 01, 10, 11 respectively.

For ease of four-level signal transmission of the embodiment, the two signal points 721, 722 are designated as a first signal point group 725 and the other two 723, 724 are designated as a second signal point group 726. The distance between the two signal point groups 725 and 726 is then determined wider than that between any two adjacent signal points. More specifically, the distance $L_0$ between the two signals 722 and 723 is arranged wider than the distance L between the two adjacent points 721 and 722 or 723 and 724. This is expressed as:

$L_0 > L$

Hence, the multi-level signal transmission system of the embodiment is based on $L_0 > L$. The embodiment is however not limited to $L_0 > L$ and $L = L_0$ will be employed temporarily or permanently depending on the requirements of design, condition, and setting.

The two signal point groups are assigned one-bit patterns of the first data stream $D_1$, as shown in FIG. 59(a). More particularly, a bit 0 of binary system is assigned to the first signal point group 725 and another bit 1 to the second signal point group 726. Then, a one-bit pattern of the second data stream $D_2$ is assigned to each signal point. For example, the two signal points 721, 723 are assigned $D_2=0$ and the other two signal points 722 and 724 are assigned $D_2=1$. Those are thus expressed by two bits per symbol.

Figure 60:
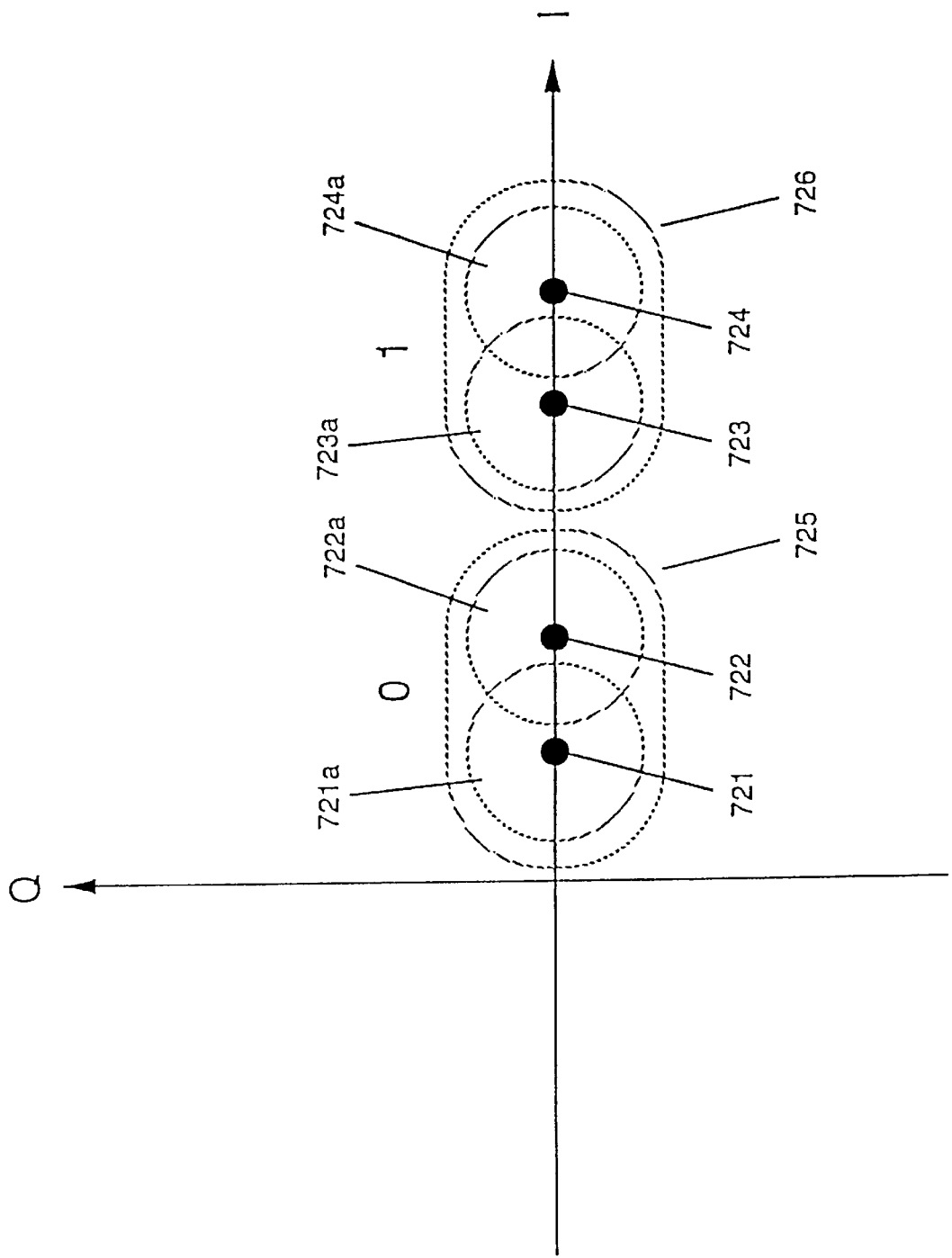
FIG. 60 is a diagram showing another assignment of signal points of the modified 4 ASK signal of the fifth embodiment when the C/N rate is low.

The multi-level signal transmission of the present invention can be implemented in an ASK mode with the use of the foregoing signal point assignment. The system of the present invention works in the same manner as of a conventional equal signal point distance technique when the signal to noise ratio or C/N rate is high. If the C/N rate becomes low and no data can be reproduced by the conventional technique, the present system ensures reproduction of the first data stream $D_1$ but not the second data stream $D_2$. In more detail, the state at a low C/N is shown in FIG. 60. The signal points transmitted are displaced by a Gaussian distribution to ranges 721a, 722a, 723a, 724a respectively at the receiver side due to noise and transmission distortion. Therefore, the distinction between the two signals 721 and 722 or 723 and 724 will hardly be executed. In other words, the error rate in the second data stream $D_2$ will be increased. As apparent from FIG. 60, the two signal points 721, 722 are easily distinguished from the other two signal points 723, 724. The distinction between the two signal point groups 725 and 726 can thus be carried out with ease. As the result, the first data stream $D_1$ will be reproduced at a low error rate.

Accordingly, the two different level data $D_1$ and $D_2$ can be transmitted simultaneously. More particularly, both the first and second data streams $D_1$ and $D_2$ of a given signal transmitted through the multi-level transmission system can be reproduced at the area where the C/N rate is high and the first data stream $D_1$ only can be reproduced in the area where the C/N rate is low.

Figure 61:
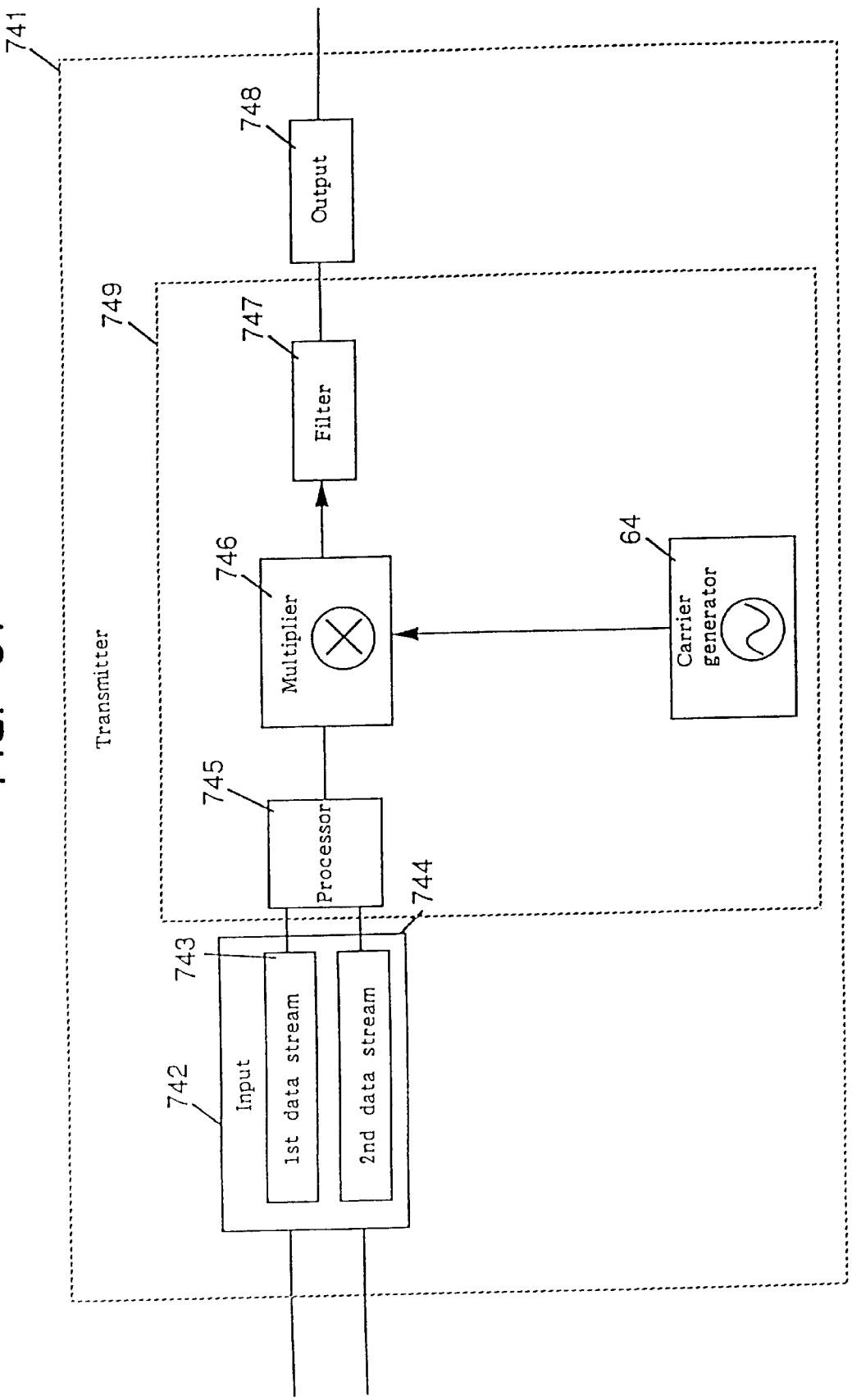
FIG. 61 is a block diagram of a transmitter of the fifth embodiment.

FIG. 61 is a block diagram of a transmitter 741 in which an input unit 742 comprises a first data stream input 743 and a second data stream input 744. A carrier wave from a carrier generator 64 is amplitude modulated by a multiplier 746 using an input signal fed across a processor 745 from the input unit 743. The modulated signal is then band limited by a filter 747 to an ASK signal of e.g. VSB mode which is then delivered from an output unit 748.

Figure 62:
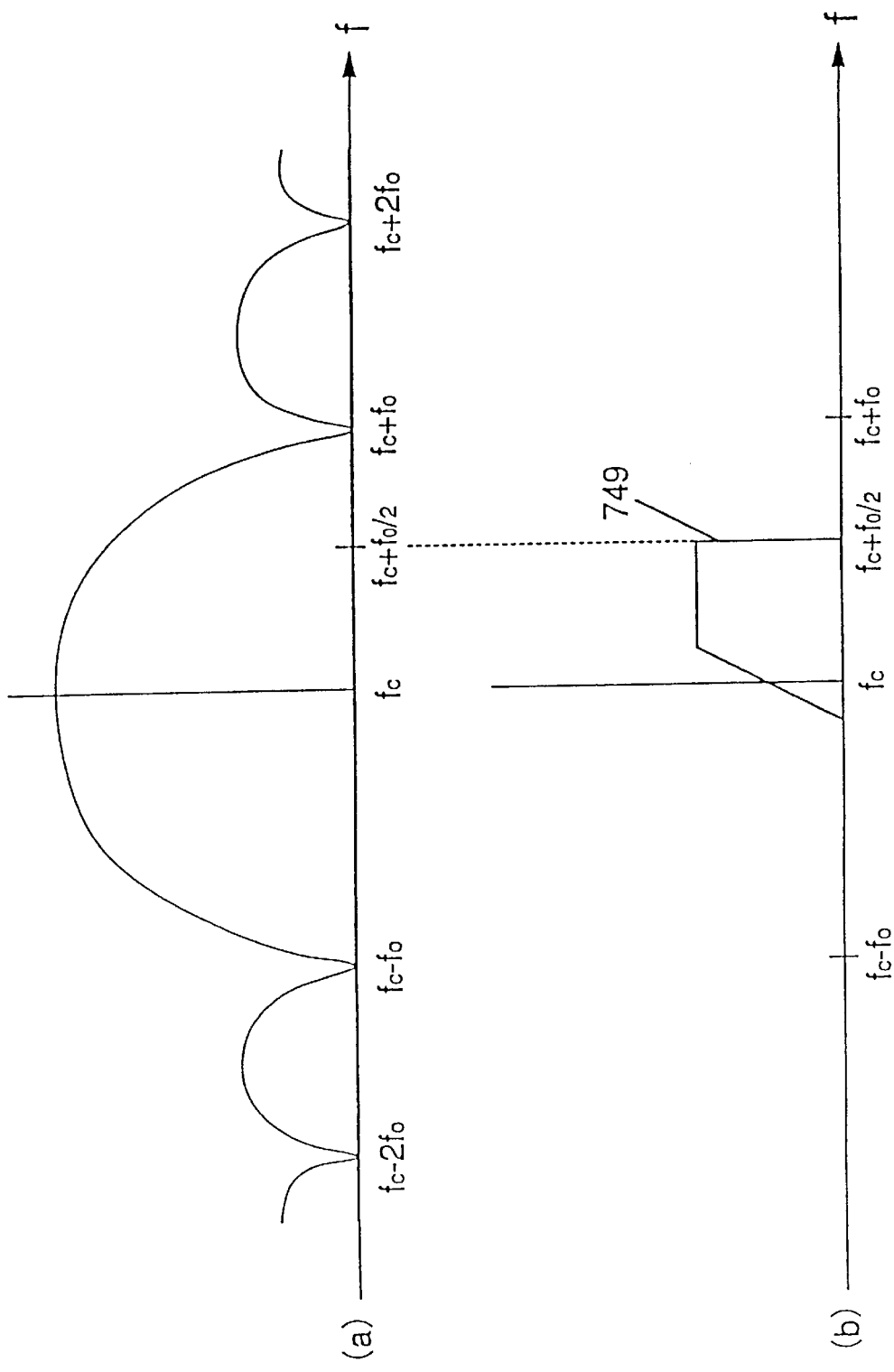
FIGS. 62(a) and 62(b) are diagrams showing frequency distribution profiles of an ASK modulated signal of the fifth embodiment.

The waveform of the ASK signal after filtering will now be examined. FIG. 62(a) shows a frequency spectrum of the ASK modulated signal in which two sidebands are provided on both sides of the carrier frequency band. One of the two sidebands is eliminated with the filter 474 to produce a signal 749 which contains a carrier component as shown in FIG. 62(b). The signal 749 is a VSB signal and if the modulation frequency band is $f_0$, will be transmitted in a frequency band of about $f_0/2$. Hence, the frequency utilization becomes high. Using VSB mode transmission, the ASK signal of two bit per symbol shown in FIG. 60 can thus carry in the frequency band an amount of data equal to that of 16 QAM mode at four bits per symbol.

Figure 63:
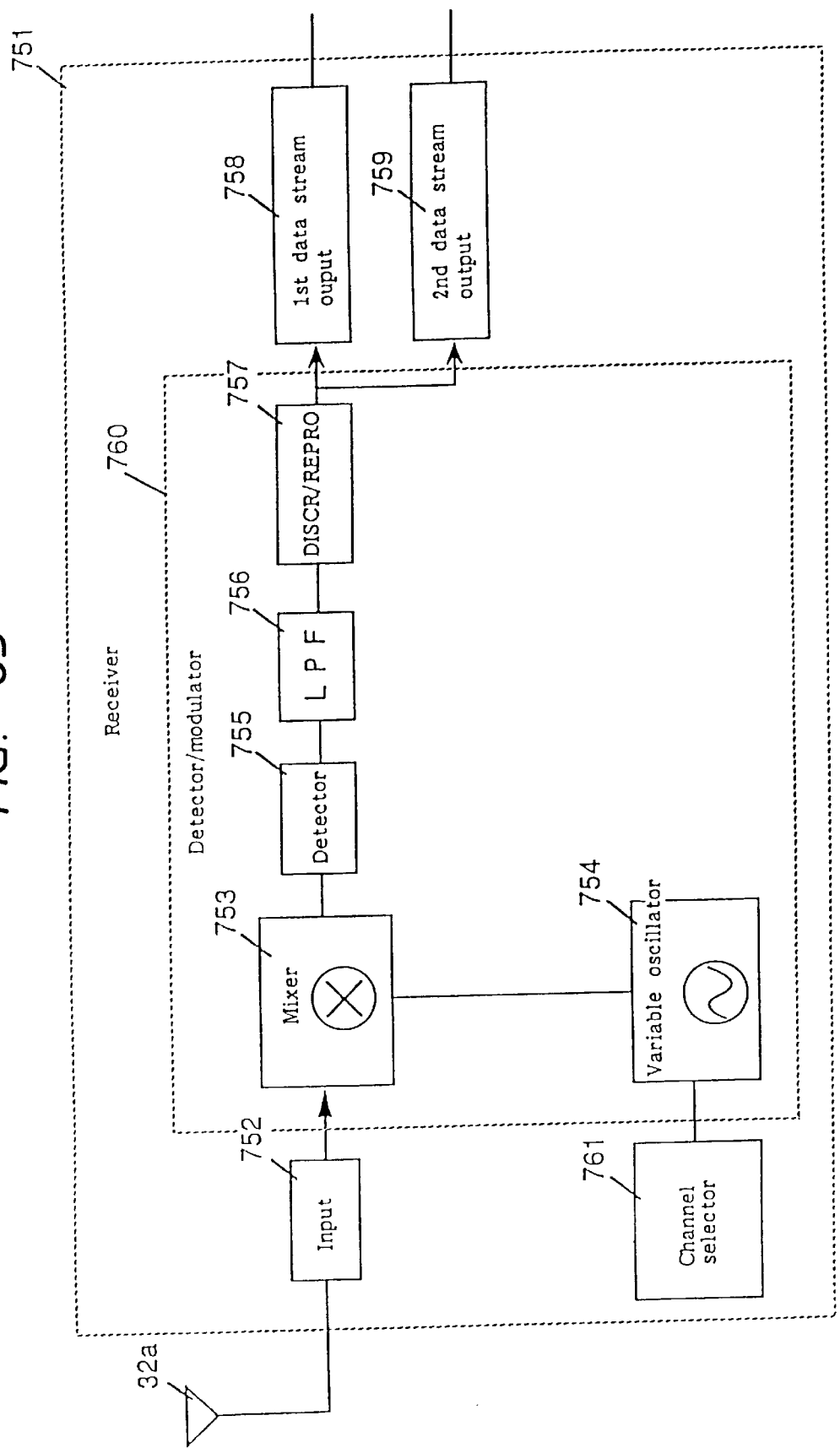
FIG. 63 is a block diagram of a receiver of the fifth embodiment.

FIG. 63 is a block diagram of a receiver 751 in which an input signal intercepted by a terrestrial antenna 32a is transferred through an input unit 752 to a mixer 753 where it is mixed with a signal from a variable oscillator 754 controlled by channel selection to a lower medium frequency signal. The signal from the mixer 753 is then detected by a detector 755 and filtered by an LPF 756 to a baseband signal which is transferred to a discriminating/reproduction circuit 757. The discrimination/reproduction circuit 757 reproduces two, first $D_1$ and second $D_2$, data streams from the baseband signal and transmit them further through a first 758 and a second data stream output 759 respectively.

Figure 64:
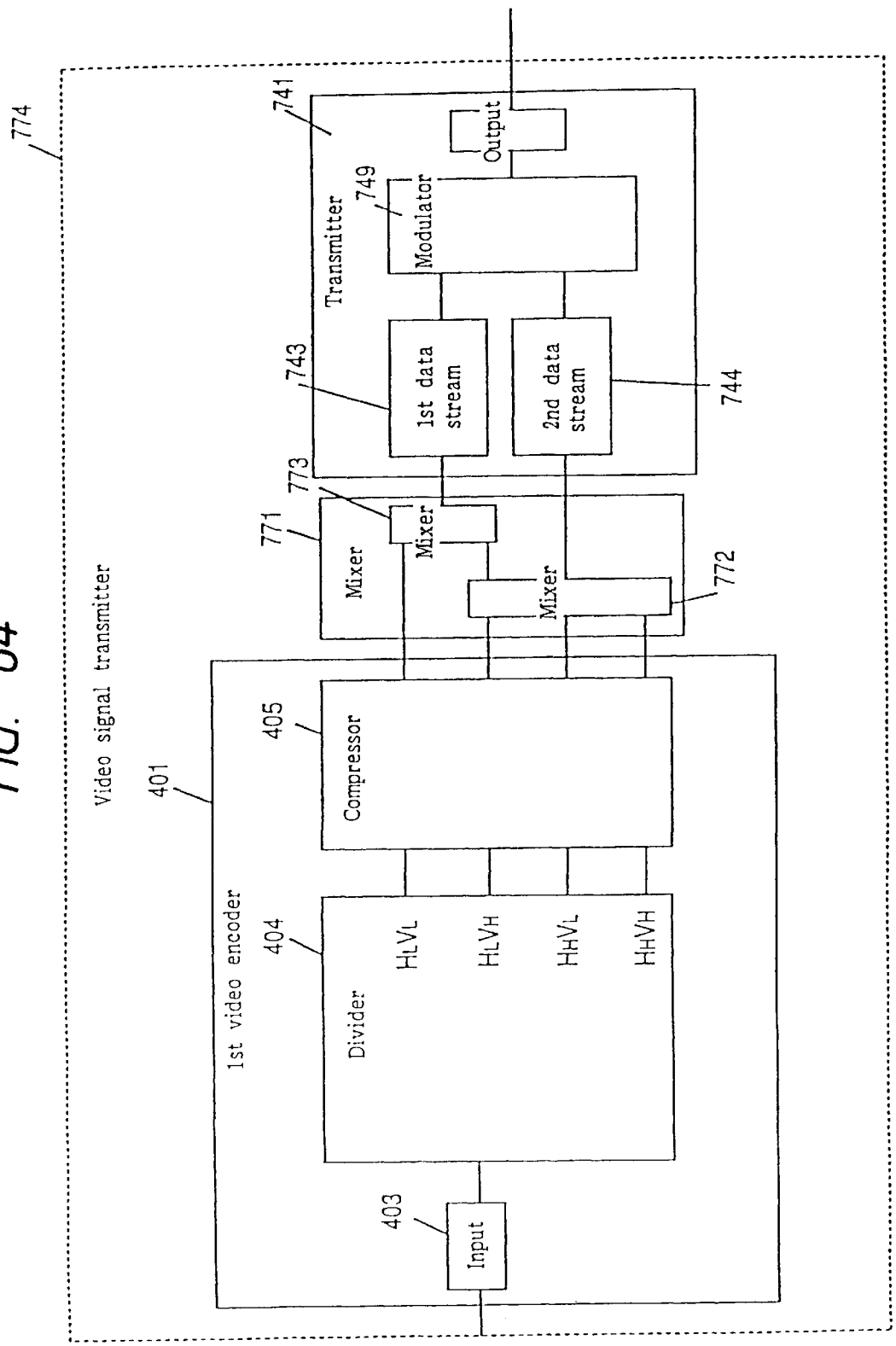
FIG. 64 is a block diagram of a video signal transmitter of the fifth embodiment.

The transmission of a TV signal using such a transmitter and a receiver will be explained. FIG. 64 is a block diagram of a video signal transmitter 774 in which a high resolution TV signal, e.g. an HDTV signal, is fed through an input unit 403 to a divider circuit 404 of a first video encoder 401 where it is divided into four high/low frequency TV signal components denoted by e.g. $H_L V_L$, $H_L V_H$, $H_H V_L$, and $H_H V_H$. This action is identical to that of the third embodiment previously described referring to FIG. 30 and will no more be explained in detail. The four separate TV signals are encoded respectively by a compressor 405 using a known DPCMDCT variable length code encoding technique which is commonly used e.g. in MPEG. Meanwhile, the motion compensation of the signal is carried out at the input unit 403. The compressed signals are summed by a summer 771 to two, first and second, data streams $D_1$, $D_2$. The low frequency video signal component or $H_L V_L$ signal is contained in the first data stream $D_1$. The two data stream signals $D_1$, $D_2$ are then transferred to a first 743 and a second data stream input 744 of a transmitter unit 741 where they are amplitude modulated and summed to an ASK signal of e.g. VSB mode which is propagated from a terrestrial antenna for broadcast service.

Figure 65:
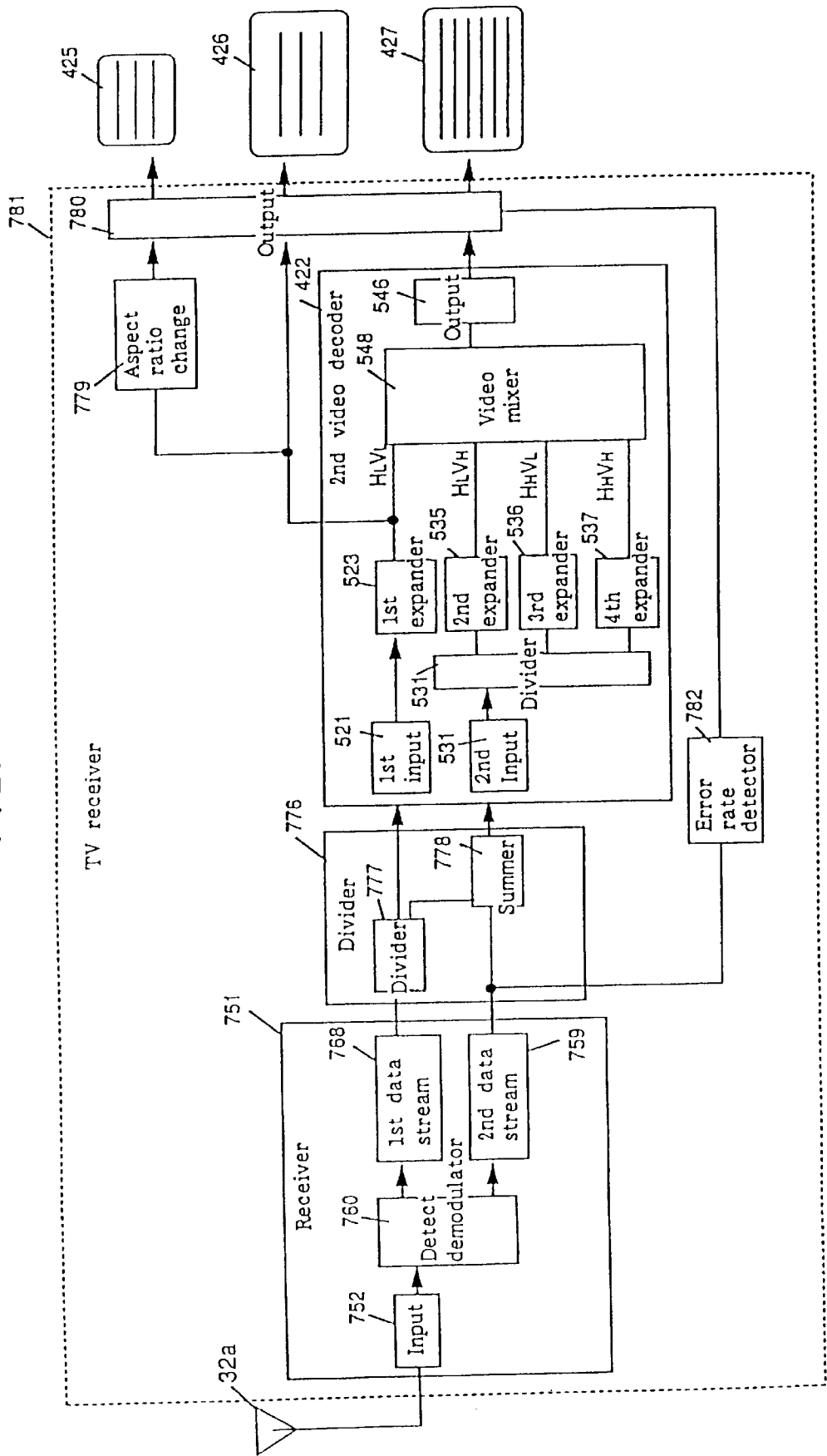
FIG. 65 is a block diagram of a TV receiver of the fifth embodiment.

FIG. 65 is a block diagram of a TV receiver for such a digital TV broadcast system. A digital TV signal intercepted by a terrestrial antenna 32a is fed to an input 752 of a receiver 781. The signal is then transferred to a detection/demodulation circuit 760 where a desired channel signal is selected and demodulated to two, first and second, data streams $D_1$, $D_2$ which are then fed to a first 758 and a second data stream output 759 respectively. The action in the receiver unit 751 is similar to that described previously and will no more be explained in detail. The two data streams $D_1$, $D_2$ are sent to a divider unit 776 in which $D_1$ is divided by a divider 777 into two components; one or compressed $H_L V_L$ is transferred to a first input 521 of a second video decoder 422 and the other is fed to a summer 778 where it is summed with $D_2$ prior to transfer to a second input 531 of the second video decoder 422. Compressed $H_L V_L$ is then sent from the first input 521 to a first expander 523 where it is expanded to $H_L V_L$ of the original length which is then transferred to a video mixer 548 and an aspect ratio changing circuit 779. When the input TV signal is an HDTV signal, $H_L V_L$ represents a widescreen NTSC signal. When the same is an NTSC signal, $H_L V_L$ represents a lower resolution video signal, e.g. MPEG1, that an NTSC level.

The input TV signal of the embodiment is an HDTV signal and $H_L V_L$ becomes a wide-screen NTSC signal. If the aspect ratio of an available display is 16:9, $H_L V_L$ is directly delivered through an output unit as a 16:9 video output 426. If the display has an aspect ratio of 4:3, $H_L V_L$ is shifted by the aspect ratio changing circuit 779 to a letterbox or sidepanel format and then, delivered from the output unit 780 as a corresponding format video output 425.

The second data stream $D_2$ fed from the second data stream output 759 to the summer 778 is summed with the output of the divider 777 to a sum signal which is then fed to the second input 531 of the second video decoder 422. The sum signal is further transferred to a divider circuit 531 while it is divided into three compressed forms of $H_L V_H$, $H_H V_L$, and $H_H V_H$. The three compressed signals are then fed to a second 535, a third 536, and a fourth expander 537 respectively for converting by expansion to $H_L V_H$, $H_H V_L$, and $H_H V_H$ of the original length. The three signals are summed with $H_L V_L$ by the video mixer 548 to a composite HDTV signal which is fed through an output 546 of the second video decoder to the output unit 780. Finally, the HDTV signal is delivered from the output unit 780 as an HDTV video signal 427.

The output unit 780 is arranged for detecting an error rate in the second data stream of the second data stream output 759 through an error rate detector 782 and if the error rate is high, delivering $H_L V_L$ of low resolution video data systematically.

Accordingly, the multi-level signal transmission system for digital TV signal transmission and reception becomes feasible. For example, if a TV signal transmitter station is near, both the first and second data streams of a received signal can successfully be reproduced to exhibit an HDTV quality picture. If the transmitter station is far, the first data stream can be reproduced to $H_L V_L$ which is converted to a low resolution TV picture. Hence, any TV program will be intercepted in a wider area and displayed at a picture quality ranging from HDTV to NTSC level.

Figure 66:
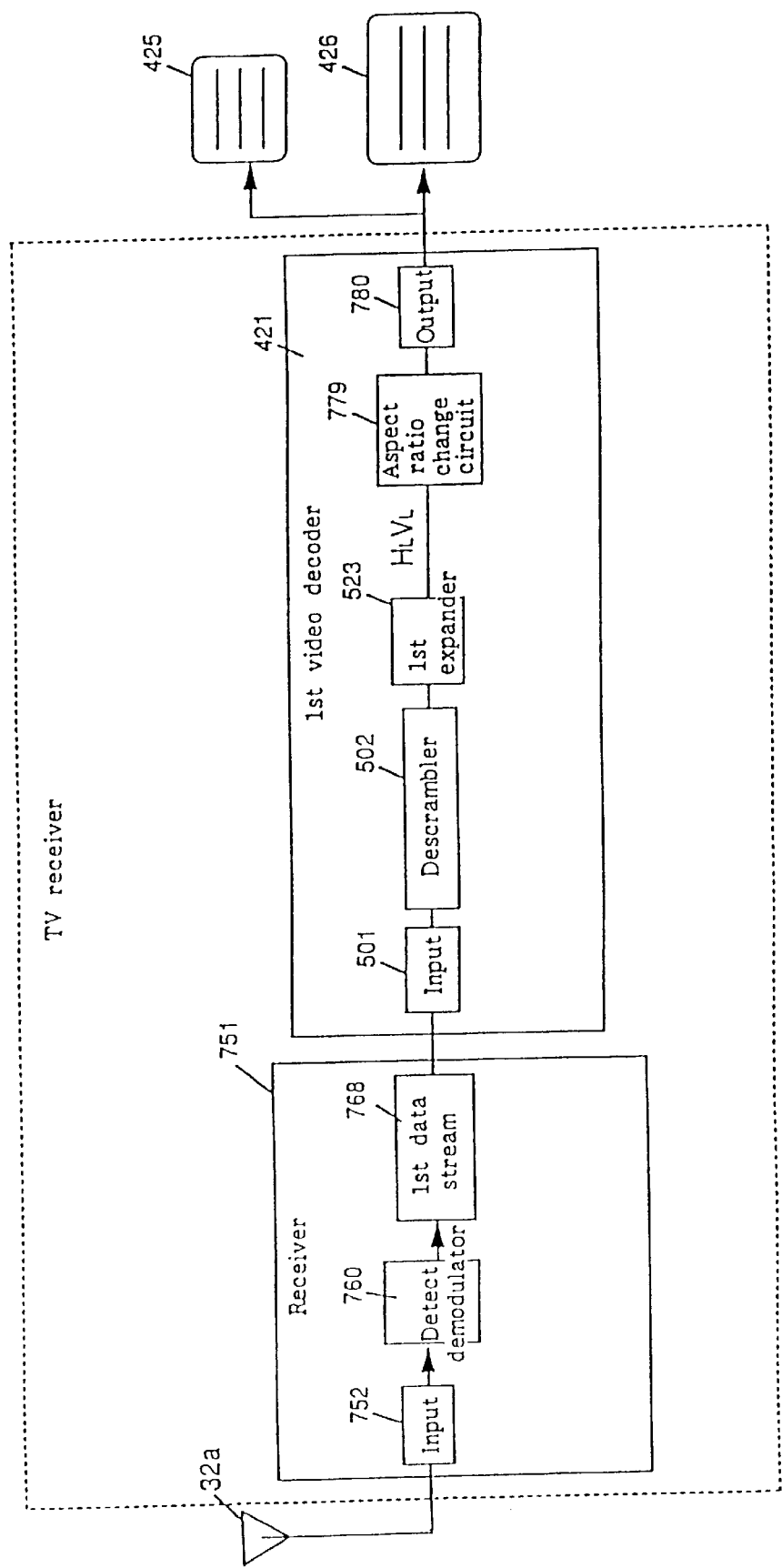
FIG. 66 is a block diagram of another TV receiver of the fifth embodiment.

FIG. 66 is a block diagram showing another arrangement of the TV receiver. As shown, the receiver unit 751 contains only a first data stream output 768 and thus, the processing of the second data stream or HDTV data is not needed so that the overall construction can be minimized. It is a good idea to have the first video decoder 421 shown in FIG. 31 as a video decoder of the receiver. Accordingly, an NTSC level picture will be reproduced. The receiver is fabricated at much less cost as having no capability to receive any HDTV level signal and will widely be accepted in the market. In brief, the receiver can be used as an adapter tuner for interception of a digital TV signal with giving no modification to the existing TV system including a display.

Figure 67:
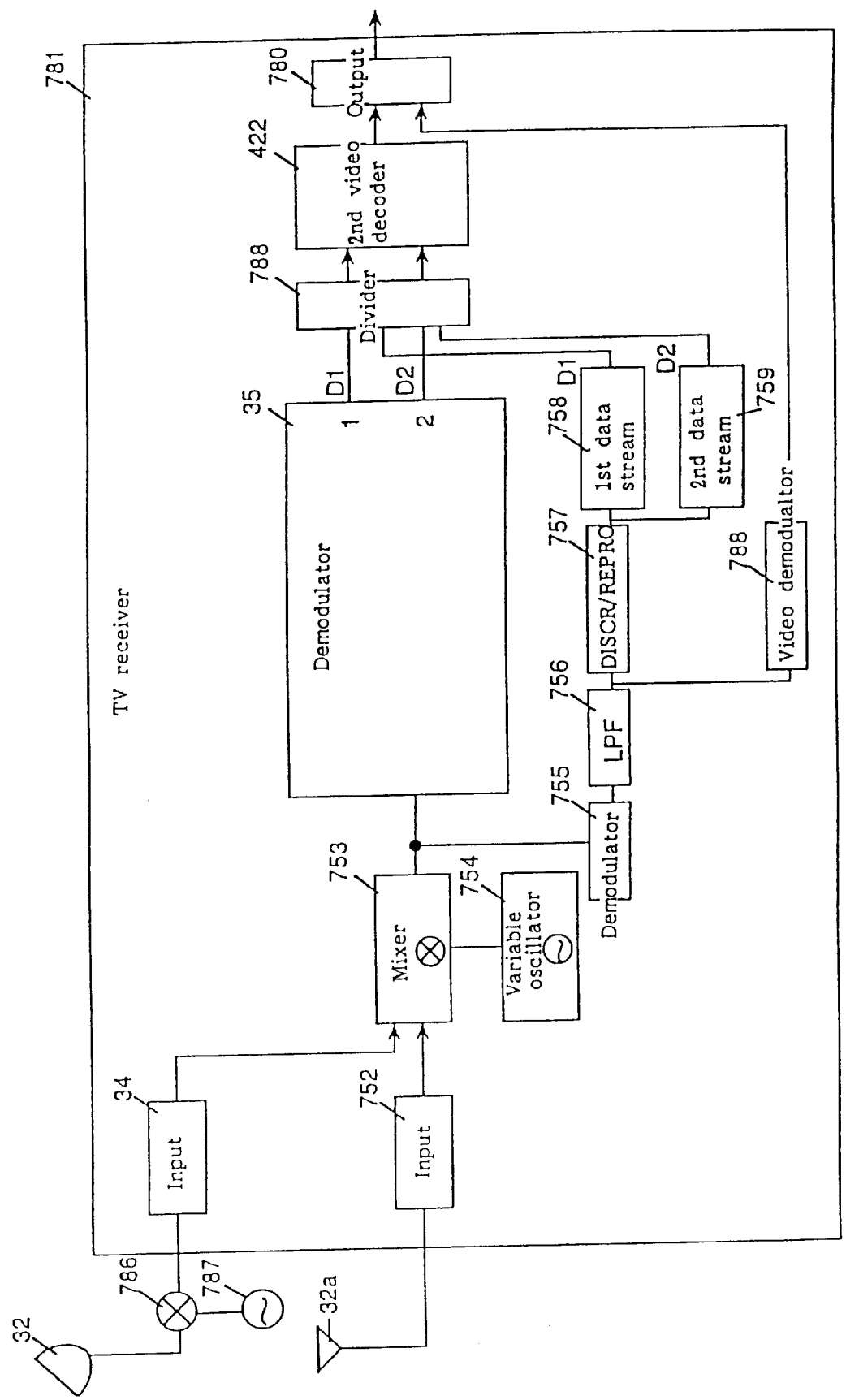
FIG. 67 is a block diagram of a satellite-to-ground TV receiver of the fifth embodiment.

The TV receiver 781 may have a further arrangement shown in FIG. 67, which serves as both a satellite broadcast receiver for demodulation of PSK signals and a terrestrial broadcast receiver for demodulation of ASK signals. In action, a PSK signal received by a satellite antenna 32 is mixed by a mixer 786 with a signal from an oscillator 787 to a low frequency signal which is then fed through an input unit 34 to a mixer 753 similar to one shown in FIG. 63. The low frequency signal of PSK or QAM mode in a given channel of the satellite TV system is transferred to a modulator 35 where two data streams $D_1$ and $D_2$ are reproduced from the signal. $D_1$ and $D_2$ are sent through a divider 788 to a second video decoder 422 where they are converted to a video signal which is then delivered from an output unit 780. Also, a digital or analogue terrestrial TV signal intercepted by a terrestrial antenna 32a is fed through an input unit 752 to the mixer 753 where one desired channel is selected by the same manner as described in FIG. 63 and detected to a low frequency base band signal. The signal of analogue form is sent directly to the demodulator 35 for demodulation. The signal of digital form is then fed to a discrimination/reproducing circuit 757 where two data streams $D_1$ and D2 are reproduced from the signal. $D_1$ and D2 are converted by the second video decoder 422 to a video signal which is then delivered further. A satellite analogue TV signal is transferred to a video demodulator 788 where it is AN modulated to an analogue video signal which is then delivered from the output unit 780. As understood, the mixer 753 of the TV receiver 781 shown in FIG. 67 is arranged compatible between two, satellite and terrestrial, broadcast services. Also, a receiver circuit including a detector 755 and an LPF 756 for AM modulation of an analogue signal can be utilized compatible with a digital ASK signal of the terrestrial TV service. The major part of the arrangement shown in FIG. 67 is arranged for compatible use, thus minimizing a circuitry construction.

Figure 68:
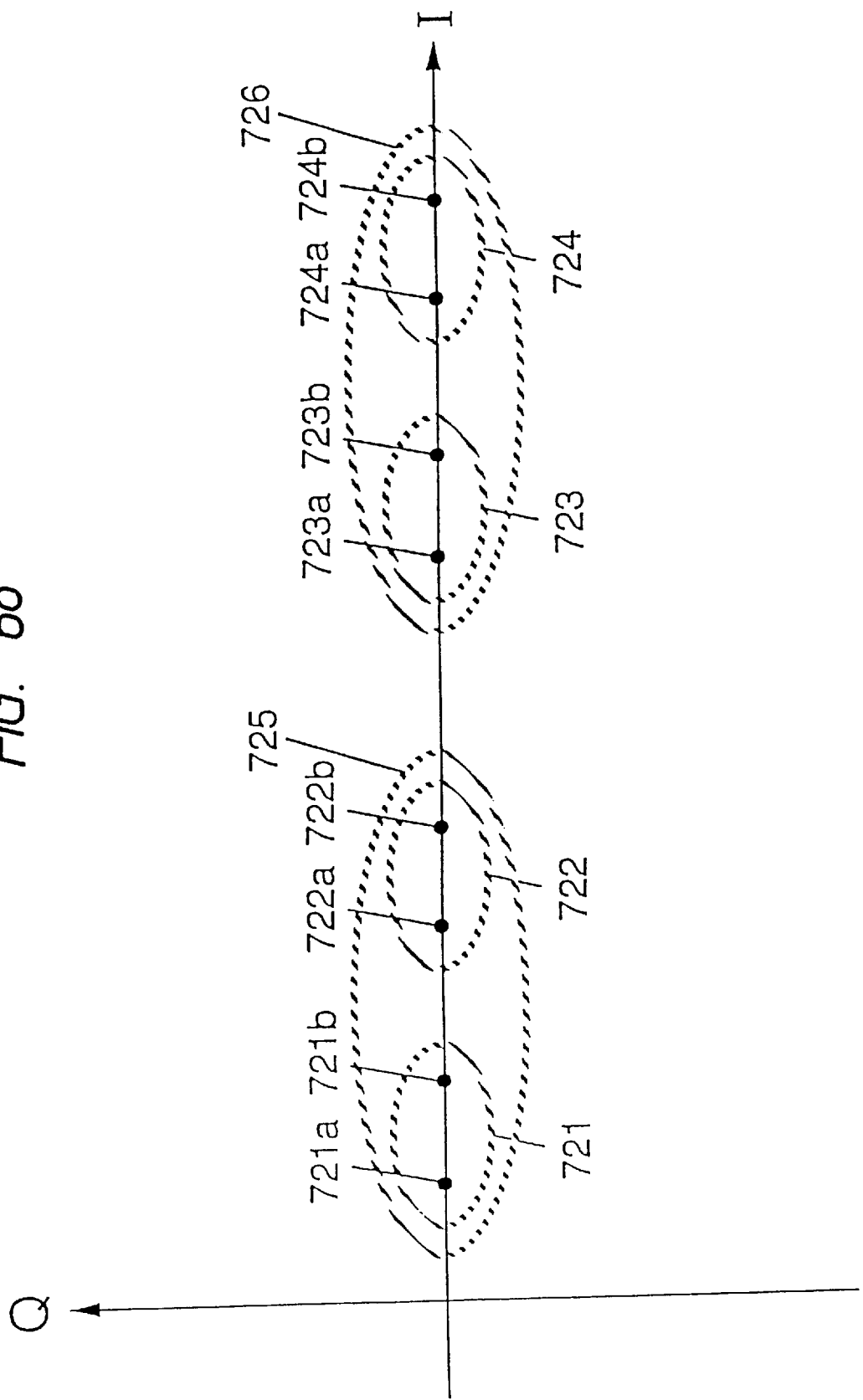
FIG. 68 is a diagram showing an assignment of signal points of an 8 ASK signal of the fifth embodiment.

According to the embodiment, a 4-level ASK signal is divided into two, $D_1$ and $D_2$, level components for execution of the one-bit mode multi-level signal transmission. If an 8-level ASK signal is used as shown in FIG. 68, it can be transmitted in a one-bit mode three-level, $D_1$, $D_2$, and $D_3$, arrangement. A shown in FIG. 68, $D_1$ is assigned to eight signal points 721a, 721b, 722a, 722b, 723a, 723b, 724a, 724b, each pair representing a two-bit pattern, $D_2$ is assigned to four small signal point groups 721, 722, 723, 724, each two groups representing a two-bit pattern, and $D_3$ is assigned to two large signal point groups 725 and 726 representing a two-bit pattern. More particularly, this is equivalent to a form in which each of the four signal points 721, 722, 723, 724 shown in FIG. 57 is divided into two components thus producing three different level data.

The three-level signal transmission is identical to that described in the third embodiment and will no further be explained in detail.

Figure 30:
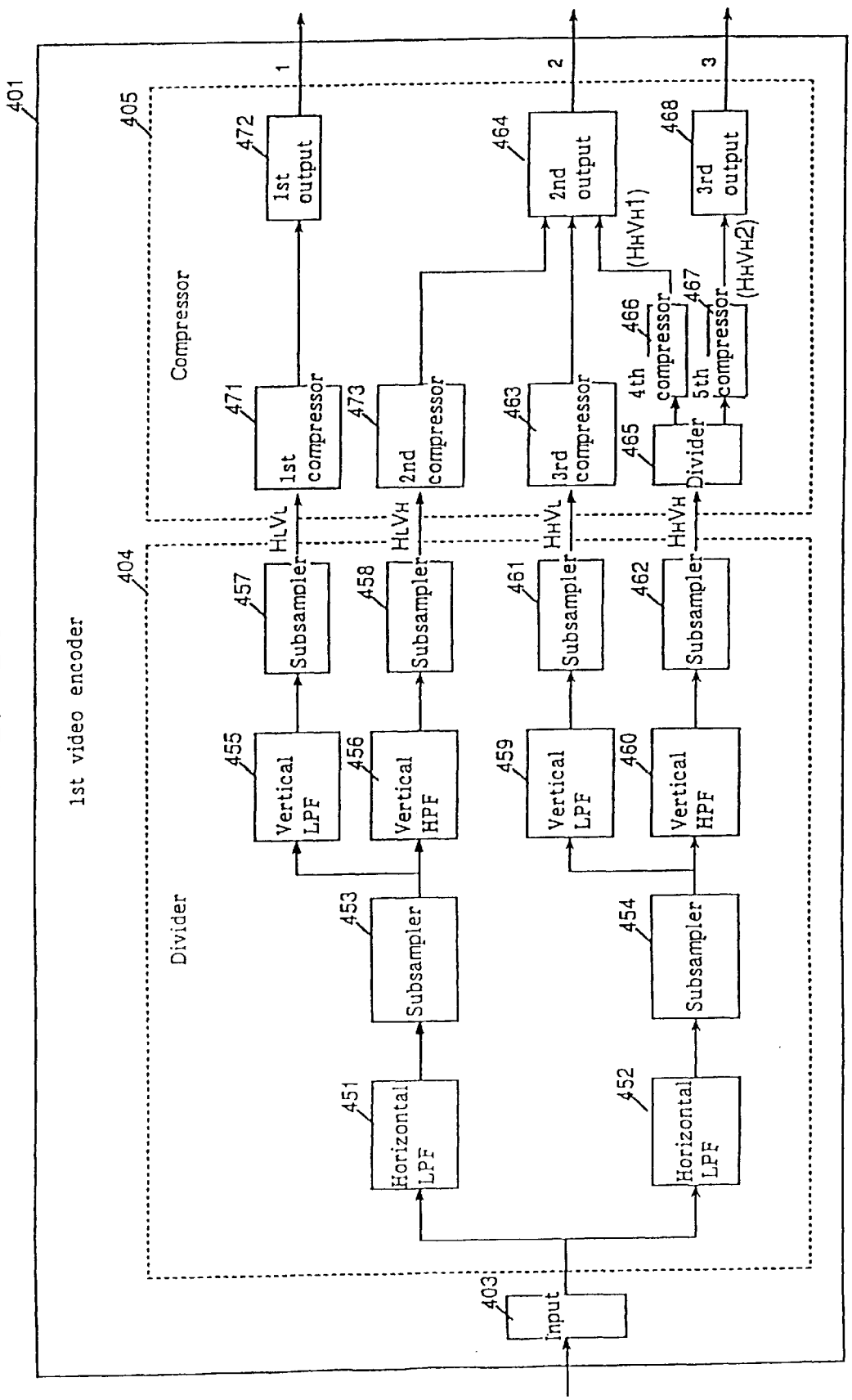
FIG. 30 is a block diagram of a first video encoder of the third embodiment.
Figure 69:
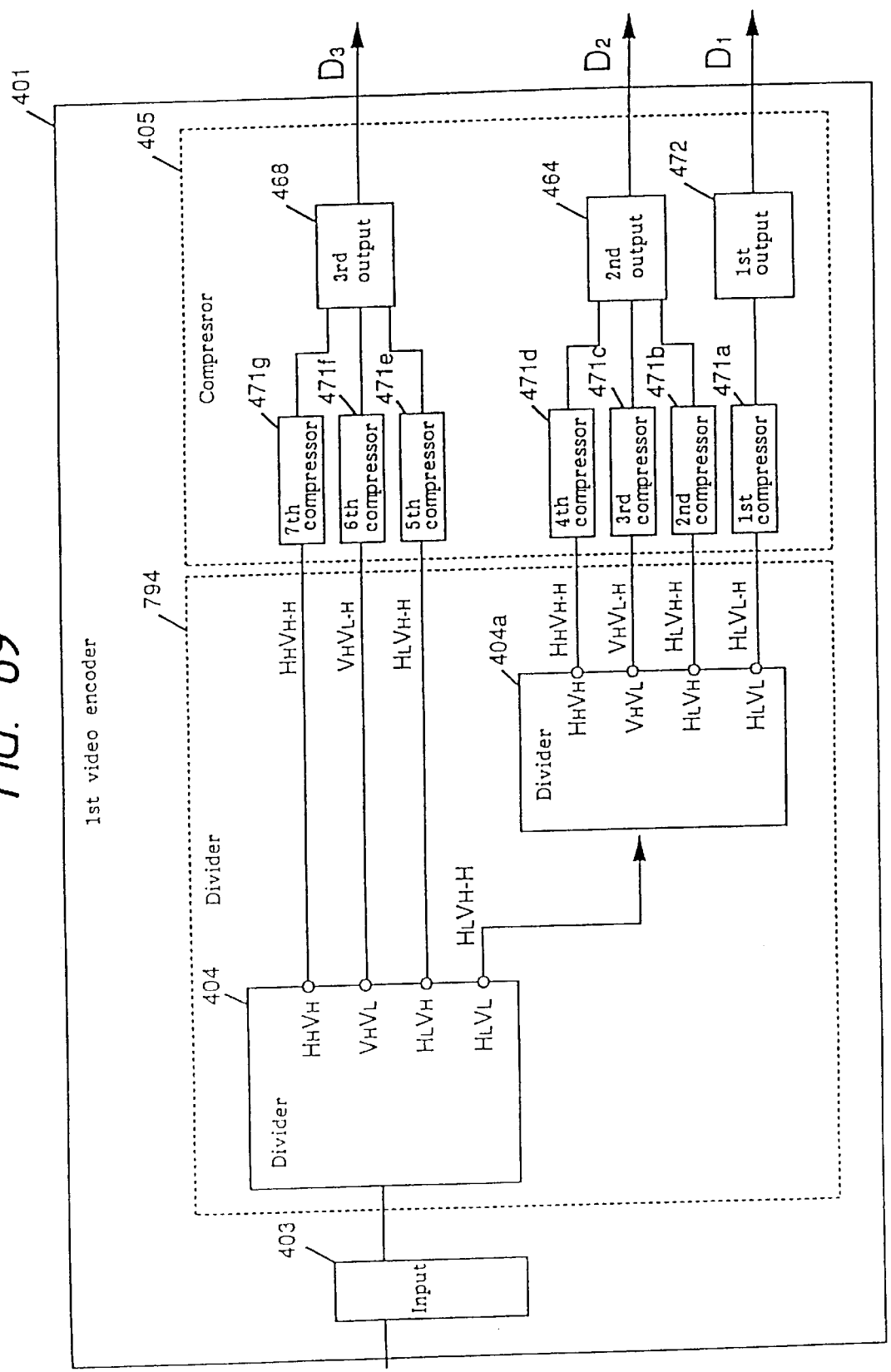
FIG. 69 is a block diagram of a video encoder of the fifth embodiment.
Figure 70:
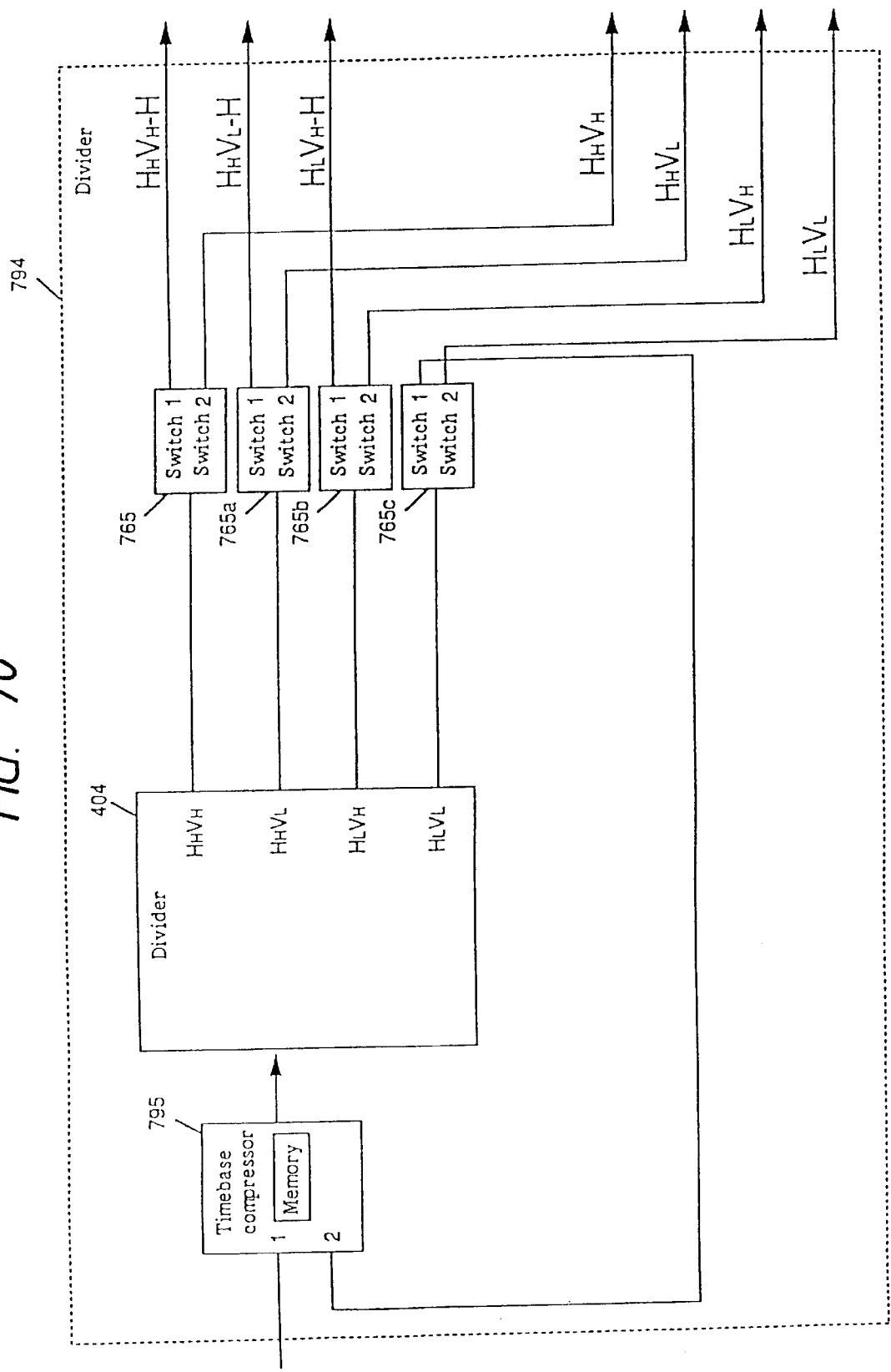
FIG. 70 is a block diagram of a video encoder of the fifth embodiment containing one divider circuit.

In particular, the arrangement of the video encoder 401 of the third embodiment shown in FIG. 30 is replaced with a modification of which block diagram is FIG. 69. The operation of the modified arrangement is similar and will no longer be explained in detail. Two video signal divider circuits 404 and 404a which may be sub-band filters are provided forming a divider unit 794. The divider unit 794 may also be arranged more simple a shown in the block diagram of FIG. 70, in which a signal passes across one signal divider circuit two times at time division mode. More specifically, a video signal of e.g. HDTV or super HDTV from the input unit 403 is time-base compressed by a time-base compressor 795 and fed to the divider circuit 404 where it is divided into four components, $H_H V_H$-H, $H_H V_L$-H, and $H_L V_H$-H, and $H_L V_L$-H at a first cycle. At the time, four switches 765, 765a, 765b, 765c remain turned to the position 1 so that $H_H V_H$-H, $H_H V_L$-H, and $H_L V_H$-H are transmitted to a compressing circuit 405. Meanwhile, $H_L V_L$-H is fed back through the terminal 1 of the switch 765c to the time-base compressor 795. At a second cycle, the four switches 765, 765a, 765b, 765c turned to the position 2 and all the four components of the divider circuit 404 are simultaneously transferred to the compressing circuit 405. Accordingly, the divider unit 796 of FIG. 70 arranged for time division processing of an input signal can be constructed in a simpler dividing circuit form.

Figure 71:
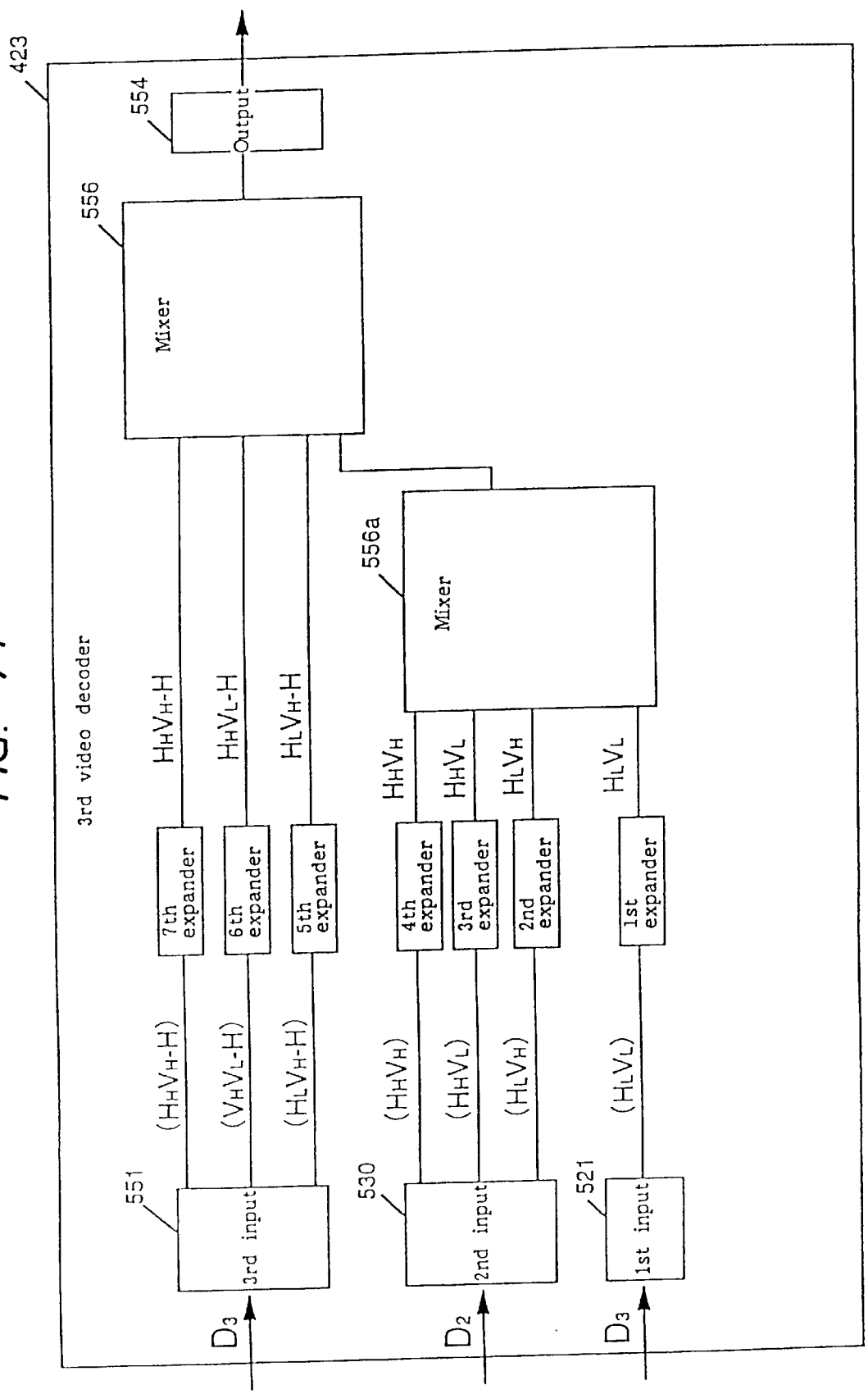
FIG. 71 is a block diagram of a video decoder of the fifth embodiment.

At the receiver side, such a video decoder as described in the third embodiment and shown in FIG. 30 is needed for three-level transmission of a video signal. More particularly, a third video decoder 423 is provided which contains two mixers 556 and 556a of different processing capability as shown in the block diagram of FIG. 71.

Figure 72:
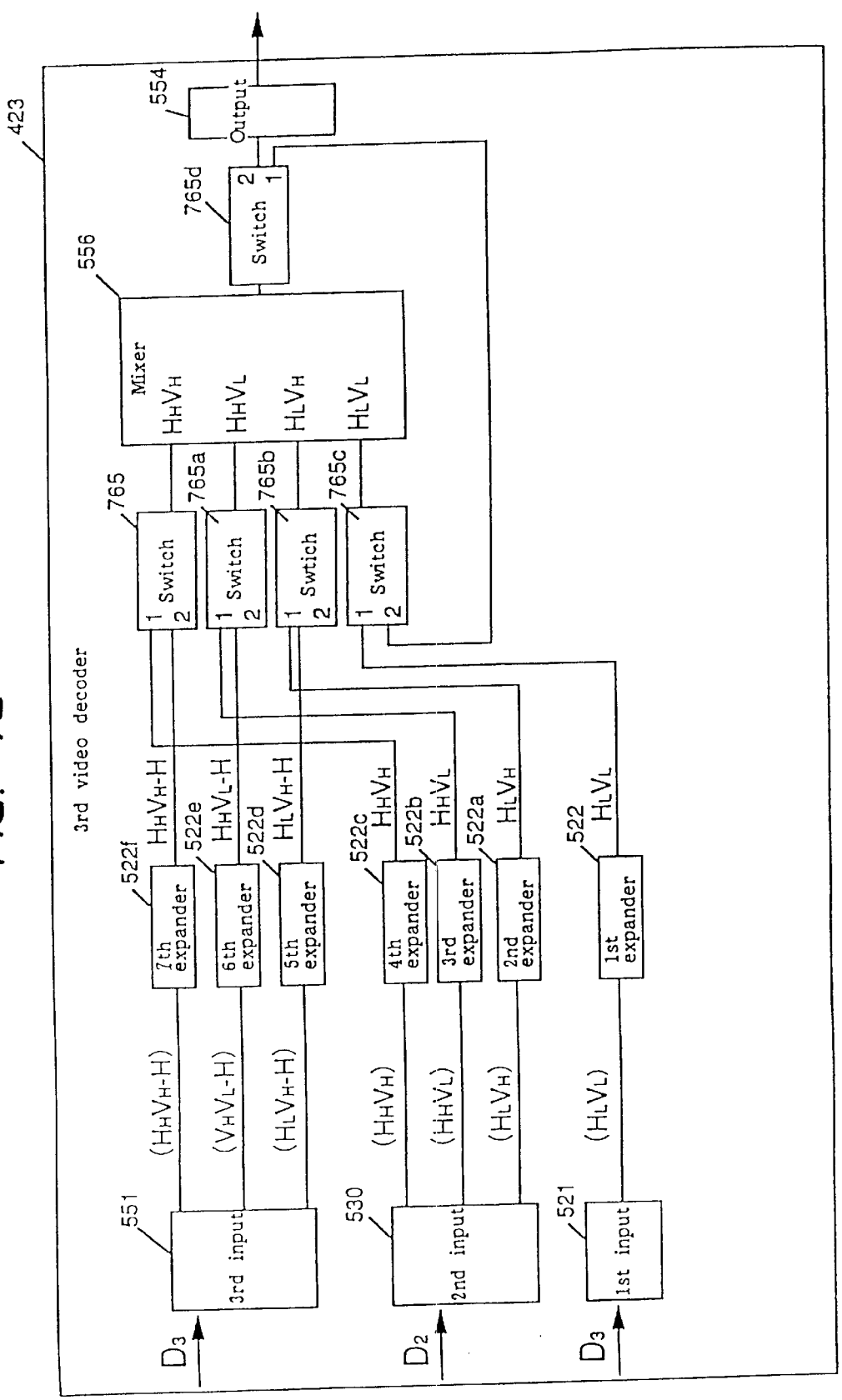
FIG. 72 is a block diagram of a video decoder of the fifth embodiment containing one mixer circuit.

Also, the third video decoder 423 may be modified in which the same action is executed with one single mixer 556 as shown in FIG. 72. At the first timing, five switches 765, 765a, 765b, 765c, 765d remains turned to the position 1. Hence, $H_L V_L$, $H_L V_H$, $H_H V_L$, and $H_H V_H$ are fed from a first 522, a second 522a, a third 522b and a fourth expander 522c to through their respective switches to the mixer 556 where they are mixed to a single video signal. The video signal which represents $H_L V_L$-H of an input high resolution video signal is then fed back through the terminal 1 of the switch 765d to the terminal 2 of the switch 765c. At the second timing, the four switches 765, 765a, 765b, 765c are turned to the point 2. Thus, $H_H V_H$ H, $H_H V_L$-H, $H_L V_H$-H, and $H_L V_L$-H are transferred to the mixer 556 where they are mixed to a single video signal which is then sent across the terminal 2 of the switch 765d to the output unit 554 for further delivery.

In this manner of time division processing of a three-level signal, two mixers can be replaced with one mixer.

More particularly, four components $H_L V_L$, $H_L V_H$, $H_H V_L$, $H_H V_H$ are fed to produce $H_L V_L$-H at the first timing. Then, $H_L V_H$-H, $H_H V_L$-H, and $H_H V_H$-H are fed at the second timing delayed from th first timing and mixed with $H_L V_L$-H to a target video signal. It is thus essential to perform the two actions at an interval of time.

If the four components are overlapped each other or supplied in a variable sequence, they have to be time-base adjusted to a given sequence through using memories accompanied with their respective switches 765, 765a, 765b, 765c. In the foregoing manner, a signal is transmitted from the transmitter at two different timing periods as shown in FIG. 73 so that no time-base controlling circuit is needed in the receiver which is thus arranged more compact.

Figure 73:
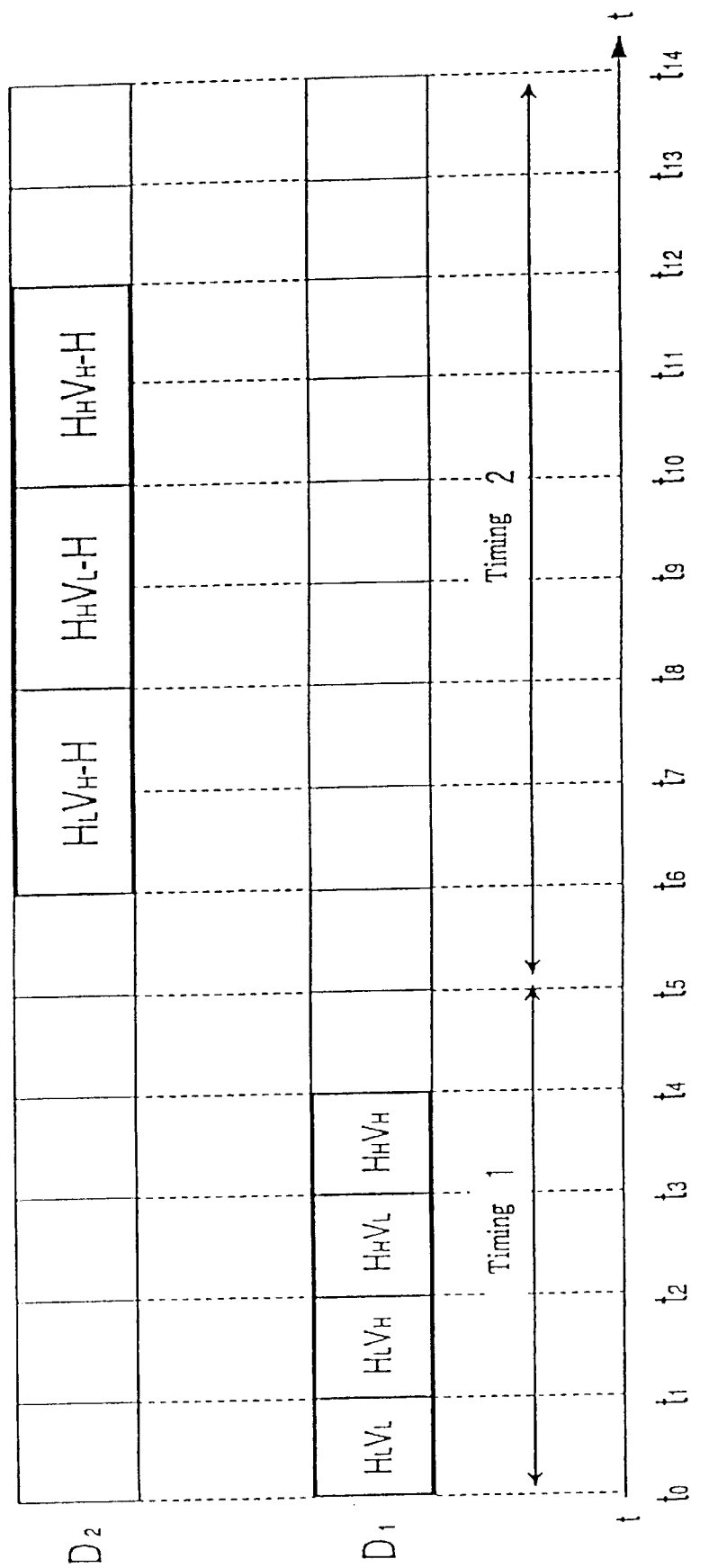
FIG. 73 is a diagram showing a time assignment of data components of a transmission signal according to the fifth embodiment.

As shown in FIG. 73, $D_1$ is the first data stream of a transmitting signal and $H_L V_L$, $H_L V_H$, $H_H V_L$, and $H_H V_H$ are transmitted on $D_1$ channel at the period of first timing. Then, at the period of second timing, $H_L V_H$, $H_H V_L$, and $H_H V_H$ are transmitted on $D_2$ channel. As the signal is transmitted in a time division sequence, the encoder in the receiver can be arranged more simple.

Figure 74:
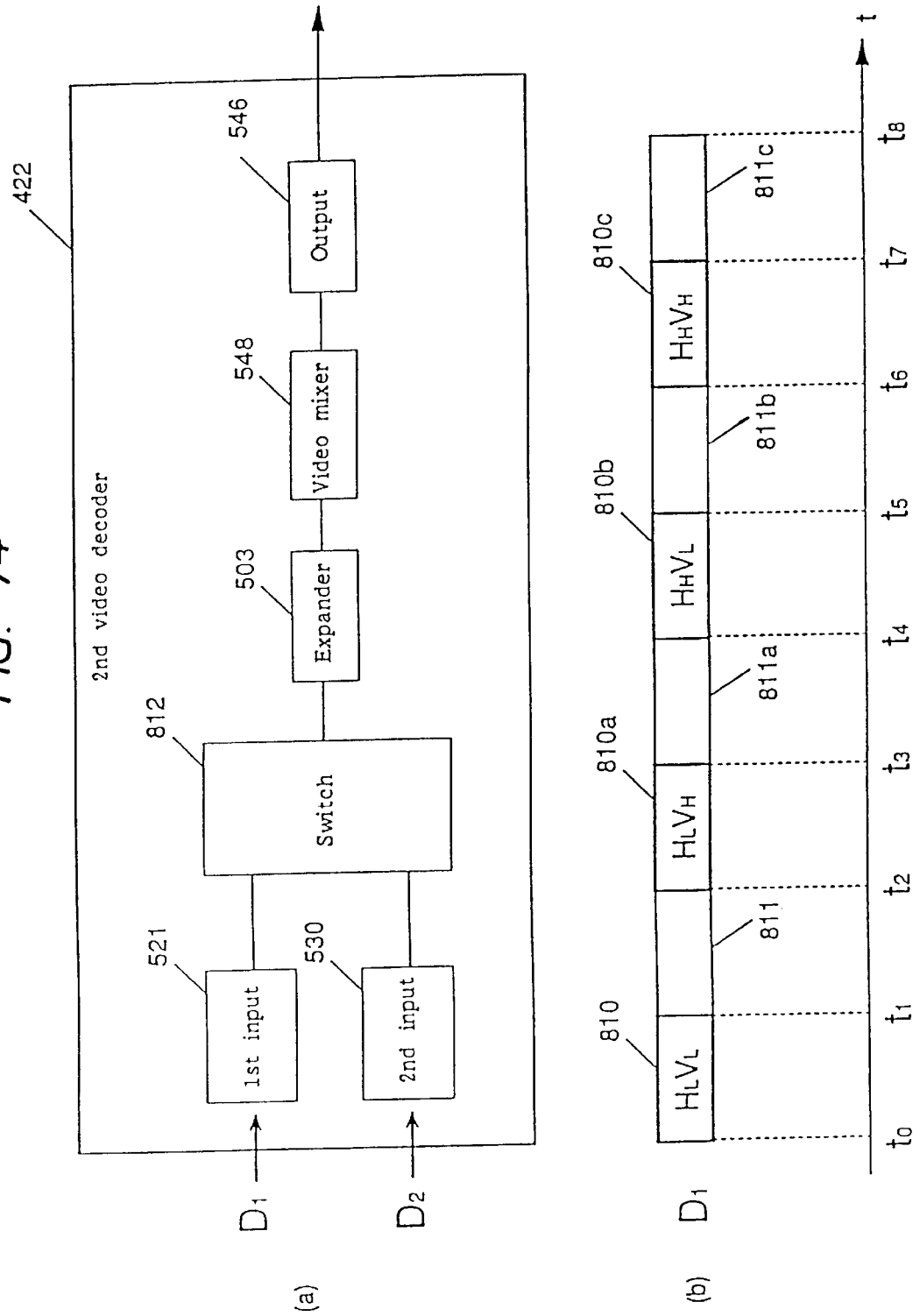
FIG. 74(a) is a block diagram of a video decoder of the fifth embodiment.
FIG. 74(b) is a diagram showing another time assignment of data components of the transmission signal according to the fifth embodiment.

The technique of reducing the number of the expanders in the decoder will now be explained. FIG. 74(b) shows a time-base assignment of four data components 810, 810a, 810b, 810c of a signal. When other four data components 811, 811a, 811b, 811c are inserted between the four data components 811, 811a, 811b, 811c respectively, the latter can be transmitted at intervals of time. In action, the second video decoder 422 shown in FIG. 74(a) receives the four components of the first data stream $D_1$ at a first input 521 and transfers them through a switch 812 to an expander 503 one after another. More particularly, the component 810 first fed is expanded during the feeding of the component 811 and after completion of processing the component 810, the succeeding component 810a is fed. Hence, the expander 503 can process a row of the components at time intervals by the same time division manner as of the mixer, thus substituting the simultaneous action of a number of expanders.

Figure 75:
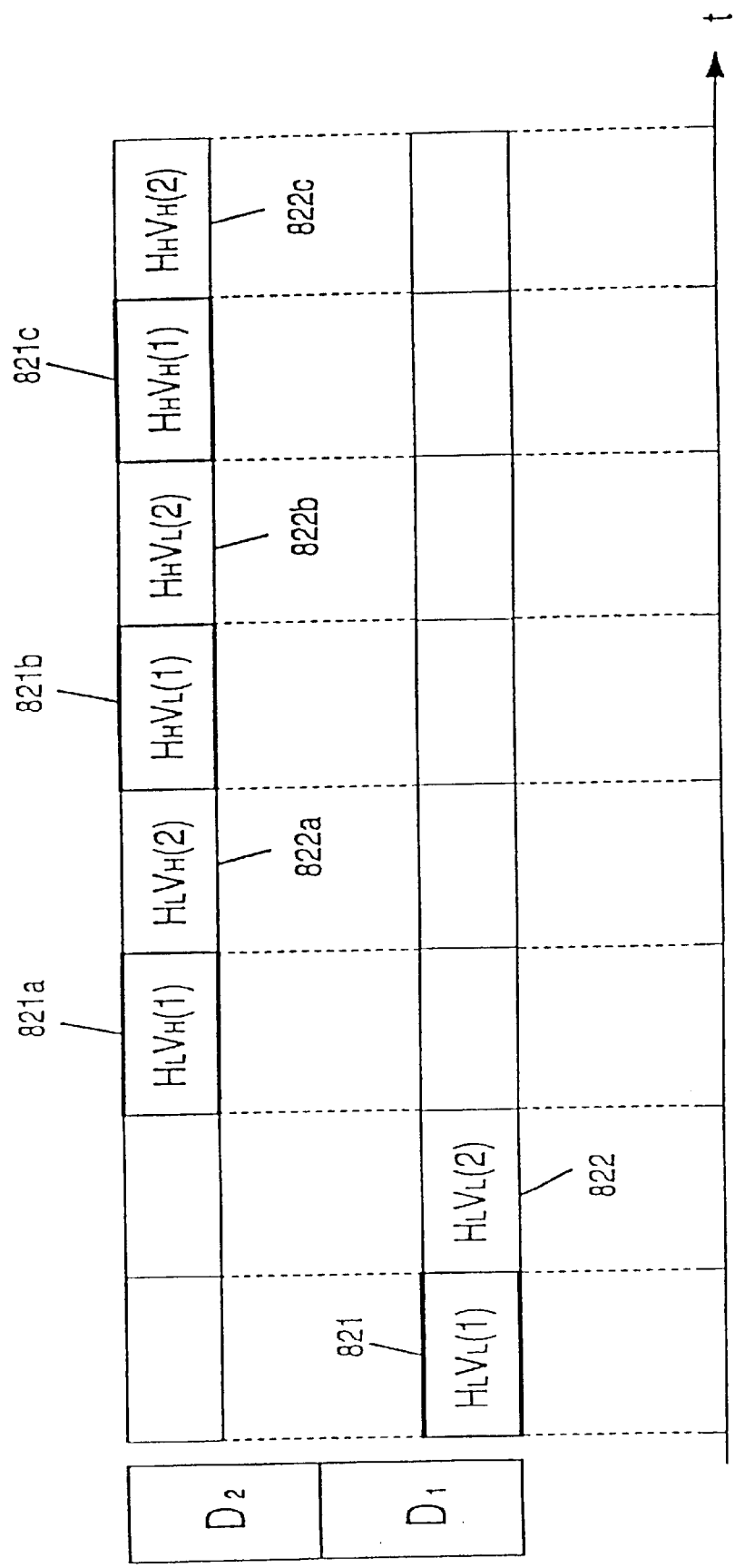
FIG. 75 is a diagram showing a time assignment of data components of a transmission signal according to the fifth embodiment.

FIG. 75 is a time-base assignment of data components of an HDTV signal, in which $H_L V_L$ (1) of an NTSC component of the first channel signal for a TV program is allocated to a data domain 821 of $D_1$ signal. Also, $H_L V_H$, $H_H V_L$, and $H_H V_H$ carrying HDTV additional components of the first channel signal are allocated to three domains 821a, 821b, 821c of $D_2$ signal respectively. There are provided other data components 822, 822a, 822b, 822c between the data components of the first channel signal which can thus be expanded with an expander circuit during transmission of the other data. Hence, all the data components of one channel signal will be processed by a single expander capable of operating at a higher speed.

Figure 76:
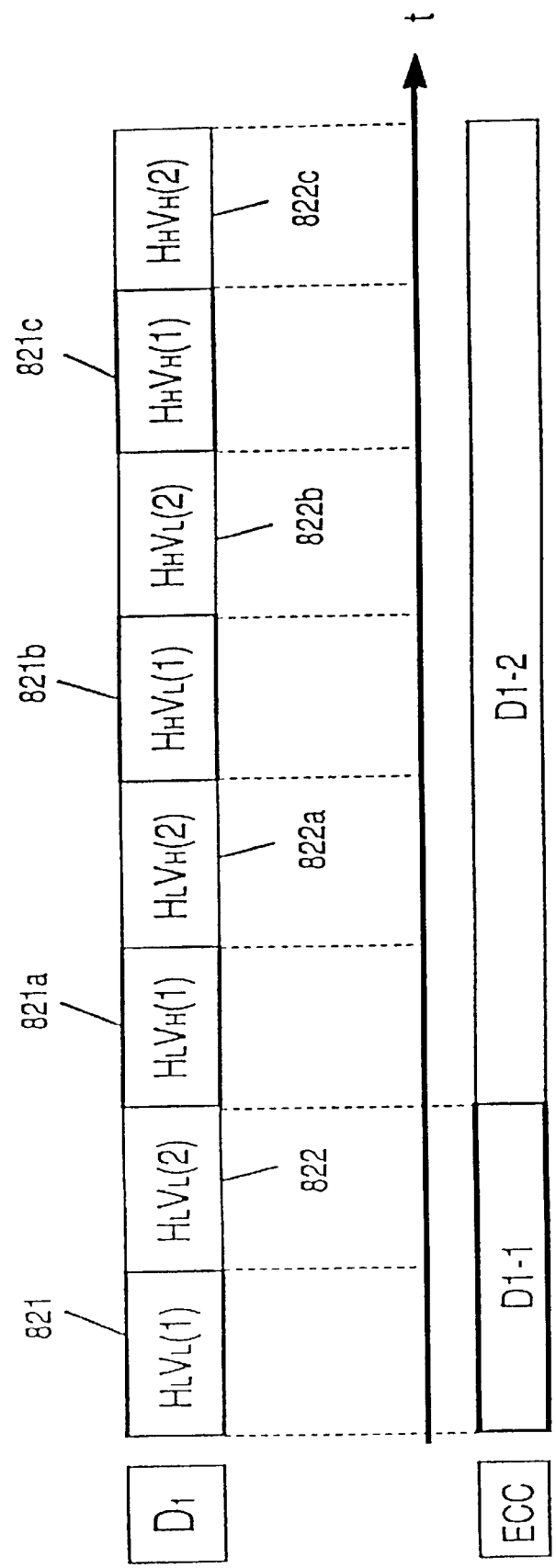
FIG. 76 is a diagram showing a time assignment of data components of a transmission signal according to the fifth embodiment.

Similar effects will be ensured by assignment of the data components to other domains 821, 821a, 821b, 821c as shown in FIG. 76. This becomes more effective in transmission and reception of a common 4 PSK or ASK signal having no different digital levels.

Figure 77:
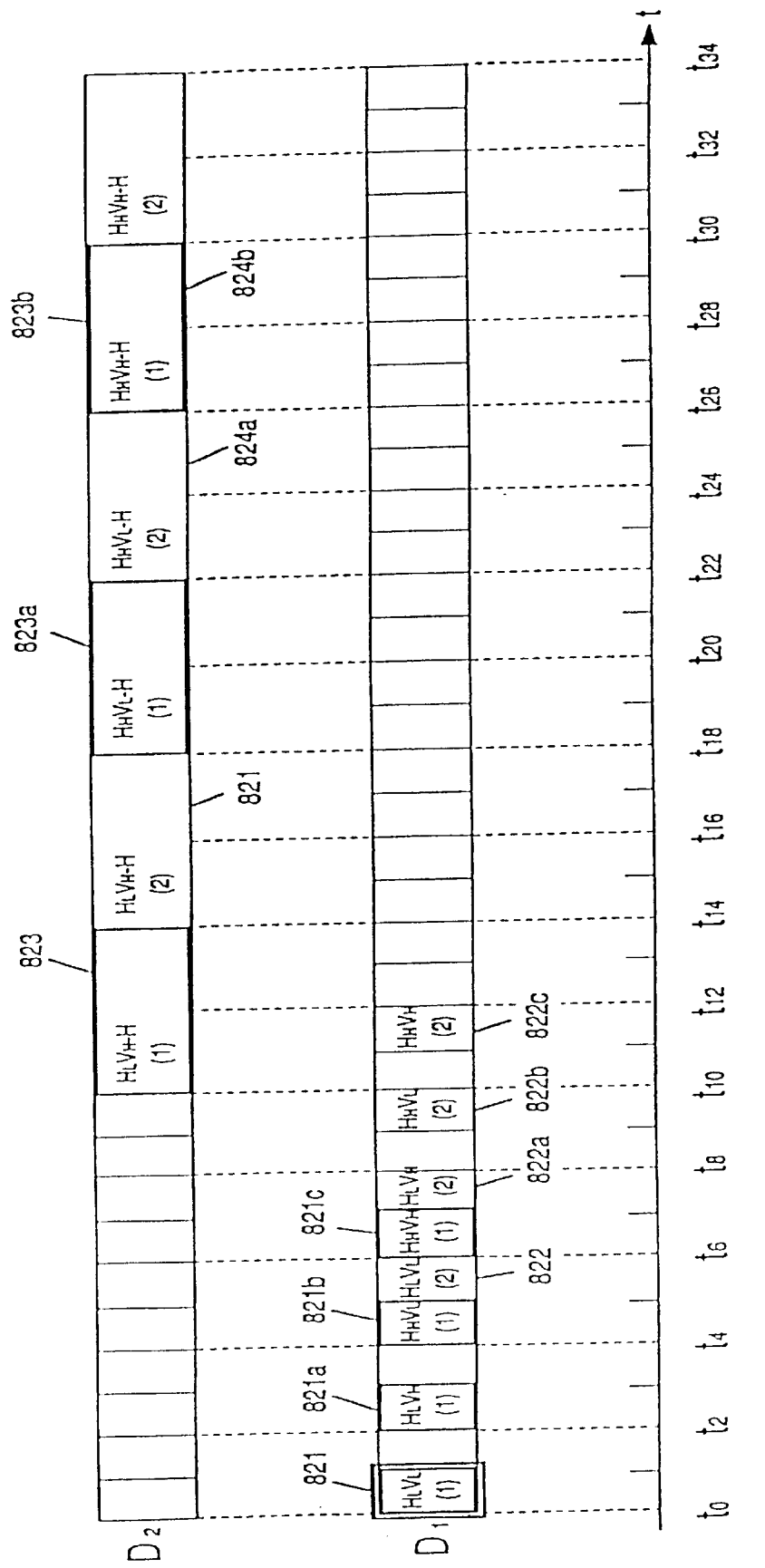
FIG. 77 is a diagram showing a time assignment of data components of a transmission signal according to the fifth embodiment.

FIG. 77 shows a time-base assignment of data components during physical two-level transmission of three different signal level data: e.g. NTSC, HDTV, and super HDTV or low resolution NTSC, standard resolution NTSC, and HDTV. For example, for transmission of three data components of low resolution NTSC, standard NTSC, and HDTV, the low resolution NTSC or $H_L V_L$ is allocated to the data domain 821 of $D_1$ signal. Also, $H_L V_H$, $H_H V_L$, and $H_H V_H$ of the standard NTSC component are allocated to three domains 821a, 821b, 821c respectively. $H_L V_H$-H, $H_H V_L$-H, and $H_H V_H$-H of the HDTV component are allocated to domains 823, 823a, and 823b respectively.

The foregoing assignment is associated with such a logic level arrangement based on discrimination in the error correction capability as described in the second embodiment. More particularly, $H_L V_L$ is carried on $D^{1-1}$ channel of the $D_1$ signal. The $D_{1-1}$ channel is higher in the error correction capability than $D_{1-2}$ channel, as described in the second embodiment. The $D_{1-1}$ channel is higher in the redundancy but lower in the error rate than the $D_{1-2}$ channel and the date 821 can be reconstructed at a lower C/N rate than that of the other data 821a, 821b, 821c. More specifically, a low resolution NTSC component will be reproduced at a far location from the transmitter antenna or in a signal attenuating or shadow area, e.g. the interior of a vehicle. In view of the error rate, the data 821 of $D_{1-1}$ channel is less affected by signal interference than the other data 821a, 821b, 821c of $D_{1-2}$ channel, while being specifically discriminated and stayed in a different logic level, as described in the second embodiment. While $D_1$ and $D_2$ are divided into two physically different levels, the levels determined by discrimination of the distance between error correcting codes are arranged different in the logic level.

Figure 90:
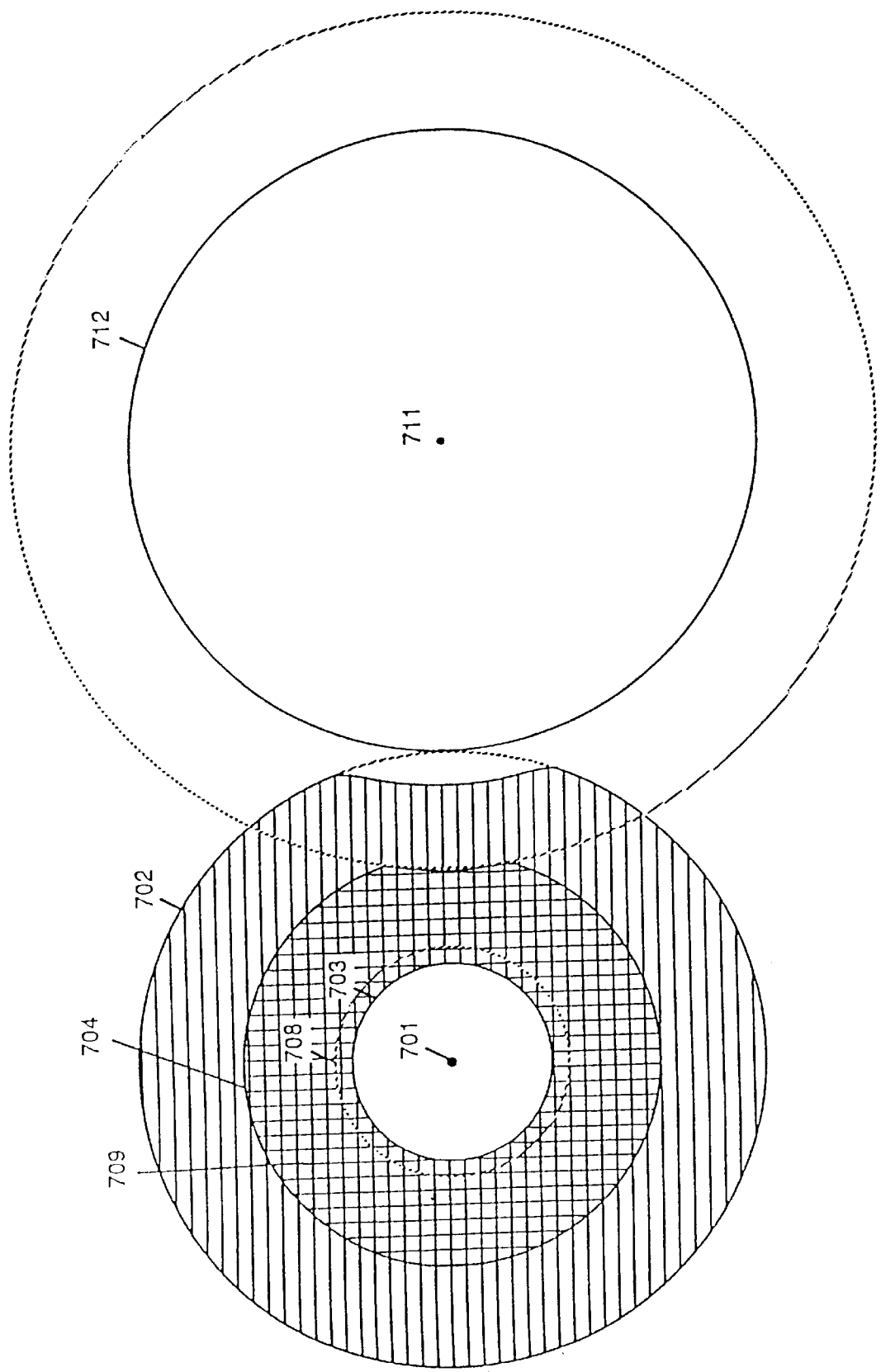
FIG. 90 is a diagram showing signal attenuating regions in the three-level transmission of the fifth embodiment.

The demodulation of $D_2$ data requires a higher C/N rate than that for $D_1$ data. In action, $H_L V_L$ or low resolution NTSC signal can at least be reproduced in a distant or lower C/N service area. $H_L V_H$, $H_H V_L$, and $H_H V_H$ can in addition be reproduced at a lower C/N area. Then, at a high C/N area, $H_L V_H$-H, $H_H V_L$-H, and $H_H V_H$-H components can also be reproduced to develop an HDTV signal. Accordingly, three different level broadcast signals can be played back. This method allows the signal receivable area shown in FIG. 53 to increase from a double region to a triple region, as shown in FIG. 90, thus ensuring higher opportunity for enjoying TV programs FIGS. 78 is a block diagram of the third video decoder arranged for the time-base assignment of data shown in FIG. 77, which is similar to that shown in FIG. 72 except that the third input 551 for $D_3$ signal is eliminated and the arrangement shown in FIG. 74(a) is added.

In operation, both the $D_1$ and $D_2$ signals are fed through two input units 521, 530 respectively to a switch 812 at the first timing. As their components including $H_L V_L$ are time divided, they are transferred in a sequence by the switch 812 to an expander 503. This sequence will now be explained referring to the time-base assignment of FIG. 77. A compressed form of $H_L V_L$ of the first channel is first fed to the expander 503 where it is expanded. Then, $H_L V_H$, $H_H V_L$, and $H_H V_H$ are expanded. All the four expanded components are sent through a switch 812a to a mixer 556 where they are mixed to produce $H_L V_L$-H. $H_L V_L$-H is then fed back from the terminal 1 of a switch 765a through the input 2 of a switch 765 to the $H_L V_L$ input of the mixer 556.

At the second timing, $H_L V_H$-H, $H_H V_L$-H, and $H_H V_H$-H of the $D_2$ signal shown in FIG. 77 are fed to the expander 503 where they are expanded before transferred through the switch 821a to the mixer 556. They are mixed by the mixer 556 to an HDTV signal which is fed through the terminal 2 of the switch 765a to the output unit 521 for further delivery. The time-base assignment of data components for transmission, shown in FIG. 77, contributes to the simplest arrangement of the expander and mixer. Although FIG. 77 shows two, $D_1$ and $D_2$, signal levels, four-level transmission of a TV signal will be feasible using the addition of a $D_3$ signal and a super resolution HDTV signal.

Figure 79:
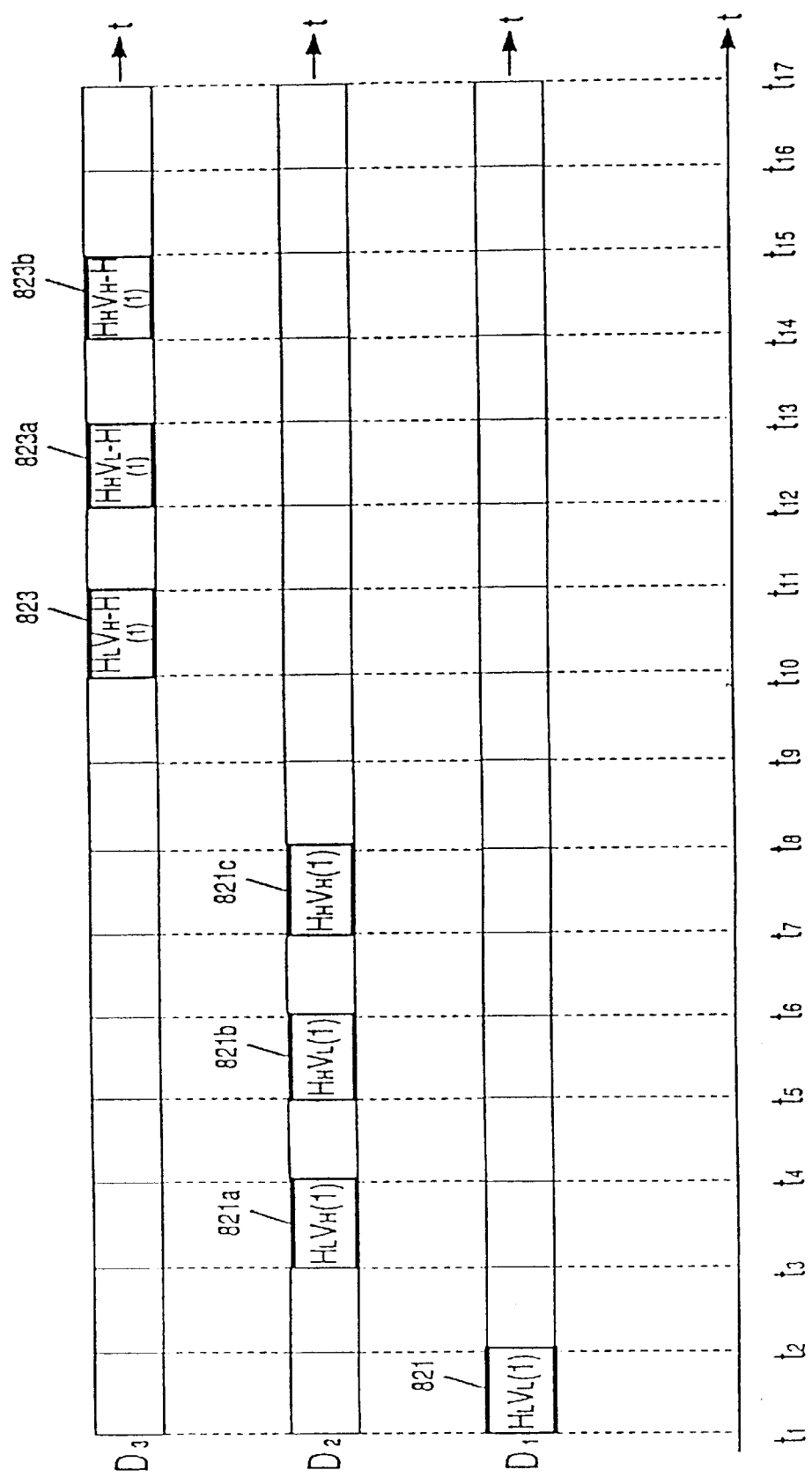
FIG. 79 is a diagram showing a time assignment of data components of a three-level transmission signal according to the fifth embodiment.
Figure 80:
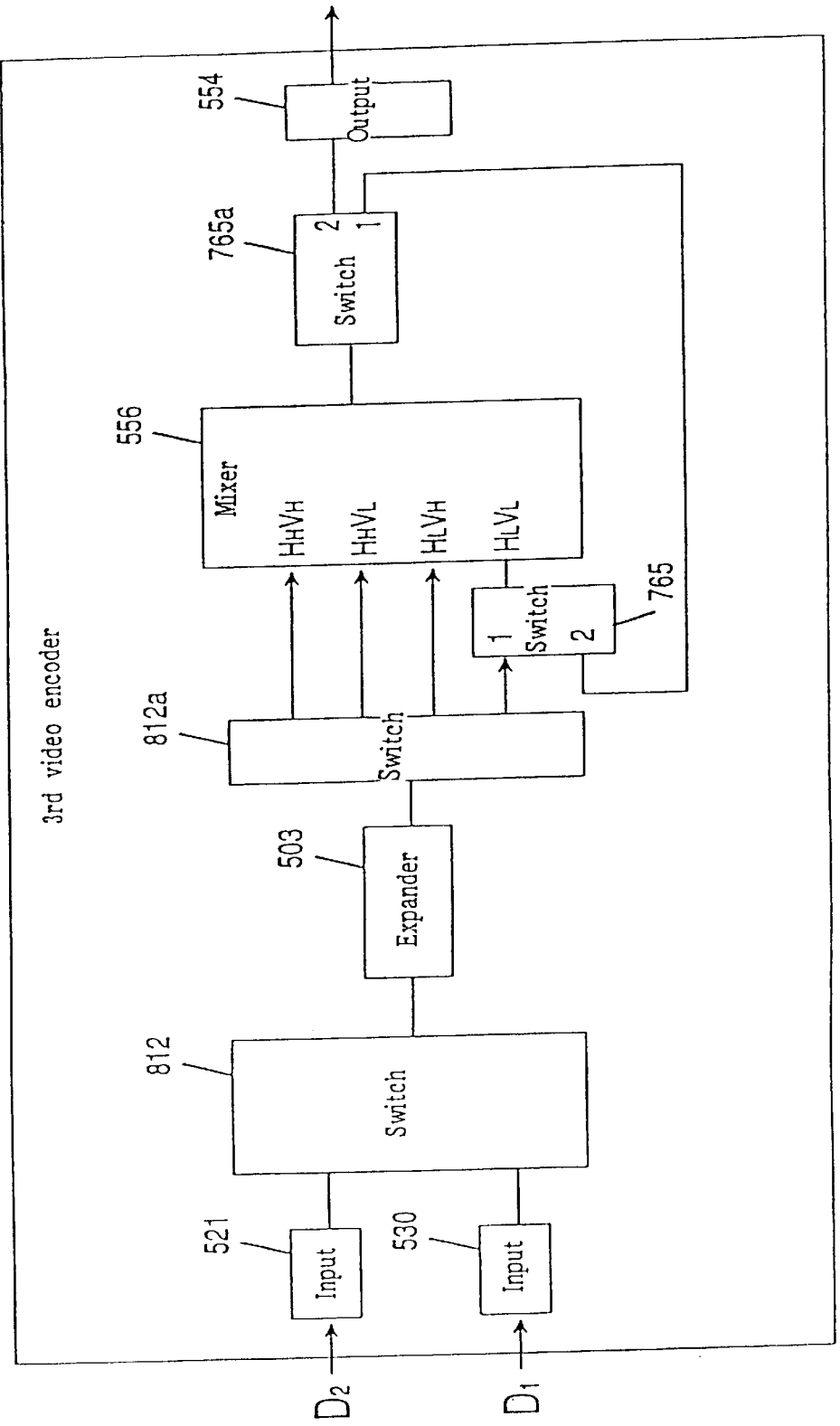
FIG. 80 is a block diagram of another video decoder of the fifth embodiment.

FIG. 79 illustrates a time-base assignment of data components of a physical three-level, $D_1$, $D_2$, $D_3$, TV signal, in which data components of the same channel are so arranged as not to overlap with one another with time. FIG. 80 is a block diagram of a modified video decoder 423, similar to FIG. 78, in which a third input 521a is added. The time-base assignment of data components shown in FIG. 79 also contributes to the simple construction of the decoder.

Figure 81:
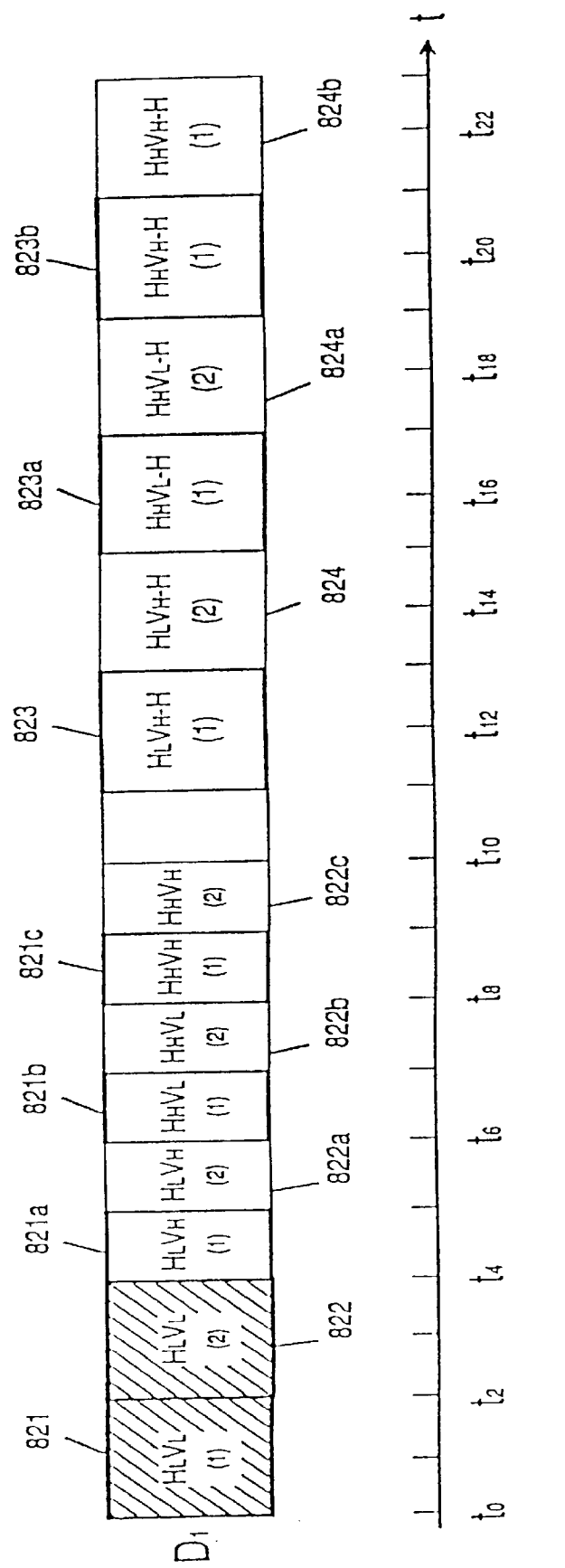
FIG. 81 is a diagram showing a time assignment of data components of a transmission signal according to the fifth embodiment.

The action of the modified decoder 423 is almost identical to that shown in FIG. 78 and associated with the time-base assignment shown in FIG. 77 and will no more be explained. It is also possible to multiplex data components on the $D_1$ signal as shown in FIG. 81. However, two data 821 and 822 are increased higher in the error correction capability than other data components 821a, 812b, 812c, thus staying at a higher signal level. More particularly, the data assignment for transmission is made in one physical level but two logic level relationship. Also, each data component of the second channel is inserted between two adjacent data components of the first channel so that serial processing can be executed at the receiver side and the same effects as of the time-base assignment shown in FIG. 79 will thus be obtained.

The time-base assignment of data components shown in FIG. 81 is based on the logic level mode and can also be carried in the physical level mode when the bit transmission rate of the two data components 821 and 822 is decreased to ½ or ⅓ thus to lower the error rate. The physical level arrangement is consisted of three different levels.

Figure 82:
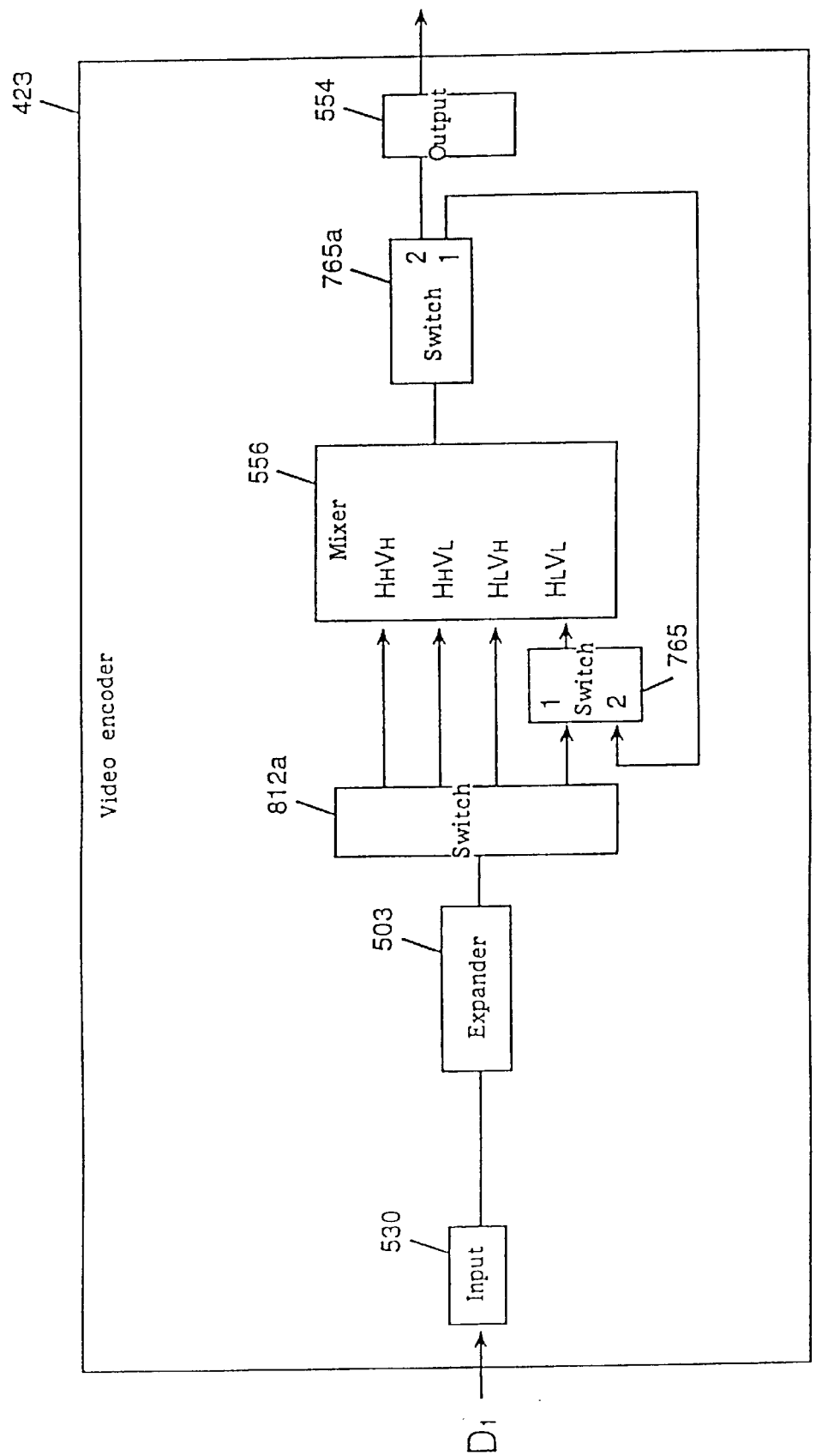
FIG. 82 is a block diagram of a video decoder for D signal of the fifth embodiment.

FIG. 82 is a block diagram of another modified video decoder 423 for decoding of the $D_1$ signal time-base arranged as shown in FIG. 81, which is simpler in construction than that shown in FIG. 80. Its action is identical to that of the decoder shown in FIG. 80 and will be no more explained.

As understood, the time-base assignment of data components shown in FIG. 81 also contributes to the similar arrangement of the expander and mixer. Also, four data components of the $D_1$ signal are fed at respective time slices to a mixer 556. Hence, the circuitry arrangement of the mixer 556 or a plurality of circuit blocks such as provided in the video mixer 548 of FIG. 32 may be arranged for changing the connection therebetween corresponding to each data component so that they become compatible in time division action and thus, minimized in circuitry construction.

Accordingly, the receiver can be minimized in the overall construction.

It would be understood that the fifth embodiment is not limited to ASK modulation and the other methods including PSK and QAM modulation, such as described in the first, second, and third embodiments, will be employed with equal success.

Figure 58:
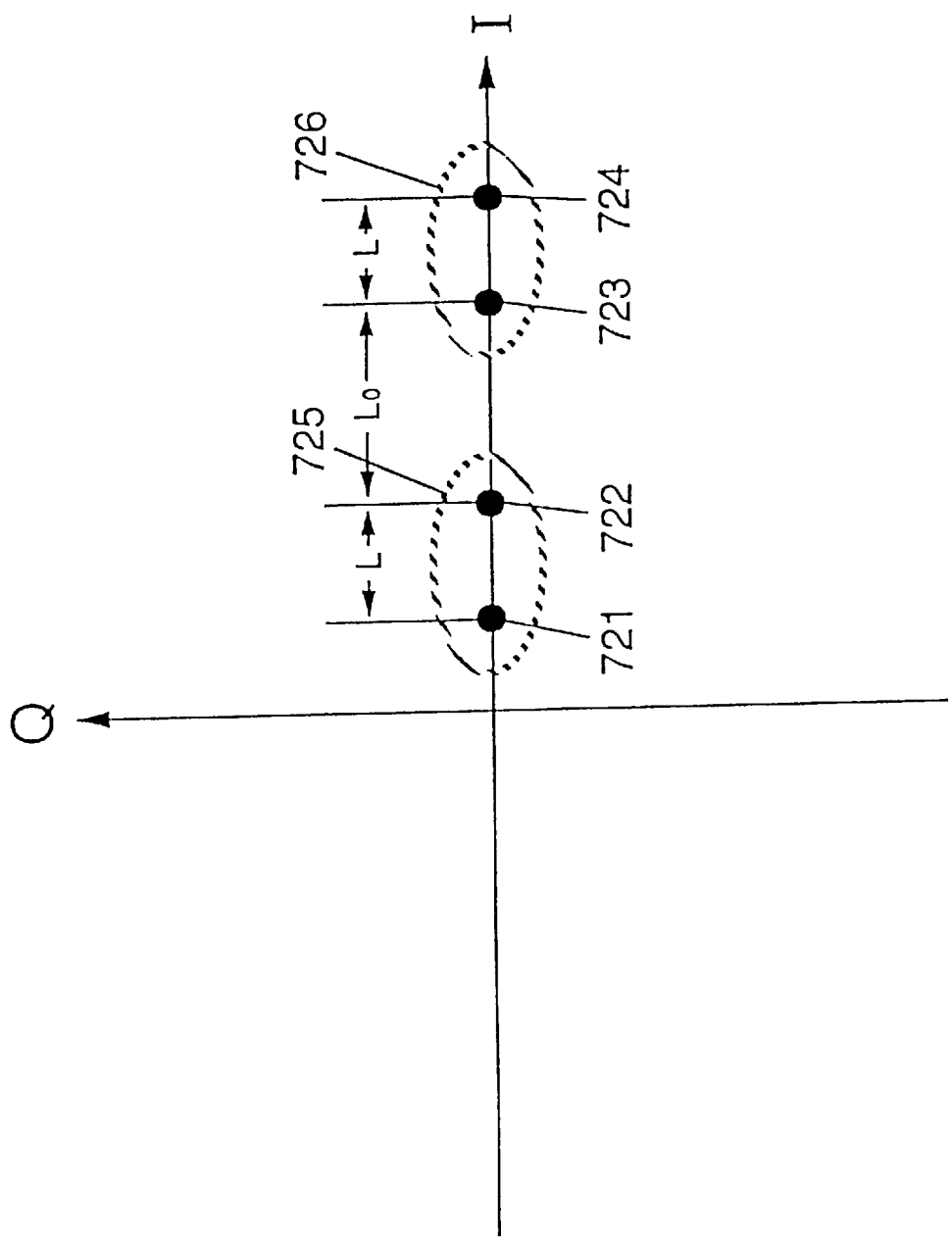
FIG. 58 is a diagram showing another assignment of signal points of the modified 4 ASK signal of the fifth embodiment.
Figure 83:
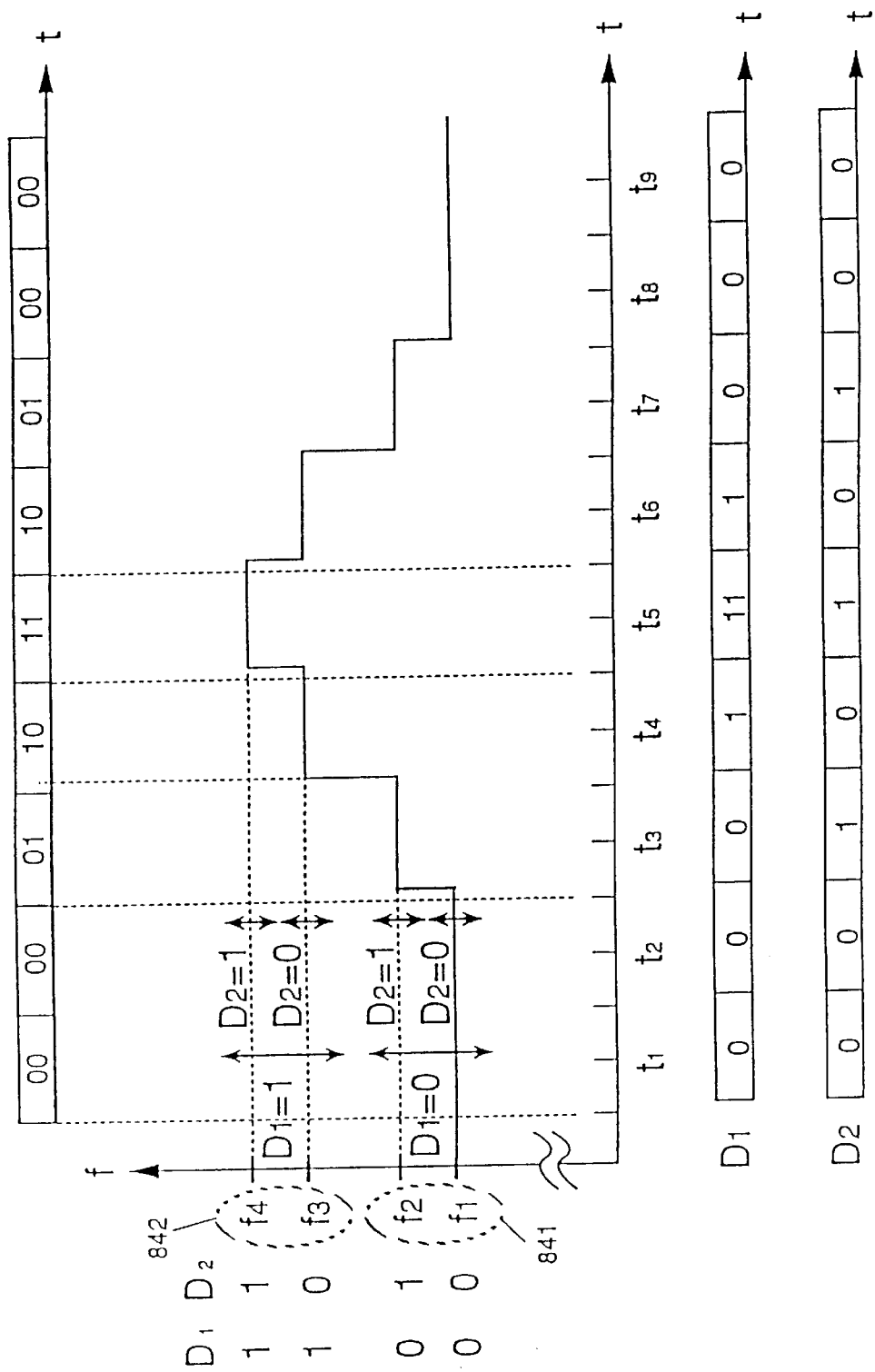
FIG. 83 is a graphic diagram showing the relation between frequency and time of a frequency modulated signal according to the fifth embodiment.

Also, FSK modulation will be eligible in any of the embodiments. For example, the signal points of a multiple-level FSK signal consisting of four frequency components f1, f2, f3, f4 are divided into groups as shown in FIG. 58 and when the distance between any two groups are spaced from each other for ease of discrimination, the multi-level transmission of the FSK signal can be implemented, as illustrated in FIG. 83.

More particularly, it is assumed that the frequency group 841 of f1 and f2 is assigned $D_1=0$ and the group 842 of f3 and f4 is assigned $D_1=1$. If f1 and f3 represent 0 at $D_2$ and f2 and f4 represent 1 at $D_2$, two-bit data transmission, one bit at $D_1$ or $D_2$, will be possible as shown in FIG. 83. When the C/N rate is high, a combination of $D_{1=0}$ and $D_2=1$ is reconstructed at t=t3 and a combination of $D_1=1$ and $D_2=0$ at t=t4. When the C/N rate is low, $D_{1=0}$ only is reproduced at t=t3 and $D_1=1$ at t=t4. In this manner, the FSK signal can be transmitted in the multi-level arrangement. This multi-state FSK signal transmission is applicable to each of the third, fourth, and fifth embodiments.

Figure 84:
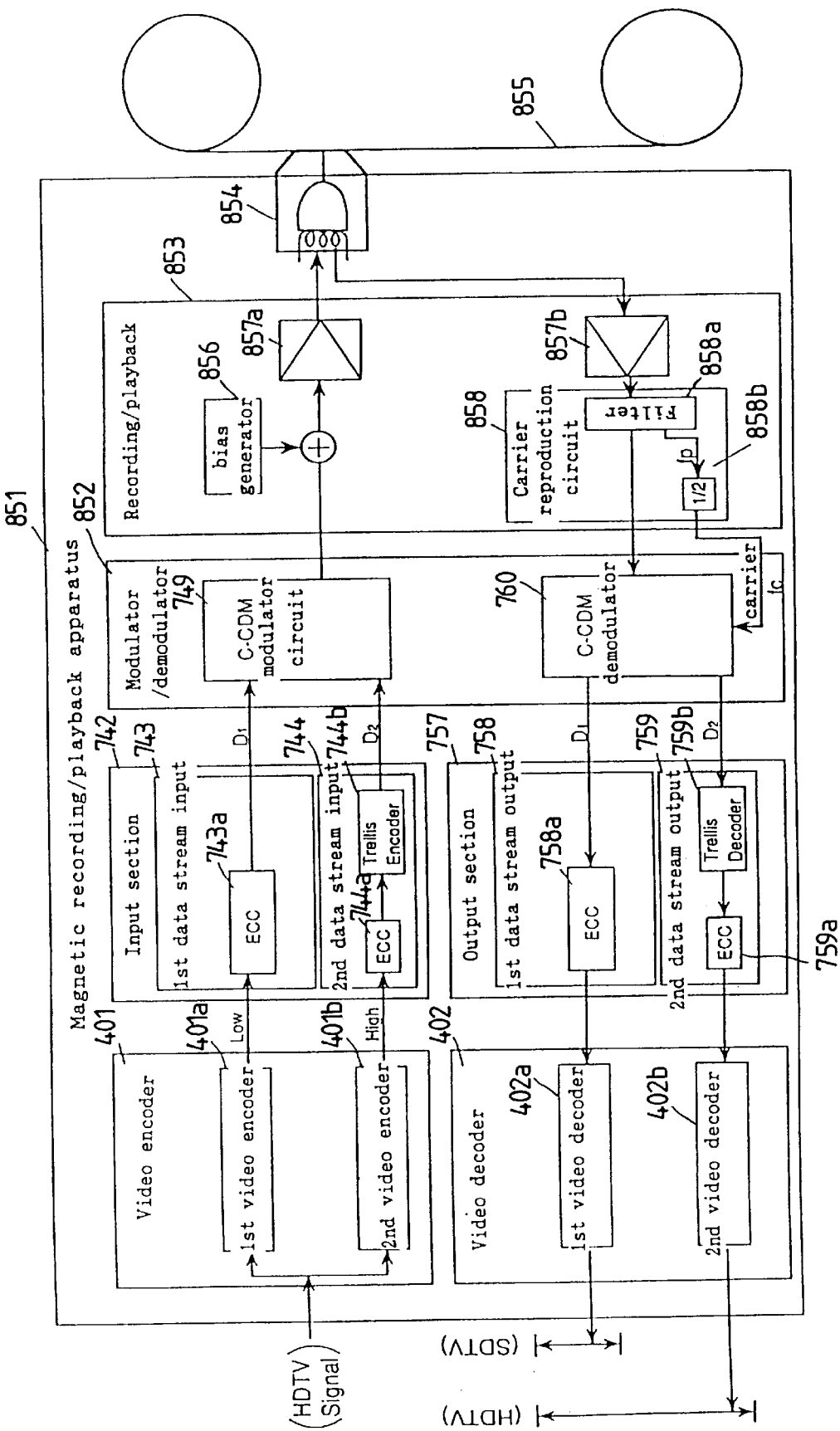
FIG. 84 is a block diagram of a magnetic record/playback apparatus of the fifth embodiment.

The fifth embodiment may also be implemented in the form of a magnetic record/playback apparatus of which block diagram shown in FIG. 84 because its ASK mode action is appropriate to magnetic record and playback operation.

Embodiment 6

A sixth embodiment of the present invention is applicable to a magnetic recording and playback apparatus. Although the above-described fifth embodiment applies the present invention to a multiple-level recording ASK data transmission system, it is also feasible in the same manner to adopt this invention in a magnetic recording and playback apparatus of a multi-level ASK recording system. A multi-level magnetic recording can be realized by incorporating the C-CDM system of the present invention to PSK, FCK, and QAM, as well as ASK.

First of all, the method of realizing a multi-level recording in a 16 QAM or 32 QAM magnetic recording playback apparatus will be explained with reference to the C-CDM system of the present invention. FIG. 84 is a circuit block diagram showing a QAM system incorporating C-CDM modulator. Hereinafter, a QAM system being multiplexed by the C-CDM modulator is termed as SRQAM.

As shown in FIG. 84, an input video signal, e.g. an HDTV signal, to a magnetic record/playback apparatus 851 is divided and compressed by a video encoder 401 into a low frequency band signal through a first video encoder 401a and a high frequency band signal through a second video encoder 401b respectively. Then, a low frequency band component, e.g. $H_L V_L$, of the video signal is fed to a first data stream input 743 of an input section 742 and a high frequency band component including $H_H V_H$ is fed to a second data stream input 744 of the same. The two components are further transferred to a modulator 749 of a modulator/demodulator unit 852. The first data stream input 743 adds an error correcting code to the low frequency band signal in an ECC 743a. On the other hand, the second data stream fed into the second data stream input 744 is 2 bit in case of 16 SRQAM, 3 bit in case of 36 SRQAM, and 4 bit in case of 64 SRQAM. After an error correcting code being encoded in an ECC 744a, this signal is supplied to a Trellis encoder 744b in which a Trellis encoded signal having a ratio 1/2 in case of 16 SRQAM, 2/3 in case of 32 SRQAM, and 3/4 in case of 64 SRQAM is produced. A 64 SRQAM signal, for example, has a first data stream of 2 bit and a second data stream of 4 bit. A Trellis encoder of FIG. 128 allows this 64 SRQAM signal to perform a Trellis encoding of ratio 3/4 wherein 3 bit data is converted into 4 bit data. Thus redundancy increases and a data rate decreases, while error correcting capability increases. This results in the reduction of an error rate in the same data rate. Accordingly, transmittable information amount of the recording/playback system or transmission system will increase substantially.

It is, however, possible to constitute the first data stream input 743 to exclude a Trellis encoder as shown in FIG. 84 of this sixth embodiment because the first data stream has low error rate inherently. This will be advantageous in view of simplification of circuit configuration. The second data stream, however, has a narrow inter-code distance as compared with the first data stream and, therefore, has a worse error rate. The Trellis encoding of the second data stream improves such a worse error rate. There is no doubt that an overall circuit configuration becomes simple if the Trellis encoding of the first data stream is eliminated. An operation for modulation is almost identical to that of the transmitter of the fifth embodiment shown in FIG. 64 and will not be further more explained. A modulated signal of the modulator 749 is fed into a recording/playback circuit 853 in which it is AC biased by a bias generator 856 and amplified by an amplifier 857a. Thereafter, the signal is fed to a magnetic head 854 for recording onto a magnetic tape 855.

Figure 113:
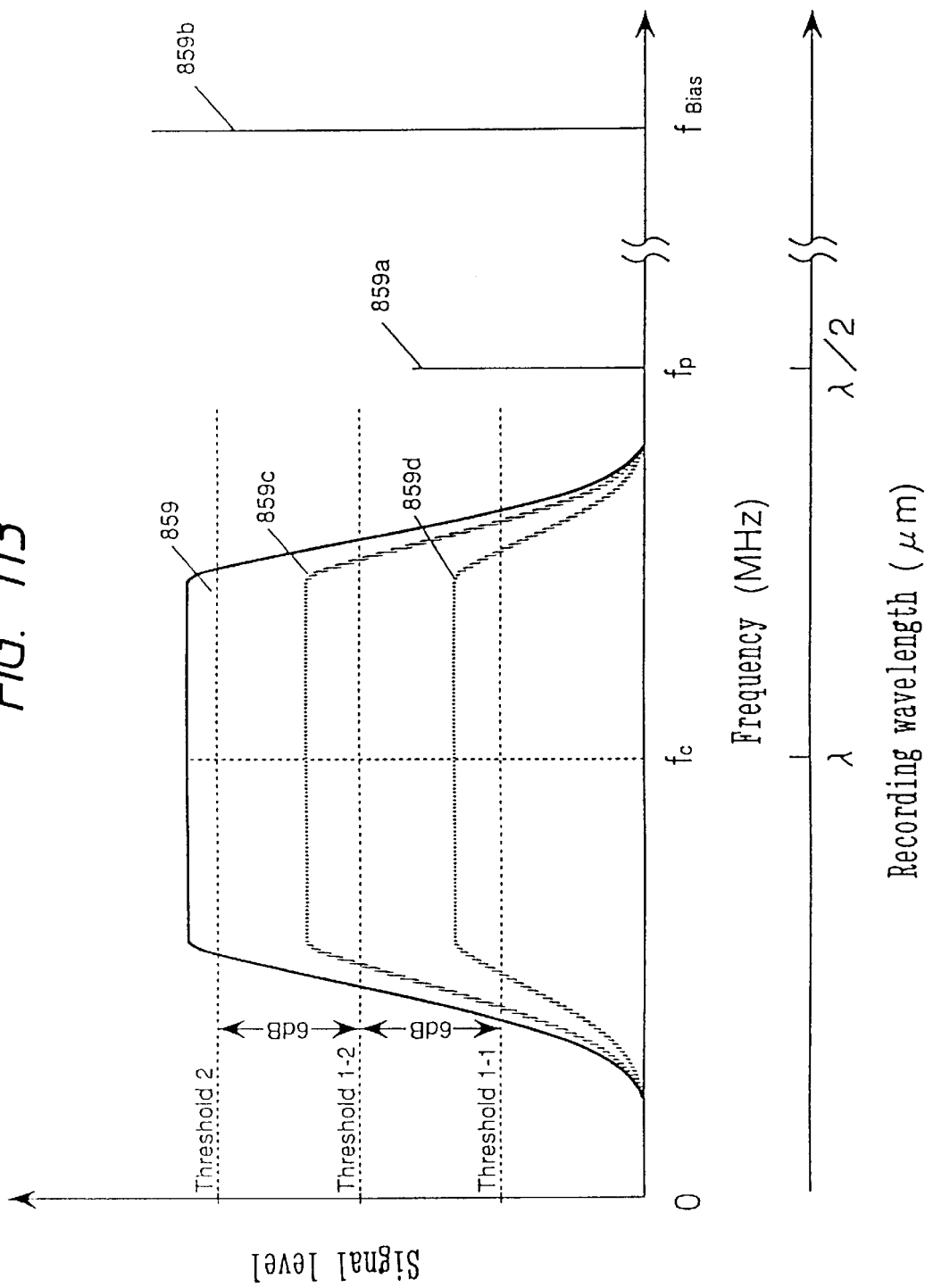
FIG. 113 is a view showing a frequency assignment of a modulation signal according to the fifth embodiment.

A format of the recording signal is shown in a recording signal frequency assignment of FIG. 113. A main, e.g. 16 SRQAM, signal 859 having a carrier of frequency fc records information, and also a pilot $f_p$ signal 859a having a frequency 2fc is recorded simultaneously. Distortion in the recording operation is lowered as a bias signal 859b having a frequency $f_{BIAS}$ adds AC bias for magnetic recording. Two of three-level signals shown in FIG. 113 are recorded in multiple state. In order to reproduce these recorded signals, two thresholds Th-1-2, Th-2 are given. A signal 859 will reproduce all of two levels while a signal 859c will reproduce $D_1$ data only, depending on the C/N level of the recording/playback.

A main signal of 16 SRQAM will have a signal point assignment shown in FIG. 10. Furthermore, a main signal of 36 SRQAM will have a signal point assignment shown in FIG. 100. In reproduction of this signal, both the main signal 859 and the pilot signal 859a are reproduced through the magnetic head 854 and amplified by an amplifier 857b. An output signal of the amplifier 857b is fed to a carrier reproduction circuit 858 in which a filter 858a separates the frequency of the pilot signal $f_p$ having a frequency 2f0 and a ½ frequency divider 858b reproduces a carrier of frequency f0 to transfer it to a demodulator 760. This reproduced carrier is used to demodulate the main signal in the demodulator 760.

Assuming that a magnetic recording tape 855, e.g. HDTV tape, is of high C/N rate, 16 signal points are discriminatable and thus both $D_1$ and $D_2$ are demodulated in the demodulator 760. Subsequently, a video decoder 402 reproduces all the signals. An HDTV VCR can reproduce a high bit-rate TV signal such as a 15 Mbps HDTV signal. The lower the C/N rate, the cheaper the cost of a video tape. So far, a VHS tape in the market is inferior by more than 10 dB in the C/N rate to a full-scale broadcast tape. If a video tape 855 is of low C/N rate, it will not be able to discriminate all the 16 or 32 valued signal points. Therefore the first data stream $D_1$ can be reproduced, while a 2 bit, 3 bit, or 4 bit data stream of the second data stream $D_2$ cannot be reproduced. Only 2 bit data stream of the first data stream is reproduced. If a two-level HDTV video signal is recorded and reproduced, a low C/N tape having insufficient capability of reproducing a high frequency band video signal can output only a low rate low frequency band video signal of the first data stream, specifically e.g. a 7 Mbps wide NTSC TV signal.

Figure 114:
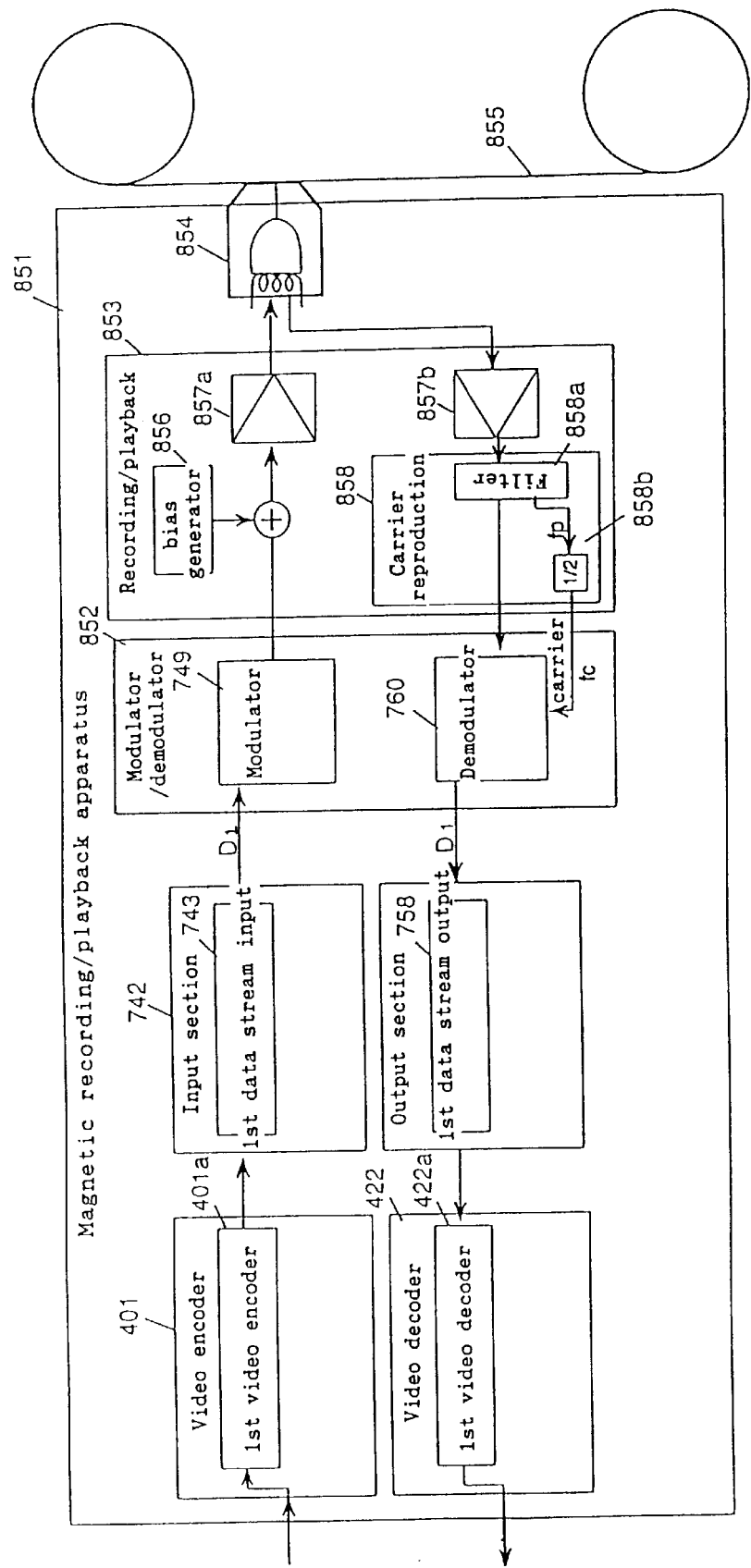
FIG. 114 is a block diagram showing a magnetic recording/playback apparatus according to the fifth embodiment.

As shown in a block diagram of FIG. 114, the second data stream output 759, the second data stream input 744, and the second video decoder 402a can be eliminated in order to provide customers one aspect of lower grade products. In this case, a recording/playback apparatus 851, dedicated to a low bit rate, will include a modulator such as a modified QPSK which modulates and demodulates the first data stream only. This apparatus allows only the first data stream to be recorded and reproduced. Specifically, a wide NTSC grade video signal can be recorded and reproduced.

Above-described high C/N rate video tape 855 capable of recording a high bit-rate signal, e.g. HDTV signal, will be capable of being used in such a low bit-rate dedicated magnetic recording/playback apparatus but will reproduce the first data stream $D_1$ only. That is, the wide NTSC signal is outputted, while the second data stream is not reproduced. In other words, one recording/playback apparatus having a complicated configuration can reproduce a HDTV signal and the other recording/playback apparatus having a simple configuration can reproduce a wide NTSC signal if a given video tape 855 includes the same multi-level HDTV signal. Accordingly in case of two-level multiple state, four combinations will be realized with perfect compatibility among two tapes having different C/N rates and two recording/ playback apparatus having different recording/playback data rates. This will bring remarkable effect. In this case, an NTSC dedicated apparatus will be simple in construction as compared with an HDTV dedicated apparatus. In more detail, a circuit scale of EDTV decoder will be ⅙ of that of HDTV decoder. Therefore, a low function apparatus can be realized at fairly low cost. Realization of two, HDTV and EDTV, types recording/playback apparatus having different recording/reproducing capability of picture quality will provide various type products ranging in a wide price range. Users can freely select a tape among a plurality of tapes, from an expensive high C/N rate tape to a cheaper low C/N rate tape, as occasion demands so as to satisfy required picture quality. Not only maintaining perfect compatibility but obtaining expandable capability will be attained and further compatibility with a future system will be ensured. Consequently, it will be possible to establish long-lasting standards for recording/playback apparatus. Other recording methods will be used in the same manner. For example, a multi-level recording will be realized by use of phase modulation explained in the first and third embodiments. A recording using ASK explained in the fifth embodiment will also be possible. A multiple state will be realized by converting present recording from two-level to four-level and dividing into two groups as shown in FIGS. 59(c) and 59(d).

A circuit block diagram for ASK is identical to that disclosed in FIG. 84. Besides embodiments already described, a multi-level recording will be also realized by use of multiple tracks on a magnetic tape. Furthermore, a theoretical multi-level recording will be feasible by differentiating the error correcting capability so as to discriminate respective data.

Compatibility with future standards will be described below. A setting of standards for recording/playback apparatus such as VCR is normally executed by taking account of the most highest C/N rate tape available in practice. The recording characteristics of tapes progresses rapidly. For example, the C/N rate has been improved more than 10 dB compared with the tape used 10 years ago. If supposed that new standards will be established after 10 to 20 years due to an advancement of tape property, a conventional method will encounter with difficulty in maintaining compatibility with older standards. New and old standards, in fact, used to be one-way compatible or non-compatible with each other. On the contrary, in accordance with the present invention, the standards are first of all established for recording and/or reproducing the first data stream and/or second data stream on present day tapes. Subsequently, if the C/N rate is improved magnificently in future, an upper level data stream, e.g. a third data stream, will be added without any difficulty as long as the present invention is incorporated in the system. For example, a super HDTV VCR capable of recording or reproducing a three-level 64 SRQAM signal will be realized while maintaining perfect compatibility with the conventional standards. A magnetic tape, recording first to third data streams in compliance with new standards, will be able to use, of cause, in the older two-level magnetic recording/playback apparatus capable of recording and/or reproducing only first and second data streams. In this case, first and second data streams can be reproduced perfectly although the third data stream is left non-reproduced. Therefore, an HDTV signal can be reproduced. For these reasons, the merit of expanding recording data amount while maintaining compatibility between new and old standards is expected.

Returning to the explanation of reproducing operation of FIG. 84, the magnetic head 854 and the magnetic reproduction circuit 853 reproduce a reproducing signal from the magnetic tape 855 and feeds it to the modulation/ demodulation circuit 852. The demodulating operation is almost identical with that of first, third, and fourth embodiments and will no further be explained. The demodulator 760 reproduces the first and second data streams $D_1$ and $D_2$. The second data stream $D_2$ is error corrected with high code gain in a Trellis-decoder 759b such as a Vitabi decoder, so as to be low error rate. The video decoder 402 demodulates $D_1$ and $D_2$ signals to output an HDTV video signal.

FIG. 131 is a block diagram showing a three-level magnetic recording/playback apparatus in accordance with the present invention which includes one theoretical level in addition to two physical levels. This system is substantially the same as that of FIG. 84. The difference is that the first data stream is further divided into two subchannels by use of a TDM in order to realize a three-level construction.

As shown in FIG. 131, an HDTV signal is separated first of all into two, medium and low frequency band video signals $D_{1-1}$ and $D_{1-2}$, through a 1-1 video encoder 401c and a 1-2 video encoder 401d and, thereafter, fed into a first data stream input 743 of an input section 742. The data stream $D_{1-1}$ having a picture quality of MPEG grade is error correcting coded with high code gain in an ECC encoder 743a, while the data stream $D_{1-2}$ is error correcting coded with normal code gain in an ECC encoder 743b. $D_{1-1}$ and $D_{1-2}$ are time multiplexed together in a TDM 743c to be one data stream $D_1$. $D_1$ and $D_2$ are modulated into two-level signal in a C-CDM 749 and then recorded on the magnetic tape 855 through the magnetic head 854.

In playback operation, a recording signal reproduced through the magnetic head 854 is demodulated into $D_1$ and $D_2$ by the C-CDM demodulator 760 in the same manner as in the explanation of FIG. 84. The first data stream $D_1$ is demodulated into two, $D_{1-1}$ and $D_{1-2}$, subchannels through the TDM 758c provided in the first data stream output 758. $D_{1-1}$ data is error corrected in an ECC decoder 758a having high code gain. Therefore, $D_{1-1}$ data can be demodulated at a lower C/N rate as compared with $D_{1-2}$ data. A 1-1 video decoder 402a decodes the $D_{1-1}$ data and outputs an LDTV signal. On the other hand, $D_{1-2}$ data is error corrected in an ECC decoder 758b having normal code gain. Therefore, $D_{1-2}$ data has a threshold value of high C/N rate compared with $D_{1-1}$ data and thus will not be demodulated when a signal level is not large. $D_{1-2}$ data is then demodulated in a 1-2 video decoder 402d and summed with $D_{1-1}$ data to output an EDTV signal of wide NTSC grade.

The second data stream $D_2$ is Vitabi demodulated in a Trellis decoder 759b and error corrected at an ECC decoder 759a. Thereafter, $D_2$ data is converted into a high frequency band video signal through a second video decoder 402b and, then, summed with $D_{1-1}$ and $D_{1-2}$ data to output an HDTV signal. In this case, a threshold value of the C/N rate of $D_2$ data is set larger than that of C/N rate of $D_{1-2}$ data. Accordingly, $D_{1-1}$ data, i.e. an LDTV signal, will be reproduced from a tape 855 having a smaller C/N rate. $D_{1-1}$ and $D_{1-2}$ data, i.e. an EDTV signal, will be reproduced from a tape 855 having a normal C/N rate. And, $D_{1-1}$, $D_{1-2}$, and $D_2$ data, i.e. an HDTV signal, will be reproduced from a tape 855 having a high C/N rate.

Three-level magnetic recording/playback apparatus can be realized in this manner. As described in the foregoing description, the tape 855 has an interrelation between C/N rate and cost. The present invention allows users to select a grade of tape in accordance with a content of TV program they want to record because video signals having picture qualities of three grades can be recorded and/or reproduced in accordance with tape cost.

Next, an effect of multi-level recording will be described with respect to fast feed playback. As shown in a recording track diagram of FIG. 132, a recording track 855a having an azimuth angle A and a recording track 855b having an opposite azimuth angle B are alternately arrayed on the magnetic tape 855. The recording track 855a has a recording region 855c at its central portion and the remainder as $D_{1-2}$ recording regions 855d, as denoted in the drawing. This unique recording pattern is provided on at least one of several recording tracks. The recording region 855c records one frame of LDTV signal. A high frequency band signal $D_2$ is recorded on a $D_2$ recording region 855e corresponding to an entire recording region of the recording track 855a. This recording format causes no novel effect against a normal speed recording/playback operation.

A fast feed reproduction in a reverse direction does not allow a magnetic head trace 855f having an azimuth angle A to coincide with the magnetic track as shown in the drawing. As the present invention provides the $D_{1-1}$ recording region 855c at a central narrow region of the magnetic tape as shown in FIG. 132, this region only is surely reproduced although it occurs with a predetermined probability. Thus reproduced $D_{1-1}$ signal can demodulate an entire picture plane of the same time although its picture quality is an LDTV of MPEG1 level. In this manner several to several tens LDTV signals per second can be reproduced with perfect picture images during the fast feed playback operation, thereby enabling users to surely confirm picture images during the fast feed operation.

A head trace 855g corresponds to a head trace in the reverse playback operation, from which it is understood only a part of the magnetic track is traced in the reverse playback operation. The recording/playback format shown in FIG. 132 however allows, even in such a reverse playback operation, to reproduce $D_{1-1}$ recording region and, therefore, an animation of LDTV grade is outputted intermittently.

Accordingly, the present invention makes it possible to record a picture image of LDTV grade within a narrow region on the recording track, which results in intermittent reproduction of almost perfect still pictures with picture quality of LDTV grade during normal and reverse fast feed playback operations. Thus, the users can easily confirm picture imaged even in high-speed searching.

Next, another method will be described to respond a higher speed fast feed playback operation. A $D_{1-1}$ recording region 855c is provided as shown at lower right of FIG. 132, so that one frame of LDTV signal is recorded thereon. Furthermore, a narrow $D_{1-1} \cdot D_2$ recording region 855h is provided at a part of the $D_{1-1}$ recording region 855c. A subchannel $D_{1-1}$ in this region records a part of information relating to the one frame of LDTV signal. The remainder of the LDTV information is recorded on the $D_2$ recording region 855j of the $D_{1-1} \cdot D_2$ recording region 855h in a duplicated manner. The subchannel $D_2$ has a data recording capacity 3 to 5 times as much as the subchannel $D_{1-1}$. Therefore, subchannels $D_{1-1}$ and $D_2$ can record one frame information of LDTV signal on a smaller, ⅓~⅕, area of the recording tape. As the head trace can be recorded in a further narrower regions 855h, 855j, both time and area are decreased into ⅓~⅕ as compared with a head trace time $T_{S1}$. Even if the trace of head is further inclined by increasing the fast feed speed amount, the probability of entirely tracing this region will be increased. Accordingly, perfect LDTV picture images will be intermittently reproduced even if the fast feed speed is increased up to 3 to 5 times as fast as the case of the subchannel $D_{1-1}$ only.

In case of a two-level VCR, this method is useless in reproducing the $D_2$ recording region 855j and therefore this region will not be reproduced in a high-speed fast feed playback operation. On the other hand, a three-level high performance VCR will allow users to confirm a picture image even if a fast feed playback operation is executed at a faster, 3 to 5 as fast as the two-level VCR, speed. In other words, not only excellent picture quality is obtained in accordance with cost but a maximum fast feed speed capable of reproducing picture images can be increased in accordance with the cost.

Although this embodiment utilizes a multi-level modulation system, it is needless to say that a normal, e.g. 16 QAM, modulation system can also be adopted to realize the fast feed playback operation in accordance with the present invention as long as an encoding of picture images is of multiple type.

A recording method of a conventional non-multiple digital VCR, in which picture images are highly compressed, disperses video data uniformly. Therefore, it was not possible in a fast feed playback operation to reproduce all the picture images on a picture plane of the same time. The picture reproduced was the one consisting of plurality of picture image blocks having non-coincided time bases with each other. The present invention, however, provides a multi-level HDTV VCR which can reproduce picture image blocks having coincided time bases on an entire picture plane during a fast feed playback operation although its picture quality is of LDTV grade.

The three-level recording in accordance with the present invention will be able to reproduce a high resolution TV signal such as HDTV signal when the recording/playback system has a high C/N rate. Meanwhile, a TV signal of EDTV grade, e.g. a wide NTSC signal, or a TV signal of LDTV grade, e.g. a low resolution NTSC signal, will be reproduced when the recording/playback system has a low C/N rate or poor function.

As is described in the foregoing description, the magnetic recording/playback apparatus in accordance with the present invention can reproduce picture images consisting of the same content even if the C/N rate is low or an error rate is high, although the resolution or the picture quality is relatively low.

Embodiment 7

Figure 91:
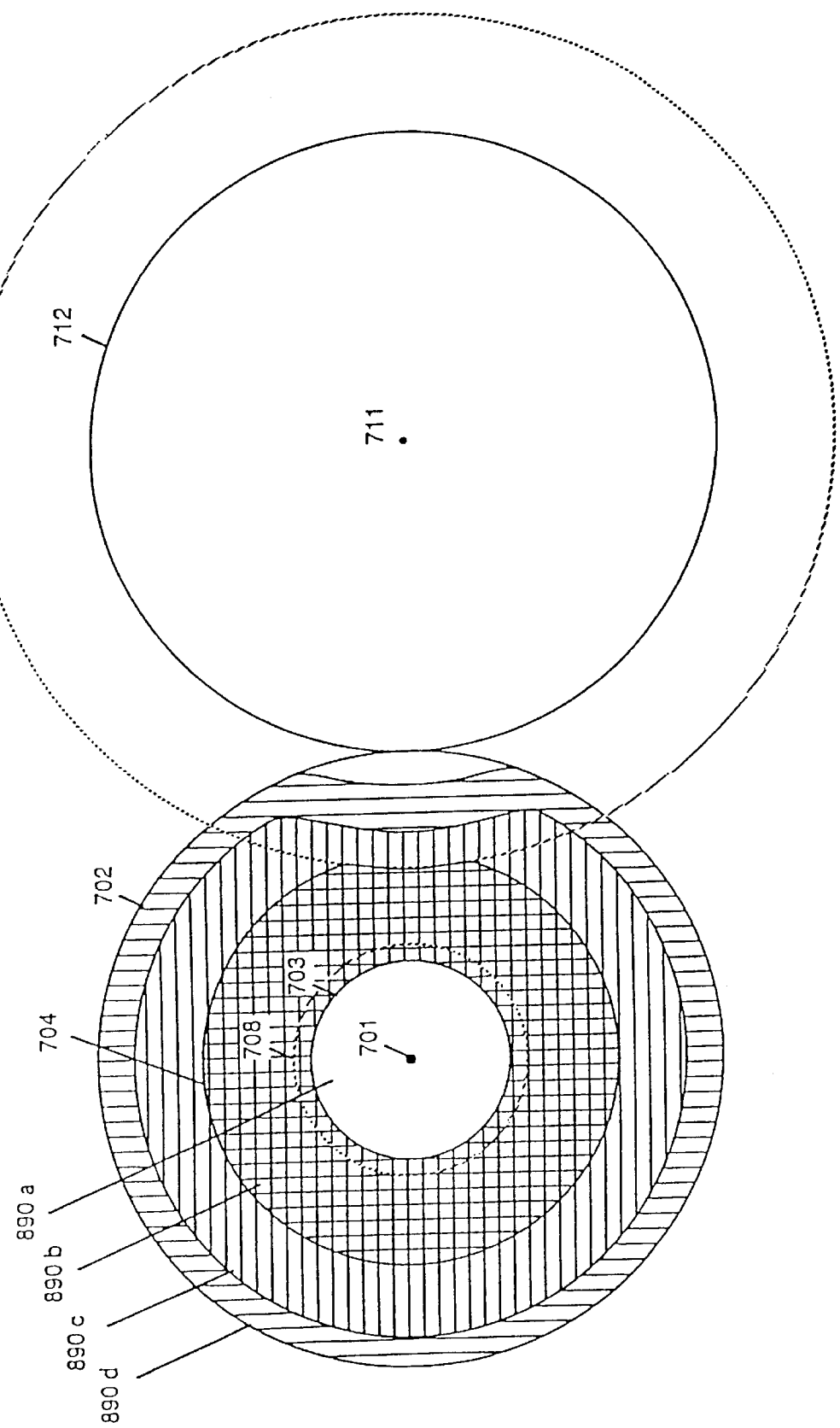
FIG. 91 is a diagram showing signal attenuating regions in the four-level transmission of a sixth embodiment.

A seventh embodiment of the present invention will be described for execution of four-level video signal transmission. A combination of the four-level signal transmission and the four-level video data construction will create a four-level signal service area as shown in FIG. 91. The four-level service area is consisted of, from innermost, a first 890a, a second 890b, a third 890c, and a fourth signal receiving area 890d. The method of developing such a four-level service area will be explained in more detail.

The four-level arrangement can be implemented by using four physically different levels determined through modulation or four logic levels defined by data discrimination in the error correction capability. The former provides a large difference in the C/N rate between two adjacent levels and the C/N rate has to be increased to discriminate all the four levels from each other. The latter is based on the action of demodulation and a difference in the C/N rate between two adjacent levels should stay at minimum. Hence, the four-level arrangement is best constructed using a combination of two physical levels and two logic levels. The division of a video signal into four signal levels will be explained.

Figure 93:
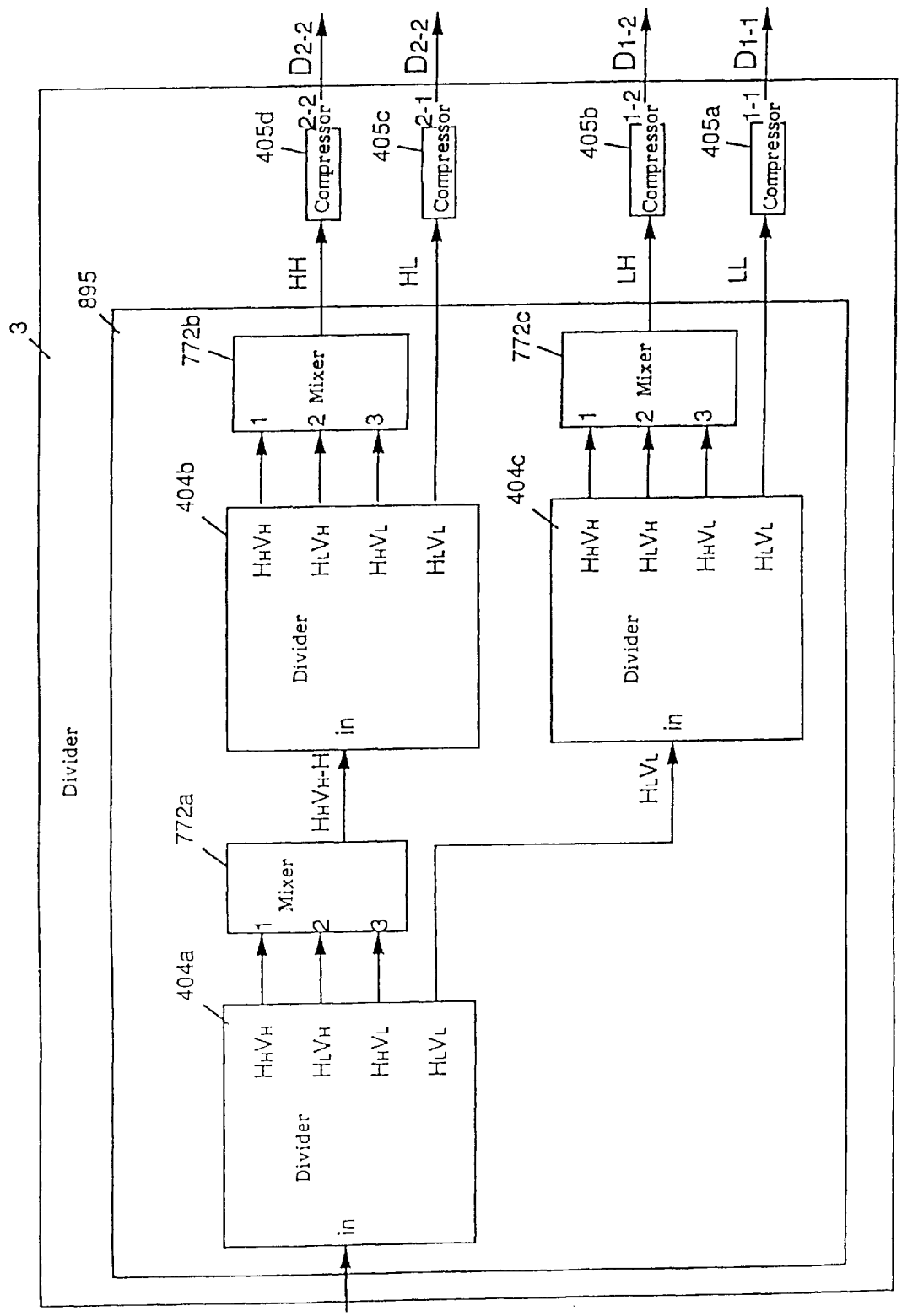
FIG. 93 is a block diagram of a divider of the sixth embodiment.

FIG. 93 is a block diagram of a divider circuit 3 which comprises a video divider 895 and four compressors 405a, 405b, 405c, 405d. The video divider 895 contains three dividers 404a, 404b, 404c which are arranged identical to the divider circuit 404 of the first video encoder 401 shown in FIG. 30 and will be no more explained. An input video signal is divided by the dividers into four components, $H_L V_L$ of low resolution data, $H_H V_H$ of high resolution data, and $H_L V_H$ and $H_H V_L$ for medium resolution data. The resolution of $H_L V_L$ is a half that of the original input signal.

The input video signal is first divided by the divider 404a into two, high and low, frequency band components, each component being divided into two, horizontal and vertical, segments. The intermediate between the high and low frequency ranges is a dividing point according to the embodiment. Hence, if the input video signal is an HDTV signal of 1000-line vertical resolution, $H_L V_L$ has a vertical resolution of 500 lines and a horizontal resolution of a half value.

Each of two, horizontal and vertical, data of the low frequency component $H_L V_L$ is further divided by the divider 404c into two frequency band segments. Hence, an $H_L V_L$ segment output is 250 lines in the vertical resolution and ¼ of the original horizontal resolution. This output of the divider 404c which is termed as an LL signal is then compressed by the compressor 405a to a $D_{1-1}$ signal.

The other three higher frequency segments of $H_L V_L$ are mixed by a mixer 772c to an LH signal which is then compressed by the compressor 405b to a $D_{1-2}$ signal. The compressor 405b may be replaced with three compressors provided between the divider 404c and the mixer 772c.

$H_L V_H$, $H_H V_L$, and $H_H V_H$ form the divider 404a are mixed by a mixer 772a to an $H_H V_H$-H signal. If the input signal is as high as 1000 lines in both horizontal and vertical resolution, $H_H V_H$-H has 500 to 1000 lines of a horizontal and a vertical resolution. $H_H V_H$-H is fed to the divider 404b where it is divided again into four components.

Similarly, $H_L V_L$ from the divider 404b has 500 to 750 lines of a horizontal and a vertical resolution and transferred as an HL signal to the compressor 405c. The other three components, $H_L V_H$, $H_H V_L$, and $H_H V_H$, from the divider 404b have 750 to 1000 lines of a horizontal and a vertical resolution and are mixed by a mixer 772b to an HH signal which is then compressed by the compressor 405d and delivered as a $D_{2-2}$ signal. After compression, the HL signal is delivered as a $D_{2-1}$ signal. As the result, LL or $D_{1-1}$ carries a frequency data of 0 to 250 lines, LH or $D_{1-2}$ carries a frequency data from more than 250 lines up to 500 lines, HL or $D_{2-1}$ carries a frequency data of more than 500 lines up to 750 lines, and HH or $D_{2-2}$ carries a frequency data of more than 750 lines to 1000 lines so that the divider circuit 3 can provide a four-level signal. Accordingly, when the divider circuit 3 of the transmitter 1 shown in FIG. 87 is replaced with the divider circuit of FIG. 93, the transmission of a four-level signal will be implemented.

The combination of multi-level data and multi-level transmission allows a video signal to be at steps declined in the picture quality in proportion to the C/N rate during transmission, thus contributing to the enlargement of the TV broadcast service area. At the receiving side, the action of demodulation and reconstruction is identical to that of the second receiver of the second embodiment shown in FIG. 88 and will be no more explained. In particular, the mixer 37 is modified for video signal transmission rather than data communications and will now be explained in more detail.

As described in the second embodiment, a received signal after demodulated and error corrected, is fed as a set of four components $D_{1-1}$, $D_{1-2}$, $D_{2-1}$, $D_{2-2}$ to the mixer 37 of the second receiver 33 of FIG. 88.

Figure 94:
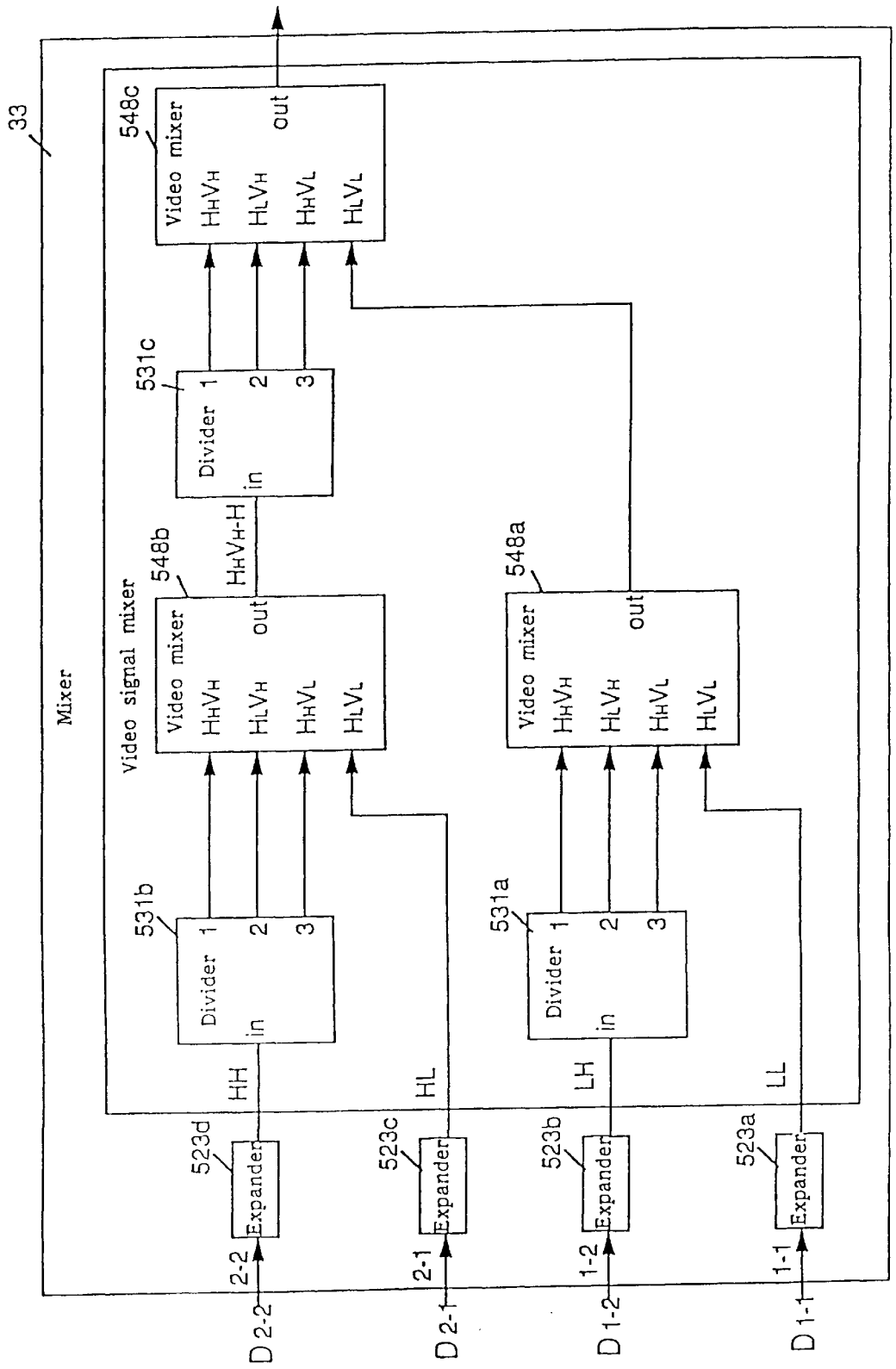
FIG. 94 is a block diagram of a mixer of the sixth embodiment.

FIG. 94 is a block diagram of a modified mixer 33 in which $D_{1-1}$, $D_{1-2}$, $D_{2-1}$, $D_{2-2}$ are explained by their respective expanders 523a, 523b, 523c, 523d to an LL, and LH, an HL, and an HH signal respectively which are equivalent to those described with FIG. 93. If the bandwidth of the input signal is 1, LL has a bandwidth of ¼, LL+LH has a bandwidth of ½, LL+LH+HL has a bandwidth of ¾, and LL+LH+HL+HH has a bandwidth of 1. The LH signal is then divided by a divider 531a and mixed by a video mixer 548a with the LL signal. An output of the video mixer 548a is transferred to an $H_L V_L$ terminal of a video mixer 548c. The video mixer 531a is identical to that of the second decoder 527 of FIG. 32 and will be no more explained. Also, the HH signal is divided by a divider 531b and fed to a video mixer 548b. At the video mixer 548b, the HH signal is mixed with the HL signal to an $H_H V_H$-H signal which is then divided by a divider 531c and sent to the video mixer 548c. At the video mixer 548c, $H_H V_H$-H is combined with the sum signal of LH and LL to a video output. The video output of the mixer 33 is then transferred to the output unit 36 of the second receiver shown in FIG. 88 where it is converted to a TV signal for delivery. If the original signal has 1050 lines of vertical resolution or is an HDTV signal of about 1000-line resolution, its four different signal level components can be intercepted in their respective signal receiving areas shown in FIG. 91.

Figure 92:
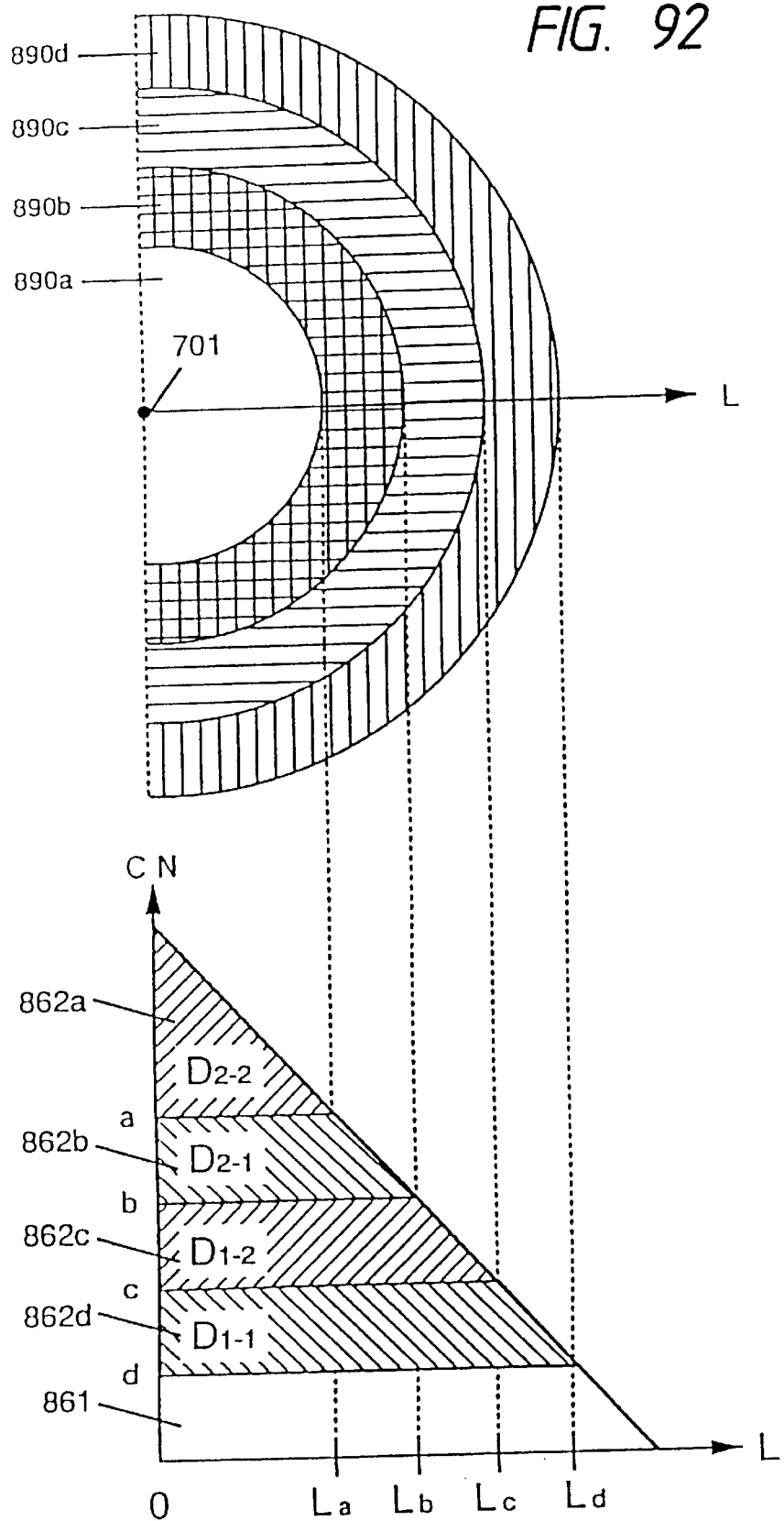
FIG. 92 is a diagram showing the four-level transmission of the sixth embodiment.

The picture quality of the four different components will be described in more detail. The illustration of FIG. 92 represents a combination of FIGS. 86 and 91. As apparent, when the C/N rate increases, the overall signal level of amount of data is increased from 862d to 862a by steps of four signal levels $D_{1-1}$, $D_{1-2}$, $D_{2-1}$, $D_{2-2}$.

Figure 95:
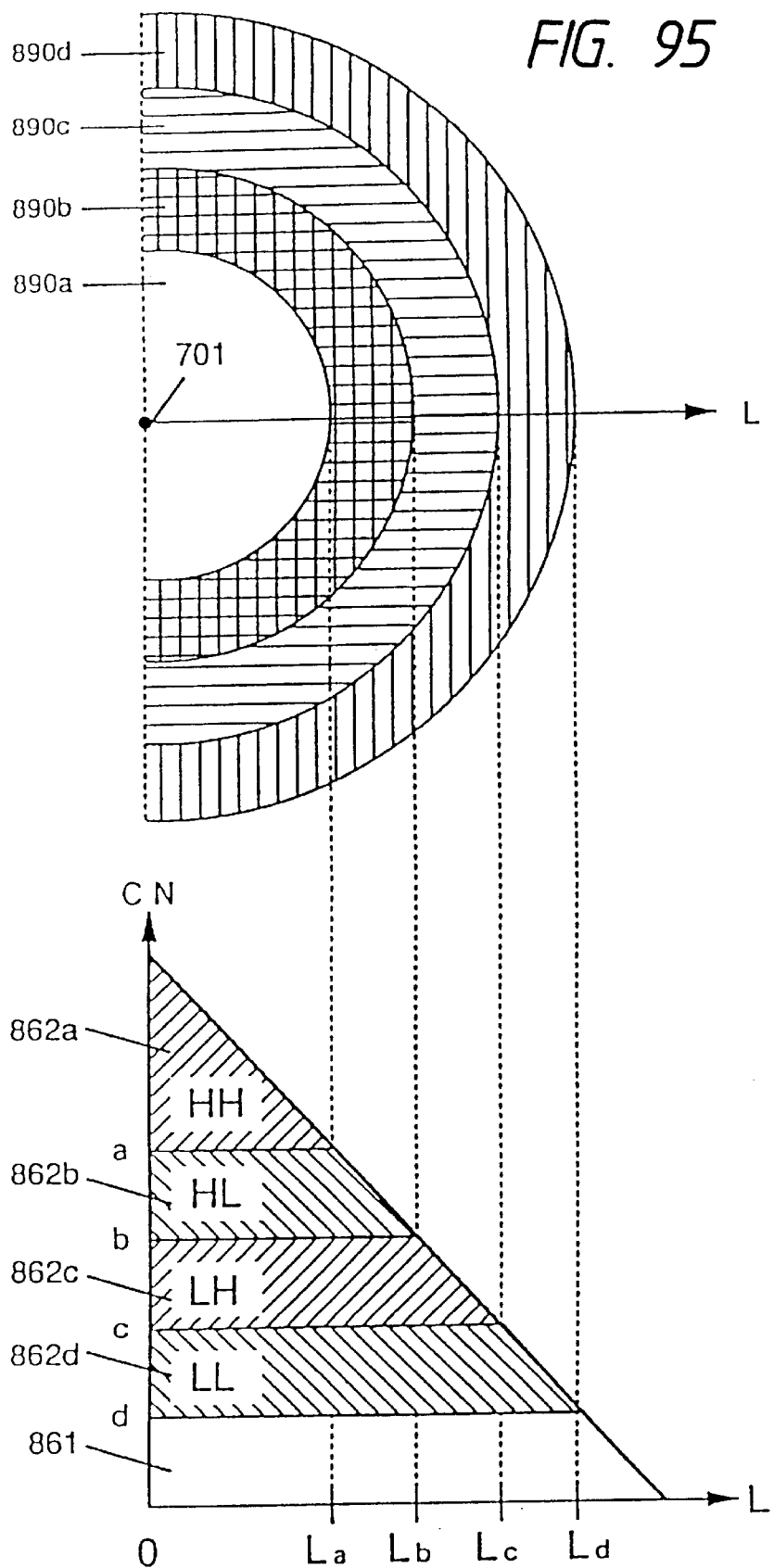
FIG. 95 is a diagram showing another four-level transmission of the sixth embodiment.
Figure 96:
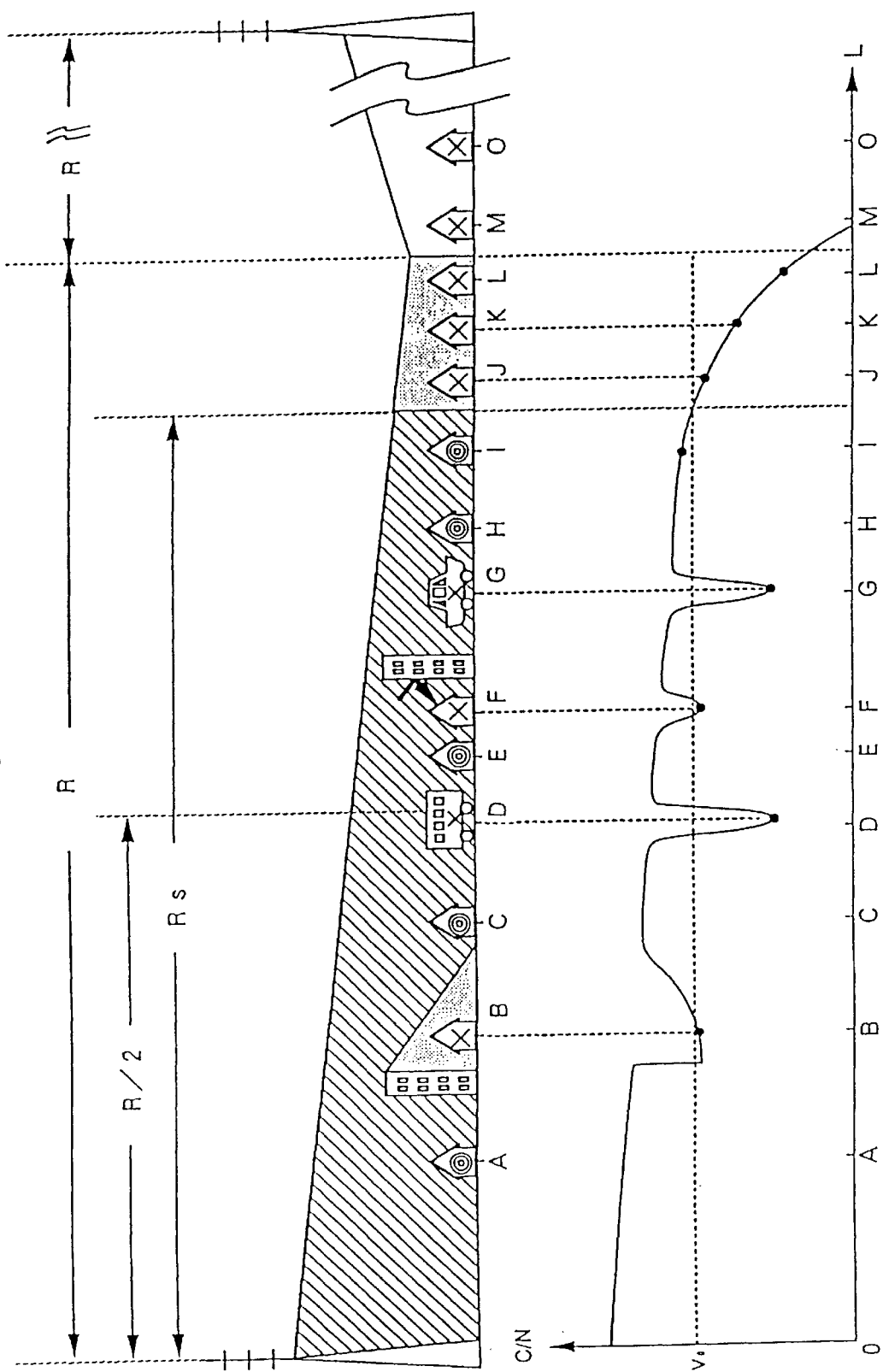
FIG. 96 is a view of signal propagation of a known digital TV broadcast system.
Figure 97:
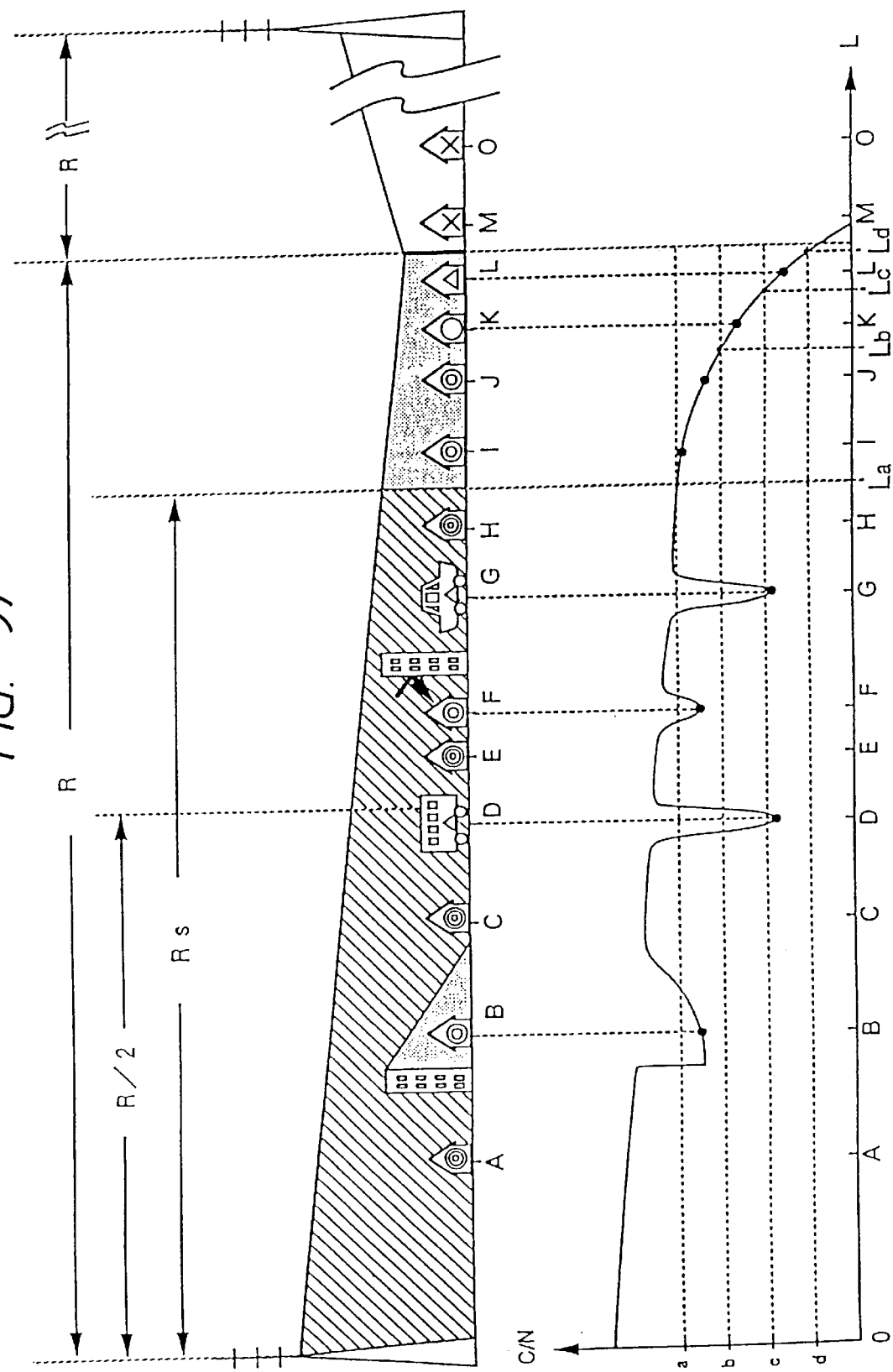
FIG. 97 is a view of signal propagation of a digital TV broadcast system according to the sixth embodiment.

Also, as shown in FIG. 95, the four different level components LL, LH, HL, and HH are accumulated in proportion to the C/N rate. More specifically, the quality of a reproduced picture will be increased as the distance from a transmitter antenna becomes small. When L=Ld, LL component is reproduced. When L=Lc, LL+LH signal is reproduced. When L=Lb, LL+LH+HL signal is reproduced. When L=La, LL+LH+HL+HH signal is reproduced. As the result, if the bandwidth of the original signal is 1, the picture quality is enhanced at ¼ increments of bandwidth from ¼ to 1 depending on the receiving area. If the original signal is an HDTV of 1000-line vertical resolution, a reproduced TV signal is 250, 500, 750, and 1000 lines in the resolution at their respective receiving areas. The picture quality will thus be varied at steps depending on the level of a signal. FIG. 96 shows the signal propagation of a conventional digital HDTV signal transmission system, in which no signal reproduction will be possible when the C/N rate is less than V0. Also, signal interception will hardly be guaranteed at signal interference regions, shadow regions, and other signal attenuating regions, denoted by the symbol x, of the service area. FIG. 97 shows the signal propagation of an HDTV signal transmission system of the present invention. As shown, the picture quality will be a full 1000-line grade at the distance La where C/N=a, a 750-line grade at the distance Lb where C/N=b, a 500-line grade at the distance Lc where C/N=c, and a 250-line grade at the distance Ld where C/N=d. Within the distance La, there are shown unfavorable regions where the C/N rate drops sharply and no HDTV quality picture will be reproduced. As understood, a lower picture quality signal can however be intercepted and reproduced according to the multi-level signal transmission system of the present invention. For example, the picture quality will be a 750-line grade at the point B in a building shadow area, a 250-line grade at the point D in a running train, a 750-line grade at the point F in a ghost developing area, a 250-line grade at the point G in a running car, a 250-line grade at the point L in a neighbor signal interference area. As set forth above, the signal transmission system of the present invention allows a TV signal to be successfully received at a grade in the area where the conventional system is poorly qualified, thus increasing its service area. FIG. 98 shows an example of simultaneous broadcasting of four different TV programs, in which three quality programs C, B, A are transmitted on their respective channels $D_{1-2}$, $D_{2-1}$, $D_{2-2}$ while a program D identical to that of a local analogue TV station is propagated on the $D_{1-1}$ channel. Accordingly, while the program D is kept available at simulcast service, the other three programs can also be distributed on air for offering a multiple program broadcast service.

Embodiment 8

Hereinafter, an eighth embodiment of the present invention will be explained referring to the drawings. The eighth embodiment employs a multi-level signal transmission system of the present invention for transmission/reception in a cellular telephone system.

Figure 115:
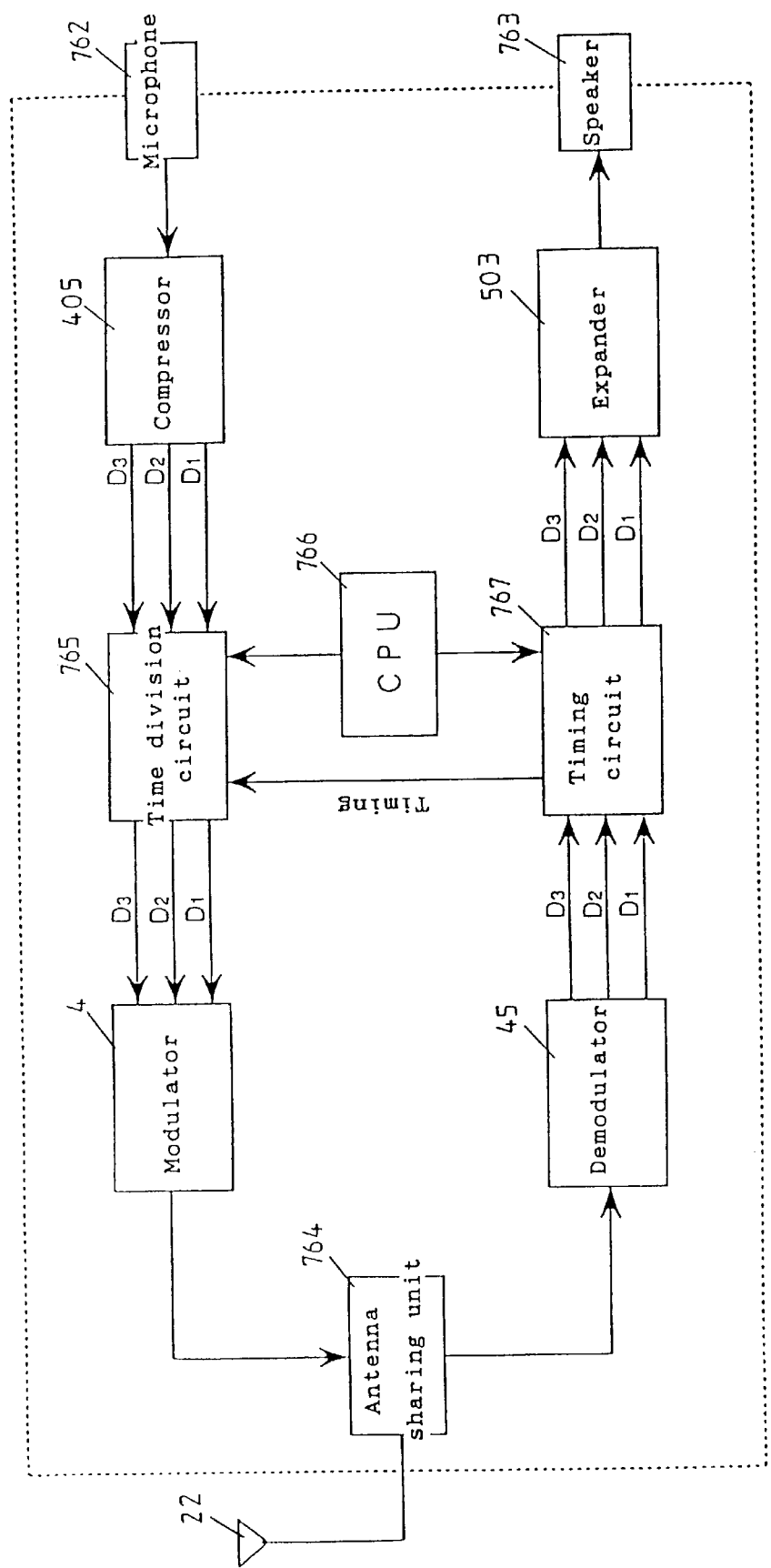
FIG. 115 is a block diagram showing a transmitter/receiver of a portable telephone according to the eighth embodiment.

FIG. 115 is a block diagram showing a transmitter/receiver of a portable telephone, in which a telephone conversation sound inputted across a microphone 762 is compressed and coded in a compressor 405 into multi-level, $D_1$, $D_2$, and $D_3$, data previously described. These $D_1$, $D_2$, and $D_3$ data are time divided in a time division circuit 765 into predetermined time slots and, then, modulated in a modulator 4 into a multi-level, e.g. SRQAM, signal previously described. Thereafter, an antenna sharing unit 764 and an antenna 22 transmit a carrier wave carrying a modulated signal, which will be intercepted by a base station later described and further transmitted to other base stations or a central telephone exchanger so as to communicate with other telephones.

On the contrary, the antenna 22 receives transmission radio waves from other base stations as communication signals from other telephones. A received signal is demodulated in a multiple-level, e.g. SRQAM, type demodulator 45 into $D_1$, $D_2$, and $D_3$ data. A timing circuit 767 detects timing signals on the basis of demodulated signals. These timing signals are fed into the time division circuit 765. Demodulated signals $D_1$, $D_2$, and $D_3$ are fed into an expander 503 and expanded into a sound signal, which is then transmitted to a speaker 763 and converted into sound.

Figure 116:
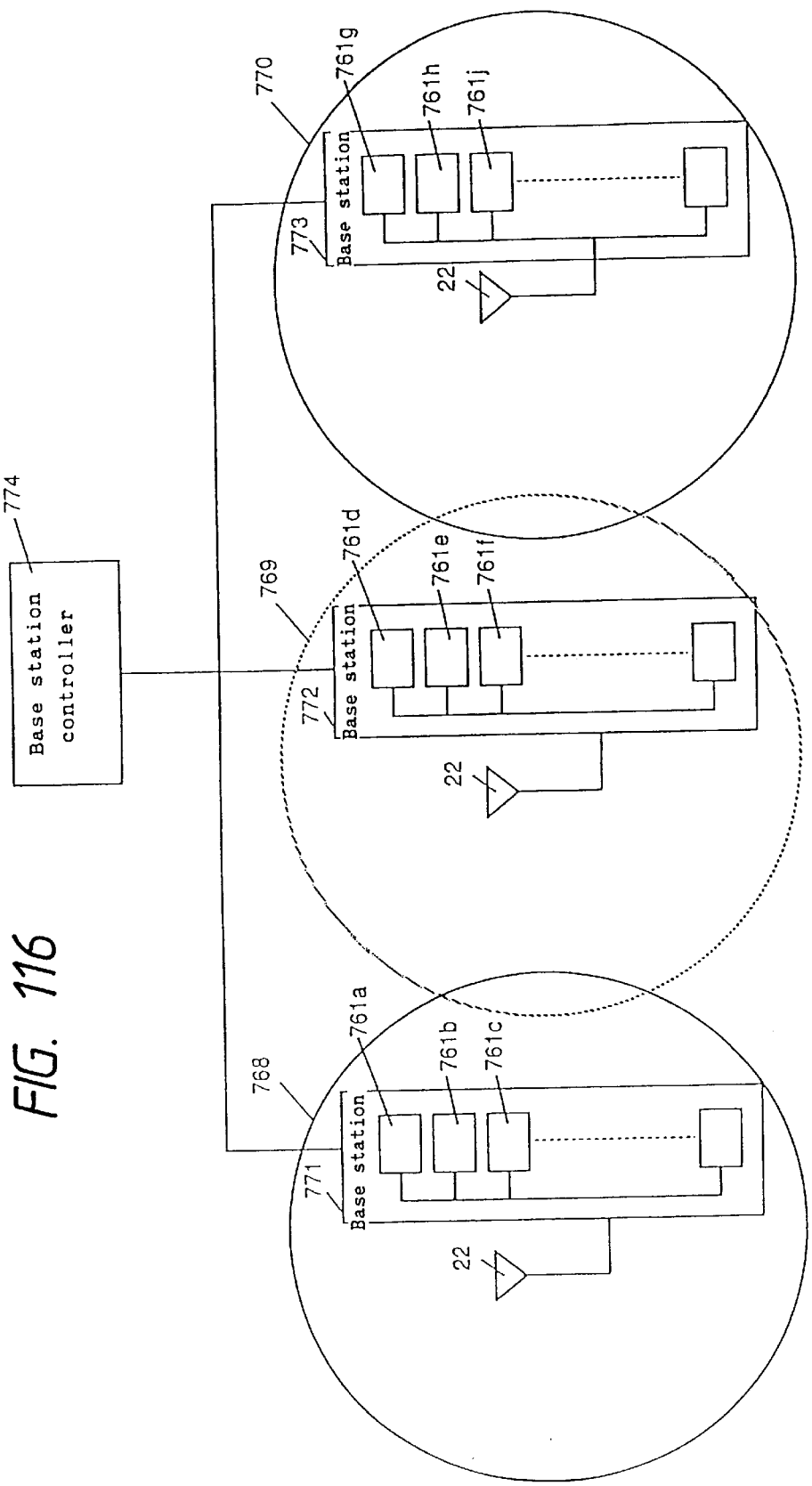
FIG. 116 is a block diagram showing base stations according to the eighth embodiment.

FIG. 116 shows a block diagram exemplarily showing an arrangement of base stations, in which three base stations 771, 772, and 773 locate at center of respective receiving cells 768, 769, and 770 of hexagon or circle. These base stations 771, 772, and 773 respectively has a plurality of transmitter/receiver units 761a~761j each similar to that of FIG. 115 so as to have data communication channels equivalent to the number of these transmitter/receiver units. A base station controller 774 is connected to all the base stations and always monitors a communication traffic amount of each base station. Based on the monitoring result, the base station controller 774 carries out an overall system control including allocation of channel frequencies to respective base stations or control of receiving cells of respective base stations.

Figure 117:
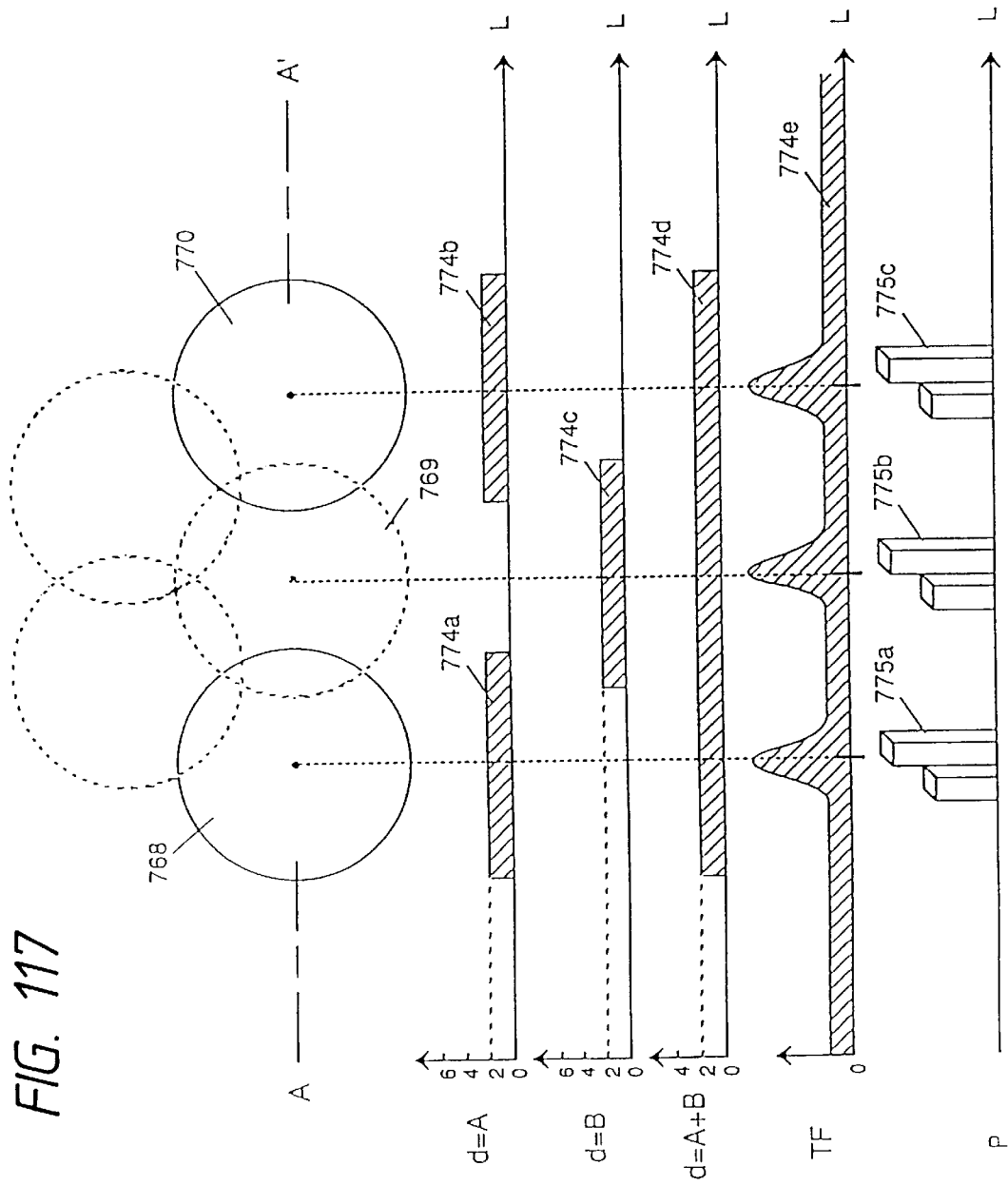
FIG. 117 is a view illustrating communication capacities and traffic distribution of a conventional system.

FIG. 117 is a view showing a traffic distribution of communication amount in a conventional, e.g. QPSK, system. A diagram d=A shows data 774a and 774b having frequency utilization efficiency 2 bit/Hz, and a diagram d=B shows data 774c having frequency utilization efficiency 2 bit/Hz. A summation of these data 774a, 774b, and 774c becomes a data 774d, which represents a transmission amount of Ach consisting of receiving cells 768 and 770. Frequency utilization efficiency of 2 bit/Hz is uniformly distributed. However, density of population in an actual urban area is locally high in several crowded areas 775a, 775b, and 775c which include buildings concentrated. A data 774e representing a communication traffic amount shows several peaks at locations just corresponding to these crowded areas 775a, 775b, and 775c, in contrast with other area having small communication amount. A capacity of a conventional cellular telephone was uniformly set to 2 bit/Hz frequency efficiency at entire region as shown by the data 774d irrespective of actual traffic amount TF shown by the data 774e. It is not effective to give the same frequency efficiency regardless of actual traffic amount. In order to compensate this ineffectiveness, the conventional systems have allocated many frequencies to the regions having a large traffic amount, increased channel number, or decreased the receiving cell of the same. However, an increase of channel number is restricted by the frequency spectrum. Furthermore, conventional multi-level, e.g. 16 QAM or 64 QAM, mode transmission systems increase transmission power. A reduction of receiving cell will induce an increase in number of base stations, which will increase installation cost.

It is ideal for the improvement of an overall system efficiency to increase the frequency efficiency of the region having a larger traffic amount and decrease the frequency efficiency of the region having a smaller traffic amount. A multi-level signal transmission system in accordance with the present invention realizes this ideal modification. This will be explained with reference to FIG. 118 showing a communication amount & traffic distribution in accordance with the eighth embodiment of the present invention.

Figure 118:
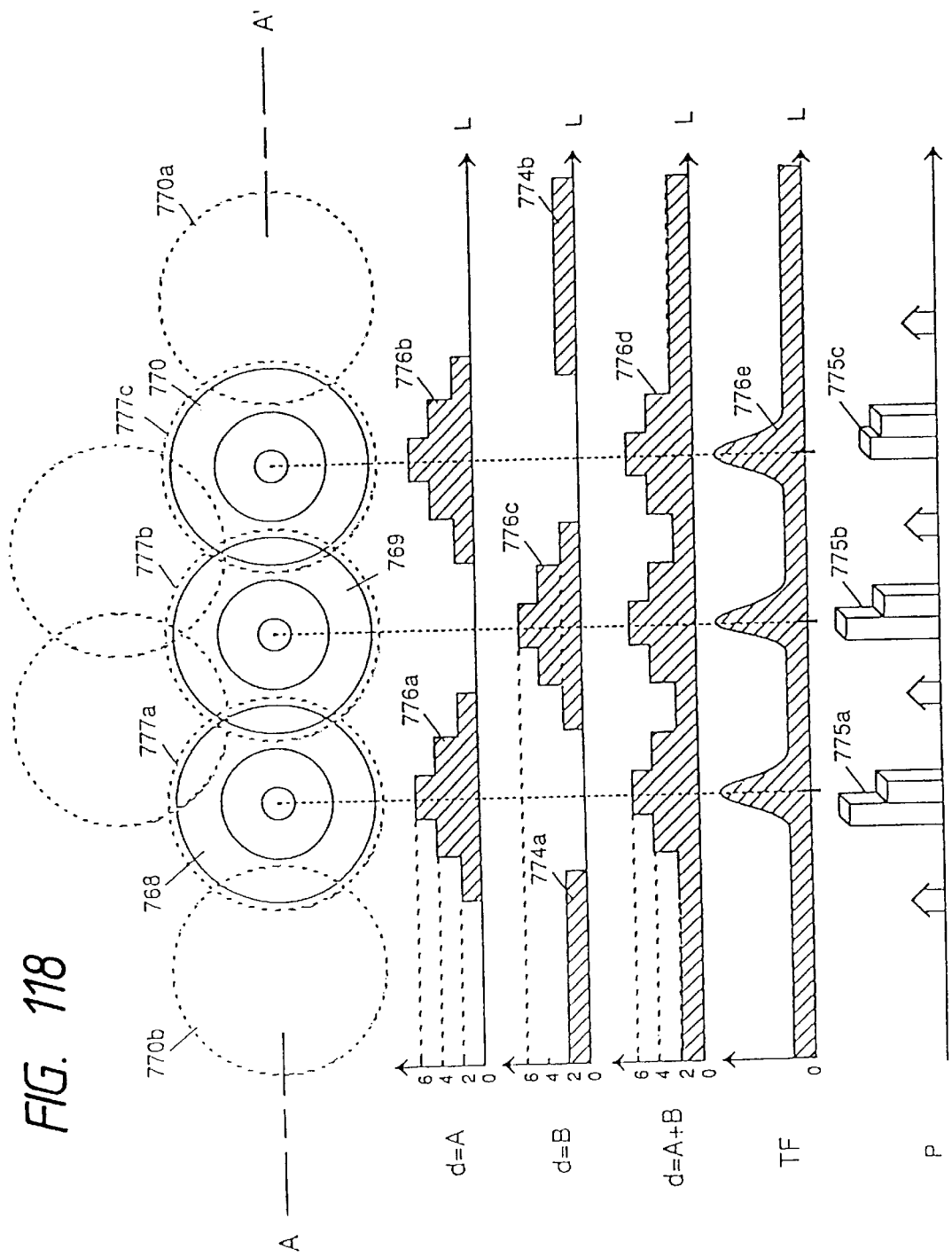

More specifically, FIG. 118 shows communication amounts of respective receiving cells 770b, 768, 769, 770, and 770a taken along a line A–A'. The receiving cells 768 and 770 utilize frequencies of a channel group $A_1$ while the receiving cells 770b, 769, and 770a utilize frequencies of a channel group B which does not overlap with the channel group A. The base station controller 774 shown in FIG. 116 increases or decreases channel number of these channels in accordance with the traffic amount of respective receiving cells. In FIG. 118, a diagram d=A represents a distribution of a communication amount of the A channel. A diagram d=B represents a distribution of a communication amount of the B channel. A diagram d=A+B represents a distribution of a communication amount of all the channels. A diagram TF represents a communication traffic amount, and a diagram P shows a distribution of buildings and population.

The receiving cells 768, 769, and 770 employ the multi-level, e.g. SRQAM, signal transmission system. Therefore, it is possible to obtain a frequency utilization efficiency of 6 bit/Hz, three times as large as 2 bit/Hz of QPSK, in the vicinity of the base stations as denoted by data 776a, 776b, and 776c. Meanwhile, the frequency utilization efficiency decreases at steps from 6 bit/Hz to 4 bit/Hz, and 4 bit/Hz to 2 bit/Hz, as it goes to suburban area. If the transmission power is insufficient, 2 bit/Hz areas become narrower than the receiving cells, denoted by dotted lines 777a, 777b, 777c, of QPSK. However, an equivalent receiving cell will be easily obtained by slightly increasing the transmission power of the base stations.

Figure 121:
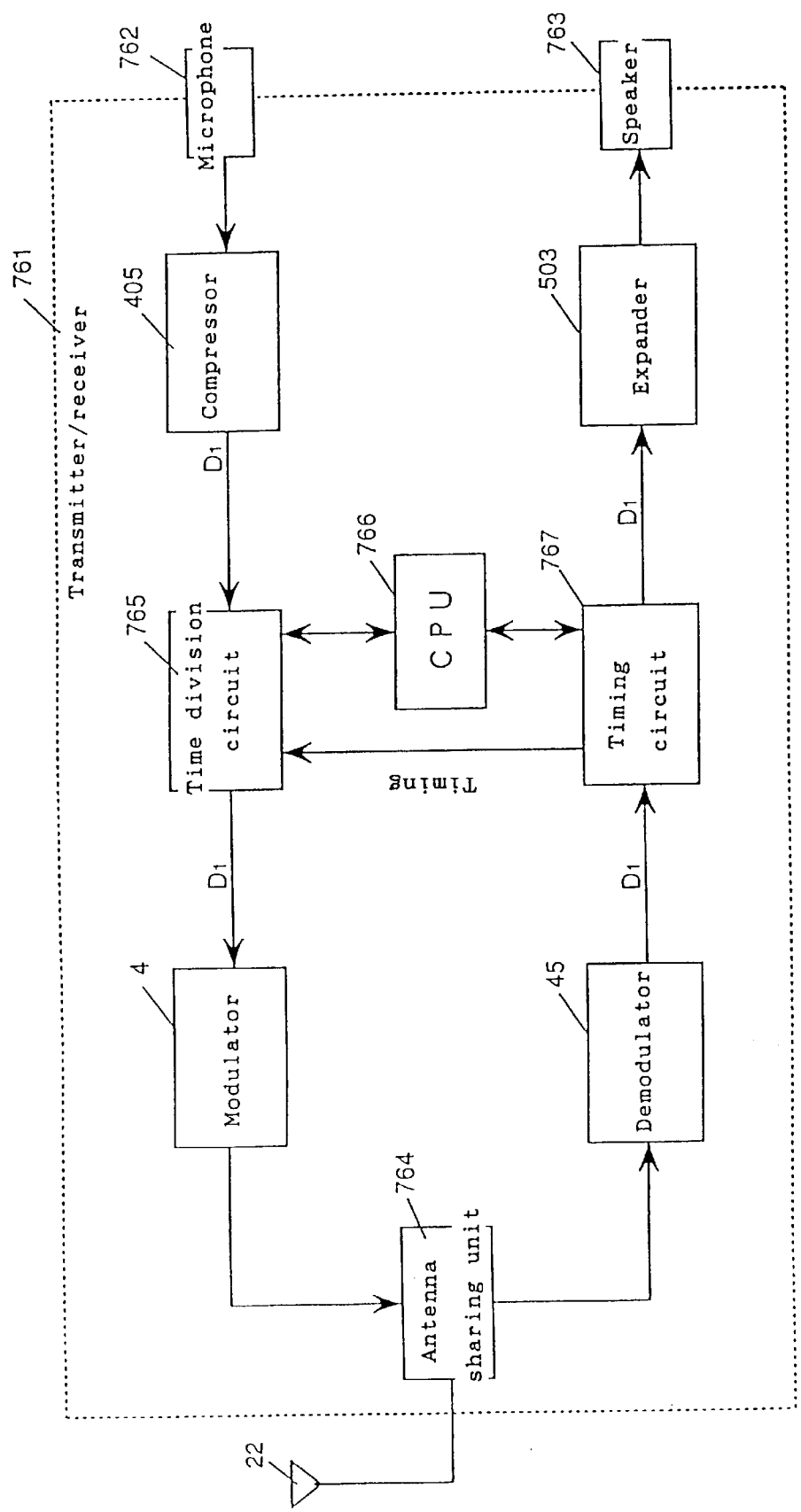
Figure 122:
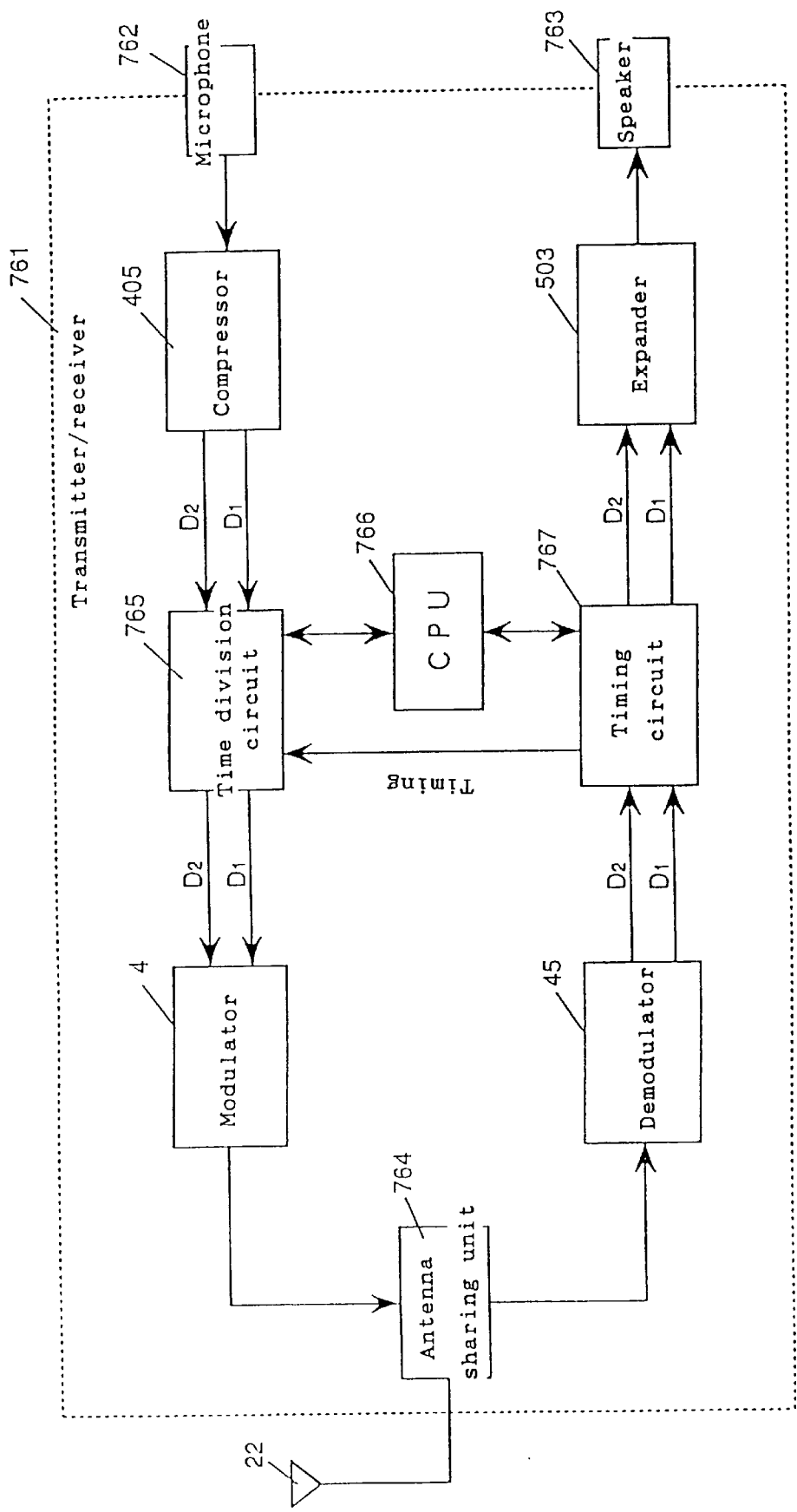

Transmitting/receiving operation of a mobile station capable of responding to a 64 SRQAM signal is carried out by use of modified QPSK, which is obtained by set a shift amount of SRQAM to S=1, at the place far from the base station, by use of 16 SRQAM at the place not so far from the same, and 64 SRQAM at the nearest place. Accordingly, the maximum transmission power does not increase as compared with QPSK. Furthermore, 4 SRQAM type transmitter/receiver, whose circuit configuration is simplified as shown in a block diagram of FIG. 121, will be able to communicate with other telephones while maintaining compatibility. That will be the same in 16 SRQAM type transmitter/receiver shown in a block diagram of FIG. 122. As a result, three different type telephones having different modulation systems will be provided. Small in size and light in weight is important for portable telephones. In this regard, the 4 SRQAM system having a simple circuit configuration will be suitable for the users who want a small and light telephone although its frequency utilization efficiency is low and therefore cost of call may increase. In this manner, the present invention system can suit for a wide variety of usage.

As is explained above, the transmission system having a distribution like d=A+B of FIG. 118, whose capacity is locally altered, is accomplished. Therefore, an overall frequency utilization efficiency will be much effectively improved if layout of base stations is determined to fit for the actual traffic amount denoted by TF. Especially, effect of the present invention will be large in a micro cell system, whose receiving cells are smaller and therefore numerous sub base stations are required. Because a large number of sub base stations can be easily installed at the place having a large traffic amount.

Figure 119:
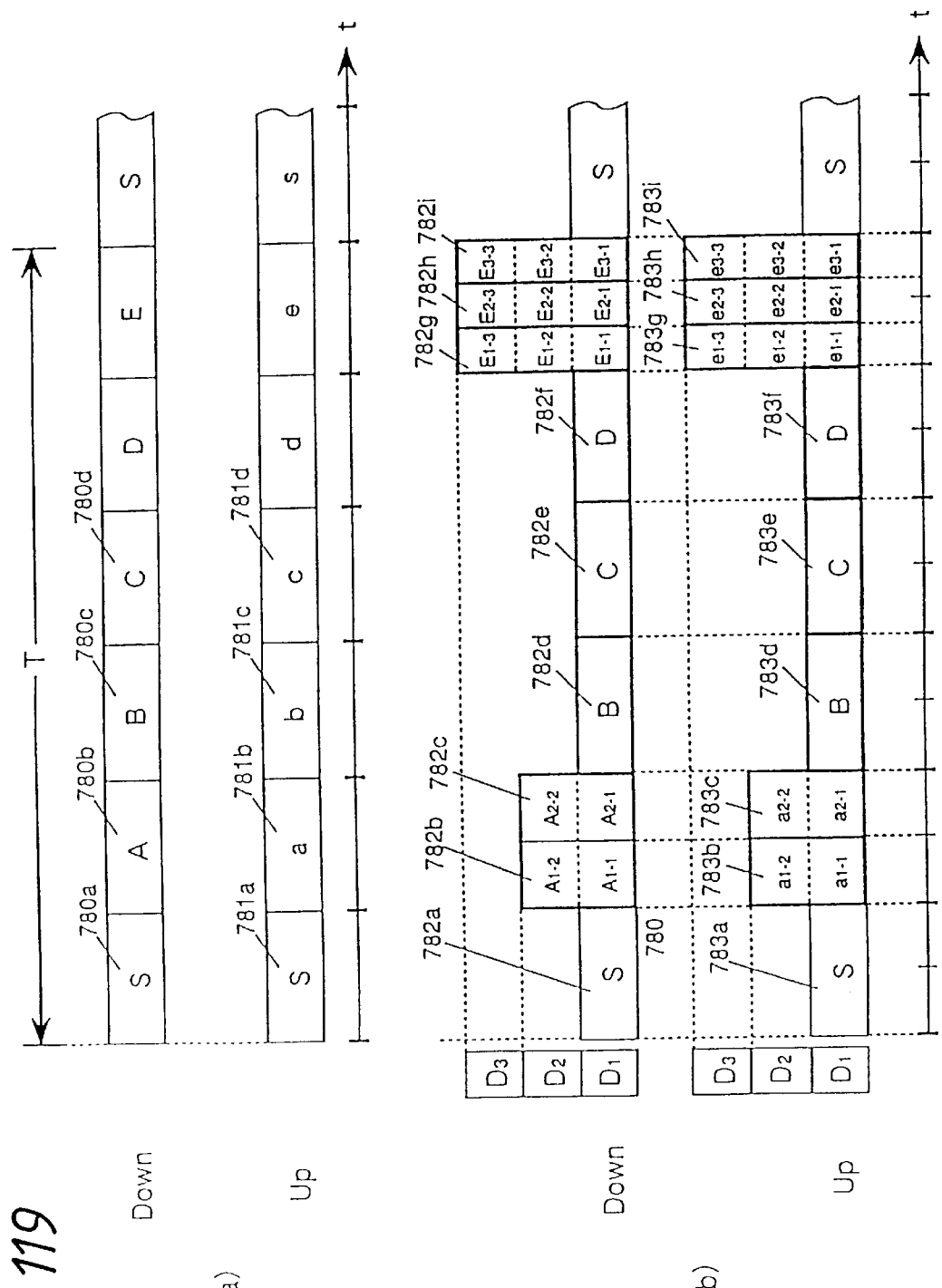

Next, data assignment of each time slot will be explained referring to Fig, 119, wherein FIG. 119(a) shows a conventional time slot and FIG. 119(b) shows a time slot according to the eighth embodiment. The conventional system performs a down, i.e. from a base station to a mobile station, transmission as shown in FIG. 119(a), in which a sync signal S is transmitted by a time slot 780a and transmission signals to respective portable phones of A, B, C channels by time slots 780b, 780c, 780d respectively at a frequency A. On the other hand, an up, i.e. from the mobile station to the base station, transmission is performed in such a manner that a sync signal S, and transmission signals of a, b, c channels are transmitted by time slots 781a, 781b, 781c, 781d at a frequency B.

The present invention, which is characterized by a multi-level, e.g. 64 SRQAM, signal transmission system, allows to have three-level data consisting of $D_1$, $D_2$, $D_3$ of 2 bit/Hz as shown in FIG. 119(b). As both of $A_1$ and $A_2$ data are transmitted by 16 SRQAM, their time slots have two times data rate as shown by slots 782b, 782c and 783b, 783c. It means the same quality sound can be transmitted by a half time. Accordingly, a time width of respective time slots 782b, 782c becomes a half. In this manner, two times transmission capacity can be acquired at the two-level region 776c shown in FIG. 118, i.e. in the vicinity of the base station.

In the same way, time slots 782g, 783g carry out the transmission/reception of E1 data by use of a 64 SRQAM signal. As the transmission capacity is three times, one time slot can be used for three channels of $E_1$, $E_2$, $E_3$. This would be used for a region further close to the base station. Thus, up to three times communication capacity can be obtained at the same frequency band. An actual transmission efficiency, however, would be reduced to 90%. It is desirable for enhancing the effect of the present invention to coincide the transmission amount distribution according to the present invention with the regional distribution of the actual traffic amount as perfect as possible.

In fact, an actual urban area consists of a crowded building district and a greenbelt zone surrounding this building area. Even an actual suburb area consists of a residential district and fields or a forest surrounding this residential district. These urban and suburb areas resemble the distribution of the TF diagram. Thus, the application of the present invention will be effective.

Figure 120:
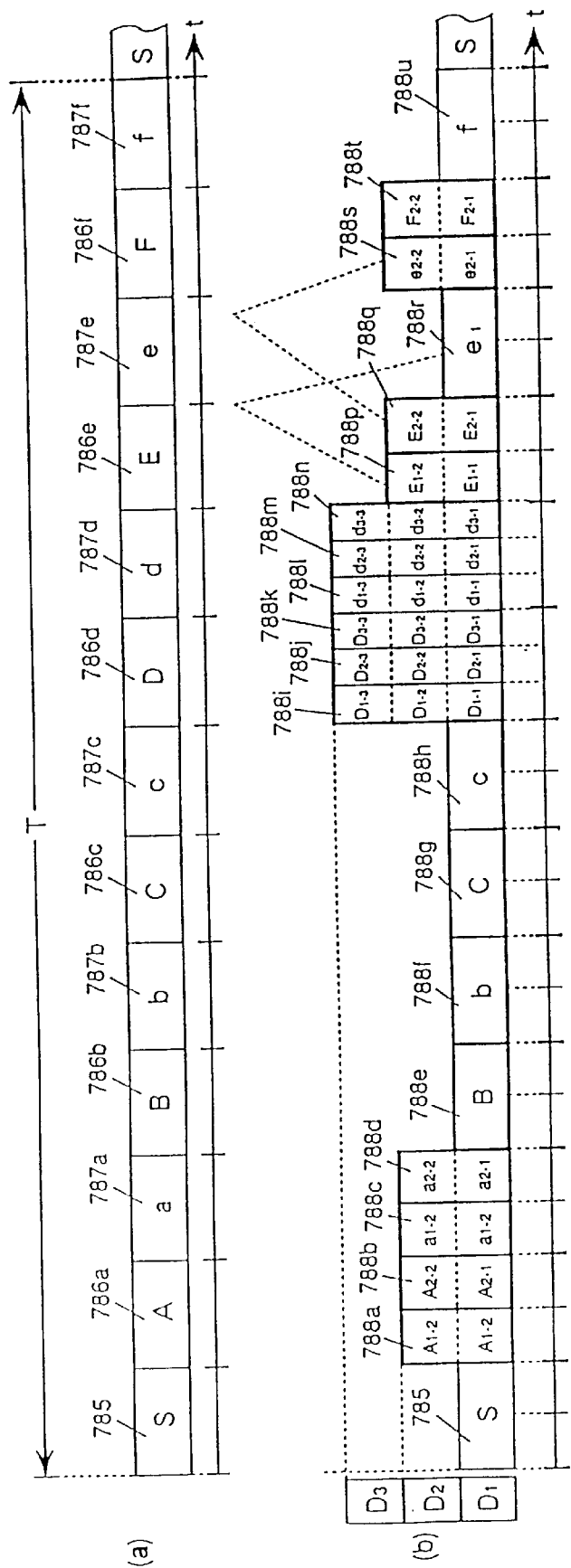

FIG. 120 is a diagram showing time slots by the TDMA method, wherein FIG. 120(a) shows a conventional method and FIG. 120(b) shows the present invention. The conventional method uses time slots 786a, 786b for transmission to portable phones of A, B channels at the same frequency and time slots 787a, 787b for transmission from the same, as shown in FIG. 120(a).

On the contrary, 16 SRQAM mode of the present invention uses a time slot 788a for reception of $A_1$ channel and a time slot 788c for transmission to $A_1$ channel as shown in FIG. 120(b). A width of the time slot becomes approximately ½. In case of 64 SRQAM mode, a time slot 788i is used for reception of $D_1$ channel and a time slot 788l is used for transmission to $D_1$ channel. A width of the time slot becomes approximately ⅓.

In order to save electric power, a transmission of $E_1$ channel is executed by use of a normal 4 SRQAM time slot 788r while reception of $EE_1$ channel is executed by use of a 16 SRQAM time slot 788p being a ½ time slot. Transmission power is surely suppressed, although communication cost may increase due to a long occupation time. This will be effective for a small and light portable telephone equipped with a small battery or when the battery is almost worn out.

As is described in the foregoing description, the present invention makes it possible to determine the distribution of transmission capacity so as to coincide with an actual traffic distribution, thereby increasing substantial transmission capacity. Furthermore, the present invention allows base stations or mobile stations to freely select one among two or three transmission capacities. If the frequency utilization efficiency is selected lower, power consumption will be decreased. If the frequency utilization efficiency is selected higher, communication cost will be saved. Moreover, adoption of a 4 SRQAM mode having smaller capacity will simplify the circuitry and reduce the size and cost of the telephone. As explained in the previous embodiments, one characteristics of the present invention is that compatibility is maintained among all of associated stations. In this manner, the present invention not only increases transmission capacity but allows to provide customers a wide variety of series from a super mini telephone to a high performance telephone.

Embodiment 9

Figure 123:
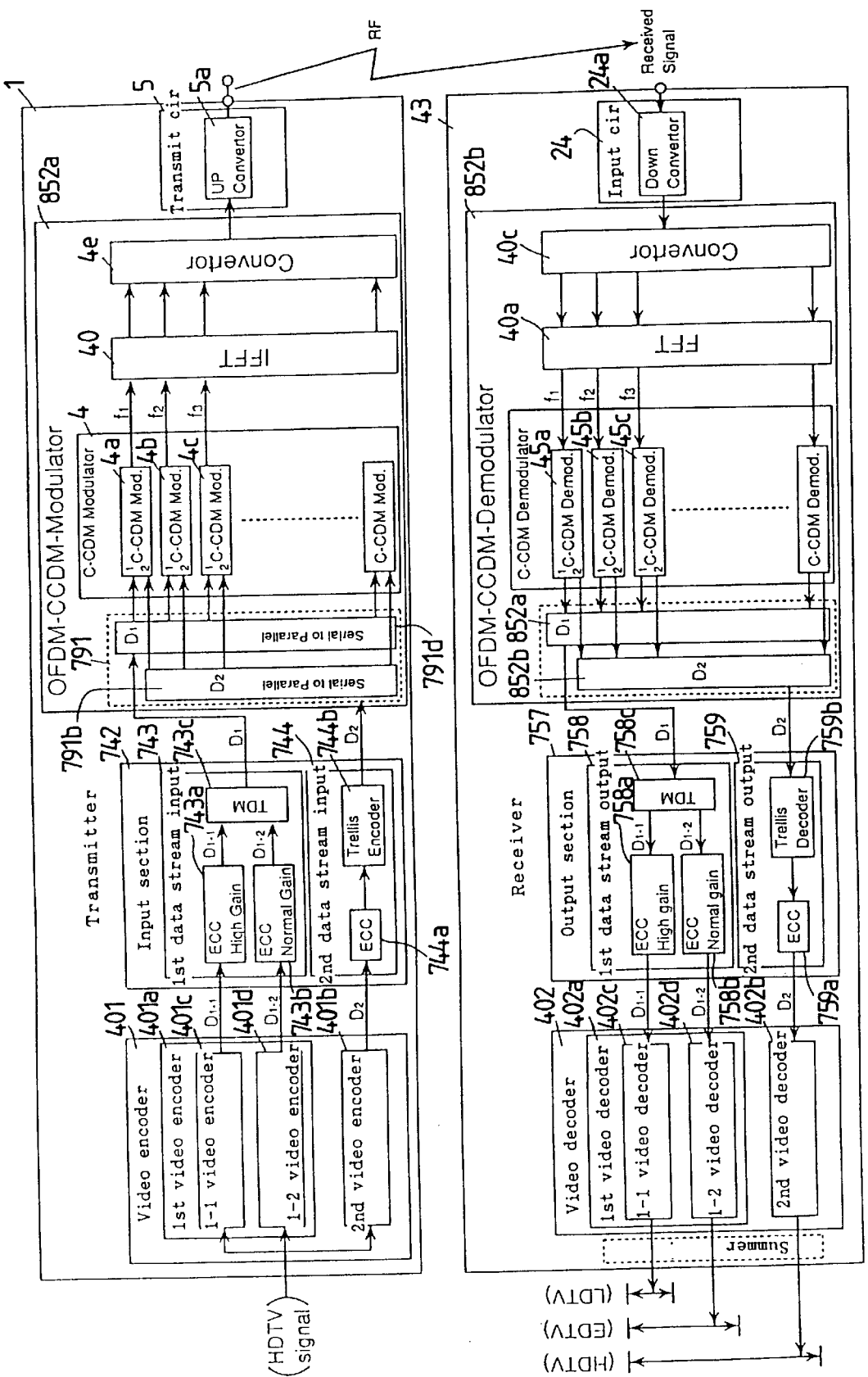
Figure 124:
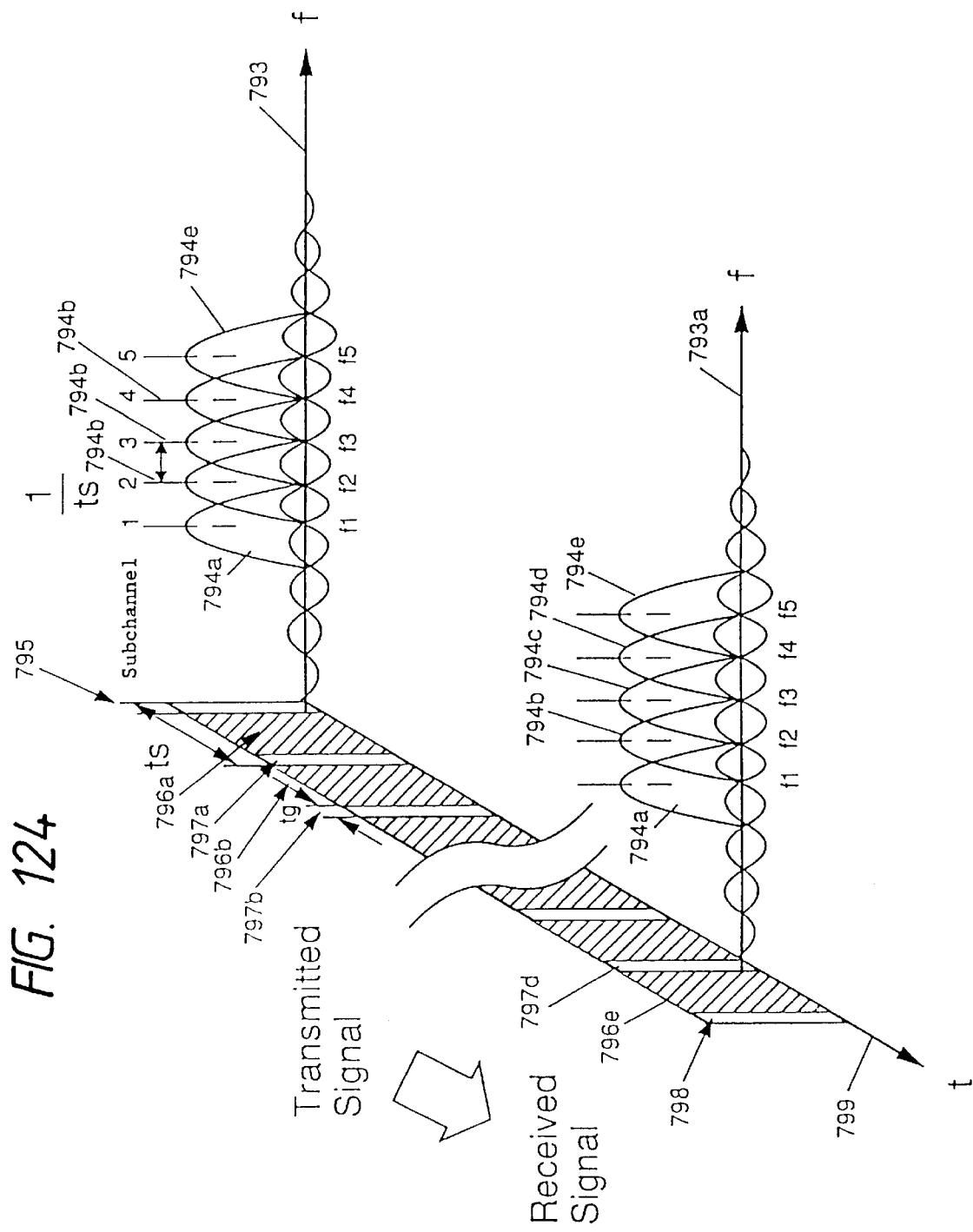

Hereinafter, a ninth embodiment of the present invention will be described referring to the drawings. The ninth embodiment employs this invention in an OFDM transmission system. FIG. 123 is a block diagram of an OFDM transmitter/receiver, and FIG. 124 is a diagram showing a principle of an OFDM action. An OFDM is one of FDM and has a better efficiency in frequency utilization as compared with a general FDM, because an OFDM sets adjacent two carriers to be quadrature with each other. Furthermore, an OFDM can bear multipath obstruction such as ghost and, therefore, may be applied in the future to the digital music broadcasting or digital TV broadcasting.

As shown in the principle diagram of FIG. 124, an OFDM converts an input signal by a serial to parallel converter 791 into a data being disposed on a frequency axis 793 at intervals of 1/ts, so as to produce subchannels 794a~794e. This signal is inversely FFT converted by a modulator 4 having an inverse FFT 40 into a signal on a time axis 799 to produce a transmission signal 795. This inverse FFT signal is transmitted during an effective symbol period 796 of the time period ts. A guard interval 797 having an amount tg is provided between respective symbol periods.

A transmitting/receiving action of an HDTV signal in accordance with this ninth embodiment will be explained referring to the block diagram of FIG. 123, which shows a hybrid OFDM-CCDM system. An inputted HDTV signal is separated by a video encoder 401 into three-level, a low frequency band $D_{1-1}$, a medium-low frequency band $D_{1-2}$, and a high-medium-low frequency band $D_2$, video signals, and fed into an input section 742.

In a first data stream input 743, a $D_{1-1}$ signal is ECC encoded with high code gain and a $D_{1-2}$ signal is ECC encoded with normal code gain. A TDM 743 performs time division multiplexing of $D_{1-1}$ and $D_{1-2}$ signals to produce a $D_1$ signal, which is then fed to a $D_1$ serial to parallel converter 791d in a modulator 852a. The $D_1$ signal consists of n pieces of parallel data, which are inputted into first inputs of n pieces of C-CDM modulator 4a, 4b, - - - respectively.

On the other hand, the high frequency band signal $D_2$ is fed into a second data stream input 744 of the input section 742, in which the $D_2$ signal is ECC (Error Correction Code) encoded in an ECC 744a and then Trellis encoded in a Trellis encoder 744b. Thereafter, the $D_2$ signal is supplied to a $D_2$ serial to parallel converter 791b of the modulator 852a and converted into n pieces of parallel data, which are inputted into second inputs of the n pieces of C-CDM modulator 4a, 4b, - - - respectively.

The C-CDM modulators 4a, 4b, 4c - - - respectively produces 16 SRQAM signal on the basis of the $D_1$ data of the first data stream input and the $D_2$ data of the second data stream input. These n pieces of C-CDM modulator respectively has a carrier different from each other. As shown in FIG. 124, carriers 794a, 794b, 794c, - - - are arrayed on the frequency axis 793 so that adjacent two carriers are 90°-out-of-phase with each other. Thus C-CDM modulated n pieces of modulated signal are fed into the inverse FFT circuit 40 and mapped from the frequency axis dimension 793 to the time axis dimension 790. Thus, time signals 796a, 796b - - - , having an effective symbol length ts, are produced. There is provided a guard interval zone 797a of Tg seconds between the effective symbol time zones 796a and 796b, in order to reduce multipath obstruction. FIG. 129 is a graph showing a relationship between time axis and signal level. The guard time Tg of the guard interval band 797a is determined by taking account of multipath affection and usage of signal. By setting the guard time Tg longer than the multipath affection time, e.g. TV ghost, modulated signals from the inverse FFT circuit 40 are converted by a parallel to serial converter 4e into one signal and, then, transmitted from a transmitting circuit 5 as an RF signal.

Figure 125:
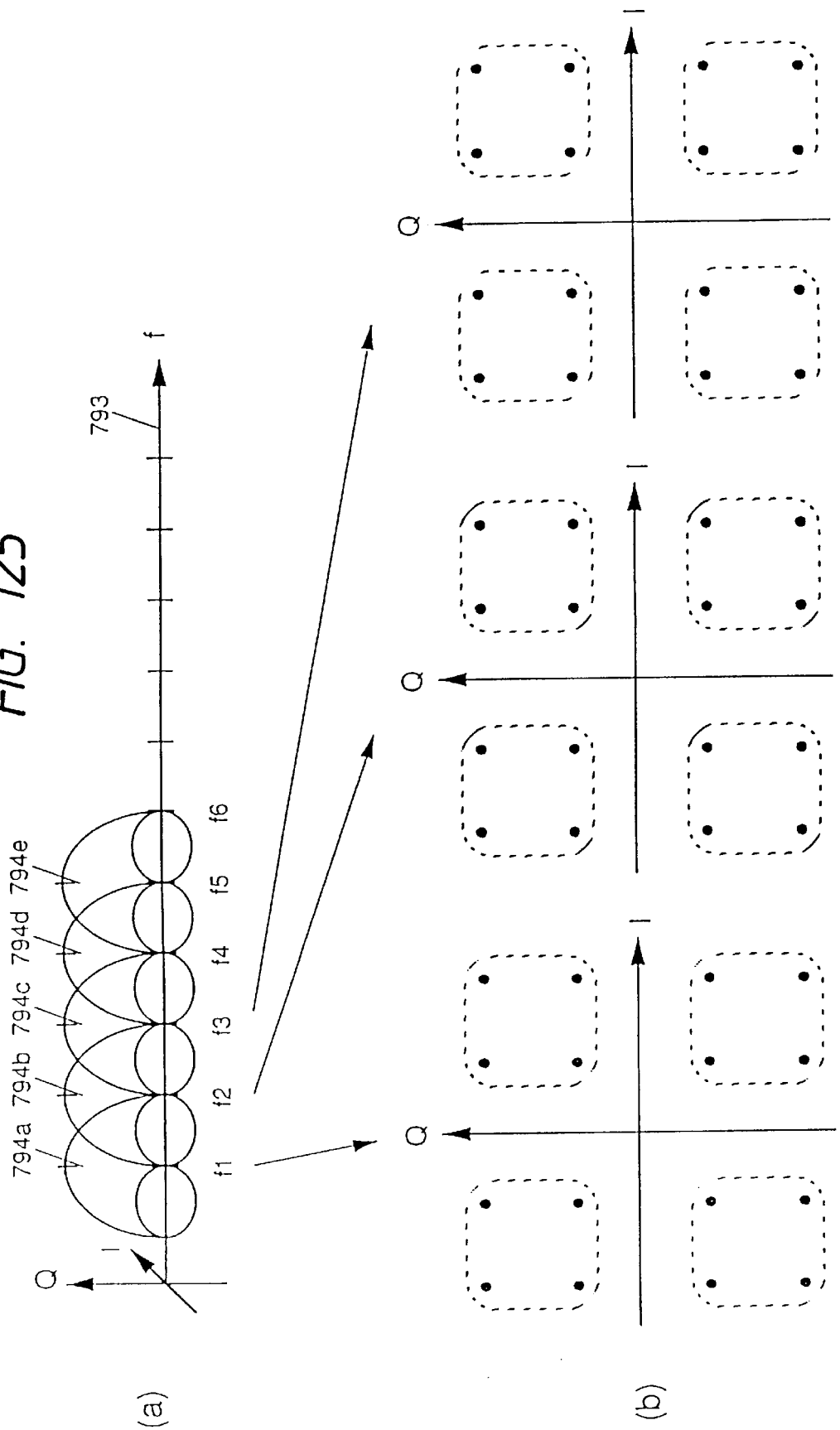

Next, an action of a receiver 43 will be described. A received signal, shown as time-base symbol signal 796e of FIG. 124, is fed into an input circuit 24 of FIG. 123. Then, the received signal is converted into a digital signal in a demodulator 852b and further changed into Fourier coefficients in an FFT 40a. Thus, the signal is mapped from the time axis 799 to the frequency axis 793a as shown in FIG. 124. That is, the time-base symbol signal is converted into frequency-base carriers 794a, 794b, - - - . As these carriers are in quadrature relationship with each other, it is possible to separate respective modulated signals. FIG. 125(b) shows thus demodulated 16 SRQAM signal, which is then fed to respective C-CDM demodulators 45a, 45b,—of a C-CDM demodulator 45, in which demodulated 16 SRQAM signal is demodulated into multi-level sub signals $D_1$, $D_2$. These sub signals $D_1$ and $D_2$ are further demodulated by a $D_1$ parallel to serial converter 852a and a $D_2$ parallel to serial converter 852b into the original $D_1$ and $D_2$ signals.

Since the signal transmission system is of C-CDM multi-level shown in 125(b), both $D_1$ and $D_2$ signals will be demodulated under better receiving condition but only $D_1$ signal will be demodulated under worse, e.g. low C/N rate, receiving condition. Demodulated $D_1$ signal is demodulated in an output section 757. As the $D_{1-1}$ signal has higher ECC code gain as compared with the $D_{1-2}$ signal, an error signal of the $D_{1-1}$ signal is reproduced even under worse receiving condition.

The $D_{1-1}$ signal is converted by a 1-1 video decoder 402c into a low frequency band signal and outputted as an LDTV, and the $D_{1-2}$ signal is converted by a 1-2 video decoder 402d into a medium frequency band signal and outputted as EDTV.

The $D_2$ signal is Trellis decoded by a Trellis decoder 759b and converted by a second video decoder 402b into a high frequency band signal and outputted as an HDTV signal. Namely, an LDTV signal is outputted in case of the low frequency band signal only. An EDTV signal of wide NTSC grade is outputted if the medium frequency band signal is added to the low frequency band signal, and an HDTV signal is produced by adding low, medium, and high frequency band signals. As well as the previous embodiment, a TV signal having a picture quality depending on a receiving C/N rate can be received. Thus, the ninth embodiment realizes a novel multi-level signal transmission system by combining an OFDM and a C-CDM, which was not obtained by the OFDM alone.

An OFDM is certainly strong against multipath such as TV ghost because the guard time Tg can absorb an interference signal of multipath. Accordingly, the OFDM is applicable to the digital TV broadcasting for automotive vehicle TV receivers. Meanwhile, no OFDM signal is received when the C/N rate is less than a predetermined value because its signal transmission pattern is not of a multi-level type.

However the present invention can solve this disadvantage by combining the OFDM with the C-CDM, thus realizing a gradational degradation depending on the C/N rate in a video signal reception without being disturbed by multipath.

When a TV signal is received in a compartment of a vehicle, not only the reception is disturbed by multipath but the C/N rate is deteriorated. Therefore, the broadcast service area of a TV broadcast station will not be expanded as expected if the countermeasure is only for multipath.

On the other hand, a reception of TV signal of at least LDTV grade will be ensured by the combination with the multi-level transmission C-CDM even if the C/N rate is fairly deteriorated. As a picture plane size of an automotive vehicle TV is normally less than 100 inches, a TV signal of an LDTV grade will provide a satisfactory picture quality. Thus, the LDTV grade service area of automotive vehicle TV will largely expanded. If an OFDM is used in an entire frequency band of HDTV signal, the present semiconductor technologies cannot prevent circuit scale from increasing so far.

Now, an OFDM method of transmitting only $D_{1-1}$ of low frequency band TV signal will be explained below. As shown in a block diagram in FIG. 138, a medium frequency band component $D_{1-2}$ and a high frequency band component $D_2$ of an HDTV signal are multiplexed in a C-CDM modulator 4a, and then transmitted at a frequency band A through an FDM 40d.

On the other hand, a signal received by a receiver 43 is first of all frequency separated by an FDM 40e and, then, demodulated by a C-CDM demodulator 4b of the present invention. Thereafter, thus C-CDM demodulated signal is reproduced into medium and high frequency components of HDTV in the same way as in FIG. 123. An operation of a video decoder 402 is identical to that of embodiments 1, 2, and 3 and will no more be explained.

Meanwhile, the $D_{1-1}$ signal, a low frequency band signal of MPEG 1 grade of HDTV, is converted by a serial to parallel converter 791 into a parallel signal and fed to an OFDM modulator 852c, which executes a QPSK or 16 QAM modulation. Subsequently, the $D_{1-1}$ signal is converted by an inverse FFT 40 into a time-base signal and transmitted at a frequency band B through the FDM 40d.

On the other hand, a signal received by the receiver 43 is frequency separated in the FDM 40e and, then, converted into a number of frequency-base signals in an FFT 40a of the OFDM modulator 852d. Thereafter, frequency-base signals are demodulated in respective demodulators 4a, 4b, - - - and are fed into a parallel to serial converter 882a, wherein a $D_{1-1}$ signal is demodulated. Thus, a $D_{1-1}$ signal of LDTV grade is outputted from the receiver 43.

In this manner, only an LDTV signal is OFDM modulated in the multi-level signal transmission. The system of FIG. 138 makes it possible to provide a complicated OFDM circuit only for an LDTV signal. A bit rate of LDTV signal is ¹⁄₂₀ of that of an HDTV. Therefore, the circuit scale of the OFDM will be reduced to ¹⁄₂₀, which results in an outstanding reduction of overall circuit scale.

An OFDM signal transmission system is strong against multipath and will soon be applied to a mobile station, such as a portable TV, an automotive vehicle TV, or a digital music broadcast receiver, which is exposed under strong and variable multipath obstruction. For such usages a small picture size of less than 10 inches, 4 to 8 inches, is the mainstream. It will be thus guessed that the OFDM modulation of a high resolution TV signal such as HDTV or EDTV will bring less effect. In other words, the reception of a TV signal of LDTV grade would be sufficient for an automotive vehicle TV.

On the contrary, multipath is constant at a fixed station such as a home TV. Therefore, a countermeasure against multipath is relatively easy. Less effect will be brought to such a fixed station by OFDM unless it is in a ghost area. Using OFDM for medium and high frequency band components of HDTV is not advantageous in view of present circuit scale of OFDM which is still large.

Accordingly, the method of the present invention, in which OFDM is used only for a low frequency band TV signal as shown in FIG. 138, can widely reduce the circuit scale of the OFDM to less than ¹⁄₁₀ without losing inherent OFDM effect capable of largely reducing multiple obstruction of LDTV when received at a mobile station such as an automotive vehicle.

Although the OFDM modulation of FIG. 138 is performed only for $D_{1-1}$ signal, it is also possible to modulate both $D_{1-1}$ and $D_{1-1}$ by OFDM. In such a case, a C-CDM two-level signal transmission is used for transmission of $D_{1-1}$ and $D_{1-2}$. Thus, a multi-level broadcasting being strong against multipath will be realized for a vehicle such as an automotive vehicle. Even in a vehicle, the gradational graduation will be realized in such a manner that LDTV and SDTV signals are received with picture qualities depending on receiving signal level or antenna sensitivity.

The multi-level signal transmission according to the present invention is feasible in this manner and produces various effects as previously described. Furthermore, if the multi-level signal transmission of the present invention is incorporated with an OFDM, it will become possible to provide a system strong against multipath and to alter data transmission grade in accordance with receivable signal level change.

The multi-level signal transmission method of the present invention is intended to increase the utilization of frequencies but may be suited for not all the transmission systems since causing some type receivers to be declined in the energy utilization. It is a good idea for use with a satellite communications system for selected subscribers to employ most advanced transmitters and receivers designed for best utilization of applicable frequencies and energy. Such a specific purpose signal transmission system will not be bound by the present invention.

The present invention will be advantageous for use with a satellite or terrestrial broadcast service which is essential to run in the same standards for as long as 50 years. During the service period, the broadcast standards must not be altered but improvements will be provided time to time corresponding to up-to-date technological achievements. Particularly, the energy for signal transmission will surely be increased on any satellite. Each TV station should provide a compatible service for guaranteeing TV program signal reception to any type receivers ranging from today's common ones to future advanced ones. The signal transmission system of the present invention can provide a compatible broadcast service of both the existing NTSC and HDTV systems and also, ensure a future extension to match mass data transmission.

The present invention concerns much on the frequency utilization than the energy utilization. The signal receiving sensitivity of each receiver is arranged different depending on a signal state level to be received so that the transmitting power of a transmitter needs not be increased largely. Hence, existing satellites which offer a small energy for reception and transmission of a signal can best be used with the system of the present invention. The system is also arranged for performing the same standards corresponding to an increase in the transmission energy in the future and offering the compatibility between old and new type receivers. In addition, the present invention will be more advantageous for use with the satellite broadcast standards.

The multi-level signal transmission method of the present invention is more preferably employed for terrestrial TV broadcast service in which the energy utilization is not crucial, as compared with satellite broadcast service. The results are such that the signal attenuating regions in a service area which are attributed to a conventional digital HDTV broadcast system are considerably reduced in extension and also, the compatibility of an HDTV receiver or display with the existing NTSC system is obtained. Furthermore, the service area is substantially increased so that program suppliers and sponsors can appreciate more viewers. Although the embodiments of the present invention refer to 16 and 32 QAM procedures, other modulation techniques including 64, 128, and 256 QAM will be employed with equal success. Also, multiple PSK, ASK, and FSK techniques will be applicable as described with the embodiments.

A combination of the TDM with the SRQAM of the present invention has been described in the above. However, the SRQAM of the present invention can be combined also with any of the FDM, CDMA and frequency dispersal communications systems.

What is claimed is:

1. A recording system comprising:
    a signal input means for inputting an input signal and for dividing said input signal into a first data stream and a second data stream, said first data stream including n values;
    a modulating means responsive to said first and second data streams for producing m signal points, where m is an integer not less than 4, in a signal space diagram through modulation of a carrier wave, and for dividing the m signal points into n signal point groups, assigning said n values of the first data stream to said n signal point groups respectively, and assigning data of the second data stream to signal points of each of said n signal point groups; and
    a recording means responsive to an output of said modulating means for recording a multiplexed modulation signal on at least one single track of a plurality of tracks of a recording medium by using a recording head so that both said first data stream and said second data stream are recorded in a same region, said multiplexed modulation signal comprising at least part or all of said first data stream and at least part or all of said second data stream.

2. A playback system having a signal reproducing means for reproducing a multiplexed modulation signal from at least a single recording track of a recording medium by using a playback head, said multiplexed modulation signal comprising a first data stream and a second data stream in a same time region, said playback system comprising:
    a demodulating means for demodulating said multiplexed modulation signal, said multiplexed modulation signal representing P signal points in a signal space diagram, said demodulating means dividing the P signal points into n signal point groups, where P and n represent integers, demodulating said first data stream of which n values are assigned to the n signal point groups, and demodulating a second data stream of which P/n values are assigned to P/n signal points of each of said n signal point groups for reconstruction of data of the first and second data streams; and
    output means responsive to an output of said demodulating means for outputting a demodulated signal, said output means outputting only the first data stream when an error rate of said second data stream is higher than a predetermined value.

3. A recording/playback system comprising:
    a signal input circuit for inputting an input signal and for dividing said input signal into a first data stream and a second data stream, said first data stream including n values;
    a modulator circuit responsive to said first and second data streams for producing m ($m \geq 4$) signal points in a signal space diagram through modulation of a carrier wave, and for dividing the m signal points into n signal point groups, assigning said n values of the first data stream to said n signal point groups respectively, and assigning data of the second data stream to said signal points of each of said n signal point groups;
    a recording circuit responsive to an output of said modulator circuit for recording a multiplexed modulation signal on a recording track of a recording medium by using a recording head so that both said first data stream and said second data stream are recorded in a same region, said multiplexed modulation signal comprising at least part of said first data stream and at least part of said second data stream; and
    a playback unit having a signal reproducing circuit for reproducing said multiplexed modulation signal comprising said first and second data streams from said recording medium by using a playback head, including:
        a demodulating circuit for demodulating said multiplexed modulation signal representing P signal points in a signal space diagram, and for dividing the P signal points into n playback signal point groups, where P and n represent integers, demodulating said first data stream for n values which are assigned to said n playback signal point groups, and demodulating said second data stream, of which P/n values are assigned to P/n signal points of each of said n playback signal point groups, for reconstruction of data of the first and second data streams, and an output circuit responsive to an output of said demodulating circuit for outputting a demodulated signal.

4. A recording system comprising:

a signal input means for inputting a video signal and for dividing said video signal into a high frequency band digital video signal and a low frequency band digital video signal;

a modulating means responsive to said high and low frequency band digital video signals for producing m signal points, where m is an integer not less than 4, in a signal space diagram through modulation of a carrier wave, and for dividing the m signal points into n signal point groups, assigning n values of the low frequency band digital video signal to said n signal point groups respectively, and assigning data of the high frequency band digital video signal to signal points of each of said n signal point groups; and a recording means responsive to an output of said modulating means for recording a modulated signal on a recording medium by using a recording head so that both said high frequency band digital video signal and said low frequency band digital video signal are recorded in a same recording region.

5. A recording/playback system in accordance with claim 2, wherein said recorded signal is a video signal including a low frequency band video signal of the first data stream and a high frequency band video signal of the second data stream, and a video signal is reconstructed from said high and low frequency band signals.

6. A recording system in accordance with claim 3, wherein said input signal is a video signal which is divided into a high frequency band video signal and a low frequency band video signal, and further said low and high frequency band video signals are recorded as said first and second data streams respectively.

7. A recording system in accordance with claim 1, wherein said input signal is a video signal which is divided into three, high, medium, and low, frequency band video signals, said high frequency band video signal is recorded as said second data stream, and said low and medium frequency band video signals being 1-1 and 1-2 data streams, respectively, are time multiplexed and recorded as said first data stream.

8. A recording system in accordance with claim 4, wherein at least either of said first and second data streams is encoded in a Trellis encoder.

9. A recording system in accordance with claim 7, wherein said 1-1 and 1-2 data streams are encoded in an error correcting encoder, and an error correcting code gain of said 1-1 data stream is set higher than that of said 1-2 data stream.

10. A playback system in accordance with claim 5, wherein at least either of said first and second data streams is decoded in a Trellis decoder.

11. A playback system in accordance with claim 2, wherein said recorded signal is a video signal consisting of three, high, medium, and low, frequency band video signals, said high frequency band video signal is received as said second data stream, said first data stream is time divided and demodulated as a 1-2 data stream of the medium frequency band video signal and a 1-1 data stream of the low frequency band video signal.

12. A playback system in accordance with claim 11, wherein said 1-1 and 1-2 data streams are decoded in an error correcting decoder, and an error correcting code gain of said 1-1 data stream is set higher than that of said 1-2 data stream.

* * * * *

UNITED STATES PATENT AND TRADEMARK OFFICE
CERTIFICATE OF CORRECTION

PATENT NO. : 5,819,000
DATED : October 6, 1998
INVENTOR(S) : Mitsuaki Oshima

It is certified that error appears in the above-indentified patent and that said Letters Patent is hereby corrected as shown below:

On the title page, item [30]
change "7-067934" to --4-67934--

Signed and Sealed this

Fourteenth Day of September, 1999

Attest:

Q. TODD DICKINSON

Attesting Officer        Acting Commissioner of Patents and Trademarks